United States Patent
Far et al.

(10) Patent No.: US 10,797,718 B1
(45) Date of Patent: Oct. 6, 2020

(54) TINY LOW POWER CURRENT MODE ANALOG TO DIGITAL CONVERTERS FOR ARTIFICIAL INTELLIGENCE

(71) Applicant: Ali Tasdighi Far, San Jose, CA (US)

(72) Inventors: Ali Tasdighi Far, San Jose, CA (US); Jerry M. Collings, Paso Robles, CA (US)

( * ) Notice: Subject to any disclaimer, the term of this patent is extended or adjusted under 35 U.S.C. 154(b) by 0 days.

(21) Appl. No.: 16/735,188

(22) Filed: Jan. 6, 2020

Related U.S. Application Data

(63) Continuation-in-part of application No. 16/381,245, filed on Apr. 11, 2019, now Pat. No. 10,594,334, and a continuation-in-part of application No. 16/266,083, filed on Feb. 3, 2019, now Pat. No. 10,581,448.

(60) Provisional application No. 62/927,285, filed on Oct. 29, 2019, provisional application No. 62/912,407, filed on Oct. 8, 2019, provisional application No. 62/880,885, filed on Jul. 31, 2019, provisional application No. 62/865,845, filed on Jun. 24, 2019, provisional application No. 62/862,772, filed on Jun. 18, 2019, provisional application No. 62/856,889, filed on Jun. 4, 2019, provisional application No.
(Continued)

(51) Int. Cl.
*H03M 1/34* (2006.01)
*G06N 20/00* (2019.01)

(52) U.S. Cl.
CPC .............. *H03M 1/34* (2013.01); *G06N 20/00* (2019.01)

(58) Field of Classification Search
CPC ............ H03M 1/34; H03M 1/38; H03M 1/36; G06N 20/00

USPC ......................................................... 341/155
See application file for complete search history.

(56) References Cited

U.S. PATENT DOCUMENTS

| | | |
|---|---|---|
| 3,187,325 A | 6/1965 | Waldhauer |
| 4,069,460 A | 1/1978 | Sauer |
| 4,179,687 A | 12/1979 | van de Plassche et al. |

(Continued)

OTHER PUBLICATIONS

A. Far, "Small size class AB amplifier for energy harvesting with ultra low power, high gain, and high CMRR," 2016 IEEE International Autumn Meeting on Power, Electronics and Computing (ROPEC), Ixtapa, 2016, pp. 1-5.

(Continued)

*Primary Examiner* — Brian K Young

(57) ABSTRACT

Single-stage and multiple-stage current-mode Analog-to-Digital converters (iADC)s utilizing apparatuses, circuits, and methods are described in this disclosure. The disclosed iADCs can operate asynchronously and be free from the digital clock noise, which also lowers dynamic power consumption, and reduces circuitry overhead associated with free running clocks. For their pseudo-flash operations, the disclosed iADCs do not require their input current signals to be replicated which saves area, lowers power consumption, and improves accuracy. Moreover, the disclosed methods of multi-staging of iADCs increase their resolutions while keeping current consumption and die size (cost) low. The iADC's asynchronous topology facilitates decoupling analog-computations from digital-computations, which helps reduce glitch, and facilitates gradual degradation (instead of an abrupt drop) of iADC's accuracy with increased input current signal frequency. The iADCs can be arranged with minimal digital circuitry (i.e., be digital-light), thereby saving on die size and dynamic power consumption.

8 Claims, 45 Drawing Sheets

Related U.S. Application Data

62/677,150, filed on May 28, 2018, provisional application No. 62/658,678, filed on Apr. 17, 2018.

(56) References Cited

U.S. PATENT DOCUMENTS

| | | | |
|---|---|---|---|
| 4,275,386 A | 6/1981 | Michel et al. | |
| 4,379,285 A | 4/1983 | Dooley | |
| 4,608,555 A | 8/1986 | Hoeft | |
| 4,667,180 A | 5/1987 | Robinson | |
| 4,675,651 A | 6/1987 | Marbot et al. | |
| 4,677,369 A | 6/1987 | Bowers et al. | |
| 4,691,190 A | 9/1987 | Robinson | |
| 5,072,221 A | 12/1991 | Schmidt | |
| 5,283,579 A | 2/1994 | Tasdighi | |
| 5,283,582 A | 2/1994 | Krenik | |
| 5,294,927 A | 3/1994 | Levinson et al. | |
| 5,410,197 A | 4/1995 | Krenik | |
| 5,459,465 A | 10/1995 | Kagey | |
| 5,640,084 A | 6/1997 | Tero et al. | |
| 5,668,710 A | 9/1997 | Caliboso et al. | |
| 5,675,341 A | 10/1997 | Vallancourt et al. | |
| 5,719,578 A | 2/1998 | Bohme | |
| 5,734,260 A | 3/1998 | Tasdighi et al. | |
| 5,734,291 A | 3/1998 | Tasdighi et al. | |
| 5,814,995 A | 9/1998 | Tasdighi | |
| 5,923,208 A | 7/1999 | Tasdighi et al. | |
| 5,990,820 A | 11/1999 | Tan | |
| 6,005,374 A | 12/1999 | Tasdighi | |
| 6,037,890 A | 3/2000 | Glass et al. | |
| 6,054,823 A | 4/2000 | Collings et al. | |
| 6,122,284 A | 9/2000 | Tasdighi et al. | |
| 6,130,632 A | 10/2000 | Opris | |
| 6,150,967 A | 11/2000 | Nakamura | |
| 6,504,500 B1 | 1/2003 | Tsukamoto | |
| 6,891,495 B2 | 5/2005 | Chen et al. | |
| 6,940,444 B1 | 9/2005 | Arigliano | |
| 6,972,706 B2 | 12/2005 | Snoeijs | |
| 7,002,505 B2 | 2/2006 | Highes | |
| 7,170,436 B2 | 1/2007 | Ye | |
| 7,187,316 B1 | 3/2007 | DeGeronimo | |
| 7,250,883 B2 | 7/2007 | Suzuki | |
| 7,397,407 B2 | 7/2008 | Shimizu et al. | |
| 7,414,562 B2 | 8/2008 | Kok et al. | |
| 7,714,762 B2 * | 5/2010 | Poon | H03M 1/42 341/161 |
| 7,719,454 B2 | 5/2010 | Minerva | |
| 7,839,317 B1 | 11/2010 | Sauer | |
| 7,893,318 B2 | 2/2011 | Albertsen et al. | |
| 7,911,366 B2 | 3/2011 | Randlett et al. | |
| 8,134,487 B2 | 3/2012 | Harpe | |
| 9,519,304 B1 | 12/2016 | Far | |
| 9,780,652 B1 | 10/2017 | Far | |
| 9,921,600 B1 | 3/2018 | Far | |
| 9,960,781 B1 * | 5/2018 | Chen | H03M 1/366 |
| 10,177,713 B1 | 1/2019 | Far | |
| 10,198,022 B1 | 2/2019 | Far | |
| 10,411,597 B1 | 9/2019 | Far | |
| 10,491,167 B1 | 11/2019 | Far | |
| 10,536,117 B1 | 1/2020 | Far | |
| 10,581,448 B1 * | 3/2020 | Far | H03M 1/447 |

| | | |
|---|---|---|
| 2005/0285770 A1 | 12/2005 | Ye |
| 2008/0024346 A1 | 1/2008 | Kok |
| 2008/0048644 A1 | 2/2008 | Hales et al. |
| 2010/0066579 A1 | 3/2010 | Randlett |
| 2010/0328120 A1 | 12/2010 | can der Plas et al. |

OTHER PUBLICATIONS

A. Far, "Compact ultra low power class AB buffer amplifier," 2017 IEEE International Autumn Meeting on Power, Electronics and Computing (ROPEC), Ixtapa, 2017, pp. 1-6.

A. Far, "Subthreshold current reference suitable for energy harvesting: 20ppm/C and 0.1%/V at 140nW," 2015 IEEE International Autumn Meeting on Power, Electronics and Computing (ROPEC), Ixtapa, 2015, pp. 1-4.

A. Far, "Amplifier for energy harvesting: Low voltage, ultra low current, rail-to-rail input-output, high speed," 2016 IEEE International Autumn Meeting on Power, Electronics and Computing (ROPEC), Ixtapa, 2016, pp. 1-6.

A. Far, "Class AB amplifier with noise reduction, speed boost, gain enhancement, and ultra low power," 2018 IEEE 9th Latin American Symposium on Circuits & Systems (LASCAS), Puerto Vallarta, Mexico, 2018, pp. 1-4.

A. Far, "Low noise rail-to-rail amplifier runs fast at ultra low currents and targets energy harvesting," 2017 IEEE International Autumn Meeting on Power, Electronics and Computing (ROPEC), Ixtapa, 2017, pp. 1-6.

A. Far, "A 5µW fractional CMOS bandgap voltage and current reference," 2013 IEEE Global High Tech Congress on Electronics, Shenzhen, 2013, pp. 7-11.

A. Far, "A 400nW CMOS bandgap voltage reference," 2013 International Conference on Electrical, Electronics and System Engineering (ICEESE), Kuala Lumpur, 2013, pp. 15-20.

A. Far, "Enhanced gain, low voltage, rail-to-rail buffer amplifier suitable for energy harvesting," 2017 IEEE International Autumn Meeting on Power, Electronics and Computing (ROPEC), Ixtapa, 2017, pp. 1-6.

A. Far, "Subthreshold bandgap voltage reference aiming for energy harvesting: 100na, 5 ppm/c, 40 ppm/v, psrr-88db," 2015 IEEE 5th International Conference on Consumer Electronics—Berlin (ICCE-Berlin), Berlin, 2015, pp. 310-313.

A. Far, "A 220nA bandgap reference with 80dB PSRR targeting energy harvesting," 2016 IEEE Canadian Conference on Electrical and Computer Engineering (CCECE), Vancouver, BC, 2016, pp. 1-4.

A. Far, "Sub-1 volt class AB amplifier with low noise, ultra low power, high-speed, using winner-take-all," 2018 IEEE 9th Latin American Symposium on Circuits & Systems (LASCAS), Puerto Vallarta, Mexico, 2018, pp. 1-4.

A. Far, "A low supply voltage 2µW half bandgap reference in standard sub-µ CMOS," 2014 IEEE International Conference on Electronics, Computing and Communication Technologies (CONECCT), Bangalore, 2014, pp. 1-5.

A. Far, "Current reference for energy harvesting: 50um per side, At 70 nW, regulating to 125C," 2014 IEEE International Autumn Meeting on Power, Electronics and Computing (ROPEC), Ixtapa, 2014, pp. 1-5.

* cited by examiner

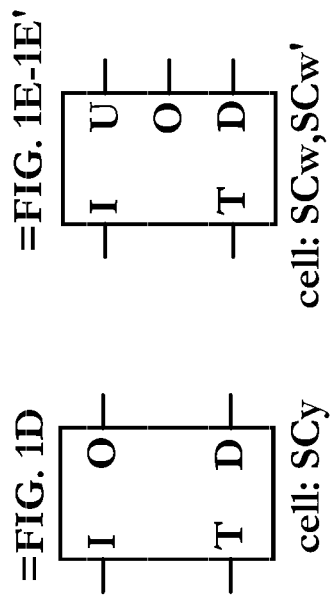
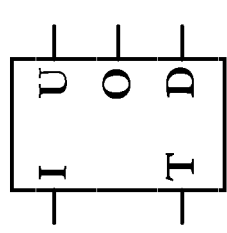
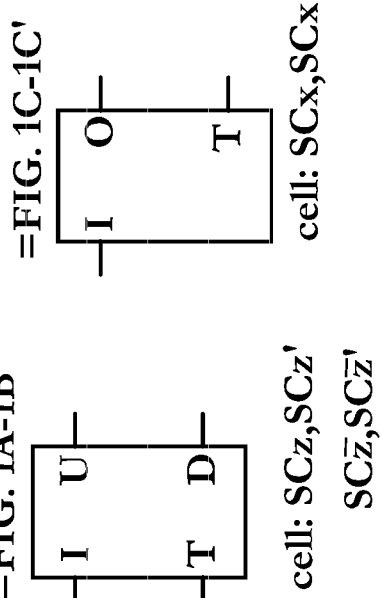
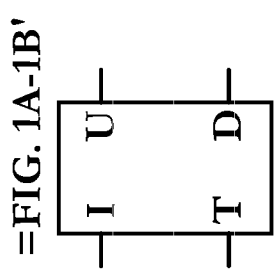
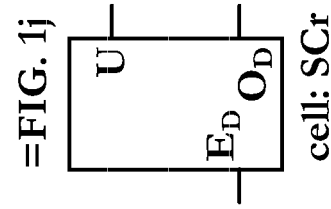
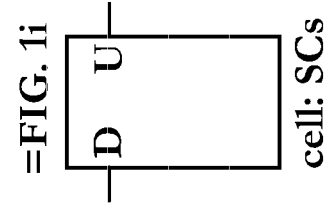
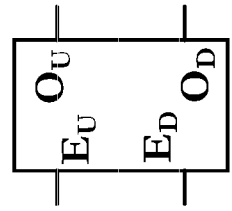
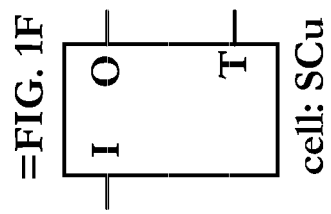
FIG. 1K  FIG. 1L  FIG. 1M  FIG. 1N
FIG. 1O  FIG. 1P  FIG. 1Q  FIG. 1R

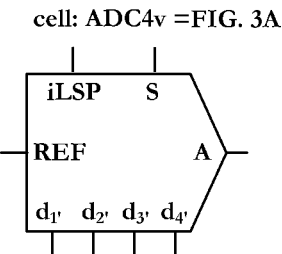
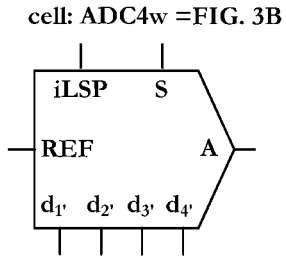
FIG. 3E    FIG. 3F
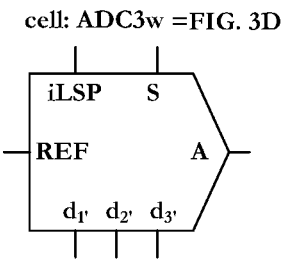
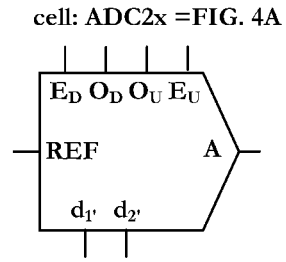
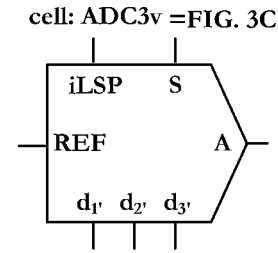
FIG. 3H    FIG. 4B    FIG. 3G
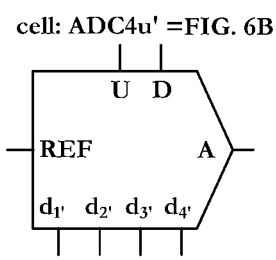
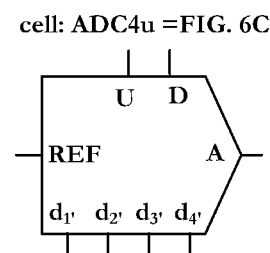
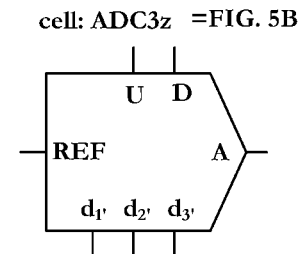
FIG. 6F    FIG. 6G    FIG. 5C
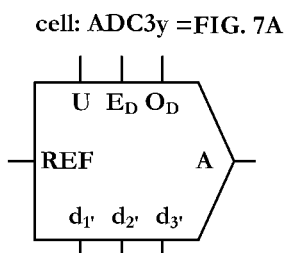
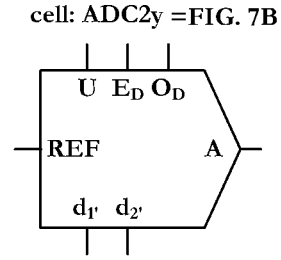
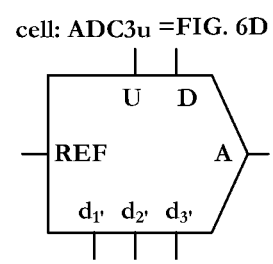
FIG. 7C    FIG. 7D    FIG. 6H

TINY LOW POWER CURRENT MODE ANALOG TO DIGITAL CONVERTERS FOR ARTIFICIAL INTELLIGENCE

CROSS-REFERENCE TO RELATED PATENT APPLICATIONS

The present disclosure claims priority from U.S. Provisional Patent Application Ser. No. 62/927,285 filed on Oct. 29, 2019, and which is herein specifically incorporated by reference in its entirety. Furthermore, the present invention is a continuation-in-part of and claims the benefit of priority from U.S. patent application Ser. No. 16/266,083 filed on Feb. 3, 2019; which claims priority from U.S. Provisional Patent Application Ser. No. 62/677,150 filed on May 28, 2018, and which are herein specifically incorporated by reference in their entirety. Furthermore, the present disclosure claims priority from U.S. Provisional Patent Application Ser. No. 62/865,845 filed Jun. 24, 2019 and which is herein specifically incorporated by reference in its entirety. Furthermore, the present invention is a continuation-in-part of and claims the benefit of priority from U.S. patent application Ser. No. 16/381,245 filed on Apr. 11, 2019; which claims priority from U.S. Provisional Patent Application Ser. No. 62/658,678 filed on Apr. 17, 2018, and which are herein specifically incorporated by reference in their entirety. Furthermore, the present disclosure claims priority from U.S. Provisional Patent Application Ser. No. 62/856,889 filed Jun. 4, 2019 and which is herein specifically incorporated by reference in its entirety. Furthermore, the present disclosure claims priority from U.S. Provisional Patent Application Ser. No. 62/880,885 filed Jul. 31, 2019 and which is herein specifically incorporated by reference in its entirety. Furthermore, the present disclosure claims priority from U.S. Provisional Patent Application Ser. No. 62/912,407 filed Oct. 8, 2019 and which is herein specifically incorporated by reference in its entirety. Furthermore, the present disclosure claims priority from U.S. Provisional Patent Application Ser. No. 62/862,772 filed Jun. 18, 2019 and which is herein specifically incorporated by reference in its entirety.

FIELD OF DISCLOSURE

The present invention relates to improvements in data-converters including analog-to-digital-converters (ADC), and including but not limited to current mode ADCs (iADC).

BACKGROUND

Demand for technologies and integrated circuits (IC)s with low current consumptions and operating at low power supply voltages continues to grow. Data-converters such as ADCs (including iADCs) are fundamental building blocks in ICs, and majority of commercially available ADCs operate generally in voltage-mode.

Voltage-mode ADCs that utilize switch-capacitor (clocking) techniques can generally offer performance benefits such as low offset, low noise, and (clocked) calibrated accuracy. Also, switch-capacitors can provide sample and hold (of ADC's input voltage signal) capability as an analog memory. However, utilization of voltage-mode ADCs in low-voltage supply applications may be constrained, in part, because the range of input voltage signals for a voltage mode ADC is generally limited to the maximum available power supply voltage. To overcome this issue in low power voltage supply applications, switch-capacitors can pump-up an ADC's internal power supply voltage, at the expense of added circuit complexity and cost. Moreover, analog computations and signal processing in voltage-mode ADCs generally depend on the outcome of digital computations, which can impede an ADC's transient response and degrade ADC's input-to-output glitch rejection. Also, switch-capacitor techniques generally require free running clocks for voltage-mode ADCs, which can increase an ADC's dynamic power consumption, and raise digital system noise. Generally speaking, charging and discharging a capacitor's voltages (e.g., including in a voltage-mode ADC) may be a slow process, which can slow down the dynamic response of a switched-capacitor based voltage-mode ADC.

Current-mode ADCs can offer some benefits for low current and low voltage power supply applications. For example, current mode-data converters are generally and inherently fast, since their internal voltage nodes generally experience small voltage movement when processing current signals along an iADCs signal path. Moreover, small voltage movements enable operating the iADCs with low power supply voltages. As such, current input signals inputted to an iADC can generally span zero to full scale independent of (low) voltage supply amplitude. Naturally, power consumption can also be lowered when operating an iADC with lower voltage power supply. Furthermore, utilizing iADCs that operate their FETs (Field-Effect-Transistors) in the subthreshold region enables running iADCs with ultra-low currents, which is beneficial, especially for ultra-low power portable applications. Additionally, operating an iADC asynchronously frees the iADC from clocks and the clock's associated off-chip overhead, which also lowers the clock related dynamic power consumption and digital noise. Moreover, operating an iADC without the need for switching capacitors, eliminates the capacitor manufacturing step and reduces IC die size which lowers the cost. Also, iADCs can be manufactured with readily available main stream digital complementary-Metal-Oxide-Semiconductor (CMOS) process, which offers rugged quality and lower cost iADCs.

Conventional flash based iADCs require replicating (plurality of) the iADC's current input signal, which increases the power consumption of the iADC. Also, copying the iADC's current input signal (for plurality of instances) would introduce mismatches between the respective current input signal copies, which degrades the accuracy of the iADC. Additionally, increasing the resolution of a flash iADC can exponentially increase the die area and increase iADC's consumes power consumption.

Furthermore, conventional algorithmic or gray-code current mode iADCs (which utilize complicated amplification and or plurality of complementary current mirrors in their analog signal paths) can suffer from mismatches between the plurality of current mirrors, and have slow dynamic response (during zero-current crossings) attributed to slow transient response of plurality of such current mirrors and amplifiers.

Accordingly, conventional algorithmic current mode or gray-code iADCs could suffer from low precision and or slow dynamic response.

SUMMARY OF THE INVENTION

Considering the above, it is the objective of the present disclosure to provide improvements to ADCs, as well as improvements to iADCs, including (but not limited to) the following (in part or combination thereof):

An objective of the present disclosure is to provide ADCs that can operate with low voltage power supplies.

Another objective of the present disclosure is to provide ADCs that are free from glitch or have low glitch.

Another objective of the present disclosure is to provide iADCs with fast dynamic response that do not require copying the iADC's current input signal, which can help lower power consumption and enhance accuracy of the iADCs.

Another objective of the present disclosure is multi-staging of iADCs to increase resolutions while keeping current consumption and die size (cost) low.

Another objective of the present disclosure is to decouple analog-computations from digital-computations. This helps reduce the ADC's glitch, and facilitates gradual degradation (instead of an abrupt drop) of ADC accuracy with increased input signal frequency.

Another objective of the present disclosure is to provide ADCs that can be arranged with minimal digital circuitry (i.e., be digital-light), thereby saving on die size and dynamic power consumption.

Another objective of the present disclosure is to provide iADCs that can be inputted with zero-to-full scale current input signal with low voltage power supplies.

An objective of the present disclosure is to provide ADCs that have low power consumption.

Another objective of the present disclosure is to provide ADCs that are asynchronous.

Another objective of the present disclosure is to provide ADCs that are free from the digital clock noise, dynamic power consumption, and circuitry overhead associated with free running clocks.

Another objective of the present disclosure is to provide iADCs that are multi-staged to increase the iADC's resolution while optimizing for (high) speed, (low) cost and (low) current consumption.

Another objective of the present disclosure is to provide ADCs that do not require passive complements (such as resistor or capacitors) which saves on manufacturing costs.

Another objective of the present disclosure is to provide ADCs that operate to specification over normal manufacturing process, temperature, and power supply voltage variations.

Another objective of the present disclosure is to provide ADCs that can be integrated with and seamlessly interface with standard digital logic (e.g., sea of gates).

Another objective of the present disclosure is to provide ADCs that are based in standard main-stream manufacturing (e.g., digital CMOS) which have proven and rugged quality and available at low cost.

Substantial amount of power in machine learning and artificial intelligence (ML & AI) computation is consumed during memory read-write cycle of conventional digital signal processing. Another objective of this disclosure is to facilitate mixed-mode signal processing for ML & AI that is memory free and thus reduce power consumption.

Generally, conventional AI & ML digital signal processing rely on central processors on the cloud which increases the overall application power consumption due to back-and-forth communications with the cloud, and introduces computation latency that may be unacceptable in some applications such as medical. Another objective of this disclosure is to facilitate low power and low cost mixed-mode signal processing for ML & AI that can be performed at the edge or on sensors to help eliminate the latency.

Another objective of this disclosure is to enable low power and low-cost analog computation that can be converted to digital and be seamlessly compatible with digital processors for hybrid AI & ML signal processing (e.g., main digital signal processors combined with analog mixed-signal accelerators and or co-processors).

Generally, performing AI & ML signal processing on the cloud has privacy risks. Another objective of the present disclosure is to enable low power and low-cost AI & ML analog and mixed signal processing at the edge or on the sensors to avoid sending and receiving information to and from the cloud.

Aspects of the embodiments disclosed herein include a system for current signal conditioning in an integrated circuit, the system comprising: a plurality of current-mode signal-conditioners (iSC)s each having an analog current input port ($A_I$), an analog current output port ($A_O$), and a digital output port ($D_O$); a plurality of scaled reference current sources ($I_R$); the first $I_R$ source coupled to the $A_I$ port of the first iSC; the second and each subsequent $I_R$ source each having a digital input port ($D_R$) for controlling the polarity of the $I_R$ source; the $A_O$ port of the first iSC and the $A_O$ port of each subsequent iSC coupled to the $A_I$ port of each corresponding subsequent successive iSC; the $A_O$ port of each iSC coupled to its corresponding $I_R$ source; the $D_O$ port of each iSC coupled to the $D_R$ port of each corresponding $I_R$ source; wherein each iSC generating an analog difference current ($i\Delta$); wherein if the $i\Delta>0$, then the corresponding iSC steers the $+i\Delta$ current onto the $A_O$ port, and generates a digital output signal ($T_O$) at the $D_O$ port; wherein if the $i\Delta<0$, then the corresponding iSC steers the $-i\Delta$ current onto the $A_O$ port, and generates an opposite digital output signal ($xT_O$) at the $D_O$ port; wherein the absolute value of the magnitude of the $I_R$ corresponding to each successive iSC is scaled to substantially twice the absolute value of the magnitude of the $I_R$ source corresponding to the subsequent successive iSC; and wherein there are n of iSCs beginning with the first iSC and ending with the $n^{th}$ iSC. The system for current signal conditioning in an integrated circuit, the system further comprising: a current mode analog to digital converter (iADC) having an analog current input port ($Ai_{ADC}$) receiving an analog input current signal ($Ii_{ADC}$); the iADC having an analog reference current port ($Ar_{ADC}$) receiving an analog reference current signal ($Ir_{ADC}$); the iADC having a digital output port ($Do_{ADC}$); the respective $D_O$ ports of the plurality of iSCs coupled to the $Do_{ADC}$ port; the $A_I$ port of the first iSC coupled to the $Ai_{ADC}$ port; wherein n is the resolution of the iADC and the $Do_{ADC}$ port is n-bit wide; wherein the absolute value of the magnitude of each $I_R$ can be scaled between a zero-scale $I_R$ and a full-scale $I_R$; wherein $Ir_{ADC}$ is proportional to the full-scale scaled $I_R$; and wherein $Ii_{ADC}$ can span between the zero-scale $I_R$ and the full-scale $I_R$.

Aspects of the embodiments disclosed herein include a method for analog to digital conversion in an integrated circuit, the method comprising: receiving a first analog input signal; receiving a first analog reference signal; subtracting the first analog reference signal from the first analog input signal to generate a first analog difference signal; generating a first digital output signal having a sign responsive to the sign of the first analog difference signal; receiving a second and subsequent analog reference signals, each respectively having a sign responsive to the respective signs of the first and subsequent analog difference signals; subtracting the second and subsequent analog reference signals, each respectively from the first and subsequent analog difference signals to respectively generate second and subsequent analog difference signals; and generating a second and subsequent digital output signals, each respectively having a sign responsive to the respective sign of the second and subsequent analog difference signals. The method for analog to digital conversion in an integrated circuit, the method further comprising: scaling the first, second, and each subsequent analog reference signals respectively to follow at least one of binary, equal, and individual weightings.

Aspects of the embodiments disclosed herein include a method for analog to digital conversion in an integrated circuit, the method comprising: receiving an analog input signal; receiving a first analog reference signal; subtracting the first analog reference signal from the analog input signal to generate a first analog difference signal; conditioning a first left analog output signal to be substantially equal to the first analog difference signal if the first analog difference signal is positive, and conditioning the first left analog output signal to be substantially equal to zero if the first analog difference signal is negative; conditioning a first right analog output signal to be substantially equal to zero if the first analog difference signal is positive, and conditioning the first right analog output signal be substantially equal to the first analog difference signal if the first analog difference signal is negative; generating a first digital output signal having a positive state if the first analog difference signal is positive, and generating the first digital output signal having a negative state if the first analog difference signal is negative; receiving a first left analog reference signal; subtracting the first left analog output signal from the first left analog reference signal to generate a second left analog difference signal; conditioning a second left analog output signal to be substantially equal to the second left analog difference signal if the second left analog difference signal is positive, and conditioning the second left analog output signal to be substantially equal to zero if the second left analog difference signal is negative; conditioning a second right analog output signal to be substantially equal to zero if the second left analog difference signal is positive, and conditioning the second right analog output signal to be substantially equal to the second left analog difference signal if the second left analog difference signal is negative; generating a second digital output signal having a positive state if the second left analog difference signal is positive, and generating the second digital output signal having a negative state if the second left analog difference signal is negative; receiving a first right analog reference signal; adding the first right analog output signal from the first right analog reference signal to generate a second right analog difference signal; conditioning a third left analog output signal to be substantially equal to the second right analog difference signal if the second right analog difference signal is positive, and conditioning the third left analog output signal to be substantially equal to zero if the second right analog difference signal is negative; conditioning a third right analog output signal to be substantially equal to zero if the second right analog difference signal is positive, and conditioning the third right analog output signal to be substantially equal to the second right analog difference signal if the second right analog difference signal is negative; and generating a third digital output signal having a positive state if the second right analog difference signal is positive, and generating the third digital output signal having a negative state if the second right analog difference signal is negative.

Aspects of the embodiments disclosed herein include a system for current mode analog-tree-fork-processing in an integrated circuit, the system comprising: a current mode analog-tree-fork-processor (iATFP) having an analog current input port ($A_i$), a left-left analog current output port ($Ao_L^L$), a left-right analog current output port ($Ao_R^L$), a right-left analog current output port ($Ao_L^R$), a right-right analog current output port ($Ao_R^R$), a middle digital output port ($D_O^M$), a left digital output port ($D_O^L$), and a right digital output port ($D_O^R$); the iATFP comprising a middle, a left, and a right current mode signal conditioner (iSC)s; each iSC having an analog current input port ($Ai_{sc}$), a left analog current output port ($Ao_{sc}^L$), a right analog current output port ($Ao_{sc}^R$), and a digital output port ($Do_{sc}$); a plurality of scaled reference current sources ($I_R$), each having a polarity; the $Ai_{sc}$ port of each iSC coupled to a corresponding $I_R$ source; the $Ao_{sc}^L$, port of the middle iSC coupled to the $Ai_{sc}$ port of the left iSC; the $Ao_{sc}^R$ port of the middle iSC coupled to the $Ai_{sc}$ port of the right iSC; the $A_i$ port coupled to the $Ai_{sc}$ port of the middle iSC; the $Ao_{sc}^L$ port of the left iSC coupled to the $Ao_L^L$ port; the $Ao_{sc}^R$ port of the left iSC coupled to the $Ao_R^L$ port; the $Ao_{sc}^L$ port of the right iSC coupled to the $Ao_L^R$ port; the $Ao_{sc}^R$ port of the right iSC coupled to the $Ao_R^R$ port; the $Do_{sc}$ port of the middle iSC coupled to the $D_O^M$ port; the $Do_{sc}$ port of the left iSC coupled to the $D_O^L$ port; the $Do_{sc}$ port of the right iSC coupled to the $D_O^R$ port; wherein the absolute value of the magnitude of the $I_R$ corresponding to the left and the right iSC is scaled to substantially half of the absolute value of the magnitude of the $I_R$ source corresponding to the middle iSC; wherein the polarity of the $I_R$ source corresponding to the left iSC is the same as the polarity of the $I_R$ source corresponding to the middle iSC, and the polarity of the $I_R$ source corresponding to right iSC is the opposite of the polarity of the $I_R$ source corresponding to the middle iSC; wherein for each iSC, if the difference input current signal (i$\Delta$) flowing through its $Ai_{sc}$ port is approximately greater than zero, then the current through its $Ao_{sc}^R$ port is conditioned to substantially equal the i$\Delta$ signal, the current through its $Ao_{sc}^L$ port is conditioned to substantially equal zero, and its $Do_{sc}$ port generates a polarity digital signal ($T_O$); and wherein for each iSC, if the i$\Delta$ signal flowing through its $Ai_{sc}$ port is approximately less than zero, then the current through its $Ao_{sc}^L$ port is conditioned to substantially equal the i$\Delta$ signal, and the current through its $Ao_{sc}^R$ port is conditioned to substantially equal zero, and its $Do_{sc}$ port generates an opposite polarity digital signal ($xT_O$). The system for current-mode analog-tree-fork-processing in an integrated circuit, the system further comprising: the $Ao_L^L$ port of the iATFP coupled to the $Ai_{sc}$ port of a left-left iSC; the $Ao_R^L$ port of the iATFP coupled to the $Ai_{sc}$ port of a left-right iSC; the $Ao_L^R$ port of the iATFP coupled to the $Ai_{sc}$ port of a right-left iSC; the $Ao_R^R$ port of the iATFP coupled to the $Ai_{sc}$ port of a right-right iSC; the $Ai_{sc}$ port of the left-left iSC, and the $Ai_{sc}$ port of the right-left iSC, each coupled respectively to a corresponding $I_R$ source having a polarity the same as the $I_R$ source corresponding to the middle iSC; the $Ai_{sc}$ port of the left-right iSC, and the $Ai_{sc}$ port of the right-right iSC, each coupled respectively to a corresponding $I_R$ source having a polarity opposite to the polarity of the $I_R$ source corresponding to the middle iSC; and wherein the absolute value of the magnitude of each $I_R$ source corresponding to the left-left, left-right, right-left, and right-right iSCs are substantially equal, and are substantially equal to one quarter of the absolute value of the magnitude of the $I_R$ source corresponding to the middle iSC. The system for current-mode analog-tree-fork-processing in an integrated circuit, the system further comprising: the $Ao_L^L$ port of the iATFP coupled to the $A_i$ port of a left-left iATFP; the $Ao_R^L$ port of the iATFP coupled to the $A_i$ port of a left-right iATFP; the $Ao_L^R$ port of the iATFP coupled to the $A_i$ port of a right-left iATFP; the $Ao_R^R$ port of the iATFP coupled to the $A_i$ port of a right-right iATFP; wherein the polarity of the $I_R$ source corresponding to the middle iSC of the left-left iAFTP and the polarity of the $I_R$ source corresponding to the middle iSC of the right-left iAFTP has the same polarity as the $I_R$ source corresponding to the middle iSC of the iAFTP; wherein the polarity of the $I_R$ source corresponding to the middle iSC of the left-right iAFTP and the polarity of the $I_R$ source corresponding to the middle iSC of the right-right iAFTP has the opposite polarity of the $I_R$ source corresponding to the middle iSC of the iAFTP; and wherein the absolute value of the magnitude of each $I_R$ source corresponding to the middle iSC of each of the left-left iATFP, the left-right iATFP, the right-left iATFP, and the right-right iATFP are substantially equal, and are substantially equal to one quarter of the absolute value of the magnitude of the $I_R$ source corresponding to the middle iSC of the iATFP. The system for current-mode analog-tree-fork-processing in an integrated circuit, the system further comprising: a multi-stage current-mode Analog-to-Digital Converter (iADC) comprising of the first iADC, and a second iADCs; a current-mode signal conditioning circuit (iSCC) having an $A_{scc}^L$ port, an $A_{scc}^R$ port, and an $A_{scc}^O$ port; the current reference input ports of the first iADC and the second iADC each coupled to a corresponding $I_R$ source; the $A_i$ coupled to a current input port of the first iADC; the $Ao_L^L$ port coupled to the $Ao_L^R$ port and coupled to the $A_{scc}^L$ port; the $Ao_R^L$ port coupled to the $Ao_R^R$ port and coupled to the $A_{scc}^R$ port; a corresponding $I_R$ source coupled to at least one of the $A_{scc}^L$ port and the $A_{scc}^R$ port; the $A_{scc}^O$ port coupled to a current input port of the second iADC; wherein the first iADC generates an m=2 bits wide Most-Significant-Bit (MSB) word by encoding the digital signals from the $Do_{sc}$ ports of the middle, the left, and the right iSCs; wherein the second iADC generates an n-bit wide Least-Significant-Bit (LSB) word; wherein a digital output word of the multi-stage iADC is m+n bits wide comprising of the MSB word and the LSB word; wherein the iSCC combines its corresponding $I_R$ source with the current flowing through the $A_{scc}^R$ port, $A_{scc}^L$ port, and generates a Least-Significant-Portion analog current ($i_{LSP}$) through $A_{scc}^O$ port, wherein the $i_{LSP}$ is the analog current input for the second iADC; wherein the absolute value of the magnitude of the $I_R$ source corresponding to the first iSCC is scaled individually; and wherein the absolute value of the magnitude of the $I_R$ source of the first iADC is scaled $2^m$ times that of the second iADC. The system for current-mode analog-tree-fork-processing in an integrated circuit, the system further comprising: a multi-stage current-mode Analog-to-Digital Converter (iADC) comprising of the first iADC, and a second iADCs; a current-mode signal conditioning circuit (iSCC) having an $A_{scc}^L$ port, an $A_{scc}^R$ port, and an $A_{scc}^O$ port; the current reference input ports of the first iADC and the second iADC each coupled to a corresponding $I_R$ source; the $A_i$ coupled to a current input port of the first iADC; the $Ao_{sc}^L$ ports of the left-left iSC, left-right iSC, right-left iSC, and right-left iSC coupled to the $A_{scc}^L$ port; the $Ao_{sc}^R$ ports of the left-left iSC, left-right iSC, right-left iSC, and right-left iSC coupled to the $A_{scc}^R$ port; a corresponding $I_R$ source coupled to at least one of the $A_{scc}^L$ port and the $A_{scc}^R$ port; the $A_{scc}^O$ port coupled to a current input port of the second iADC; wherein the first iADC generates an m=3 bits wide Most-Significant-Bit (MSB) word by encoding the digital signals from the $D_O^M$ port, $D_O^L$ port, $D_O^R$ port, and the $Do_{sc}$ ports of the left-left, the left-right, the right-left, and the right-right iSCs; wherein the second iADC generates an n-bit wide Least-Significant-Bit (LSB) word; wherein a digital output word of the multi-stage iADC is m+n bits wide comprising of the MSB word and the LSB word; wherein the iSCC combines its corresponding $I_R$ source with the current flowing through the $A_{scc}^R$ port, $A_{scc}^L$ port, and generates a Least-Significant-Portion analog current ($i_{LSP}$) through $A_{scc}^O$ port, wherein the $i_{LSP}$ is the analog current input for the second iADC; wherein the absolute value of the magnitude of the $I_R$ source corresponding to the first iSCC is scaled individually; and wherein the absolute value of the magnitude of the $I_R$ source of the first iADC is scaled $2^m$ times that of the second iADC. The system for current-mode analog-tree-fork-processing in an integrated circuit, the system further comprising: a multi-stage current-mode Analog-to-Digital Converter (iADC) comprising of the first iADC, and a second iADCs; a current-mode signal conditioning circuit (iSCC) having an $A_{scc}^L$ port, an $A_{scc}^R$ port, and an $A_{scc}^O$ port; the current reference input ports of the first iADC and the second iADC each coupled to a corresponding $I_R$ source; the $A_i$ coupled to a current input port of the first iADC; the $Ao_L^L$ ports and the $Ao_L^R$ ports of the left-left iATFP, left-right iATFP, right-left iATFP, and right-right iATFP coupled to the $A_{scc}^L$ port; the $Ao_R^L$ and the $Ao_R^R$ ports of the left-left iATFP, left-right iATFP, right-left iATFP, and right-right iATFP coupled to the $A_{scc}^R$ port; a corresponding $I_R$ source coupled to at least one of the $A_{scc}^L$ port and the $A_{scc}^R$ port; the $A_{scc}^O$ port coupled to a current input port of the second iADC; wherein the first iADC generates an m=4 bits wide Most-Significant-Bit (MSB) word by encoding the digital signals from the $D_O^M$ port, $D_O^L$ port, $D_O^R$ port of the left-left, the left-right, the right-left, the right-right iATFP, and the iATFP; wherein the second iADC generates an n-bit wide Least-Significant-Bit (LSB) word; wherein a digital output word of the multi-stage iADC is m+n bits wide comprising of the MSB word and the LSB word; wherein the iSCC combines its corresponding $I_R$ source with the current flowing through the $A_{scc}^R$ port, $A_{scc}^L$ port, and generates a Least-Significant-Portion analog current ($i_{LSP}$) through $A_{scc}^O$ port, wherein the $i_{LSP}$ is the analog current input for the second iADC; wherein the absolute value of the magnitude of the $I_R$ source corresponding to the first iSCC is scaled individually; and wherein the absolute value of the magnitude of the $I_R$ source of the first iADC is scaled $2^m$ times that of the second iADC.

Aspects of the embodiments disclosed herein include a method for analog to digital conversion in an integrated circuit, the method comprising: receiving a first analog input signal; receiving a first analog reference signal; subtracting the first analog reference signal from the first analog input signal to generate a first analog difference signal; reversing the polarity of the first analog difference signal in a first single polarity-reversing current mirror circuit to produce a first conditioned analog signal if the polarity of the first analog difference signal is of a first sign, and not reversing the polarity of the first analog difference signal to produce the first conditioned analog signal if the polarity of the first analog difference signal is not of the first sign; generating a first digital output signal having a sign responsive to the sign of the first analog difference signal; receiving a second and subsequent analog reference signals; subtracting the second and subsequent analog reference signals, each respectively from the first and subsequent conditioned analog signals to respectively generate second and subsequent analog difference signals; reversing the polarity of the second and subsequent analog difference signals respectively in second and subsequent single polarity-reversing current mirror circuits to respectively produce the second and subsequent conditioned analog signals if the respective polarities of the second and subsequent analog difference signals are of second and subsequent signs, and not reversing the respective polarity of the second and subsequent analog difference signals to produce the second and subsequent conditioned analog signals if the respective polarities of the second and subsequent analog difference signals are not of the respective second and subsequent signs; and generating a second and subsequent digital output signals, each respectively having a sign responsive to the respective sign of the second and subsequent analog difference signals. The method for analog to digital conversion in an integrated circuit, the method further comprising: scaling the first, second, and each subsequent analog reference signals respectively to follow at least one of binary, equal, and individual weightings.

Aspects of the embodiments disclosed herein include a system for current signal conditioning in an integrated circuit, the system comprising: a plurality of current signal-conditioner (iSC)s each having an analog input port ($Ai_{sc}$), an analog current output port ($Ao_{sc}$), and a digital output port ($Do_{sc}$); a plurality of scaled reference current sources ($I_R$); each of the scaled $I_R$ coupled to the $Ai_{sc}$ port of each iSC, a plurality of current mirrors (iCM)s each having an analog input port ($Ai_{CM}$), an analog current output port ($Ao_{CM}$); each $Ai_{sc}$ is coupled to a corresponding $Ai_{CM}$; each $Ao_{sc}$ is coupled to a corresponding $Ao_{CM}$; wherein each iSC generating a first analog difference current signal ($\Delta i_{SC}$); wherein if the $\Delta i_{SC}>0$, then each iSC steers the $\Delta i_{SC}$ onto the $Ao_{SC}$, and generates a digital output signal ($To_{SC}$) at the $Do_{SC}$ port; wherein if the $\Delta i_{SC}<0$, then each iSC steers the $-\Delta i_{SC}$ onto the $Ao_{SC}$, and generates the opposite $To_{SC}$ at the $Do_{SC}$ port; and wherein each scaled $I_R$ is programmable between a substantially zero-scale $I_R$ and a substantially full-scale $I_R$. The system for current signal conditioning in an integrated circuit, the system further comprising: a current mode analog to digital converter (iADC) having an analog current input port ($A_I$) receiving an analog input current signal ($S_I$); the iADC having an analog reference current port ($A_R$) receiving an analog reference current signal ($S_R$); the iADC having a digital output port ($D_O$); the $D_O$ coupled to plurality of $Do_{SC}$s; the $Ai_{SC}$ of the first iSC coupled to $A_I$; the $Ao_{SC}$ of the first iSC and each subsequent iSC coupled to $Ai_{SC}$ of each subsequent successive iSC; wherein n is the resolution of the iADC; wherein the $D_O$ is n-bit wide; wherein there are n of iSCs beginning with the first iSC and ending with the $n^{th}$ iSC; wherein the $S_I$ can span between the zero-scale $I_R$ to the full scale $I_R$; wherein $S_R$ is proportional to the scaled $I_R$; wherein the scaled $I_R$ of the first iSC is programmed to half of the full-scale $I_R$; wherein the scaled $I_R$ is halved from one iSC to the next; wherein the $\Delta i_{SC}$ of the first iSC is $S_I-I_R/2$; and wherein the $\Delta i_{SC}$ of each subsequent successive iSC is the $\Delta i_{SC}$ of each successive iSC minus a binary scaled $I_R$. The system for current signal conditioning in an integrated circuit, the system further comprising: the $Ao_{SC}$ of the last iSC coupled to an input port of another iADC; and wherein n is increased by multi-staging the iADC with the another iADC.

Aspects of the embodiments disclosed herein include a method for multi-staging a flash current mode Analog-to-Digital-Converter (iADC), in an integrated circuit, the method comprising: receiving an input signal ($S_I$) at an analog input port ($A_I$) of an m-bit flash iADC; receiving a reference signal ($S_R$) at a reference port ($A_R$) of the flash iADC; generating a digital word ($To_M$) at a digital port ($Do_M$) of the flash iADC; generating a sequence of a plurality of difference signals ($\Delta i_L$) in the flash iADC by comparing the $S_I$ respectively with a sequence of a plurality of scaled $S_R$; providing a plurality of current mode signal conditioners (iSC)s, wherein each iSC having an input port ($Ai_L$), an up-output-port ($Au_L$), an down-output-port ($Ad_L$), and a digital output port ($Do_L$); supplying the plurality of $Ai_L$ with the respective sequence of plurality $\Delta i_L$; steering each $\Delta i_L$ onto its corresponding $Ad_L$ and generating a digital signal ($To_L$) at its corresponding $Do_L$ if $\Delta i_L<0$; steering each $\Delta i_L$ onto its corresponding $Au_L$ and generating an opposite $To_L$ at its corresponding $Do_L$ if $\Delta i_L>0$; combining plurality of current signals flowing through $Au_L$ and $Ad_L$ with a scaled $S_R$ to generate a Least-Significant-Portion (LSP) current ($i_{LSP}$); inputting a $S_R/2^m$ to a second iADC; inputting the $i_{LSP}$ to the second iADC to generate a least-significant-bit (LSB) word ($To_L$); and mapping the $To_L$ and $To_M$ to generate a final digital word ($T_O$). method for multi-staging a flash current mode Analog-to-Digital-Converter (iADC) in an integrated circuit, the method further comprising: wherein the flash iADC's sequence of plurality of scaled $S_R$ are weighted at least one of thermometer and individually weighted.

BRIEF DESCRIPTION OF THE DRAWINGS

The subject matter presented herein is illustrated by way of example, and not by way of limitation, in the figures of the accompanying drawings and illustrations, and in which like reference numerals refer to similar elements, and in which:

FIG. 1A' is a circuit schematic illustrating another current-mode signal conditioning circuit, the SCz' cell.

FIG. 1K is a block diagram illustrating the following signal conditioning circuits: SCz cell of FIG. 1A, the SCz' cell of FIG. 1A', the SC$\overline{z}$ cell of FIG. 1B, and the SC$\overline{z}$' cell of FIG. 1B'.

FIG. 1L is a block diagram illustrating the following signal conditioning circuits: SCx cell of FIG. 1C, and the SCx' cell of FIG. 1C'.

FIG. 1M is a block diagram illustrating the signal conditioning circuit SCy cell of FIG. 1D.

FIG. 1N is a block diagram illustrating the following signal conditioning circuits: SCw cell of FIG. 1E, and the SCw' cell of FIG. 1E'.

FIG. 1O is a block diagram illustrating the signal conditioning circuit SCu cell of FIG. 1F.

FIG. 1P is a block diagram illustrating the following signal conditioning circuits: SCt cell of FIG. 1G, and the SCt' cell of FIG. 1H.

FIG. 1Q is a block diagram illustrating the signal conditioning circuits SCs cell of FIG. 1*i*.

FIG. 1R is a block diagram illustrating the signal conditioning circuits SCr cell of FIG. 1*j*.

FIG. 3E is an iADC block diagram for ADC4v that is described and illustrated in section 3A and FIG. 3A, respectively.

FIG. 3F is an iADC block diagram for ADC4w that is described and illustrated in section 3B and FIG. 3B, respectively.

FIG. 3G is an iADC block diagram for ADC3v that is described and illustrated in section 3C and FIG. 3C, respectively.

FIG. 3H is an iADC block diagram for ADC3w that is described and illustrated in section 3D and FIG. 3D, respectively.

FIG. 4B is a flash iADC block diagram for the flash ADC2x that is described and illustrated in section 4A and FIG. 4A, respectively.

FIG. 5C is a tree iADC block diagram for the tree ADC3z that is described and illustrated in section 5B and FIG. 5B, respectively.

FIG. 6F is an iADC block diagram for the ADC4u' that is described and illustrated in section 6B and FIG. 6B, respectively.

FIG. 6G is an iADC block diagram for the ADC4u that is described and illustrated in section 6C and FIG. 6C, respectively.

FIG. 6H is an iADC block diagram for the ADC3u that is described and illustrated in section 6D and FIG. 6D, respectively.

FIG. 7C is an iADC block diagram for the ADC3y that is described and illustrated in section 7A and FIG. 7A, respectively.

FIG. 7D is an iADC block diagram for the ADC2y that is described and illustrated in section 7B and FIG. 7B, respectively.

DETAILED DESCRIPTION

Figure 1A:
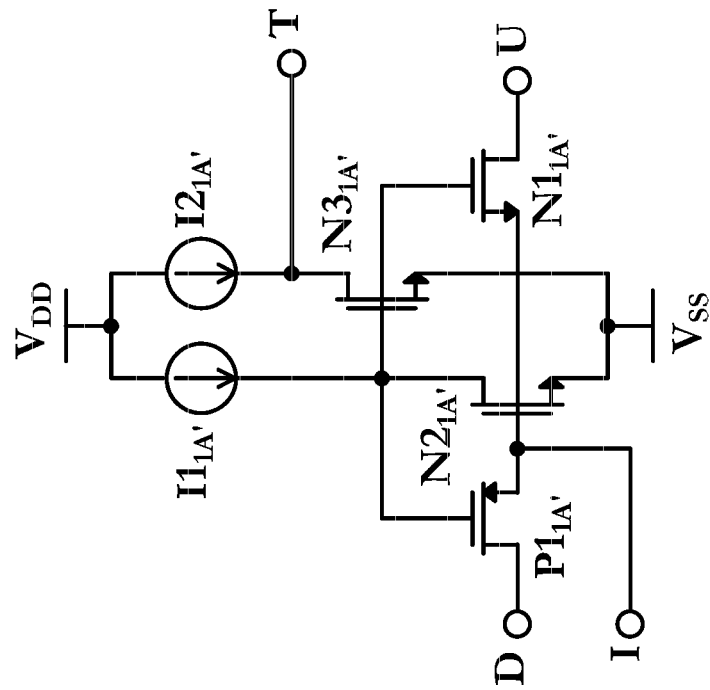
FIG. 1A is a circuit schematic illustrating a current-mode signal conditioning circuit, the SCz cell.
Figure 1A:
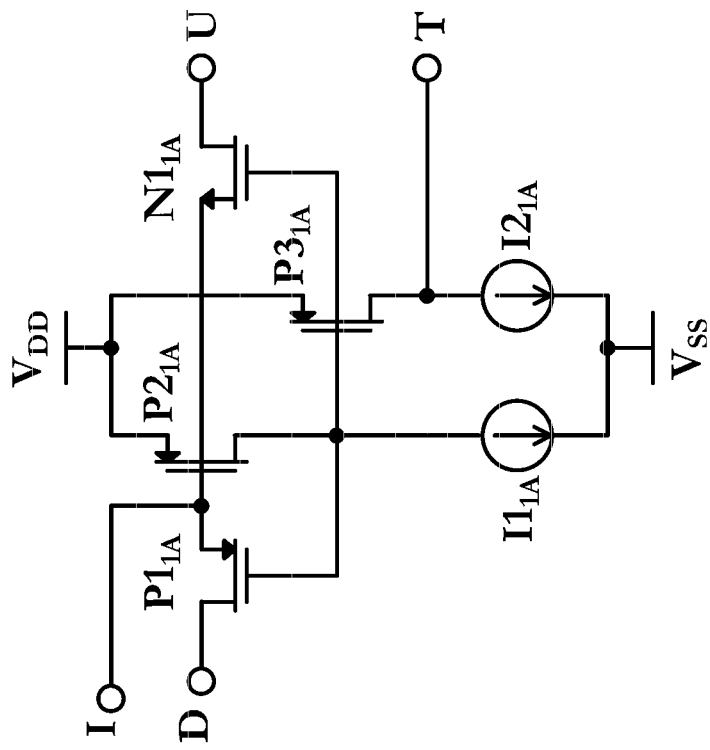

Numerous embodiments are described in the present application and are presented for illustrative purposes only and is not intended to be exhaustive. The embodiments were chosen and described to explain principles of operation and their practical applications. The present disclosure is not a literal description of all embodiments of the disclosure(s). The described embodiments also are not, and are not intended to be, limiting in any sense. One of ordinary skill in the art will recognize that the disclosed embodiment(s) may be practiced with various modifications and alterations, such as structural, logical, and electrical modifications. For example, the present disclosure is not a listing of features which must necessarily be present in all embodiments. On the contrary, a variety of components are described to illustrate the wide variety of possible embodiments of the present disclosure(s). Although particular features of the disclosed embodiments may be described with reference to one or more particular embodiments and/or drawings, it should be understood that such features are not limited to usage in the one or more particular embodiments or drawings with reference to which they are described, unless expressly specified otherwise. The scope of the disclosure is to be defined by the claims.

Although process (or method) steps may be described or claimed in a particular sequential order, such processes may be configured to work in different orders. In other words, any sequence or order of steps that may be explicitly described or claimed does not necessarily indicate a requirement that the steps be performed in that order. The steps of processes described herein may be performed in any order possible. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the embodiment(s). In addition, although a process may be described as including a plurality of steps, that does not imply that all or any of the steps are essential or required. Various other embodiments within the scope of the described disclosure(s) include other processes that omit some or all of the described steps. In addition, although a circuit may be described as including a plurality of components, aspects, steps, qualities, characteristics and/or features, that does not indicate that any or all of the plurality are essential or required. Various other embodiments may include other circuit elements or limitations that omit some or all of the described plurality.

Throughout this disclosure, the terms FET is field-effect-transistor; MOS is metal-oxide-semiconductor; MOSFET is MOS FET; PMOS is p-channel MOS; NMOS is n-channel MOS; BiCMOS is bipolar CMOS; LSP of a signal is the Least-Significant-Portion of the signal; MSP of the signal is the Most-Significant-Portion of the signal; and the sum of the MSP of the signal plus the LSP of the signals is equal to the whole signal; and the MSP or LSP can be represented in analog or digital form or combination thereof; MSB is Most-Significant-Bit and LSB is Least-Significant-Bit; SPICE is Simulation Program with Integrated Circuit Emphasis which is an industry standard circuit simulation program; micro is µ which is $10^{-6}$; nano is n which is $10^{-9}$; and pico is p which is $10^{-12}$. Bear in mind that $V_{DD}$ (as a positive power supply) and $V_{SS}$ (as a negative power supply) are applied to all the circuitries, block, or systems in this disclosure, but may not be shown for clarity of illustrations. The $V_{SS}$ may be connected to a negative power supply or to the ground (zero) potential. Body terminal of MOSFETs can be connected to their respective source terminals or to the MOSFET's respective power supplies, $V_{DD}$ and $V_{SS}$. All the ADC including, analog-to-digital converters (ADC) as well as digital-to-analog converters (DAC) may not show (for illustrative clarity) a positive reference and a negative reference input, wherein the negative reference input can also be connected to an analog ground potential or zero volts.

Throughout this disclosure, ADCs are illustrated with a 2-bits to 6-bit of resolution for reasons of demonstrative and descriptive clarity, but they can have higher resolution, (e.g., 16-bits of resolution may be practical via calibration or trimming).

Consider that for descriptive clarity illustrations of the disclosed inventions are simplified, and their improvements beyond simple illustrations would be obvious to one skilled in the arts. For example, some circuit schematics are show current sources or current mirrors utilizing one FET. In such instances, for example, FETs can instead be cascaded to improve their output impedances. In some other instances, analog switches are shown as single FETs with one input, one output, and one control input. In such instances, the one FET acting as a switch can be replaced with two FETs having a common input but opposite control polarities to manage the switch input's on and off voltage span and improve their on-off glitch transients.

In this disclosure, unless otherwise specified, the illustrated ADCs are generally asynchronous (i.e., they are clock free) which eliminates the need for a free running clock and improves dynamic power consumption with lower clock noise. However, the methods, systems, or circuits disclosed generally are applicable to ADCs that are synchronous (i.e., requiring clocks). For example, the signal conditioning circuits throughout this disclosure can be arranged for lower offset and lower noise utilizing switched capacitors topologies.

The MOSFETs utilized in this disclosure can be arranged to operate in subthreshold or normal (non-subthreshold region).

Be mind that other manufacturing technologies, such as Bipolar, BiCMOS, and others can utilize this disclosure in whole or part.

Throughout this specification, the disclosed iADCs generally have the following benefits:

First, iADCs that operate in current mode are inherently fast.

Second, current signal processing along the iADC's signal paths, generally, have small voltage swings which enables operating the iADCs with lower voltage power supply.

Third, operating at low supply voltage reduces power consumption of the iADC.

Fourth, iADCs can be inputted with zero-to-full scale input signal with low voltage power supplies.

Fifth, summation and subtraction functions in analog current mode is generally simple and takes small chip area. For example, summation of two analog currents could be accomplished by coupling the current signals. Depending on accuracy and speed requirements, subtraction of analog current signals could be accomplished by utilizing a current mirror where the two analog current signals are applied to the opposite side of the current mirror, for example.

Sixth, iADC can be arranged without passive components (such as passive resistor or passive capacitors) which lowers the manufacturing costs.

Seventh, iADC can operate to specification over normal manufacturing process, temperature, and power supply voltage variations.

Eighth, iADC can be integrated with standard digital logic (e.g., sea of gates).

Ninth, iADC can be based in standard main-stream manufacturing (e.g., digital CMOS) which have proven and rugged quality and are available at low costs.

Tenth, iADCs can be made small and low cost, in part due to the iADC's digital light design.

Eleventh, the accuracy of iADCs is generally dominated by the matching of current sources in their current reference network, which can be arranged for better matching or be calibrated.

Section 1A—Description of FIG. 1A

FIG. 1A is a circuit schematic illustrating a current-mode signal conditioning circuit, SCz, which has an analog input port (I), two analog output ports (D, and U), and one digital output port (T). Note that FIG. 1K is a block diagram illustration of the SCz of FIG. 1A.

A current difference signal ($I_{in}-I_r=\Delta i$) that is inputted to the analog input port, I, of SCz is steered to the analog output ports, D or U, of SCz depending on the polarity of $\Delta i$ and concurrently SCz generates a digital signal (T) that indicates the polarity of $\Delta i$.

When the net input current ($-\Delta i$) that is inputted to the analog input of SCz pulls down on port I, then $P2_{1A}$ turns on and lifts the voltage at gate terminals of $P1_{1A}$, $N1_{1A}$, and $P3_{1A}$ which turns $N1_{1A}$ on, $P1_{1A}$ off, and $P3_{1A}$ off. Accordingly, $-\Delta i$ flows through $N1_{1A}$ and the voltage at T which is the digital output port of SCz lifts towards $V_{DD}$ (T=1). Conversely, when the net input current ($+\Delta i$) applied to the input of SCz pulls up on port I, then $P2_{1A}$ turns off and lowers the voltage at gate terminals of $P1_{1A}$, $N1_{1A}$, and $P3_{1A}$ which turns $N1_{1A}$ off, $P1_{1A}$ on, and $P3_{1A}$ on. Accordingly, $+\Delta i$ flows through $P1_{1A}$ and the voltage at T which is the digital output port of SCz falls towards $V_{SS}$ (T=0).

Notice that SCz benefits from operating in the current mode, which were explained earlier. Moreover, the matching of any of the FETs in SCz is not critical to circuit's performance, and as such they can be arranged with small size that makes SCz small and fast.

Section 1A'—Description of FIG. 1A'

FIG. 1A' is a circuit schematic illustrating another current-mode signal conditioning circuit, SCz', which has an analog input port (I), two analog output ports (D, and U), and one digital output port (T). Be mindful that FIG. 1A' is a complementary version of FIG. 1A and that FIG. 1K is also the block diagram illustration of the SCz' of FIG. 1A'.

Similarly, in FIG. 1A' a current difference ($I_{in}-I_r=\Delta i$) that is inputted to the analog input port, I, of SCz' is steered to the analog output ports, D or U, of SCz' depending on the polarity of $\Delta i$ and concurrently SCz' generates a digital signal (T) that indicates the polarity of $\Delta i$.

In FIG. 1A', when the net input current ($-\Delta i$) applied to the input of SCz' pulls down on port I, then $N2_{1A'}$ turns off and lifts the voltage at gate terminals of $P1_{1A'}$, $N1_{1A'}$, and $N3_{1A'}$ which turns $N1_{1A'}$ on, $P1_{1A'}$ off, and $N3_{1A'}$ on. Accordingly, $-\Delta i$ flows through $N1_{1A'}$. Also, here the voltage at T which is the digital output port of SCz' falls towards $V_{SS}$ (T=0). Conversely, in FIG. 1A', when the net input current ($+\Delta i$) applied to the input of SCz' pulls up port I, then $N2_{1A'}$ turns on and lowers the voltage at gate terminals of $P1_{1A'}$, $N1_{1A'}$, and $N3_{1A'}$ which turns $N1_{1A'}$ off, $P1_{1A'}$ on, and $N3_{1A'}$ off. Accordingly, $+\Delta i$ flows through $P1_{1A'}$ and the voltage at T which is the digital output port of SCz' lifts towards $V_{DD}$ (T=1).

Take into consideration that in FIG. 1A' also SCz' benefits from operating in the current mode, which were explained earlier. Moreover, the matching of any of the FETs in SCz' is not critical to circuit's performance, and as such they can be arranged with small size that makes SCz' small and fast.

Figure 1B:
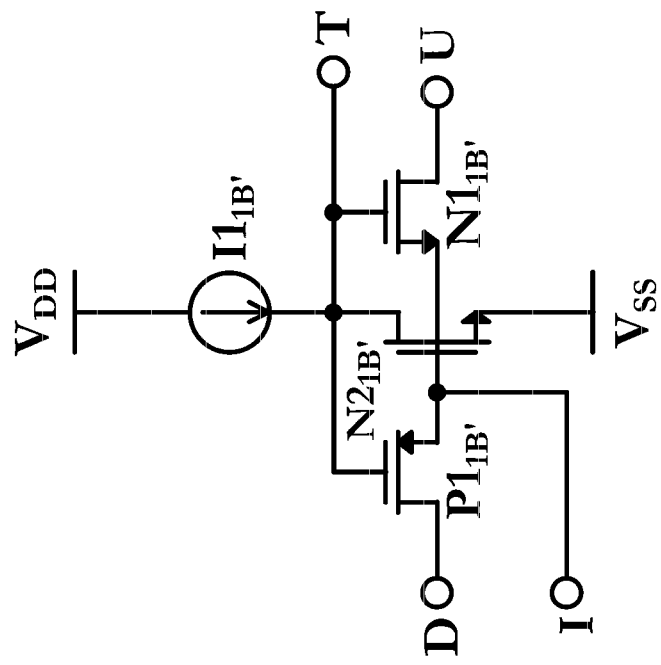
FIG. 1B is a circuit schematic illustrating another current-mode signal conditioning circuit, the SC$\overline{z}$ cell.
Figure 1B:
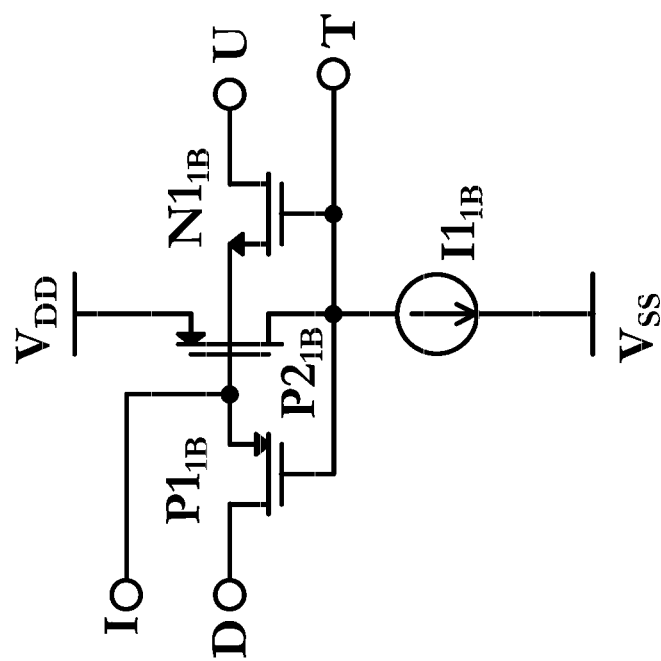

Section 1B—Description of FIG. 1B

FIG. 1B is a circuit schematic illustrating another current-mode signal conditioning circuit, SC$\bar{z}$, which has an analog input port (I), two analog output ports (D, and U), and one digital output port (T). Here also, FIG. 1K is the block diagram illustration of the SC$\bar{z}$ of FIG. 1B.

A current difference signal ($I_{in}-I_r=\Delta i$) that is inputted to the analog input port, I, of SC$\bar{z}$ is steered to the analog output ports, D or U, of SC$\bar{z}$ depending on the polarity of $\Delta i$ and concurrently SC$\bar{z}$ generates a digital signal (T) that indicates the polarity of $\Delta i$.

When the net input current ($-\Delta i$) that is inputted to the analog input of SC$\bar{z}$ pulls down on port I, then $P2_{1B}$ turns on and lifts the voltage at gate terminals of $P1_{1B}$ and $N1_{1B}$, which turns $N1_{1B}$ on, and $P1_{1B}$ off. Accordingly, $-\Delta i$ flows through $N1_{1B}$ and the voltage at T which is the digital output port of SC$\overline{z}$ falls towards $V_{SS}$ (T=0). Conversely, when the net input current (+Δi) applied to the input of SC$\overline{z}$ pulls up on port I, then P2$_{1B}$ turns off and lowers the voltage at gate terminals of P1$_{1B}$ and N1$_{1B}$, which turns N1$_{1B}$ off and P1$_{1B}$ on. Accordingly, +Δi flows through P1$_{1B}$ and the voltage at T which is the digital output port of SC$\overline{z}$ rises towards $V_{DD}$ (T=1).

Note that SC$\overline{z}$ of FIG. 1B is similar to SCz of FIG. 1A (but the difference is that it excludes and inverter comprising of P3$_{1A}$ and I2$_{1A}$). The SC$\overline{z}$ also benefits from operating in the current mode, which were explained earlier. Moreover, the matching of any of the FETs in SC$\overline{z}$ is not critical to circuit's performance, and as such they can be arranged with small size that makes SC$\overline{z}$ small and fast.

Section 1B'—Description of FIG. 1B'

FIG. 1B' is a circuit schematic illustrating another current-mode signal conditioning circuit, SC$\overline{z}$', which has an analog input port (I), two analog output ports (D, and U), and one digital output port (T). Here also, notice that FIG. 1B' is a complementary version of FIG. 1B and that FIG. 1K is also the block diagram illustration of the SC$\overline{z}$' of FIG. 1B'.

A current difference signal ($I_{in}$−$I_r$=Δi) that is inputted to the analog input port, I, of SC$\overline{z}$' is steered to the analog output ports, D or U, of SC$\overline{z}$' depending on the polarity of Δi and concurrently SC$\overline{z}$' generates a digital signal (T) that indicates the polarity of Δi.

When the net input current (−Δi) that is inputted to the analog input of SC$\overline{z}$' pulls down on port I, then N2$_{1B'}$ turns off and lifts the voltage at gate terminals of P1$_{1B'}$ and N1$_{1B'}$ which turns N1$_{1B'}$ on, and P1$_{1B'}$ off. Accordingly, −Δi flows through N1$_{1B'}$ and the voltage at T which is the digital output port of SC$\overline{z}$' rises towards $V_{DD}$ (T=1). Conversely, when the net input current (+Δi) applied to the input of SCz' pulls up on port I, then N2$_{1B'}$ turns on and lowers the voltage at gate terminals of P1$_{1B'}$ and N1$_{1B'}$ which turns N1$_{1B'}$ off and P1$_{1B'}$ on. Accordingly, +Δi flows through P1$_{1B'}$ and the voltage at T which is the digital output port of SC$\overline{z}$' falls towards $V_{SS}$ (T=0).

Note that SC$\overline{z}$' of FIG. 1B' is similar to SCz' of FIG. 1A' (but excludes and inverter comprising of N3$_{1A'}$ and I2$_{1A'}$). The SC$\overline{z}$' also benefits from operating in the current mode, which were explained earlier. Moreover, the matching of any of the FETs in SC$\overline{z}$' is not critical to circuit's performance, and as such they can be arranged with small size that makes SC$\overline{z}$' small and fast.

Figure 1C:
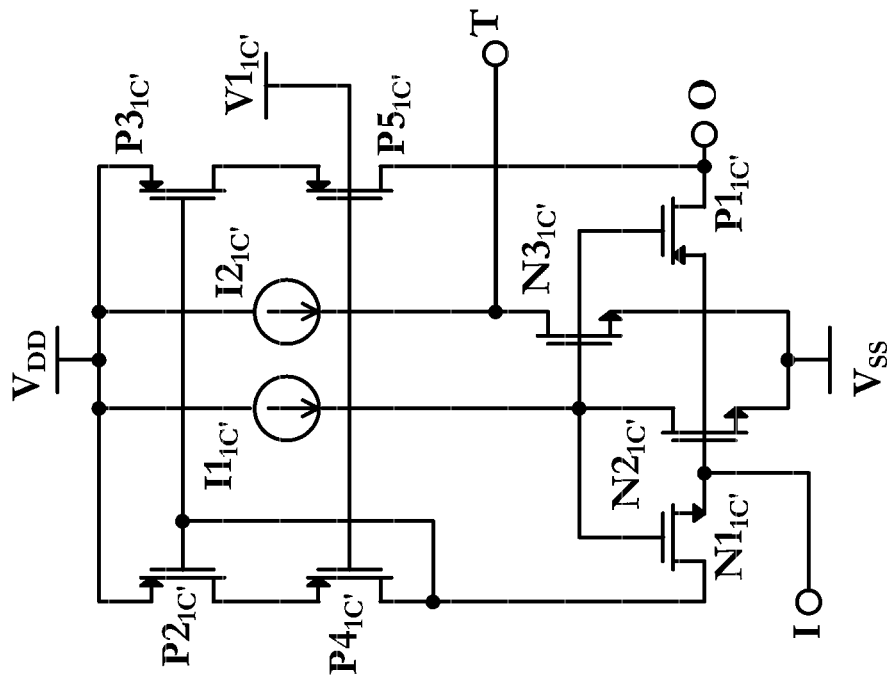
FIG. 1C is a circuit schematic illustrating another current-mode signal conditioning circuit, the SCx cell.
Figure 1C:
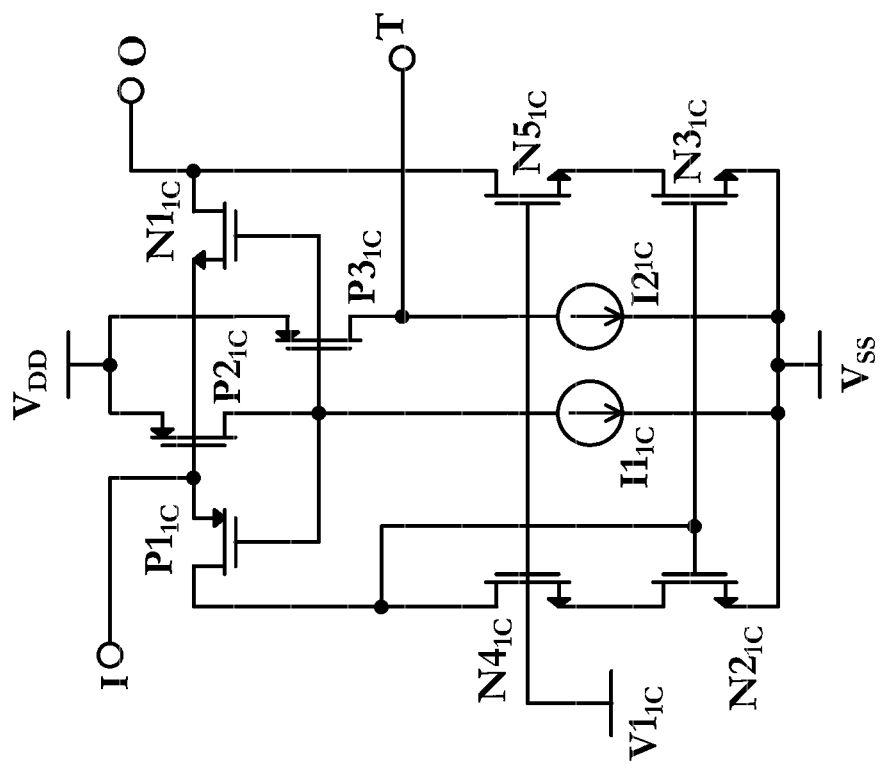

Section 1C—Description of FIG. 1C

FIG. 1C is a circuit schematic illustrating another current-mode signal conditioning circuit, SCx, which has an analog input port (I) that receives a current difference analog input signal (Δi=$I_{in}$−$I_r$), an analog output ports (O), and a digital output port (T). The SCx generates a rectified analog output signal that is the absolute value of a difference analog input signal, and it also generates a digital output signal that denotes the sign of the difference input signal. Be mindful that FIG. 1L is a block diagram illustration of the SCx of FIG. 1C.

A current difference input signal ($I_{in}$−$I_r$=Δi) that is inputted to the analog input port, I, of SCx is rectified and steered to O that is the analog output ports of SCx, which also generates a digital signal (T) that indicates the polarity of Δi.

When the net input current (−Δi) that is inputted to the analog input of SCx pulls down on port I, then P2$_{1C}$ turns on and lifts the voltage at gate terminals of P1$_{1C}$, N1$_{1C}$, and P3$_{1C}$ which turns N1$_{1C}$ on, P1$_{1C}$ off, and P3$_{1C}$ off. Accordingly, −Δi flows through N1$_{1C}$ and onto O, which is the SCx's analog output port, while concurrently the voltage at T which is the digital output port of SCx falls towards $V_{SS}$ (T=0). Conversely, when the net input current (+Δi) applied to the input of SCx pulls up on port I, then P2$_{1C}$ turns off and lowers the voltage at gate terminals of P1$_{1C}$, N1$_{1C}$, and P3$_{1C}$ which turns N1$_{1C}$ off, P1$_{1C}$ on, and P3$_{1C}$ on. A current mirror, comprising of N2$_{1C}$ and N3$_{1C}$ (and N4$_{1C}$ and N5$_{1C}$ as cascode FETs to lift the current mirror's output impedance) mirrors P1$_{1C}$'s current (+Δi) output it with a sign change (−Δi) at O that is the analog output port of SCx, while concurrently the voltage at T which is the digital output port of SCx lifts towards $V_{DD}$ (T=1).

Take into consideration that SCx also benefits from operating in the current mode, which were explained earlier. Also, Notice that but for requiring larger than minimum FETs sizes for better matching of the current mirror (comprising of N2$_{1C}$ and N3$_{1C}$) the matching other FETs in SCx is not critical to circuit's performance, and as such they can be arranged with small size that makes SCx small and fast.

Section 1C'—Description of FIG. 1C'

FIG. 1C' is a circuit schematic illustrating another current-mode signal conditioning circuit, SCx', which has an analog input port (I) that receives a current difference analog input signal (Δi=$I_{in}$−$I_r$), an analog output ports (O), and a digital output port (T). The SCx' generates a rectified analog output signal that is the absolute value of a difference analog input signal, and it also generates a digital output signal that denotes the sign of the difference input signal. Note that FIG. 1L is also the block diagram illustration of the SCx' of FIG. 1C'.

An absolute value of a current difference analog input signal ($I_{in}$−$I_r$=Δi) that is inputted to the analog input port, I, of SCx' is rectified and steered to O that is the analog output ports of SCx', which also generates a digital signal (T) that indicates the polarity of Δi.

When the net input current (−Δi) that is inputted to the analog input of SCx' pulls down on port I, then N2$_{1C'}$ turns off and lifts the voltage at gate terminals of P1$_{1C'}$, N1$_{1C'}$, and N3$_{1C'}$ which turns N1$_{1C'}$ on, P1$_{1C'}$ off, and N3$_{1C'}$ on. Accordingly, −Δi flows through N1$_{1C'}$ and changes sign (+Δi) when flowing through a current mirror (comprising of P2$_{1C'}$, P3$_{1C'}$, P4$_{1C'}$, and P5$_{1C'}$) and then onto O, which is the SCx' analog output port. Concurrently, the voltage at T which is the digital output port of SCx' falls towards $V_{SS}$ (T=0). Conversely, when the net input current (+Δi) applied to the input of SCx' pulls up on port I, then N2$_{1C'}$ turns on and lowers the voltage at gate terminals of P1$_{1C'}$, N1$_{1C'}$, and N3$_{1C'}$ which turns N1$_{1C}$ off, P1$_{1C}$ on, and N3$_{1C}$ off. Accordingly, P1$_{1C'}$ passes the current (+Δi) to O that is the analog output port of SCx', while concurrently the voltage at T which is the digital output port of SCx' lifts towards $V_{DD}$ (T=1).

Take into consideration that SCx' also benefits from operating in the current mode, which were explained earlier. Also, Be mindful that but for requiring larger than minimum FETs sizes for better matching of the current mirror (comprising of P2$_{1C'}$ and P3$_{1C'}$) the matching other FETs in SCx' is not critical to circuit's performance, and as such they can be arranged with small size that makes SCx' small and fast.

Figure 1D:
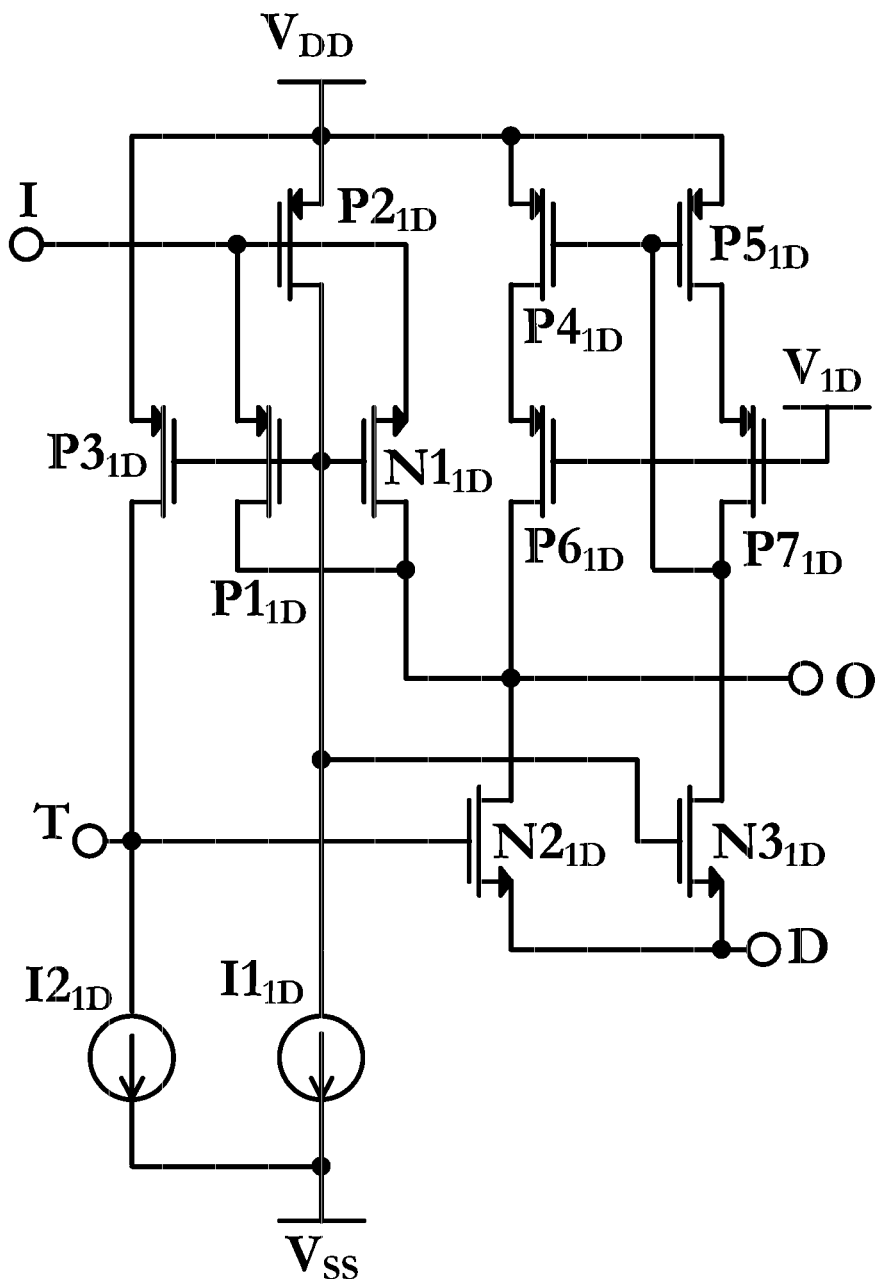
FIG. 1D is a circuit schematic illustrating another current-mode signal conditioning circuit, the SCy cell.

Section 1D—Description of FIG. 1D

FIG. 1D is a circuit schematic illustrating another current-mode signal conditioning circuit, SCy, which has two analog input ports (I and D), an analog output port (O), and a digital output port (T). The SCy generates an analog output signal ($I_O$) at the O port that is the rectified value of a difference analog input signal ($\Delta i = I_{in} - I_r$) at the I port, plus a scaled analog input reference signal ($sI_r$) inputted at the D port whose polarity is determined by the sign of the difference analog input signal at the I port. The SCy also generates a digital output signal that denotes the sign of the difference analog input signal at the I port. Notice that FIG. 1M is a block diagram illustration of the SCy of FIG. 1D.

In FIG. 1D, a polar current switch sub-circuit is utilized to add or subtract the scaled analog input reference signal ($sI_r$) from the current at the O port depending on the polarity of difference analog input signal ($\Delta i$) at the I port. This polar current switch sub-circuit is comprising of current mirrors $P4_{1D}$, $P5_{1D}$ (and $P1_{6D}$ and $P7_{1D}$ to raise the current mirror's output impedance) and current switch comprising of $N2_{1D}$ and $N3_{1D}$.

When $\Delta i$ that is the difference analog input signal at the I port ($I_{in} - I_r = \Delta i$) of SCy pulls down on port I, then $P2_{1D}$ turns on and lifts the voltage at gate terminals of $P1_{1D}$, $N1_{1D}$, and $P3_{1D}$ which turns $N1_{1D}$ on, $P1_{1D}$ off, and $P3_{1D}$ off. Accordingly, $-\Delta i$ flows through $N1_{1D}$ and onto the O port of SCy when the voltage at T which is the digital output port of SCy falls towards $V_{SS}$ (T=0). Concurrently, with the signal T=0, $N3_{1D}$ is turned on and $N2_{1D}$ is turned off. As such, the polarity of the scaled analog input reference signal ($sI_r$) that is inputted to the D port of SCy is flipped as $sI_r$ flows through the current mirror $P5_{1D}$ and $P4_{1D}$ where $sI_r$ is added to $-\Delta i$ at the O port of SCy to generate its $I_O$.

Conversely, whilst $+\Delta i$ that is the difference analog input signal at the I port ($I_{in} - I_r = \Delta i$) of SCy pulls up on port I, then $P2_{1D}$ turns off and pulls down on the voltage at gate terminals of $P1_{1D}$, $N1_{1D}$, and $P3_{1D}$ which turns $N1_{1D}$ off, $P1_{1D}$ on, and $P3_{1D}$ on. Accordingly, $+\Delta i$ flows through $P1_{1D}$ and onto the O port of SCy while the voltage at T which is the digital output port of SCy lifts towards $V_{DD}$ (T=1). Concurrently, with the signal T=1, $N3_{1D}$ is turned off and $N2_{1D}$ is turned on. As such, the scaled analog input reference signal ($sI_r$) that is inputted to the D port of SCy passes through $N2_{1D}$ where $sI_r$ is added to $+\Delta i$ at the O port of SCy to generate its $I_O$.

Take into consideration that SCy also benefits from operating in the current mode, which were explained earlier. Also, be mindful that but for requiring larger than minimum FETs sizes for better matching of the current mirror (comprising of $P5_{1D}$ and $P4_{1D}$) the matching other FETs in SCy is not critical to circuit's performance, and as such they can be arranged with small size that makes SCy small and fast.

Figure 1E:
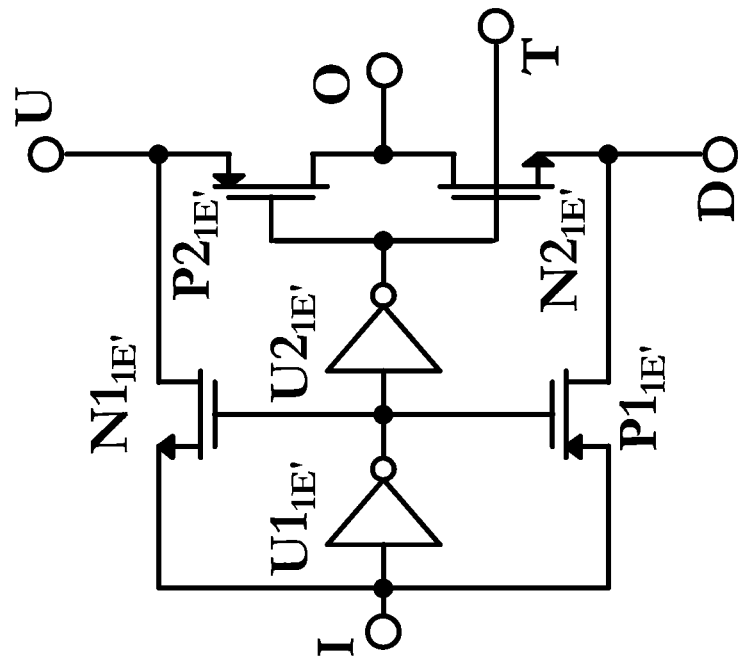
FIG. 1E is a circuit schematic illustrating another current-mode signal conditioning circuit, the SCw cell.
Figure 1E:
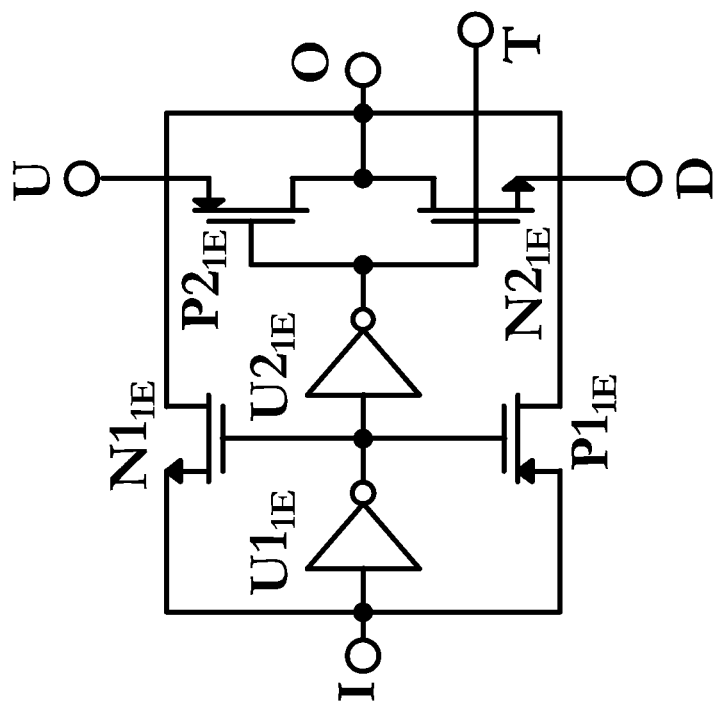

Section 1E—Description of FIG. 1E

FIG. 1E is a circuit schematic illustrating another current-mode signal conditioning circuit, SCw, which has three analog input ports (I, U, and D), an analog output port (O), and a digital output port (T). The SCw generates an analog output signal ($I_O$) at the O port that is the rectified value of a difference analog input signal at the I port (which receives the difference analog input signal $\Delta i = I_{in} - I_r$). Also, the SCw receives two scaled analog input reference signals ($s_1 I_r$ and $s_2 I_r$) that are inputted at the U and D ports, respectively. It is worth noting that for a binary-weighted iADC and for descriptive clarity of each SCw cell here $s_1 = s_2$, but to establish for example a non-linear current reference network for a non-linear iADC, different values for $s_1$ and $s_2$ on each SCw in a sequence can be arrange. The SCw also generates a digital output signal that denotes the sign of the difference analog input signal at the I port. Notice that FIG. 1N is a block diagram illustration of the SCw of FIG. 1E.

Let's consider the case when a $+s_1 I_r$ is inputted to the U port and a $-s_2 I_r$ is inputted to the D port of the SCw, wherein $s_1 = s_2$.

When a $-\Delta i$ that is a difference analog input signal at the I port ($I_{in} - I_r = \Delta i$) of SCw pulls down on the port I, then output of the inverter $U1_{1E}$ lifts the voltage at gate terminals of $P1_{1E}$ and $N1_{1E}$ which turns $N1_{1E}$ on, and $P1_{1E}$ off. Accordingly, $-\Delta i$ flows through $N1_{1E}$ and onto the O port of SCw. Also, the voltage at T which is the output of inverter $U2_{1E}$ that is the digital output port of SCw falls towards $V_{SS}$ (T=0). With T=0, $N2_{1E}$ turns off, and $P2_{1E}$ turns on. Here, the $-s_1 I_r$ at the D port is blocked by $N2_{1E}$ and $+s_1 I_r$ at the U port passes through $P2_{1E}$ and onto the O port. As such, the $-\Delta i$ is added to the $+s_1 I_r$.

When $+\Delta i$ that is the difference analog input signal at the I port ($I_{in} - I_r = \Delta i$) of SCw lifts up on the port I, then output of the inverter $U1_{1E}$ lowers the voltage at gate terminals of $P1_{1E}$ and $N1_{1E}$ which turns $N1_{1E}$ off and $P1_{1E}$ on. Accordingly, $+\Delta i$ flows through $P1_{1E}$ and onto the O port of SCw. Also, the voltage at T which is the output of inverter $U2_{1E}$ that is the digital output port of SCw lifts towards $V_{DD}$ (T=1). With T=1, $P2_{1E}$ turns off, and $N2_{1E}$ turns on. Here, the $+s_1 I_r$ at the D port is blocked by $P2_{1E}$ and $-s_1 I_r$ at the U port passes through $N2_{1E}$ and onto the O port. As such, the $+\Delta i$ is added to the $-s_1 I_r$.

Take into consideration that SCw also benefits from operating in the current mode, which were explained earlier. Also, be mindful that the matching FETs in SCw is not critical to circuit's performance, and as such they can be arranged with small size that makes SCw area efficient and fast. It would be obvious to one skilled in the art to include additionally circuitry to prevent the D and U ports from floating by biasing or clamping the ports when $N2_{1E}$ and $P2_{1E}$ are off, respectively, which could help the dynamic response of the D and U ports and hence that of SCw.

Section 1E'—Description of FIG. 1E'

FIG. 1E' is a circuit schematic illustrating another current-mode signal conditioning circuit, SCw', which has three analog input ports (I, U, and D), an analog output port (O), and a digital output port (T). The SCw' generates an analog output signal ($I_O$) at the O port that is the rectified value of a difference analog input signal at the I port (which receives the difference analog input signal $\Delta i = I_{in} - I_r$). Also, the SCw' receives two scaled analog input reference signals ($s_1 I_r$ and $s_2 I_r$) that are inputted at the U and D ports, respectively. Note that for descriptive clarity here $s_1 = s_2$. The SCw' also generates a digital output signal that denotes the sign of the difference analog input signal at the I port. Additionally, note that FIG. 1N is also a block diagram illustration of the SCw' of FIG. 1E'.

Let's consider the case when a $+s_1 I_r$ is inputted to the U port and a $-s_2 I_r$ is inputted to the D port of the SCw', wherein for descriptive clarity $s_1 = s_2$.

When $-\Delta i$ that is the difference analog input signal at the I port ($I_{in} - I_r = \Delta i$) of SCw' pulls down on the port I, then output of the inverter $U1_{1E'}$ lifts the voltage at gate terminals of $P1_{1E'}$ and $N1_{1E'}$ which turns $N1_{1E'}$ on and $P1_{1E'}$ off. Accordingly, $-\Delta i$ flows through $N1_{1E'}$ and onto the U port of SCw'. Also, the voltage at T which is the output of inverter $U2_{1E'}$ that is the digital output port of SCw' falls towards $V_{SS}$ (T=0). With T=0, $N2_{1E'}$ turns off, and $P2_{1E'}$ turns on. Here, the $-s_1 I_r$ at the D port is blocked by $N2_{1E'}$ and $+s_1 I_r$ combines with the $-\Delta i$ at the U port which passes through $P2_{1E'}$ and onto the O port. As such, the $-\Delta i$ is added to $+s_1I_r$.

When $+\Delta i$ that is the difference analog input signal at the I port $(I_{in}-I_r=\Delta i)$ of SCw' lifts up on the port I, then output of the inverter $U1_{1E'}$ lowers the voltage at gate terminals of $P1_{1E'}$ and $N1_{4E'}$ which turns $N1_{4E'}$ off and $P1_{1E'}$ on. Accordingly, $+\Delta i$ flows through $P1_{1E'}$ and onto the D port of SCw'. Also, the voltage at T which is the output of inverter $U2_{1E'}$ and the digital output port of SCw lifts towards $V_{DD}$ (T=1). With T=1, $P2_{1E'}$ turns off, and $N2_{1E'}$ turns on. Here, the $+s_1I_r$ at the D port is blocked by $P2_{1E'}$ and combines with $+\Delta i$ at the U port and pass through $N2_{1E'}$ and onto the O port. As such, the $+\Delta i$ is added to $-s_1I_r$.

Take into consideration that SCw' also benefits from operating in the current mode, which were explained earlier. Also, notice that the matching FETs in SCw is not critical to circuit's performance, and as such they can be arranged with small size that makes SCw area efficient and fast. As noted earlier, It would be obvious to one skilled in the art to include additionally circuitry to prevent the D and U ports from floating by biasing or clamping the D and U ports when $N2_{1E'}$ and $P2_{1E'}$ are off, respectively, which could help the dynamic response of the D and U ports and hence that of SCw'.

Figure 1F:
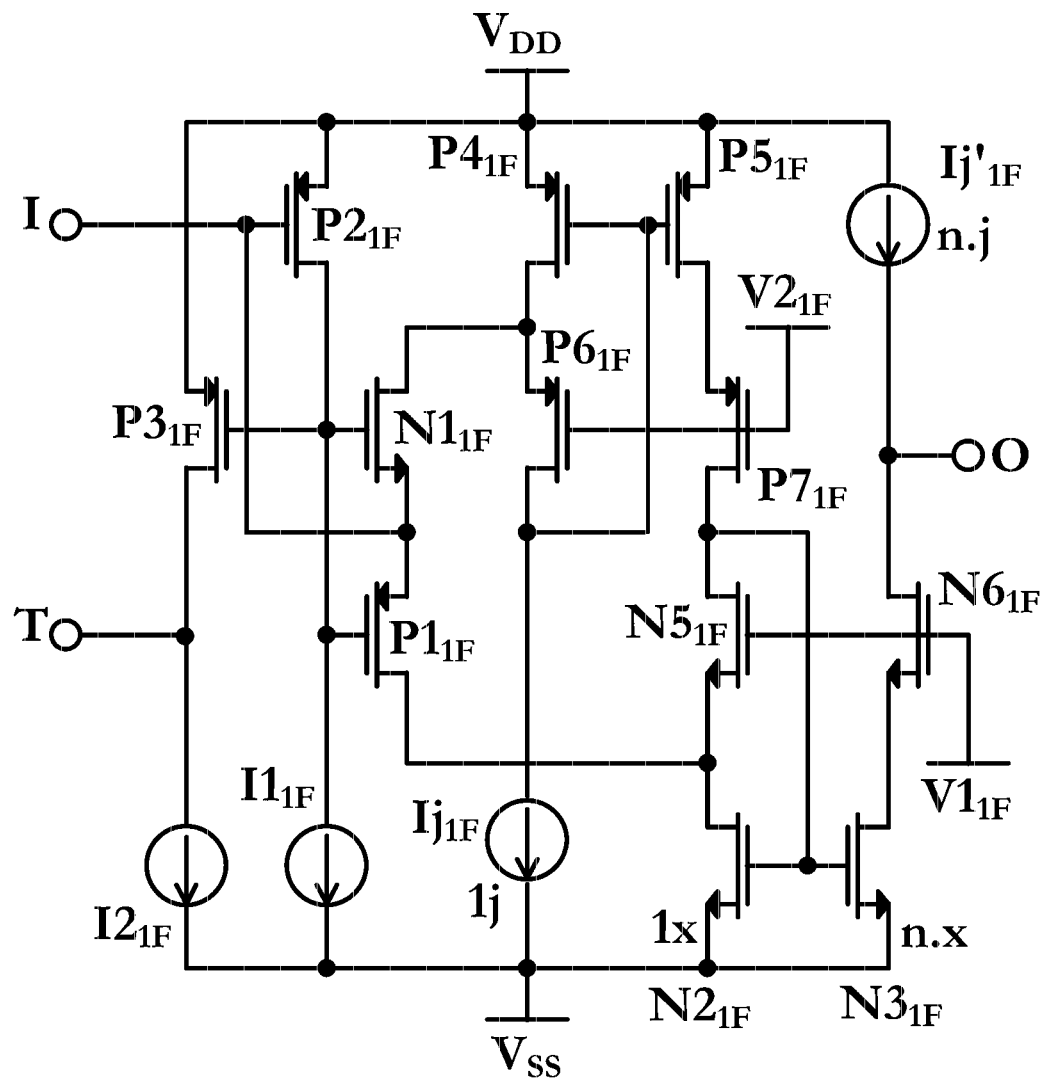
FIG. 1F is a circuit schematic illustrating another current-mode signal conditioning circuit, the SCu cell.

Section 1F—Description of FIG. 1F

FIG. 1F is a circuit schematic illustrating another current-mode signal conditioning circuit, SCu, which has an analog input port (I) that receives a current difference analog input signal ($\Delta i = I_{in}-I_r$), an analog output ports (O), and a digital output port (T). The SCu generates a rectified analog output signal that is a scaled absolute value of a difference analog input signal, and it also generates a digital output signal that denotes the polarity of the difference input signal. Note that FIG. 1O is a block diagram illustration of the SCu of FIG. 1F.

A current difference input signal $(I_{in}-I_r=\Delta i)$ that is inputted to the analog input port, I, of SCu is rectified, scaled, and steered to O that is the analog output ports of SCu, which also generates a digital signal (T) that indicates the polarity of $\Delta i$. Also note that SCu is comprised of an upper and a lower current mirror. The upper current mirror is comprised of $P4_{1F}$, $P5_{1F}$, $P6_{1F}$, and $P7_{1F}$ (where $P6_{1F}$ and $P7_{1F}$ are cascode to increase to the upper current mirror output impedance). Be mindful that the input to the upper current mirror can be either the drain node of $P4_{1F}$ or the drain node of $P6_{1F}$. The lower current mirror is comprised of $N2_{1F}$, $N3_{1F}$, $N5_{1F}$, and $N6_{1F}$ (where $N5_{1F}$ and $N6_{1F}$ are cascode to increase to the lower current mirror output impedance). Notice that the input to the lower current mirror can be either the drain node of $N5_{1F}$ or the drain node of $N2_{1F}$. Also, the lower current mirror is scaled with a current gain of n·X between $N2_{1F}$ and $N3_{1F}$, wherein n programs the scale factor for the absolute value of the difference analog input signa. The current sources $Ij_{1F}$ (with the value 1·j) and $Ij'_{1F}$ (with the value n·j) keep the current mirrors alive during zero current crossings which helps the current mirror dynamic response When the net input current $(-\Delta i)$ that is inputted to the analog input of SCu pulls down on port I, then $P2_{1F}$ turns on and lifts the voltage at gate terminals of $P1_{1F}$, $N1_{1F}$, and $P3_{1F}$ which turns $N1_{1F}$ on, $P1_{1F}$ off, and $P3_{1F}$ off. Accordingly, $-\Delta i$ flows through the upper current mirror and steered onto the lower current mirror where it is gained up by scale factor n. As such, $n \times (-\Delta i)$ is outputted to the O port. Moreover, the voltage at T which is the digital output port of SCu falls towards $V_{SS}$ (T=0).

Conversely, when the net input current $(+\Delta i)$ applied to the input of SCu pulls up on port I, then $P2_{1F}$ turns off and lowers the voltage at gate terminals of $P1_{1F}$, $N1_{1F}$, and $P3_{1F}$ which turns $N1_{1F}$ off, $P1_{1F}$ on, and $P3_{1F}$ on. The $+\Delta i$ is scaled by n with its sign flipped through the lower current mirror and steered onto the O port. As such, $n \times (-1)(+\Delta i)$ is outputted to the O port. Moreover, the voltage at T which is the digital output port of SCu lifts towards $V_{DD}$ (T=1).

Take into consideration that SCu also benefits from operating in the current mode, which were explained earlier. Also, Be mindful that but for requiring larger than minimum FETs sizes for better matching of the upper and lower current mirrors (comprising of $P4_{1F}$ and $P5_{1F}$ as well as $N2_{1F}$ and $N3_{1F}$) the matching other FETs in SCu is not critical to circuit's performance, and as such they can be arranged with small size that makes SCu area efficient and fast.

Figure 1G:
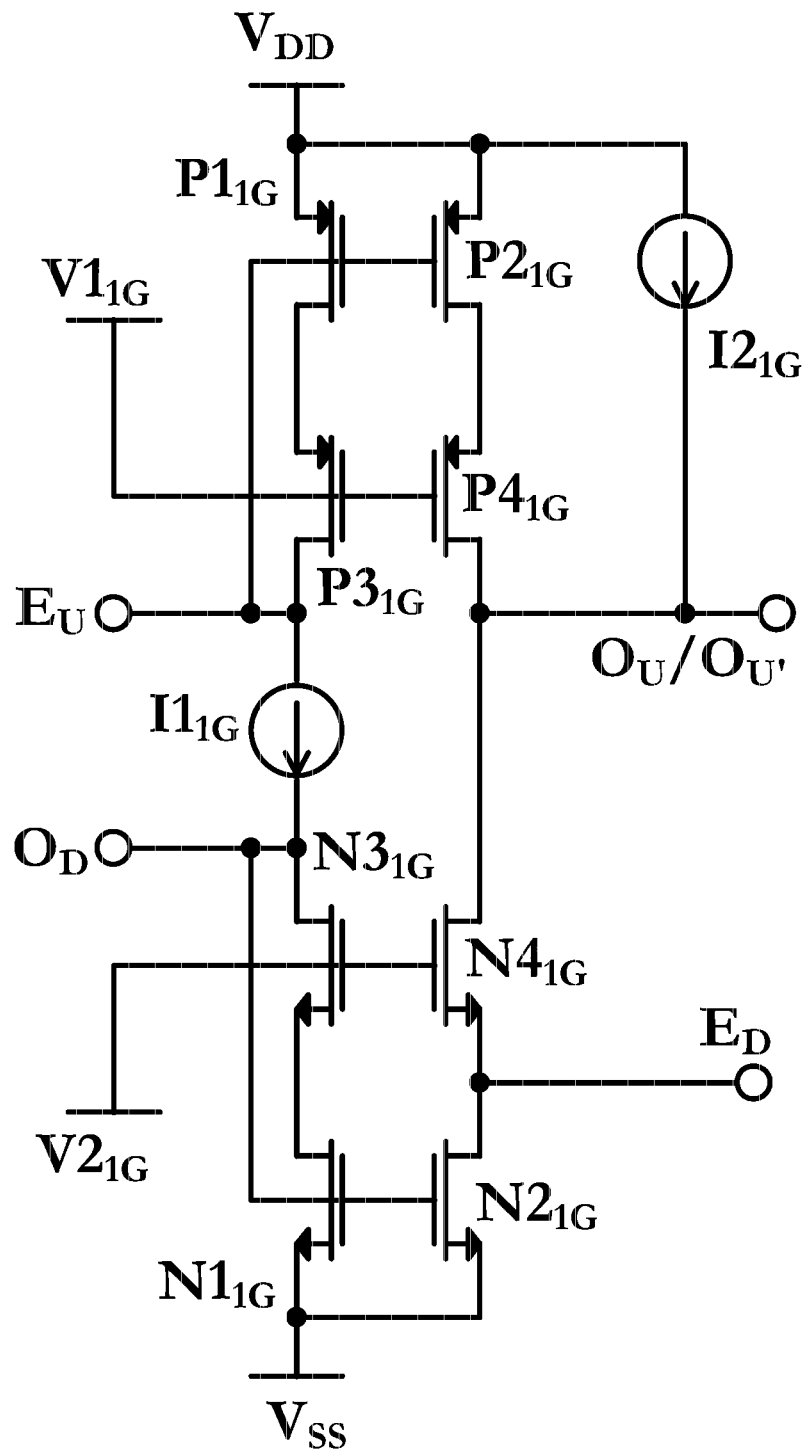
FIG. 1G is a circuit schematic illustrating another current-mode signal conditioning circuit, the SCt cell.

Section 1G—Description of FIG. 1G

FIG. 1G is a circuit schematic illustrating another current-mode signal conditioning circuit, SCt, which has three analog input ports ($O_D$, $E_D$, and $E_U$) and an analog input/output port ($O_U/O_{U'}$).

Utilizing an upper current mirror (comprised of $P1_{1G}$, $P2_{1G}$, $P3_{1G}$, and $P4_{1G}$) and a lower current mirrors (comprised of $N1_{1G}$, $N2_{1G}$, $N3_{1G}$, and $N4_{1G}$), the SCt performs analog arithmetic on inputted currents as follows: $(iO_{U'}-iE_U)-(iO_D-iE_D)=iO_U$ or $(iO_{U'}-iO_D)-(iE_U-iE_D)=iO_U$ where $iE_D$ is the current inputted to $E_D$ port, $iO_D$ is the current inputted to $O_D$ port, $iO_{U'}$ is the current inputted to $O_{U'}$ port, $iE_U$ is the current inputted to $E_U$ port, $I1_{1G}$ and $I2_{1G}$ are scaled reference current ($s \cdot I_r$) that provides an offset bias current, and $iO_U$ is the residual current outputted from the $O_U$ port. To keep the upper and lower current alive during current crossings, current sources $I1_{1G}$ and $I2_{1G}$ also can provide an injection current to keep the current mirrors alive during current crossings, which also improves the dynamic response of SCt.

Note that FIG. 1P is a block diagram illustration of the SCt of FIG. 1G.

Figure 1H:
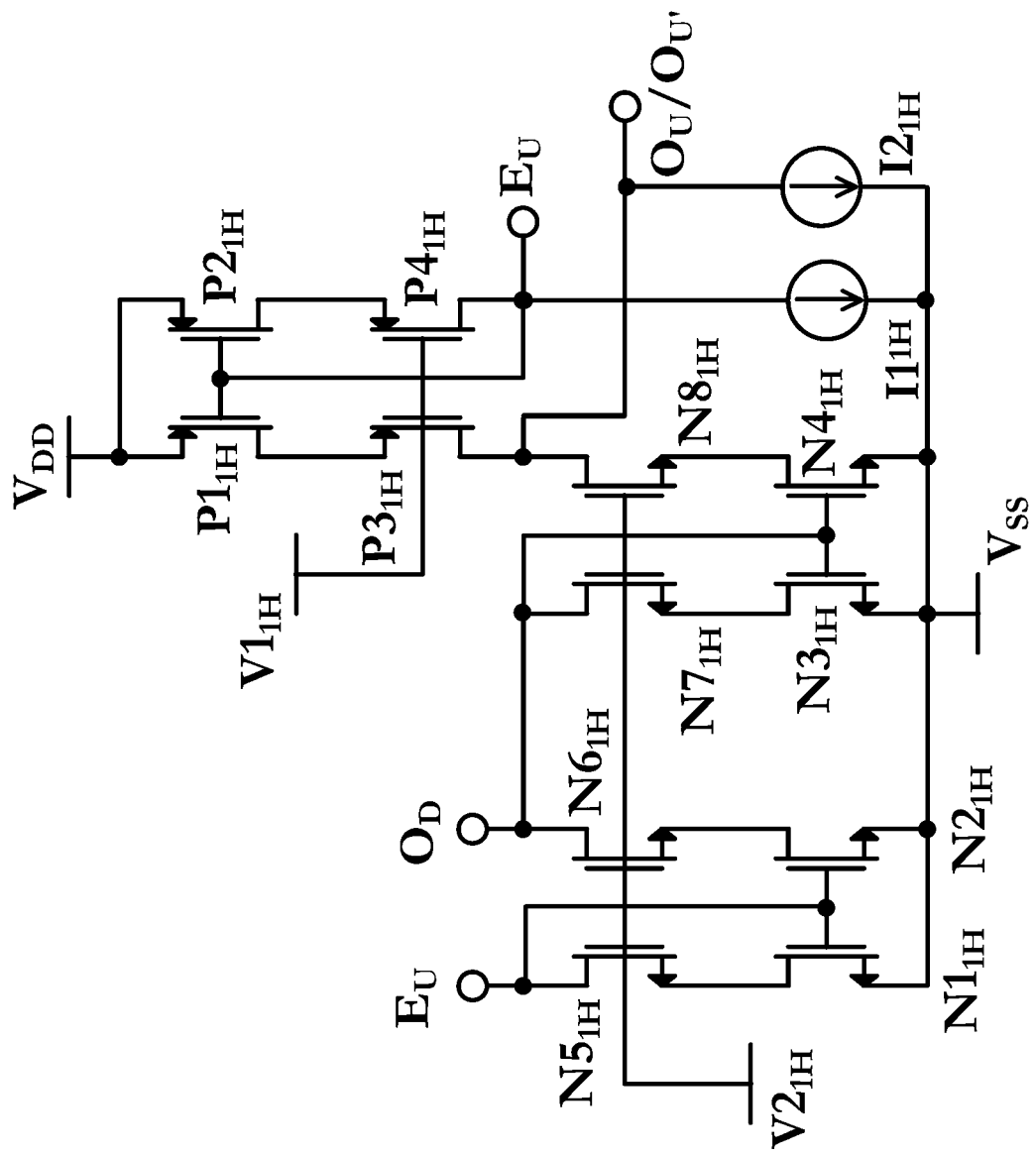
FIG. 1H is a circuit schematic illustrating another current-mode signal conditioning circuit, the SCt' cell.

Section 1H—Description of FIG. 1H

FIG. 1H is a circuit schematic illustrating another current-mode signal conditioning circuit, SCt', which has three analog input ports ($O_D$, $E_D$, and $E_U$) and an analog input/output port ($O_U/O_{U'}$). FIG. 1H illustrates an alternative embodiment to that of FIG. 1G in performing current signal conditioning.

Utilizing an upper current mirror (comprised of $P1_{1H}$, $P2_{1H}$, $P3_{1H}$, and $P4_{1H}$) and two lower current mirrors (comprised of $N1_{1H}$, $N2_{1H}$, $N5_{1H}$, and $N6_{1H}$ as well as $N3_{1H}$, $N4_{1H}$, $N7_{1H}$, and $N8_{1H}$), the SCt' also performs analog arithmetic on inputted currents similar to that of FIG. 1G and as follows: $(iO_{U'}-iE_{U'})-(iO_D-iE_D)$ or $(iO_{U'}-iO_D)-(iE_{U'}-iE_D)=iO_U$ where $iE_D$ is the current inputted to $E_D$ port, $iO_U$ is the current inputted to $O_D$ port, $iO_{U'}$ is the current inputted to $O_{U'}$ port, $iE_U$ is the current inputted to $E_U$ port, $I1_{1H}$ and $I2_{1H}$ are scaled reference current ($s \times I_R$), and $iO_U$ is the residual current outputted from the $O_U$ port. Similar to FIG. 1G, to keeps the upper and lower current alive during current crossings, current sources such as $I1_{1H}$ and $I2_{1H}$ can be utilized to provide an offset bias current, which also improves the dynamic response of SCt.

Note that FIG. 1P is also the block diagram illustration of the SCt' of FIG. 1H.

Figure 1J:
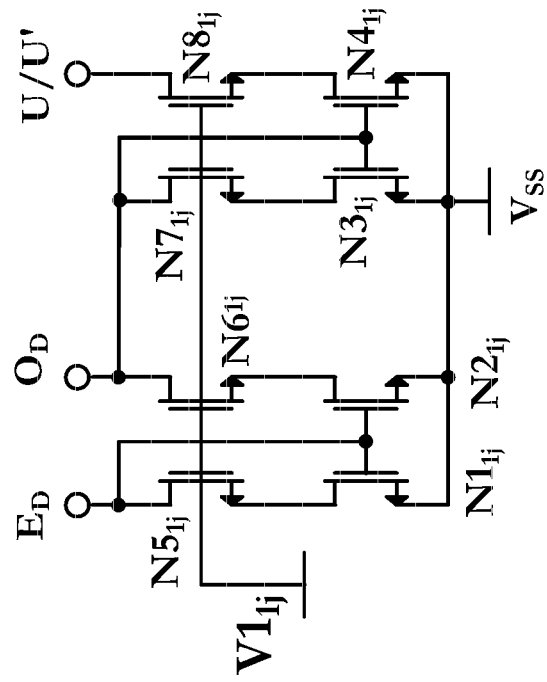
FIG. 1j is a circuit schematic illustrating another current-mode signal conditioning circuit, the SCr cell.
Figure 1I:
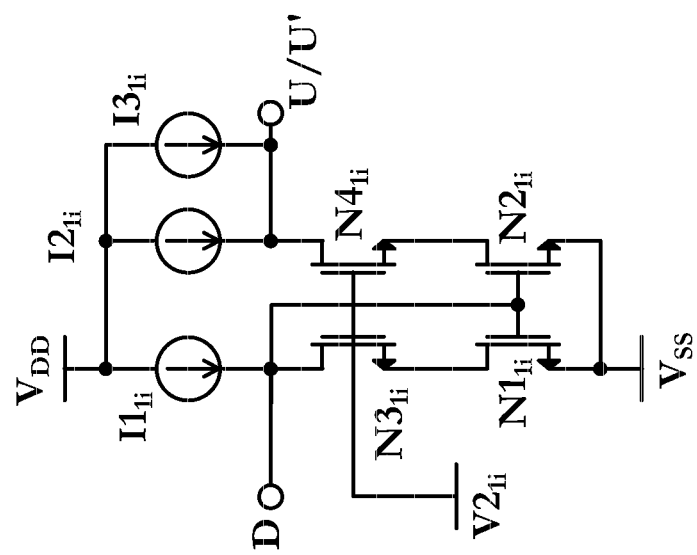
FIG. 1i is a circuit schematic illustrating another current-mode signal conditioning circuit, the SCs cell.

Section 1I—Description of FIG. 1I

FIG. 1i is a circuit schematic illustrating another current-mode signal conditioning circuit, SCs, which has one analog input port (D) and an analog input/output port (U/U').

Utilizing current mirrors (comprised of $N1_{1i}$, $N2_{1i}$, $N3_{1i}$, and $N4_{1i}$), the SCs also performs analog arithmetic on inputted currents as follows: $(i_D-i_{U'})+I3_{1i}=i_U$ where $i_D$ is the current inputted to D port, $i_{U'}$ is the current inputted to U' port, $i_U$ is the residual current outputted to the U port, and $I3_{1i}$ is a scaled reference current ($s \cdot I_r$) that provides an offset bias current. Injection current sources $I1_{1i}$ and $I2_{1i}$ help the dynamic response of SCs during zero-current crossing transients by keeping the current mirror alive.

Notice that FIG. 1Q is also the block diagram illustration of the SCs of FIG. 1i.

Section 1J—Description of FIG. 1J

FIG. 1j is a circuit schematic illustrating another current-mode signal conditioning circuit, SCr, which has two analog input ports ($O_D$ and $E_D$) and an analog input/output port (U/U').

Utilizing two lower currents mirrors (comprised of $N1_{1j}$, $N2_{1j}$, $N5_{1j}$, and $N6_{1j}$ as well as $N3_{1j}$, $N4_{1j}$, $N7_{1j}$, and $N8_{1j}$), the SCr also performs analog arithmetic on inputted currents as follows: $(iO_D-iE_D)+i_{U'}=i_U$ or where $iE_D$ is the current inputted to $E_D$ port, $iO_D$ is the current inputted to $O_D$ port, $i_{U'}$ is the current inputted to U' port, and $i_U$ is the residual current outputted from the U port.

Be mindful that FIG. 1R is also the block diagram illustration of the SCr of FIG. 1j.

Section 1K—Description of FIG. 1K

FIG. 1K is a block diagram illustrating the following signal conditioning circuits: SCz cell of FIG. 1A, the SCz' cell of FIG. 1A', the SC$\bar{z}$ cell of FIG. 1B, and the SC$\bar{z}$' cell of FIG. 1B'. FIG. 1K has one analog input port I, two analog output ports U and D, and one digital output port T.

Section 1L—Description of FIG. 1L

FIG. 1L is a block diagram illustrating the following signal conditioning circuits: SCx cell of FIG. 1C, and the SCx' cell of FIG. 1C'. FIG. 1L has one analog input port I, one analog output port O, and one digital output port T.

Section 1M—Description of FIG. 1M

FIG. 1M is a block diagram illustrating the signal conditioning circuit SCy cell of FIG. 1D. FIG. 1M has two analog input ports I and D, one analog output port O, and one digital output port T.

Section 1N—Description of FIG. 1N

FIG. 1N is a block diagram illustrating the following signal conditioning circuits: SCw cell of FIG. 1E, and the SCw' cell of FIG. 1E'. FIG. 1N has one analog input port I, one analog output port O, and one digital output port T.

Section 1O—Description of FIG. 1O

FIG. 1O is a block diagram illustrating the signal conditioning circuit SCu cell of FIG. 1F. FIG. 1O has one analog input port I, one analog output port O, and one digital output port T.

Section 1P—Description of FIG. 1P

FIG. 1P is a block diagram illustrating the following signal conditioning circuits: SCt cell of FIG. 1G, and the SCt' cell of FIG. 1H. FIG. 1P has three analog input ports ($E_u$, $E_D$, $O_D$) and one analog input/output port ($O_u/O_u$). For illustrative clarity only one $O_u$ port is shown as the analog input/output port ($O_u/O_u$) on FIG. 1P, and for descriptive clarity in text, $O_{u'}$ is referred to as an input and $O_u$ as an output.

Section 1Q—Description of FIG. 1Q

FIG. 1Q is a block diagram illustrating the signal conditioning circuits SCs cell of FIG. 1i. FIG. 1Q has one analog input port (D) and one analog input/output port (U/U'). For illustrative clarity only one U port is shown as the analog input/output port (U/U') on FIG. 1P, and for descriptive clarity in text, U' is referred to as an input and U as an output.

Section 1R—Description of FIG. 1R

FIG. 1R is a block diagram illustrating the signal conditioning circuits SCr cell of FIG. 1j. FIG. 1R has two analog input ports ($E_D$, $O_D$) and one analog input/output port (U/U'). For illustrative clarity only one U port is shown as the analog input/output port ($O_u/O_u$) on FIG. 1R, and for descriptive clarity in text, U' is referred to as an input and U as an output.

Figures 2A, 2B:
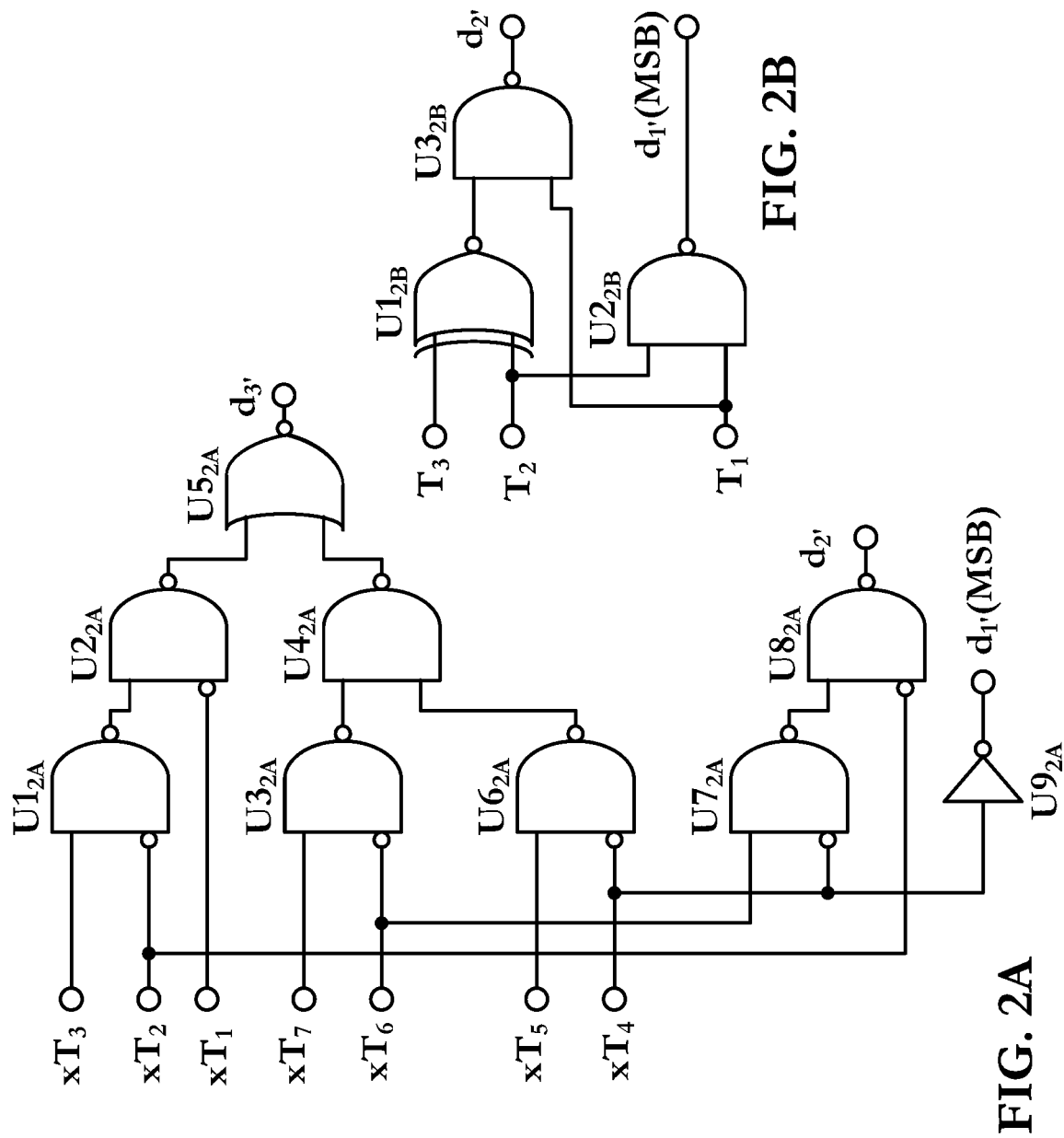
FIG. 2A is a schematic logic diagram of a thermometer code (with 7-inputs) to binary code (with 3-outputs) encoder, the U7E cell.
FIG. 2B is a schematic logic diagram of a thermometer code (with 3-inputs) to binary code (with 2-outputs) encoder, the U3E cell.

Section 2A—Description of FIG. 2A

FIG. 2A is a schematic logic diagram of a (7-inputs) thermometer code to (3-outputs) binary code, encoder named U7E. It has 7 digital input ports $T_7$, $T_6$, $T_5$, $T_4$, $T_3$, $T_2$, (or opposite polarity inputs $\bar{T}_7$, $\bar{T}_6$, $\bar{T}_5$, $\bar{T}_4$, $\bar{T}_3$, $\bar{T}_2$, $\bar{T}_1$) and 3 digital output ports $d_{3'}$, $d_{2'}$, $d_{1'}$ where for 3-bits $d_{3'}$ is the LSB and $d_{1'}$ is the MSB. Be mindful that for example $T_7$ are $xT_7$ through $T_1$ are $xT_1$ terminologies can be used interchangeably.

The encoder is comprised of 7 two input NAND gates $U1_{2A}$ to $U8_{2A}$ (with 6 of the NAND gates having an inverted input); one inverter $U9_{2A}$; and one NOR gate $U5_{2A}$.

Figure 2C:
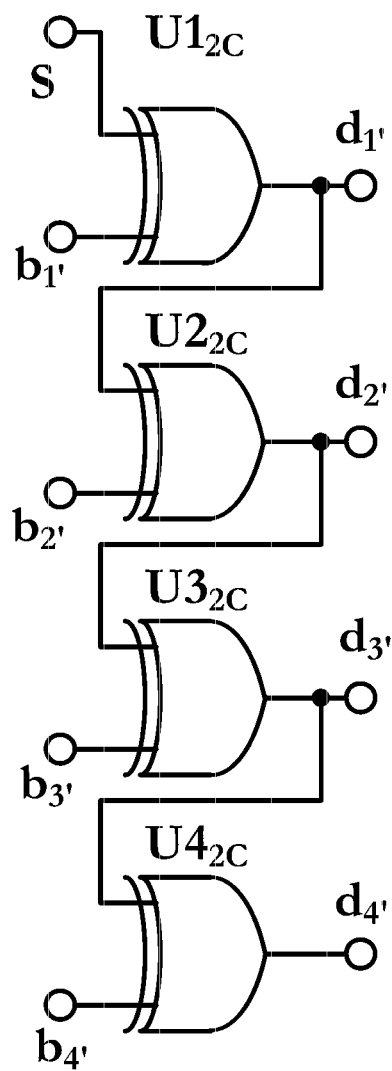
FIG. 2C is a schematic logic diagram of a gray code (with 4-inputs) to binary code (with 4-outputs) decoder, the U4G cell.
Figure 2D:
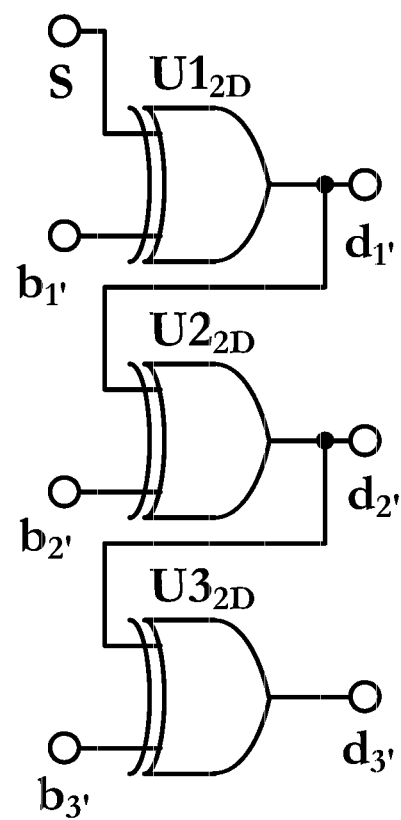
FIG. 2D is a schematic logic diagram of a gray code (with 3-inputs) to binary code (with 3-outputs) decoder, the U3G cell.
Figure 2E:
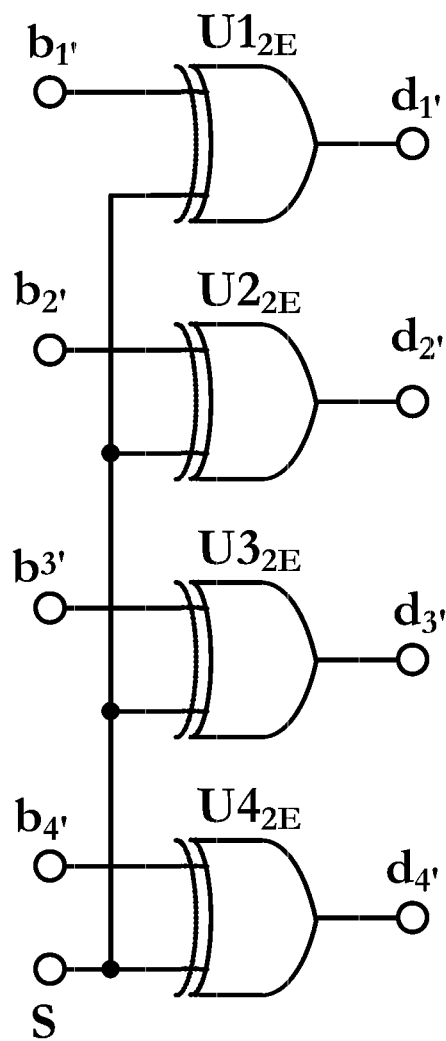
FIG. 2E is a schematic logic diagram of a polarity logic with 4-outputs, the U4S cell.
Figure 2F:
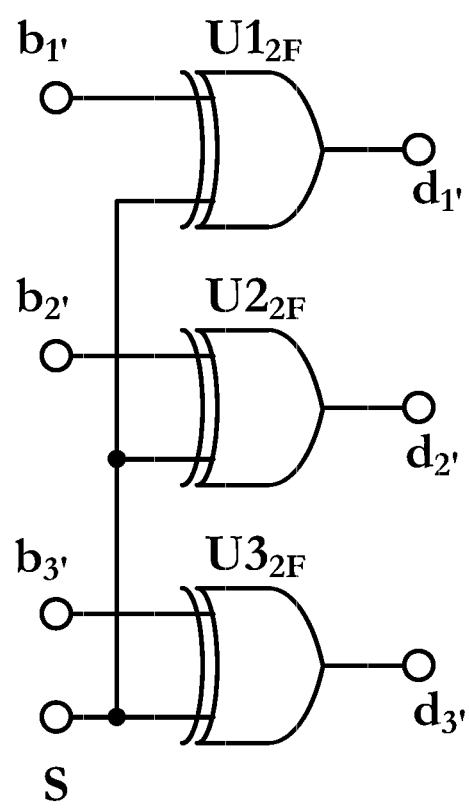
FIG. 2F is a schematic logic diagram of a polarity logic with 3-outputs, the U3S cell.
Figure 2H:
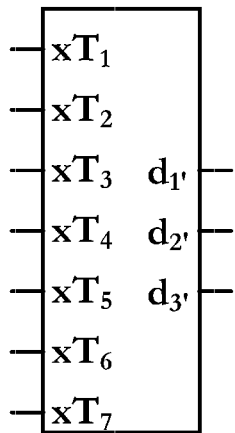
FIG. 2H is a block diagram illustrating the encoder U7E of FIG. 2A.

Note that FIG. 2H is the block diagram of encoder U7E of FIG. 2A.

Section 2B—Description of FIG. 2B

FIG. 2B is a schematic logic diagram of a (3-inputs) thermometer code to (2-outputs) binary code encoder, named U3E. It has 3 digital input ports $T_3$, $T_2$, and $T_1$ plus 2 digital output ports $d_{2'}$ and $d_{1'}$ where for 2-bits $d_{2'}$ is the LSB and $d_{1'}$ is the MSB The encoder is comprised of 1 two input XOR gate $U1_{2B}$, and 2 two input NAND gates $U2_{2b}$ and $U3_{2B}$.

Figure 2I:
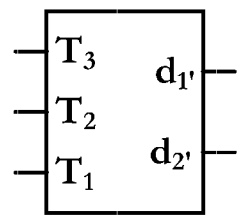
FIG. 2*i* is a block diagram illustrating the encoder U3E of FIG. 2B.

Notice that FIG. 2i is the block diagram of encoder U3E of FIG. 2B.

Section 2C—Description of FIG. 2C

FIG. 2C is a schematic logic diagram of a (4-inputs) gray code to (4-outputs) binary code decoder, named U4G. It has 4 gray-code input ports $b_{1'}$, $b_{2'}$, $b_{3'}$, and $b_{4'}$ plus a digital input sign bit S port. It also has 4 digital output ports $d_{1'}$, $d_{2'}$, $d_{3'}$, and $d_{4'}$ where for the 4 digital output bits $d_{1'}$ is the MSB and $d_{4'}$ is the LSB. The gray to binary decoder is comprised of 4 two input exclusive or (XOR) gates $U1_{2C}$ to $U4_{2C}$.

Figure 2J:
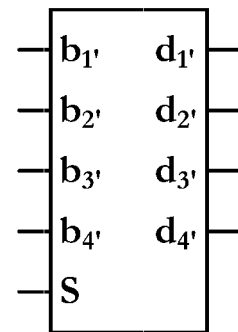
FIG. 2*j* is a block diagram illustrating the decoder U4G of FIG. 2C.

Note that FIG. 2*j* is the block diagram of decoder U4G of FIG. 2C.

Section 2D—Description of FIG. 2D

FIG. 2D is a schematic logic diagram of a (3-inputs) gray code to (3-outputs) binary code decoder, named U3G. It has 3 gray-code input ports $b_{1'}$, $b_{2'}$, and $b_{3'}$ plus a digital input sign bit S port. It also has 3 digital output ports $d_{1'}$, $d_{2'}$, and $d_{3'}$ where for the 3 digital output bits $d_{1'}$ is the MSB and $d_{3'}$ is the LSB. The gray to binary decoder is comprised of 3 two input exclusive or (XOR) gates $U1_{2D}$ to $U3_{2D}$.

Figure 2K:
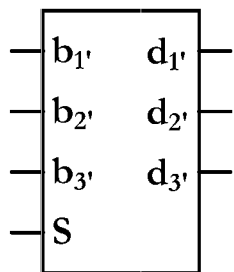
FIG. 2K is a block diagram illustrating the decoder U3G of FIG. 2D.

Be mindful that FIG. 2K is the block diagram of decoder U3G of FIG. 2D.

Section 2E—Description of FIG. 2E

FIG. 2E is a schematic logic diagram of a polarity logic gates, named U4S. It has 4 digital inputs, a digital sign input, and 4 digital outputs, wherein depending on the polarity of the sign bit the 4-bit output word keeps the same polarity as the 4-bit input word or its opposite. It has 4 gray-code input ports $b_{1'}$, $b_{2'}$, $b_{3'}$, and $b_{4'}$ plus a digital input sign bit S. It also has 4 digital output ports $d_{1'}$, $d_{2'}$, $d_{3'}$, and $d_{4'}$ where for the 4 digital output bits $d_{1'}$ is the MSB and $d_{4'}$ is the LSB. The gray to binary decoder contains 4 two input exclusive or (XOR) gates $U1_{2E}$ to $U4_{2E}$.

Figure 2L:
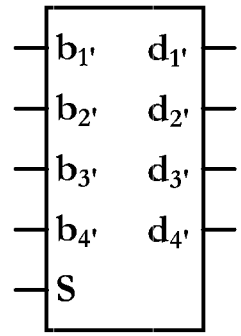
FIG. 2L is a block diagram illustrating the polarity logic U4S of FIG. 2E.

Note that FIG. 2L is the block diagram of polarity logic U4S of FIG. 2E.

Section 2F—Description of FIG. 2F

FIG. 2F is a schematic logic diagram of a polarity logic gates, named U3S. It has 3 digital inputs, a digital sign input, and 3 digital outputs, wherein depending on the polarity of the sign bit the 3-bit output word keeps the same polarity as the 3-bit input word or its opposite. It has 3 gray-code input ports $b_{1'}$, $b_{2'}$, and $b_{3'}$ plus a digital input sign bit S port. It also has 3 digital output ports $d_{1'}$, $d_{2'}$, and $d_{3'}$ where for the 3 digital output bits $d_{1'}$ is the MSB and $d_{3'}$ is the LSB. The gray to binary decoder is comprised of 3 two input exclusive or (XOR) gates $U1_{2F}$ to $U3_{2F}$.

Figure 2M:
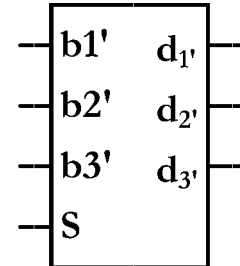
FIG. 2M is a block diagram illustrating the polarity logic U3S of FIG. 2F.

Notice that FIG. 2M is the block diagram of polarity logic U3S of FIG. 2F.

Section 2H—Description of FIG. 2H

FIG. 2H is a block diagram illustrating the encoder U7E of FIG. 2A. FIG. 2H has 7 digital input ports ($xT_1$ through $xT_7$) and 3 digital output ports ($d_{1'}$ through $d_{3'}$) where $d_{1'}$ is the MSB and $d_{3'}$ is the LSB.

Section 2I—Description of FIG. 2I

FIG. 2*i* is a block diagram illustrating the encoder U3E of FIG. 2B. FIG. 2*i* has 3 digital input ports ($xT_1$ through $xT_3$) and 2 digital output ports ($d_{1'}$ and $d_{2'}$) where $d_{1'}$ is the MSB and $d_{2'}$ is the LSB.

Section 2J—Description of FIG. 2J

FIG. 2*j* is a block diagram illustrating the decoder U4G of FIG. 2C. FIG. 2*j* has 4 digital input ports ($b_{1'}$ through $b_{4'}$), a sign digital input bit (S), and 4 digital output ports ($d_{1'}$ through $d_{4'}$) where $d_{1'}$ is the MSB and $d_{4'}$ is the LSB.

Section 2K—Description of FIG. 2K

FIG. 2K is a block diagram illustrating the decoder U3G of FIG. 2D. FIG. 2K has 3 digital input ports ($b_{1'}$ through $b_{3'}$), a sign digital input bit (S), and 3 digital output ports ($d_{1'}$ through $d_{3'}$) where $d_{1'}$ is the MSB and $d_{3'}$ is the LSB.

Section 2L—Description of FIG. 2L

FIG. 2L is a block diagram illustrating the polarity logic U4S of FIG. 2E. FIG. 2L has 4 digital input ports ($b_{1'}$ through $b_{4'}$), a sign digital input bit (S), and 4 digital output ports ($d_{1'}$ through $d_{4'}$) where $d_{1'}$ is the MSB and $d_{4'}$ is the LSB.

Section 2M—Description of FIG. 2M

FIG. 2M is a block diagram illustrating the polarity logic U3S of FIG. 2F. FIG. 2M has 3 digital input ports ($b_{1'}$ through $b_{3'}$), a sign digital input bit (S), and 3 digital output ports ($d_{1'}$ through $d_{3'}$) where $d_{1'}$ is the MSB and $d_{3'}$ is the LSB.

Figure 3A:
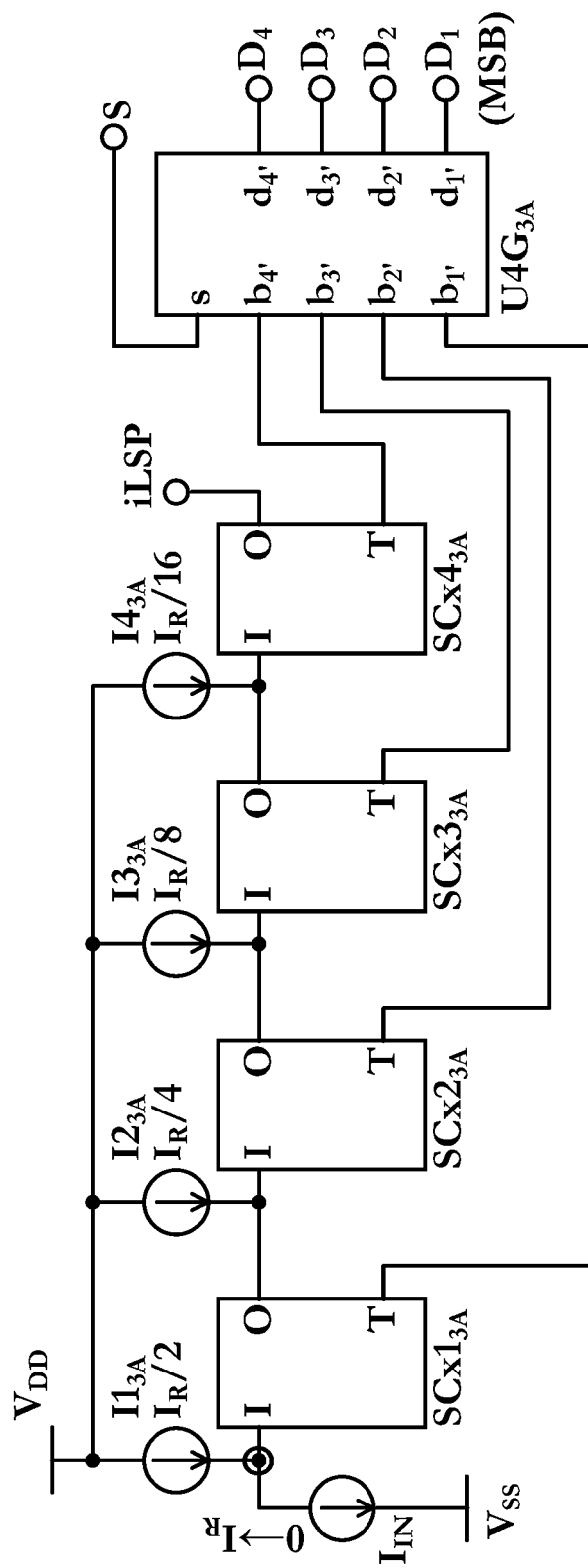
FIG. 3A is a circuit block diagram of an embodiment illustrating an iADC (referred to as ADC4v cell) that utilizes cascaded sequence of signal conditioning circuits SCx.

Section 3A—Description of FIG. 3A

FIG. 3A is a circuit block diagram of an embodiment illustrating an iADC (referred to as ADC4v cell) that utilizes cascaded sequence of signal conditioning circuits SCx. As a reminder, the SCx's circuit schematic is illustrated in FIG. 1C, and SCx's block diagram is illustrated in FIG. 1L. Also, the ADC4v cell block diagram is described (and illustrated) in section 3E (FIG. 3E).

Also, keep in mind that FIG. 3E of ADC4v is utilized later in this disclosure to illustrate multi-stage iADCs with extended resolution.

The ADC4v is illustrated as having 4-bits of resolution, which is not as a limitation of the disclosed invention, but for illustrative and descriptive clarity. Higher resolution iADC (e.g., 16-bits with calibration for higher accuracy) can be arranged by utilizing the disclosed ADC4v.

The ADC4v has an analog input port (A) which is at the input (1) port of the first $SCx1_{3A}$. The ADC4v's first $SCx1_{3A}$ is inputted with a scaled $I_R$ that is $I1_{3A}=I_R/2$ as well as an $I_{IN}$ (whose range traverses between zero scale=0 and full scale=$I_R$). In other words, ADC4v is inputted with a difference analog current signal that is $\Delta i = I_{IN} - I_R/2$.

Notice that ADC4v has an analog current reference input port, REF, which is inputted with $I_R$ that is mirrored onto the iADC's internal binary scaled reference current network, which are depicted as $I1_{3A}$ through $I4_{3A}$ scaled from $I_R/2$ through $I_R/16$, respectively, in FIG. 3A.

The ADC4v has one digital sign input port (S), and a digital output port that is 4-bit wide comprising of $D_1$ (MSB) through $D_4$ (LSB). The ADC4v has an analog output port $i_{LSP}$ that is the O port of $SCx4_{3A}$, which generates an analog output current as a least significant portion (LSP) that can feed the input of a second stage iADC to be digitized in order to extend the iADC's resolution.

Next, an explanation is provided as to how an absolute value difference (current) signal flows through the sequence of SCx cells, wherein a sequence of digital signals are generated indicating the polarity of the difference (current) signal, and wherein the absolute value difference (current)

signal doubles in frequency and halves in peak-to-peak amplitude as it traverses through the sequence of SCX cells.

As a reminder, the SCx's circuit schematic is described in section 1C and illustrated in FIG. 1C Here, the $SCx1_{3A}$ generates a digital output signal T that indicates the polarity of $I_{IN}-I1_{3A}=I_{IN}-I_R/2$. Concurrently, $SCx1_{3A}$ generates an absolute value difference analog signal $\Delta i=|I_{IN}-I_R/2|$ at its analog output (the O port) that is coupled with an $I_R/2$ and the input port of the next $SCx2_{3A}$ that is in sequence. For example, let's program $I_R=160$ nA, and let $I_{IN}$ ramp (at a frequency f) from zero-scale to full-scale 160 nA. In response, the current flowing out of $SCX1_{3A}$'s output port O would be an equilateral triangular wave ramping at frequency of 2×f with a peak-to-peak amplitude of 80 nA which is half of that of its input's peak-to-peak amplitude of 160 nA.

As $\Delta i$ flows through the cascaded sequence of signal conditioning circuits (SCx) the next respective $\Delta i$ in sequence is rectified (for absolute value), halved in peak-to-peak value, and doubled in frequency, while concurrently the cascaded sequence of SCxs generate a corresponding sequence of gray-coded digital output signal T.

Accordingly, the respective T gray-codes of the respective SCxs are inputted to $b_1$ through $b_4$, digital input port of $U4G_{3A}$ (whose logic schematic is FIG. 2C and its cell block diagram is FIG. 2j). The $U4G_{3A}$ is also inputted with a sign bit (S). Accordingly, the output port of $U4G_{3A}$ generates a digital output word, comprising of the bits $D_1$ through $D_4$ of ADC4v.

Note that as the gray-coded digital output signal T are generated by the respective SCxs, the analog output of SCxs does not 'pulse' the $\Delta i$ between zero-scale to full-scale. Instead there is a 'ramp' from zero-scale to full-scale followed by a ramp from full-scale to zero-scale. As such, the input of SCxs in the cascoded sequence never experience a 'pulse' in $\Delta i$ which helps their dynamic response.

Moreover, the generation of the gray-coded digital output signal T in the SCxs doesn't interfere with the analog signal flow through the cascaded sequence of SCxs. Thus, ADC4v exhibits low glitch.

Furthermore, note for example that the analog computation $\Delta i=|I_{IN}-I_R/2|$ and the respective digital response T codes (which indicate the polarity of $I_{IN}-I_R/2$ for $SCx1_{3A}$) are generated asynchronously. Thus, the rectification 'conditioning of the difference analog current' and the 'digital decision about the polarity of difference analog current' are made concurrently for each SCx without the need for any free running clock. Being free from clocks enables asynchronous analog to digital conversion. Also, being free from clocks reduces glitch, noise, and dynamic power consumption associated with a free running clock.

It is important to be mindful that the accuracy of ADC4v is dominated by the MSB current reference ($I1_{3A}=I_R/2$) and the accuracy of the first SCx's interior current mirror (e.g., FET matching between $N2_{1C}$ and $N3_{1C}$ in $SCX1_{3A}$ illustrated in FIG. 1C). Conversely, the LSP (least significant portion of) current reference and last SCx matching are less critical in diminishing the accuracy of the iADC. As such, the last few SCXs (e.g., $SCx3_{3A}$, $SCx4_{3A}$) and last few reference currents (e.g., $I3_{3A}=I_R/8$, $I4_{3A}=I_R/16$) can be arranged with smaller and more area efficient FETs, which saves area and helps the LSP operate faster than otherwise.

In summary some of the benefits of the iADCs of FIG. 3A described in this disclosure are:

First, the iADC (comprised of sequence of cascaded SCx) that operate in current mode benefits from current mode operations, which were explained earlier.

Second, the disclosed embodiment of SCx, which contributes to accuracy of iADC, utilizes only one current mirror. Generally, the fewer the current mirrors in an iADC's input-to-output signal path, the less the mismatch associated with current mirror matching, which in turn improves the accuracy of the iADC. Thus, the accuracy of the disclosed iADC is dominated by the MSB (first) current reference (e.g., $I_R/2$) and the first SCx (e.g., $SCx1_{3A}$ which only has one current mirror, as noted above) which can be optimized in design and FET layout for better matching. Accordingly, FET's matching may not as critical for current references (e.g., $I_R/8$ and $I_R/16$) and SCxs (e.g., $SCx3_{3A}$ and $SCx4_{3A}$) down the cascaded sequence (e.g., SCxs in the LSP of iADC) and they can be arranged with smaller sized FETs which would be more area efficient and faster.

Third, the disclosed SCx also dominates the dynamic response of iADC and utilizes one current mirror, as noted. The fewer the current mirrors in the SCx, the less delay in the sequence of cascaded SCxs, which improves the dynamic response of the iADC.

Fourth, the iADC is asynchronous and does not require a free running clock. As such, the digital noise and dynamic power consumption associated with iADCs requiring free running clocks is avoided.

Fifth, analog computation and digital computation occur concurrently with almost little to no interference with one another. Moreover, instead of right-angled triangular waveforms (i.e., zero-scale to full-scale pulse) the difference analog current signals (that flow from one SCx input to the next SCx output and onward through the cascaded sequence of SCxs) are equilateral triangular waveforms (i.e., no zero-scale to full-scale pulse), which helps the dynamic response of the SCXs.

Sixth, the switching of respective sequence of SCx's digital outputs are arranged with minimal interference into the analog signal flow path in the sequence of SCxs. Thus, the disclosed iADC has low glitch.

Seventh, the disclosed iADC is not restricted in its operating current magnitude. It can operate in subthreshold for ultra-low current or normal region with higher currents for wider input current span and for higher speeds.

Eight, the disclosed iADC architecture is flexible in that its resolution can be extended by coupling multiple iADCs together.

Figure 3B:
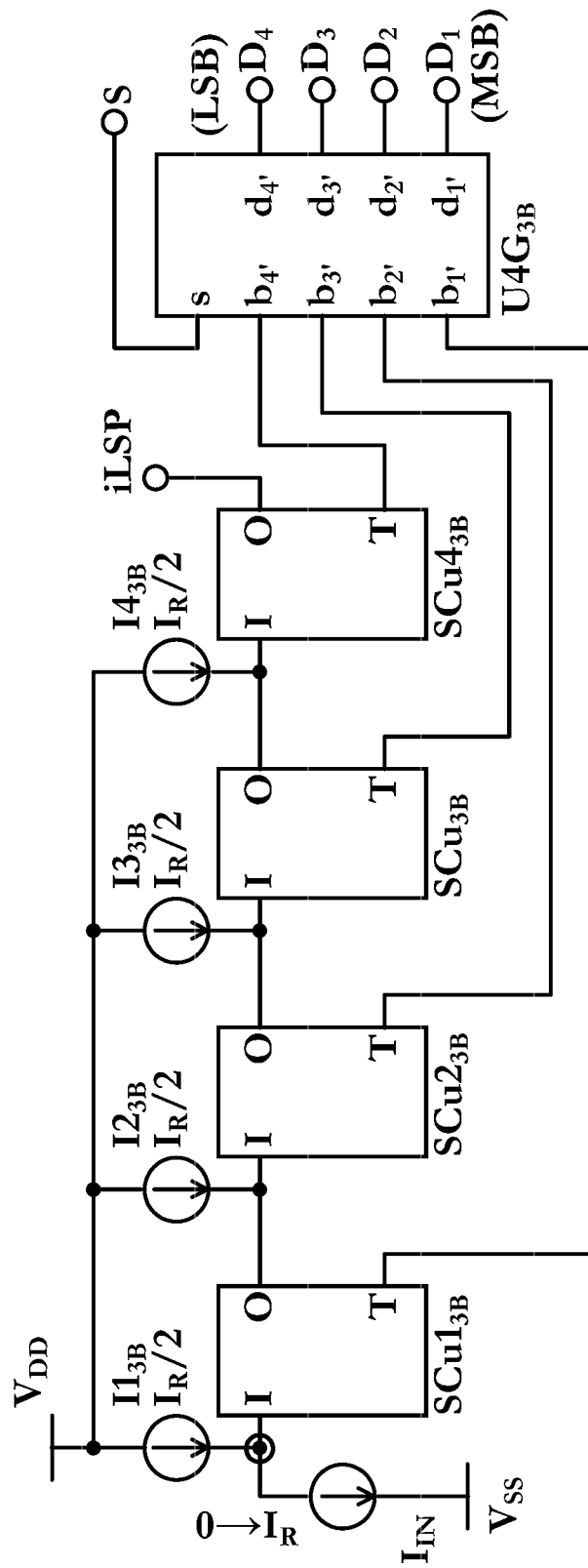
FIG. 3B is a circuit block diagram of an embodiment illustrating an iADC (referred to as ADC4w cell) that utilizes cascaded sequence of signal conditioning circuits SCu.

Section 3B—Description of FIG. 3B

FIG. 3B is a circuit block diagram of an embodiment illustrating an iADC (referred to as ADC4w cell) that utilizes cascaded sequence of signal conditioning circuits SCu. As a reminder, the SCu's circuit schematic is illustrated in FIG. 1F, and SCu's block diagram is illustrated in FIG. 1O. The ADC4w cell block diagram is described (and illustrated) in section 3F (FIG. 3F).

Also, keep in mind that FIG. 3F of ADC4w is utilized later in this disclosure in illustrating multi-stage iADC with extended resolution.

The ADC4w is illustrated as having 4-bits of resolution, which is not as a limitation of the disclosed invention, but for illustrative and descriptive clarity. Higher resolution iADC (e.g., 16-bits with calibration for higher accuracy) can be arranged by utilizing the disclosed ADC4w.

The ADC4w has an analog input port (A) which is at the input (1) port of the first $SCu1_{3B}$. The ADC4w's first $SCu1_{3B}$ is inputted with a scaled $I_R$ that is $I1_{3B}=I_R/2$ as well as an (whose range traverses between zero scale=0 and full scale=$I_R$). In other words, $SCu1_{3B}$ of ADC4w is inputted with a difference analog current signal that is $\Delta i = I_{IN} - I_R/2$.

Notice that ADC4w has an analog current reference input port, REF, which is inputted with $I_R$ that is mirrored onto the iADC's internal reference current network, which are depicted as $I1_{3B}$ through $I4_{3B}$ scaled equally with $I_R/2$ in FIG. 3B.

The ADC4w has one digital sign input port (S), and a digital output port that is 4-bit wide comprising of $D_1$ (MSB) through $D_4$ (LSB). The ADC4w has an analog output port $i_{LSP}$ that is the O port of the fourth $SCu4_{3B}$, which generates an analog output current as a least significant portion (LSP) that can feed the input of a second stage iADC to be digitized in order to extend the iADC's resolution.

Next, an explanation is provided as to how an absolute value difference (current) signal flows through the sequence of SCu cells, wherein a sequence of digital signals are generated indicating the polarity of the difference (current) signal, and wherein the absolute value difference (current) signal doubles in frequency while maintaining the nearly same peak-to-peak amplitude as it traverses through the sequence of SCu cells.

As a reminder, the SCu circuit schematic is described in section 1F (and illustrated in FIG. 1F) where the current mirror comprising of $N3_{1F}$ and $N2_{1F}$ has a scale factor of 2 set by n, which maintains the nearly peak-to-peak amplitude of signals in and out of SCus across the cascaded sequence.

Here in FIG. 3B, the $SCu1_{3B}$ generates a digital output signal T that indicates the polarity of $SCu1_{3B}$'s analog difference (current) signal $I_{IN} - I1_{3B} = I_{IN} - I_R/2$. Concurrently, $SCu1_{3B}$ generates an absolute value difference analog signal $\Delta i = 2 \times |I_{IN} - I_R/2|$ at its analog output (the O port) that is coupled with an $I_R/2$ and the I port of the next $SCu2_{3B}$ that is in sequence. For example, let's program $I_R = 160$ nA, and let $I_{IN}$ ramp (at a frequency f) from zero-scale to full-scale 160 nA. In response, the current flowing out of $SCu1_{3B}$'s O would be an equilateral triangular wave ramping at frequency of $2 \times f$ with a peak-to-peak amplitude of 160 nA, which is the same as that of its input's peak-to-peak amplitude of 160 nA.

As $\Delta i$ flows through the cascaded sequence of signal conditioning circuits (SCu) the next respective $\Delta i$ in sequence is rectified (for absolute value), the analog current output of each SCu maintains the same peak-to-peak value, while it is doubled in frequency. Concurrently the cascaded sequence of SCus generate a corresponding sequence of gray-coded digital output signal T. All else equal and in general, the lower the $\Delta i$ peak-to-peak amplitude inputted into a SCu, then the slower the respective SCu. Hence, to maintain a same (e.g., larger) peak-to-peak current signal amplitude at input of SCu can help maintain the dynamic speed of SCus down the cascode sequence.

The respective T gray-codes of the respective SCus is inputted to $b_1$, through $b_4$, digital input port of $U4G_{3B}$. Again, as a reminder the $U4G_{3B}$'s logic schematic is FIG. 2C and its cell block diagram is FIG. 2J. The $U4G_{3B}$ is also inputted with a sign bit (S). Accordingly, the output port of $U4G_{3B}$ generates a digital output word, comprising of the bits $D_1$ through $D_4$ of ADC4w.

Note that as the gray-coded digital output signal T are generated by the respective SCus, the analog output of SCus does not 'pulse' the $\Delta i$ between zero-scale to full-scale. Instead there is a 'ramp' from zero-scale to full-scale followed by a ramp from full-scale to zero-scale. As such, the input of SCus in the cascoded sequence never experience a 'pulse' in $\Delta i$ which helps their dynamic response.

Moreover, the generation of the gray-coded digital output signal T in the SCus doesn't interfere with the analog signal flow through the cascaded sequence of SCus. Thus, ADC4w exhibits low glitch.

Furthermore, consider for example that the analog computation $\Delta i = |I_{IN} - I_R/2|$ and the respective digital response T code (which indicate the polarity of $I_{IN} - I_R/2$ for $SCu1_{3B}$) are generated asynchronously. Thus, the rectification 'conditioning of the difference analog current' and the 'digital decision about the polarity of difference analog current' are made concurrently for each SCu without the need for any free running clock. Being free from clocks here enables asynchronous analog to digital conversion. Also, being free from clocks reduces glitch, noise, and dynamic power consumption associated with a free running clock.

In summary some of the benefits of the iADCs of FIG. 3B described in this disclosure are:

First, the iADC (comprised of sequence of cascaded SCu) that operate in current mode benefits from current mode operations, which were explained earlier.

Second, each SCu's input-to-output current difference signal maintains its peak-to-peak amplitude down the cascaded sequence of SCus. As such, there remains enough current to fuel the speed of SCu, especially SCus down stream (e.g., the LSB sections)

Third, the iADC is asynchronous and does not require a free running clock. As such, the digital noise and dynamic power consumption associated with iADCs requiring free running clocks is avoided.

Fourth, analog computation and digital computation occur concurrently with almost little to no interference with one another. Moreover, instead of right-angled triangular waveforms (i.e., zero-scale to full-scale pulse) the difference analog current signals (that flow from one SCu input to the next SCu output and onward through the cascaded sequence of SCus) are equilateral triangular waveforms (i.e., no zero-scale to full-scale pulse), which helps the dynamic response of the SCus.

Fifth, the switching of respective sequence of SCu's digital outputs are arranged with minimal interference into the analog signal flow path in the sequence of SCus. Thus, the disclosed iADC has low glitch.

sixth, the disclosed iADC is not restricted in its operating current magnitude. It can operate in subthreshold for ultra-low current or normal region with higher currents for wider input current span and for higher speeds.

Seventh, the disclosed iADC is flexible in that its resolution can be extended with additional stages.

Figure 3C:
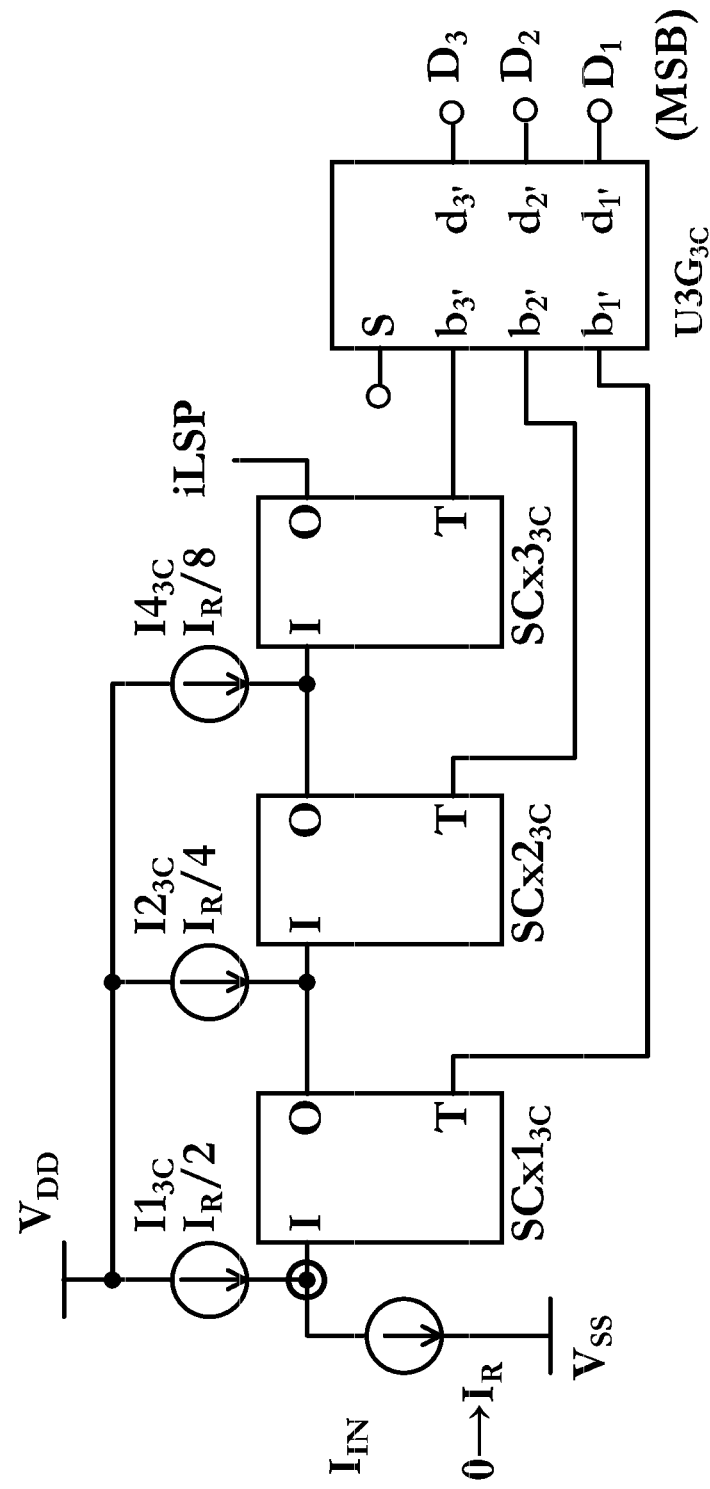
FIG. 3C is a circuit block diagram of another embodiment illustrating an iADC (referred to as ADC3v cell) that utilizes cascaded sequence of signal conditioning circuits SCx.

Section 3C—Description of FIG. 3C

FIG. 3C is a circuit block diagram of another embodiment illustrating an iADC (referred to as ADC3v cell) that utilizes cascaded sequence of signal conditioning circuits SCx. As a reminder, the SCx's circuit schematic is illustrated in FIG. 1C, and SCx's block diagram is illustrated in FIG. 1L. The ADC3v cell block diagram is described (and illustrated) in section 3G (FIG. 3G).

Also, keep in mind that FIG. 3G of ADC3v will be utilized later to illustrate multi-stage iADC with extended resolution.

The ADC3v is illustrated as having 3-bits of resolution, which is not as a limitation of the disclosed invention, but for illustrative and descriptive clarity. As stated earlier, higher resolution iADC (e.g., 16-bits with calibration for higher accuracy) can be arranged by utilizing the disclosed ADC3v.

The ADC3v has an analog input port (A) which is at the input (1) port of the first $SCx1_{3C}$. The ADC3v's first $SCx1_{3C}$ is inputted with a scaled $I_R$ that is $I1_{3C}=I_R/2$ as well as an $I_{IN}$ (whose range traverses between zero scale=0 and full scale=$I_R$). In other words, ADC3v is inputted with a difference analog current signal that is $\Delta i = I_{IN} - I_R/2$.

Notice that ADC3v has an analog current reference input port, REF, which is inputted with $I_R$ that is mirrored onto the iADC's internal binary scaled reference current network, which are depicted as $I1_{3C}$ through $I3_{3C}$ scaled from $I_R/2$ through $I_R/8$, respectively, in FIG. 3C.

The ADC3v has one digital sign input port (S), and a digital output port that is 3-bit wide comprising of $D_1$ (MSB) through $D_3$ (LSB). The ADC3v has an analog output port $i_{LSP}$ that is the O port of $SCx3_{3C}$, which generates an analog output current as a least significant portion (LSP) that can feed the input of a second stage iADC to be digitized in order to extend the iADC's resolution.

Similarly here, an explanation is provided as to how an absolute value difference (current) signal flows through the sequence of SCx cells, wherein a sequence of digital signals are generated indicating the polarity of the difference (current) signal, and wherein the absolute value difference (current) signal doubles in frequency and halves in peak-to-peak amplitude as it traverses through the sequence of SCx cells.

As a reminder, the SCx's circuit schematic is described in section 1C and illustrated in FIG. 1C Here, the $SCx1_{3C}$ generates a digital output signal T that indicates the polarity of $I_{IN} - I1_{3C} = I_{IN} - I_R/2$. Concurrently, $SCx1_{3C}$ generates an absolute value difference analog signal $\Delta i = I_R/2$ I at its analog output (the O port) that is coupled with an $I_R/2$ and the input port of the next $SCX2_{3C}$ that is in sequence. For example, let's program $I_R = 160$ nA, and let $I_{IN}$ ramp (at a frequency f) from zero-scale to full-scale 160 nA. In response, the current flowing out of $SCx1_{3C}$'s output port O would be an equilateral triangular wave ramping at frequency of 2×f with a peak-to-peak amplitude of 80 nA, which is half of that of its input's peak-to-peak amplitude of 160 nA.

As $\Delta i$ flows through the cascaded sequence of signal conditioning circuits (SCx) the next respective $\Delta i$ in sequence is rectified (for absolute value), halved in peak-to-peak value, and doubled in frequency, while concurrently the cascaded sequence of SCxs generate a corresponding sequence of gray-coded digital output signal T.

Accordingly, the respective T gray-codes of the respective SCxs are inputted to $b_1$, through $b_4$, digital input port of $U3G_{3C}$ (whose logic schematic is FIG. 2D and its cell block diagram is FIG. 2K). The $U3G_{3C}$ is also inputted with a sign bit (S). Accordingly, the output port of $U3G_{3C}$ generates a digital output word, comprising of the bits $D_1$ through $D_3$ of ADC3v.

Note that as the gray-coded digital output signal T are generated by the respective SCxs, the analog output of SCxs does not 'pulse' the $\Delta i$ between zero-scale to full-scale. Instead there is a 'ramp' from zero-scale to full-scale followed by a ramp from full-scale to zero-scale. As such, the input of SCxs in the cascoded sequence never experience a 'pulse' in $\Delta i$ which helps their dynamic response.

Moreover, the generation of the gray-coded digital output signal T in the SCxs doesn't interfere with the analog signal flow through the cascaded sequence of SCxs. Thus, ADC3v exhibits low glitch.

Furthermore, note for example that the analog computation $\Delta i = |I_{IN} - I_R/2|$ and the respective digital response T code (which indicate the polarity of $I_{IN} - I_R/2$ for $SCx1_{3C}$) are generated asynchronously. Thus, the rectification 'conditioning of the difference analog current' and the 'digital decision about the polarity of difference analog current' are made concurrently for each SCx without the need for any free running clock. Being free from clocks enables asynchronous analog to digital conversion. Also, being free from clocks reduces glitch, noise, and dynamic power consumption associated with a free running clock.

It is important to be mindful that the accuracy of ADC3v is dominated by the MSB current reference ($I1_{3C}=I_R/2$) and the accuracy of the first SCx's interior current mirror (e.g., FET matching between $N2_{1C}$ and $N3_{1C}$ in $SCx1_{3C}$ illustrated earlier in FIG. 1C). Conversely, the LSP (least significant portion of) current reference and last SCx matching are less critical in diminishing the accuracy of the iADC. As such, the last few SCxs (e.g., $SCx3_{3C}$) and last few reference currents (e.g., $I3_{3C}=I_R/8$) can be arranged with smaller and more area efficient FETs, which saves area and helps the LSP operate faster than otherwise.

In summary some of the benefits of the iADCs of FIG. 3C described in this disclosure are:

First, the iADC (comprised of sequence of cascaded SCx) that operate in current mode benefits from current mode operations, which were explained earlier.

Second, the disclosed embodiment of SCx, which contributes to accuracy of iADC, utilizes only one current mirror. Generally, the fewer the current mirrors in an iADC's input-to-output signal path, the less the mismatch associated with current mirror matching, which in turn improves the accuracy of the iADC. Thus, the accuracy of the disclosed iADC is dominated by the MSB (first) current reference (e.g., $I_R/2$) and the first SCx (e.g., $SCx1_{3C}$ which only has one current mirror, as noted above) which can be optimized in design and FET layout for better matching. Accordingly, FET's matching may not as critical for current references (e.g., $I_R/8$) and SCxs (e.g., $SCx3_{3C}$) down the cascaded sequence (e.g., SCxs in the LSP of iADC) and they can be arranged with smaller sized FETs which would be more area efficient and faster.

Third, the disclosed SCx also dominates the dynamic response of iADC and utilizes one current mirror, as noted. The fewer the current mirrors in the SCx, the less delay in the sequence of cascaded SCxs, which improves the dynamic response of the iADC.

Fourth, the iADC is asynchronous and does not require a free running clock. As such, the digital noise and dynamic power consumption associated with iADCs requiring free running clocks is avoided.

Fifth, analog computation and digital computation occur concurrently with almost little to no interference with one another. Moreover, instead of right-angled triangular waveforms (i.e., zero-scale to full-scale pulse) the difference analog current signals (that flow from one SCx input to the next SCx output and onward through the cascaded sequence of SCxs) are equilateral triangular waveforms (i.e., no zero-scale to full-scale pulse), which helps the dynamic response of the SCxs.

Sixth, the switching of respective sequence of SCx's digital outputs are arranged with minimal interference into the analog signal flow path in the sequence of SCxs. Thus, the disclosed iADC has low glitch.

Seventh, the disclosed iADC is not restricted in its operating current magnitude. It can operate in subthreshold for ultra-low current or normal region with higher currents for wider input current span and for higher speeds.

Eight, the disclosed iADC architecture is flexible in that its resolution can be extended by coupling multiple iADCs together.

Figure 3D:
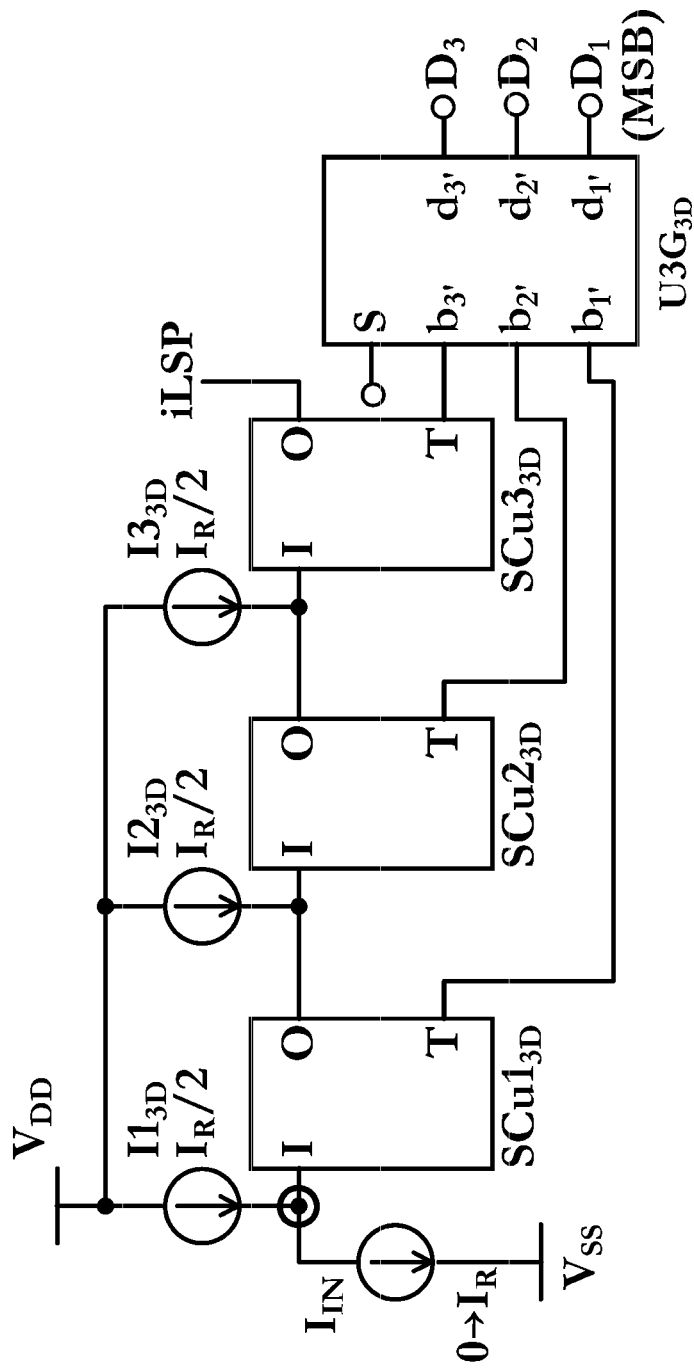
FIG. 3D is a circuit block diagram of another embodiment illustrating an iADC (referred to as ADC3w cell) that utilizes cascaded sequence of signal conditioning circuits SCu.

Section 3D—Description of FIG. 3D

FIG. 3D is a circuit block diagram of another embodiment illustrating an iADC (referred to as ADC3w cell) that utilizes cascaded sequence of signal conditioning circuits SCu. As a reminder, the SCu's circuit schematic is illustrated in FIG. 1F, and SCu's block diagram is illustrated in FIG. 1O. The ADC3w cell block diagram is described (and illustrated) in section 3H (FIG. 3H).

Also, keep in mind that FIG. 3H of ADC3w will be utilized later in illustrating multi-stage iADC with extended resolution.

The ADC4w is illustrated as having 3-bits of resolution, which is not as a limitation of the disclosed invention, but for illustrative and descriptive clarity. Higher resolution iADC (e.g., 16-bits with calibration for higher accuracy) can be arranged by utilizing the disclosed ADC3w.

The ADC3w has an analog input port (A) which is at the input (1) port of the first $SCu1_{3D}$. The ADC3w's first $SCu1_{3D}$ is inputted with a scaled $I_R$ that is $I1_{3D}=I_R/2$ as well as an $I_{IN}$ (whose range traverses between zero scale=0 and full scale=$I_R$). In other words, ADC3w is inputted with a difference analog current signal that is $\Delta i=I_{IN}-I_R/2$.

Notice that ADC3w has an analog current reference input port, REF, which is inputted with $I_R$ that is mirrored onto the iADC's internal reference current network, which are depicted as $I1_{3D}$ through $I3_{3D}$ scaled equally with $I_R/2$ in FIG. 3D.

The ADC3w has one digital sign input port (S), and a digital output port that is 3-bit wide comprising of $D_1$ (MSB) through $D_3$ (LSB). The ADC3w has an analog output port $i_{LSP}$ that is the O port of $SCu4_{3D}$, which generates an analog output current as a least significant portion (LSP) that can feed the input of a second stage iADC to be digitized in order to extend the iADC's resolution.

Next, an explanation is provided as to how an absolute value difference (current) signal flows through the sequence of SCu cells, wherein a sequence of digital signals are generated indicating the polarity of the difference (current) signal, and wherein the absolute value difference (current) signal doubles in frequency while maintaining the nearly same peak-to-peak amplitude as it traverses through the sequence of SCu cells.

As a reminder, the SCu's circuit schematic is described in section IF (and illustrated in FIG. 1F) where the current mirror comprising of $N3_{1F}$ and $N2_{1F}$ has a scale factor of 2 set by n, which maintains the nearly peak-to-peak amplitude of signals in and out of SCus across the cascaded sequence.

Here in FIG. 3D, the $SCu1_{3D}$ generates a digital output signal T that indicates the polarity of $SCu1_{3D}$'s analog difference (current) signal $I_{IN}-I1_{3D}=I_{IN}-I_R/2$. Concurrently, $SCu1_{3D}$ generates an absolute value difference analog signal $\Delta i=2\times|I_{IN}-I_R/2|$ at its analog output (the O port) that is summed an $I_R/2$ and coupled with the I port of the next $SCu2_{3D}$ that is in its sequence. For example, let's program $I_R=160$ nA, and let $I_{IN}$ ramp (at a frequency f) from zero-scale to full-scale 160 nA. In response, the current flowing out of $SCu1_{3D}$'s O with a peak-to-peak amplitude of 160 nA, which is the same as that of its input's peak-to-peak amplitude of 160 nA.

As $\Delta i$ flows through the cascaded sequence of signal conditioning circuits (SCu) the next respective $\Delta i$ in sequence is rectified (for absolute value), the analog current output of each SCu maintains the same peak-to-peak value, while it is doubled in frequency. Concurrently the cascaded sequence of SCus generate a corresponding sequence of gray-coded digital output signal T. All else equal and in general, the lower the $\Delta i$ peak-to-peak amplitude inputted into a SCu, then the slower the respective SCu. Hence, to maintain a same (e.g., larger) peak-to-peak current signal amplitude at input of SCu can help maintain the dynamic speed of SCus down the cascode sequence.

The respective T gray-codes of the respective SCus is inputted to $b_1$, through $b_3$, digital input port of $U3G_{3D}$. Again, as a reminder the $U3G_{3D}$'s logic schematic is FIG. 2D and its cell block diagram is FIG. 2K. The $U3G_{3D}$ is also inputted with a sign bit (S). Accordingly, the output port of $U3G_{3D}$ generates a digital output word, comprising of the bits $D_1$ through $D_3$ of ADC3w.

Note that as the gray-coded digital output signal T are generated by the respective SCus, the analog output of SCus does not 'pulse' the $\Delta i$ between zero-scale to full-scale. Instead there is a 'ramp' from zero-scale to full-scale followed by a ramp from full-scale to zero-scale. As such, the input of SCus in the cascoded sequence never experience a 'pulse' in $\Delta i$ which helps their dynamic response.

Moreover, the generation of the gray-coded digital output signal T in the SCus doesn't interfere with the analog signal flow through the cascaded sequence of SCus. Thus, ADC3w exhibits low glitch.

Furthermore, consider for example that the analog computation $\Delta i=|I_{IN}-I_R/2|$ and the respective digital response T code (which indicate the polarity of $I_{IN}-I_R/2$ for $SCu1_{3D}$) are generated asynchronously. Thus, the rectification 'conditioning of the difference analog current' and the 'digital decision about the polarity of difference analog current' are made concurrently for each SCu without the need for any free running clock. Being free from clocks here enables asynchronous analog to digital conversion. Also, being free from clocks reduces glitch, noise, and dynamic power consumption associated with a free running clock.

In summary some of the benefits of the iADCs of FIG. 3D described in this disclosure are:

First, the iADC (comprised of sequence of cascaded SCus) that operate in current mode benefits from current mode operations, which were explained earlier.

Second, each SCu's input-to-output current difference signal maintains its peak-to-peak amplitude down the cascaded sequence of SCus. As such, there remains enough current to fuel the speed of SCu, especially SCus downstream (e.g., the LSB sections)

Third, the iADC is asynchronous and does not require a free running clock. As such, the digital noise and dynamic power consumption associated with iADCs requiring free running clocks is avoided.

Fourth, analog computation and digital computation occur concurrently with almost little to no interference with one another. Moreover, instead of right-angled triangular waveforms (i.e., zero-scale to full-scale pulse) the difference analog current signals (that flow from one SCu input to the next SCu output and onward through the cascaded sequence of SCus) are equilateral triangular waveforms (i.e., no zero-scale to full-scale pulse), which helps the dynamic response of the SCus.

Fifth, the switching of respective sequence of SCu's digital outputs are arranged with minimal interference into the analog signal flow path in the sequence of SCus. Thus, the disclosed iADC has low glitch.

sixth, the disclosed iADC is not restricted in its operating current magnitude. It can operate in subthreshold for ultra-low current or normal region with higher currents for wider input current span and for higher speeds.

Seventh, the disclosed iADC is flexible in that its resolution can be extended with additional stages.

Section 3E—Description of FIG. 3E

FIG. 3E is an iADC block diagram for ADC4v that is described and illustrated in section 3A and FIG. 3A, respectively. The iADC block diagram of FIG. 3E has an analog input port (A), an analog current reference input port (REF), an analog current output port (iLSP), a sign digital input bit (S), and a digital output port that is 4-bit wide and comprising of digital output bits $d_{1'}$ through $d_{4'}$ wherein $d_{1'}$ is the MSB and $d_{4'}$ is the LSB, unless otherwise specified.

Section 3F—Description of FIG. 3F

FIG. 3F is an iADC block diagram for ADC4w that is described and illustrated in section 3B and FIG. 3B, respectively. The iADC block diagram of FIG. 3F has an analog input port (A), an analog current reference input port (REF), an analog current output port (iLSP), a sign digital input bit (S), and a digital output port that is 4-bit wide and comprising of digital output bits $d_{1'}$ through $d_{4'}$ wherein $d_{1'}$ is the MSB and $d_{4'}$ is the LSB, unless otherwise specified.

Section 3G—Description of FIG. 3G

FIG. 3G is an iADC block diagram for ADC3v that is described and illustrated in section 3C and FIG. 3C, respectively. The iADC block diagram of FIG. 3G has an analog input port (A), an analog current reference input port (REF), an analog current output port (iLSP), a sign digital input bit (S), and a digital output port that is 3-bit wide and comprising of digital output bits $d_{1'}$ through $d_{3'}$ wherein $d_{1'}$ is the MSB and $d_{3'}$ is the LSB, unless otherwise specified.

Section 3H—Description of FIG. 3H

FIG. 3H is an iADC block diagram for ADC3w that is described and illustrated in section 3D and FIG. 3D, respectively. The iADC block diagram of FIG. 3H has an analog input port (A), an analog current reference input port (REF), an analog current output port (iLSP), a sign digital input bit (S), a digital output port that is 3-bit wide and comprising of digital output bits $d_{1'}$ through $d_{3'}$ wherein $d_{1'}$ is the MSB and $d_{3'}$ is the LSB, unless otherwise specified.

Figure 4A:
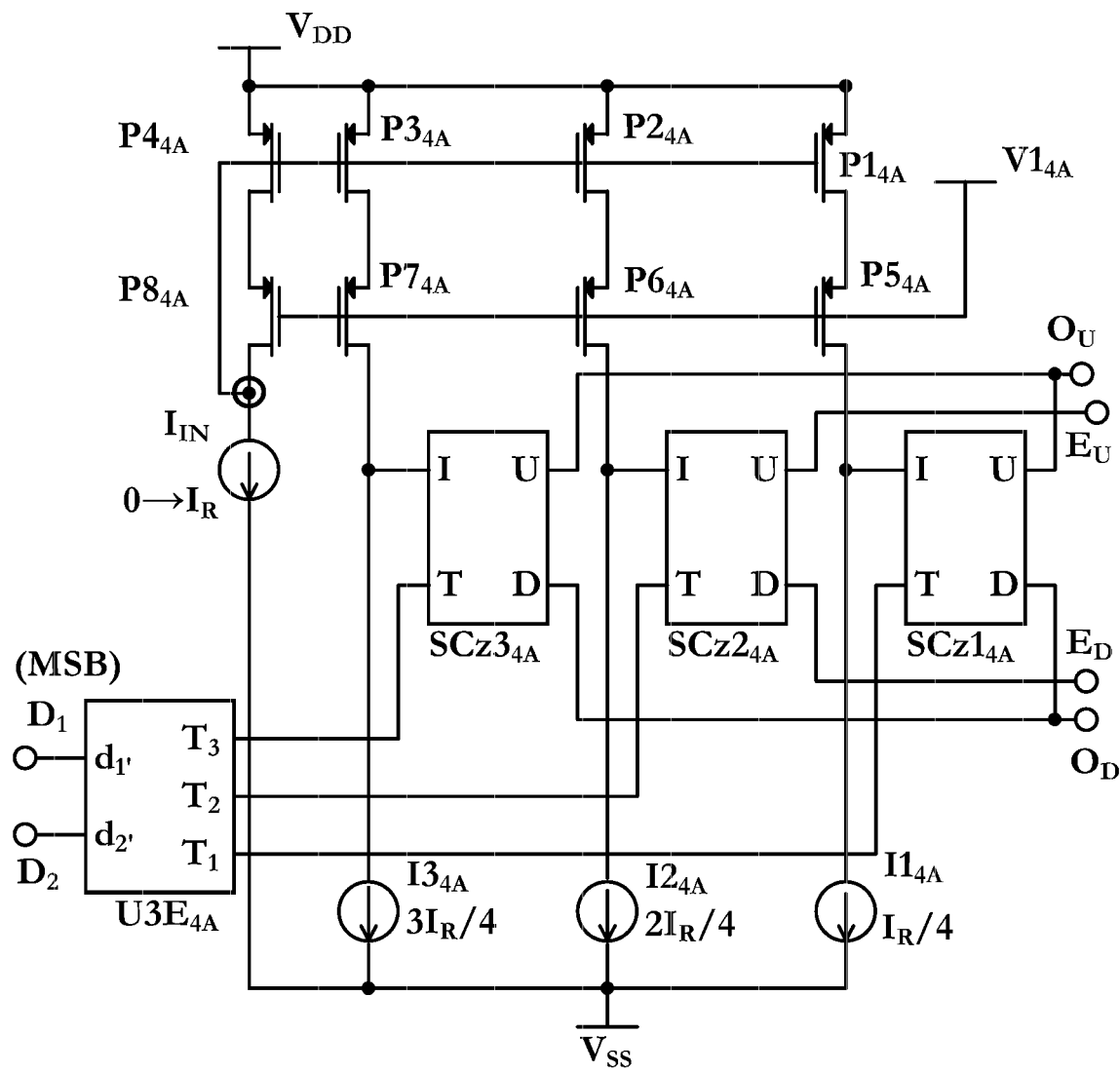
FIG. 4A is a circuit block diagram of an embodiment illustrating a flash iADC (referred to as ADC2x cell) that utilizes signal conditioning circuits SCz.

Section 4A—Description of FIG. 4A

FIG. 4A is a circuit block diagram of an embodiment illustrating a flash iADC (referred to as ADC2x cell) that utilizes signal conditioning circuits SCz. As a reminder, the SCz's circuit schematic is illustrated in FIG. 1A, and SCz's block diagram is illustrated in FIG. 1K. The ADC2x cell block diagram is described (and illustrated) in section 4B (FIG. 4B).

Also, keep in mind that FIG. 4B of ADC2x will be utilized later to illustrate a multi-stage iADC with extended resolution.

The ADC2x is illustrated as having 2-bits of resolution (i.e., n=2), which is not as a limitation of the disclosed invention, but for illustrative and descriptive clarity. Higher resolution flash iADC (e.g., 6-bits with calibration for higher accuracy) can be arranged by utilizing the disclosed flash ADC2x.

The ADC2x has an analog input port (A) where an $I_{IN}$ (whose range traverses between zero scale=0 and full scale=$I_R$) is inputted, and copied $2^n-1=3$ times via input signal current mirrors $P4_{4A}$ through $P1_{4A}$ (and the input signal current mirror's respective cascodes $P8_{4A}$ through $P5_{4A}$).

Be mindful that ADC2x has an analog current reference input port, REF, which is inputted with $I_R$ that is then mirrored onto the iADC's internal reference current network. The iADC's internal reference current network is thermometer weighted comprising of $2^n-1=3$ reference current sources, which are depicted as $I1_{4A}=3\times I_R/4$, $I1_{4A}=2\times I_R/4$, and $I1_{4A}=1\times I_R/4$.

The ADC2x has a digital output port that is 2-bit wide comprising of $D_1$ (MSB) $D_2$ (LSB). The ADC2x has four analog output port $O_U$, $E_U$, $O_D$, and $E_D$, which provide the signals needed to generate an equilateral triangular waveform or the $i_{LSP}$, which is explained later in this section.

Keep in mind that the objective of generating an $i_{LSP}$ as a least significant portion (LSP) analog current signal is to be able to feed the $i_{LSP}$ onto the input of a second stage iADC (for $i_{LSP}$ to be digitized) in order to extend the overall resolution of iADC.

Also, consider that when the $i_{LSP}$ follows an equilateral triangular waveform pattern, it helps the dynamic response of the second stage iADC (that receives $i_{LSP}$ as an input) since $i_{LSP}$ avoid pulse signals (i.e., right-angled triangular waveform) between its zero-scale and full-scale.

Here is how the ADC2x's digital outputs and the four analog outputs at $O_U$, $E_U$, $O_D$, and $E_D$ are generated: The difference current signal ($\Delta i$) between copy of $I_{IN}$ (e.g., $I_D$ of $P3_{4A}$) and its respective thermometer current reference (e.g., $3I_R/4$) is fed onto the signal conditioning circuit SCz (e.g., $SCz3_{4A}$). If the polarity of $\Delta i > 0$, then the SCz's digital output bit T=1 and $\Delta i$ is steered through the analog D (i.e., down) port of SCz (e.g., $SCz3_{4A}$). Conversely, if the polarity of $\Delta i < 0$, then the SCz's digital output bit T=0 and $\Delta i$ is steered through the analog U (i.e., up) port of SCz (e.g., $SCz3_{4A}$).

The SCz's respective digital output bits T are inputted to a digital thermometer to binary encoder U3E that outputs $D_1$ and $D_2$ (e.g., $U3E_{4A}$'s the logic diagram is illustrated in FIG. 2B, and $U3E_{4A}$'s block diagram is illustrated in FIG. 2i).

The currents in the D ports of odd numbered SCz (e.g., $SCz3_{4A}$ and $SCz1_{4A}$) are summed at the $O_D$ port. The currents in the D ports of even numbered SCz (e.g., $SCz2_{4A}$) are summed at the $E_D$ port. The currents in the U ports of odd numbered SCz (e.g., $SCz3_{4A}$ and $SCz1_{4A}$) are summed at the $O_U$ port. The currents in the U ports of even numbered SCz (e.g., $SCz2_{4A}$) are summed at the $E_U$ port.

The SCt circuit combines the respective currents from $O_U$, $E_U$, $O_D$, and $E_D$ ports to generate an $i_{LSP}$ which can be fed into the input of a second stage iADC (for $i_{LSP}$ to be digitized) in order to extend the overall resolution of an iADC. In effect, for the odd numbered SCzs, the difference between the U and D output currents are summed ($\Sigma\Delta_O$). For the even numbered SCzs, the difference between the U and D output currents are summed ($\tau\Delta_E$). Then, $i_{LSP}=\Sigma\Delta_O - \Sigma\Delta_E$ $s\times I_R$, wherein $s\times I_R$ is a scaled reference current that is an offset current.

As a reminder, the circuit schematic illustrated in FIG. 1H is the signal conditioning circuit SCt whose cell block diagram is depicted in FIG. 1P.

Figure 8A:
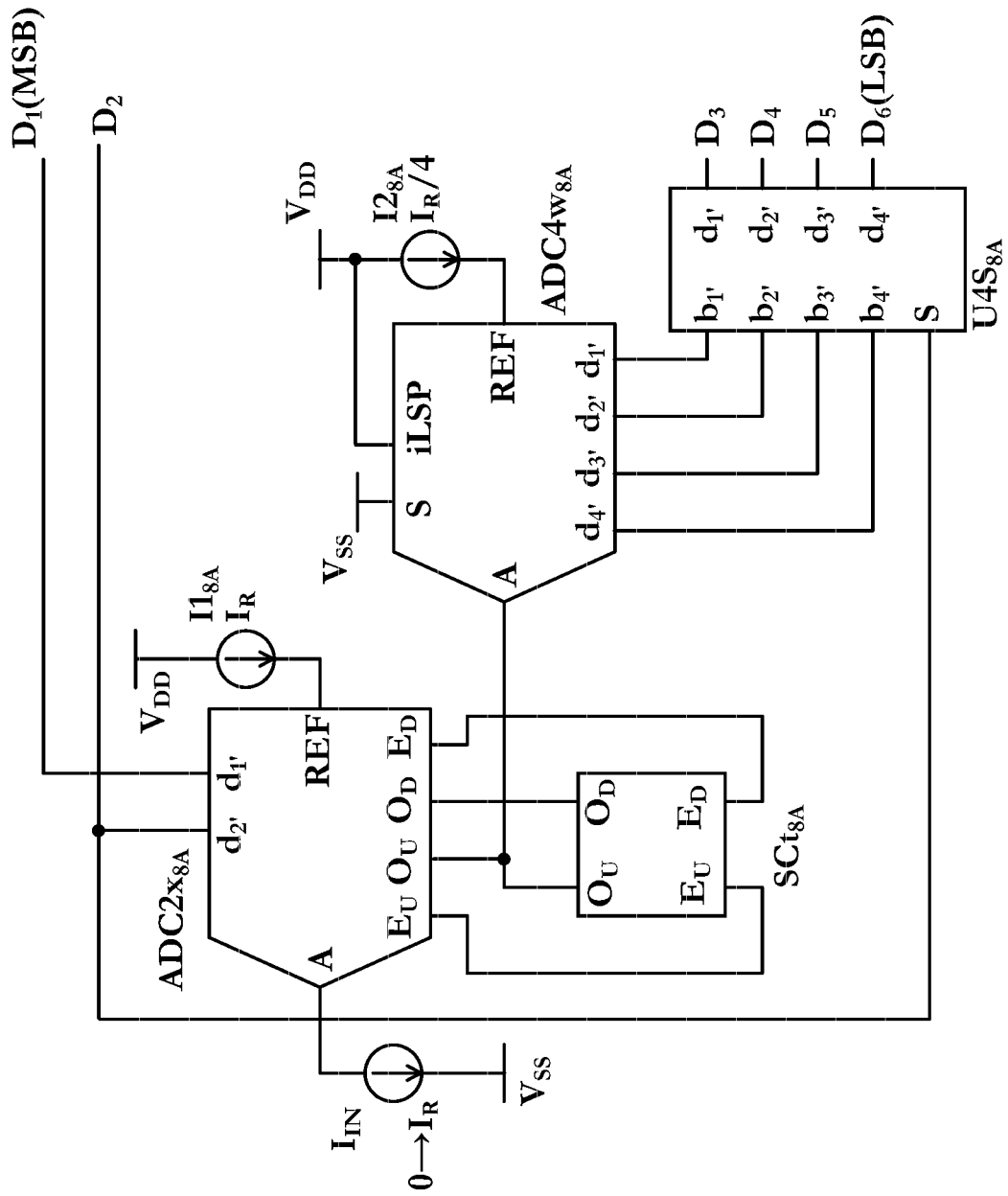
FIG. 8A is a circuit diagram that illustrates an embodiment of a multi-stage iADC comprising of a first sub-iADC disclosed (and illustrated) in section 4A (FIG. 4A) and a second sub-iADC disclosed (and illustrated) in section 3B (FIG. 3B).

Moreover, section 8A and FIG. 8A describe and illustrate the combination of a SCt or SCt' and ADC2x with a second iADC to extend the overall resolution of an iADC.

In summary some of the benefits of the iADCs of FIG. 4A described in this disclosure are:

First, the iADC operates in current mode and benefits from current mode operations, which were explained earlier.

Second, the iADC is a flash iADC and its inherently fast since an analog input signal is compared with thermometer weighted current reference signals in parallel which can simultaneously generate a digital output representation of the analog input signal.

Third, the iADC is asynchronous and does not require a free running clock. As such, the digital noise and dynamic power consumption associated with iADCs requiring free running clocks is avoided.

Fourth, analog computation and digital computation occur concurrently with almost little to no interference with one another.

Fifth, instead of right-angled triangular waveforms (i.e., zero-scale to full-scale pulse) the difference analog current signals out of SCzs, that are later combined to generate an iLSP signal, are equilateral triangular waveforms (i.e., no zero-scale to full-scale pulse), which helps the dynamic response of the second stage iADCs.

Sixth, the disclosed iADC is not restricted in its operating current magnitude. It can operate in subthreshold for ultra-low current or normal region with higher currents for wider input current span and for higher speeds.

Seventh, the disclosed iADC architecture is flexible in that its resolution can be extended by coupling multiple iADCs together.

Section 4B—Description of FIG. 4B

FIG. 4B is a flash iADC block diagram for the flash ADC2x that is described and illustrated in section 4A and FIG. 4A, respectively. The flash iADC block diagram of FIG. 4B has an analog input port (A), an analog current reference input port (REF), four analog current output ports ($O_U$, $E_U$, $O_D$, and $E_D$), and a digital output port that is 2-bit wide and comprising of digital output bits $d_{1'}$ through $d_{2'}$, wherein $d_{1'}$ is the MSB and $d_{2'}$ is the LSB, unless otherwise specified.

Figure 5A:
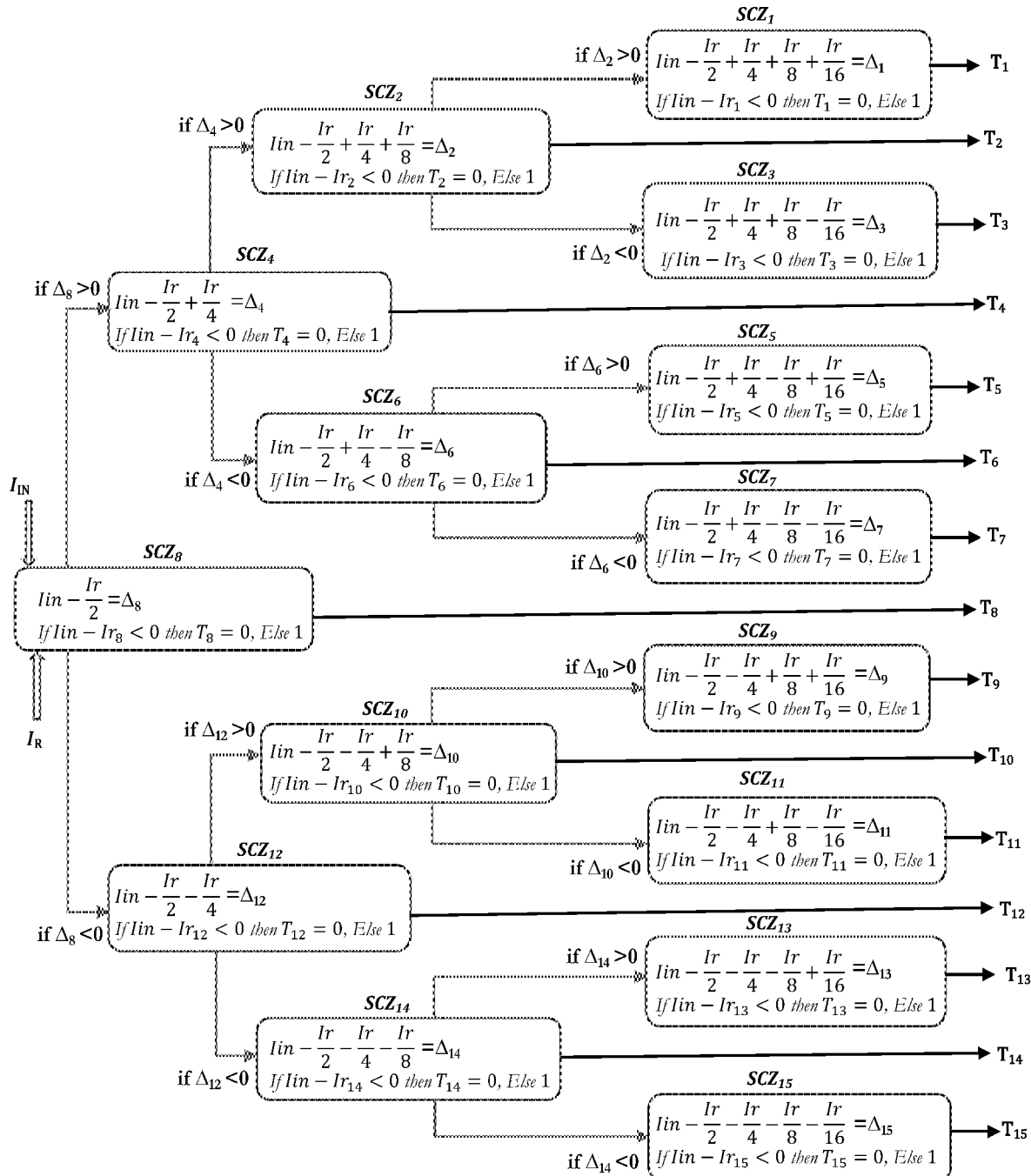
FIG. 5A is a flow chart diagram of a tree ADC method, illustrating a 4-bit iADC.

Section 5A—Description of FIG. 5A

FIG. 5A is a flow chart diagram of a tree ADC method, illustrating a 4-bit iADC.

Before discussing the FIG. 5A flow chart, the tree ADC method is described next.

The tree ADC method resembles a collection of linked tree forks, wherein the two outputs of each tree fork in a previous row link with inputs of two tree links in the next row. The tree ADC method is arranged with $2^n$ signal conditioning circuits (SCz) where each SCz forms a tree fork, wherein each SCz has an input and two outputs (left and right branches). Each of SCz's outputs are coupled with inputs of two subsequent SCz, wherein n is the ADC's resolution or ADC's number of digital output bits.

In the tree's first row, the tree fork # is $$2^n\left(\frac{1}{2}\right).$$

In the second row, the offshoot branches of the tree fork # is $$2^n\left(\frac{1}{2}\right)$$

are linked with tree fork $$\#2^n\left(\frac{1}{2}+\frac{1}{4}\right)$$

on its left side, and linked with tree fork $$\#2^n\left(\frac{1}{2}-\frac{1}{4}\right)$$

on its right side. In the third row there are four tree forks. The tree fork $$\#2^n\left(\frac{1}{2}+\frac{1}{4}\right)$$

has two offshoot branches: its left branch linking with tree fork $$\#2^n\left(\frac{1}{2}+\frac{1}{4}+\frac{1}{8}\right),$$

and its right branch linking with tree fork $$\#2^n\left(\frac{1}{2}+\frac{1}{4}-\frac{1}{8}\right).$$

Also, me tree fork $$\#2^n\left(\frac{1}{2}-\frac{1}{4}\right)$$

has two offshoot branches: its left branch linking with tree fork number $$2^n\left(\frac{1}{2}-\frac{1}{4}+\frac{1}{8}\right),$$

and its right branch linking with tree fork number $$2^n\left(\frac{1}{2}-\frac{1}{4}-\frac{1}{8}\right),$$

and so on.

For example, in a 3-bit ADC (or n=3), the ADC's tree fork in the first row is numbered as $$2^3\left(\frac{1}{2}\right)$$

or tree fork #4. In the ADC's second row, the tree fork #4's offshoots are linked with tree fork $$\#6 = 2^3\left(\frac{1}{2} + \frac{1}{4}\right)$$

and tree fork $$\#2 = 2^3\left(\frac{1}{2} - \frac{1}{4}\right).$$

In the third row there are four tree forks: The offshoots of the tree fork #6 are linked with tree fork $$\#7 = 2^3\left(\frac{1}{2} + \frac{1}{4} + \frac{1}{8}\right)$$

and tree fork $$\#5 = 2^3\left(\frac{1}{2} + \frac{1}{4} - \frac{1}{8}\right).$$

The offshoots of the tree fork #2 are linked with tree fork $$\#3 = 2^3\left(\frac{1}{2} - \frac{1}{4} + \frac{1}{8}\right)$$

and tree fork $$\#1 = 2^3\left(\frac{1}{2} - \frac{1}{4} - \frac{1}{8}\right),$$

and so on.

For a n-bit ADC, there are $2^{n-1}$ tree forks, wherein each tree fork is formed by a SCz. As such there are $2n^{-1}$ SCzs for an n-bit tree ADC, wherein SCzs are numbered in the same manner as their corresponding numbered tree fork described earlier.

A SCz has two outputs: A left-side port (U) analog output, and a right-side port (D) analog output.

The SCz receives a difference signal $\Delta s$ and steers a $+(|\Delta s|+\Delta s)/2$ to its U analog port, or $-(|\Delta s|-\Delta s)/2$ to its D analog port.

As such, a SCz steers $\Delta s$ onto the U analog port when $\Delta s$ is positive, and the SCz steers $-\Delta s$ onto the D analog port when $\Delta s$ is negative.

The SCz has a port (I) analog input, which receives a difference analog input signal ($\Delta s = s_i - \pm r \times s_r$) that is the difference between an analog signal ($s_i$) and a scaled reference signal ($\pm r \times s_r$), wherein $s_i$'s full-scale is equal to $s_r$ and $0 < r < 1$. Consider that r can be programmed in scale to arrange for a binary or non-linear weighted ADC. The SCz also generates a digital signal at its digital output port (T) that indicates the polarity of the $\Delta s$.

As stated earlier, if $\Delta s$ is positive, then SCz steers the analog output signal $\Delta s$ to the left-side analog port (U) of the SCz and a zero-analog output signal to the right-side analog port (D) of the SCz. If $\Delta s$ is negative, then SCz steers the analog output signal $\Delta s$ to the left-side analog port (D) of the SCz and a zero-analog out signal to the right-side analog port (U) the SCz.

The SCz $$\#2^n\left(\frac{1}{2}\right)$$

receives the ADC's analog input signal minus a half-scaled reference signal $$\left(\frac{1}{2} \times s_r\right)$$

in the row # i. The U analog output signal of the SCz $$\#2^n\left(\frac{1}{2}\right)$$

minus a scaled reference signal $-r \times s_r$ establish the $\Delta s = s_i - r \times s_r$ steered onto SCz $$\#2^n\left(\frac{1}{2} + \frac{1}{4}\right)$$

if $\Delta s$ is positive, otherwise $\Delta s = 0$ is steered onto SCz $$\#2^n\left(\frac{1}{2} + \frac{1}{4}\right).$$

The D analog output signal of the SCz $$\#2^n\left(\frac{1}{2}\right)$$

plus a scaled reference signal $+r \times s_r$ establish the $\Delta s = -s_i + r \times s_r$ steered onto SCz $$\#2^n\left(\frac{1}{2} - \frac{1}{4}\right)$$

if $\Delta s$ is negative, otherwise $\Delta s = 0$ is steered SCz $$\#2^n\left(\frac{1}{2} - \frac{1}{4}\right)$$

and so on.

Notice that the sign of scaled reference signal (e.g., $-r \times s_r$) that corresponds to a U analog output signal is the opposite to the sign of scaled reference signal (e.g., $+r \times s_r$) that corresponds to a D analog output signal.

Be mindful that the ADC's analog computation of $\Delta s = s_i - \pm r \times s_r$ in each SCz occurs nearly simultaneously with the generation of a digital output signal at the T port of the respective SCz, which indicates the polarity of $\Delta s$.

Also, note that for a binary weighted version of the disclosed tree ADC method, the scaled reference input signal ($\pm r \times s_r$) for each SCz is twice of the scaled reference input signal of the SCzs in the subsequent row.

In case of a binary weighted ADC, there would be $2^{n-1}$ of thermometer output codes (i.e., $2n^{-1}$ thermometer codes outputted for $2n^{-1}$ SCzs for an n-bit ADC). The respective thermometer codes at T ports of $2^{n-1}$ of SCzs (that is a $2^{n-1}$ bit wide digital word) is inputted to a digital encoder ($2^{n-1}$ inputs to n outputs) to generate the digital binary n-bit wide output word for the ADC.

As indicated earlier, the analog computation of $\Delta s = s_i - \pm r \times s_r$ in each SCz occurs in concert with the digital code generation for the respective SCz. As such, an analog computation of the $\Delta s$ signal, which is steered by an SCz output to the next SCz's input, is nearly independent of digital computation (i.e., ADC's digital code generation). This the ADC method minimizes glitch and jitter for the ADC's transfer function.

For example, in a 3-bit binary weighted ADC (or n=3), the ADC's SCz in the first row is numbered as $$2^3 \left( \frac{1}{2} \right)$$

or $SCz_4$. The difference input signal for $SCz_4$ is $$\Delta s_4 = s_i - \frac{1}{2} \times s_r$$

which is steered to either a left or a right side SCz of the next row, depending on polarity of $\Delta s_4$. If $\Delta s_4 > 0$, then $SCz_4$'s U analog output steers $\Delta s_4$ to a SCz numbered $$\#6 = 2^3 \left( \frac{1}{2} + \frac{1}{4} \right)$$

or $SCz_6$, which also receives a scaled reference signal of $$-\frac{1}{4} \times s_r.$$

In other words, for $SCz_6$ the $$\Delta s_6 = s_i - \frac{1}{2} \times s_r - \frac{1}{4} \times s_r = s_i - \left( \frac{1}{2} + \frac{1}{4} \right) \times s_r,$$

while $SCz_4$'s D analog output is zero (which is linked with $SCz_2$'s input). On the other hand, If $\Delta s_4 < 0$, then $SCz_4$'s D analog output steers $\Delta s_4$ to a SCz numbered $$\#2 = 2^3 \left( \frac{1}{2} - \frac{1}{4} \right)$$

or $SCz_2$, which also receives a scaled reference signal of $$+\frac{1}{4} \times s_r.$$

In other words, for $$\Delta s_2 = s_i - \frac{1}{2} \times s_r + \frac{1}{4} \times s_r = s_i - \left( \frac{1}{2} - \frac{1}{4} \right) \times s_r,$$

while $SCz_4$'s U analog output is zero (which is linked with $SCz_6$'s input)

Notice that in the example above, the scaled reference signal for $SCz_4$ (in the first row) is $$\frac{1}{2} \times s_r,$$

whereas the scaled reference signal for $SCz_2$ and $SCz_6$ (arranged in the second row) are half of that or $$\frac{1}{4} \times s_r.$$

Moreover, notice that the polarity of the scaled reference signal for $SCz_2$ and $SCz_6$ are the opposite of one another.

Next, FIG. 5A illustrates a flow chart of a tree ADC method in a binary weighted 4-bit current mode analog to digital converter (iADC). Illustrating a 4-bit iADC is for clarity of description and illustration, and not a limitation to the resolution of the tree ADC method, and depending on applications cost-performance requirements the resolution can be 16-bits, as an example.

On the left center of FIG. 5A, an analog input current signal ($I_{in}$) and an input reference current signal ($I_r$) are supplied to an iADC's $SCz_8$. As a reminder the first row's SCz number for a 4-bit iADC (n=4) is $$2^n \times \left( \frac{1}{2} \right) = 2^4 \times \left( \frac{1}{2} \right) = 8.$$

For $SCz_8$ block, $$I_{r8} = 2^3 \times \frac{I_r}{2^4} = I_r/2.$$

If $\Delta_8 = I_{in} - I_{r8} < 0$, then $T_8 = 0$ and $I_{in} - I_{r8} = I_{in} - I_r/2$ is steered onto $SCz_{12}$ and zero current is steered onto $SCz_4$. If $\Delta_8 = I_{in} - I_{r8} > 0$, then $T_8 = 1$ and $I_{in} - I_{r8} = I_{in} - I_r/2$ is steered onto $SCz_4$ and zero current is steered onto $SCz_{12}$.

For $SCz_{12}$ block that receives a non-zero $\Delta$ current signal, $$I_{r12} = (2^3 + 2^2) \times \frac{I_r}{2^4} = 3I_r/4.$$

If $\Delta_{12} = I_{in} - I_{r12} < 0$, then $T_{12} = 0$ and $I_{in} - I_{r12} = I_{in} - 3I_r/4$ is steered onto $SCz_{14}$ and zero current is steered onto $SCz_{10}$. If $\Delta_{12}=I_{in}-I_{r12}>0$, then $T_{12}=1$ and $I_{in}-I_{r12}=I_{in}-3I_r/4$ is steered onto $SCz_{10}$ and zero current is steered onto $SCz_{14}$.

For $SCz_4$ block that receives a non-zero $\Delta$ current signal, $$I_{r4} = (2^3 - 2^2) \times \frac{I_r}{2^4} = I_r/4.$$

If $\Delta_4=I_{in}-I_{r4}<0$, then $T_4=0$ and $I_{in}-I_{r4}=I_{in}-I_r/4$ is steered onto $SCz_6$ and zero current is steered onto $SCz_2$. If $\Delta_4=I_{in}-I_{r4}>0$, then $T_4=1$ and $I_{in}-I_{r4}=I_{in}-I_r/4$ is steered onto $SCz_2$ and zero current is steered onto $SCz_6$.

For $SCz_{14}$ block that receives a non-zero $\Delta$ current signal, $$I_{r14} = (2^3 + 2^2 + 2^1) \times \frac{I_r}{2^4} = 7I_r/8.$$

If $\Delta_{14}=I_{in}-I_{r14}<0$, then $T_{14}=0$ and $I_{in}-I_{r14}=I_{in}-7I_r/8$ is steered onto $SCz_{15}$ and zero current is steered onto $SCz_{13}$. If $\Delta_{14}=I_{in}-I_{r14}>0$, then $T_{14}=1$ and $I_{in}-I_{r14}=I_{in}-7I_r/8$ is steered onto $SCz_{13}$ and zero current is steered onto $SCz_{15}$.

For $SCz_{10}$ block that receives a non-zero $\Delta$ current signal, $$I_{r10} = (2^3 + 2^2 - 2^1) \times \frac{I_r}{2^4} = 5I_r/8.$$

If $\Delta_{10}=I_{in}-I_{r10}<0$, then $T_{10}=0$ and $I_{in}-I_{r10}=I_{in}-5I_r/8$ is steered onto $SCz_{11}$ and zero current is steered onto $SCz_9$. If $\Delta_{10}=I_{in}-I_{r10}>0$, then $T_{10}=1$ and $I_{in}-I_{r10}=I_{in}-5I_r/8$ is steered onto $SCz_9$ and zero current is steered onto $SCz_{11}$.

For $SCz_6$ block that receives a non-zero $\Delta$ current signal, $$I_{r6} = (2^3 - 2^2 + 2^1) \times \frac{I_r}{2^4} = 3I_r/8.$$

If $\Delta_6=I_{in}-I_{r6}<0$, then $T_6=0$ and $I_{in}-I_{r6}=I_{in}-3I_r/8$ is steered onto $SCz_7$ and zero current is steered onto $SCz_s$. If $\Delta_6=I_{in}-I_{r6}>0$, then $T_6=1$ and $I_{in}-I_{r6}=I_{in}-3I_r/8$ is steered onto $SCz_5$ and zero current is steered onto $SCz_7$.

For $SCz_2$ block that receives a non-zero $\Delta$ current signal, $$I_{r2} = (2^3 - 2^2 - 2^1) \times \frac{I_r}{2^4} = 1I_r/8.$$

If $\Delta_2=I_{in}-I_{r2}<0$, then $T_2=0$ and $I_{in}-I_{r2}=I_{in}-1I_r/8$ is steered onto $SCz_3$ and zero current is steered onto $SCz_1$. If $\Delta_2=I_{in}-I_{r2}>0$, then $T_2=1$ and $I_{in}-I_{r2}=I_{in}-1I_r/8$ is steered onto $SCz_i$ and zero current is steered onto $SCz_3$.

For $SCz_{15}$ block that receives a non-zero $\Delta$ current signal $$I_{r15} = (2^3 + 2^2 + 2^1 + 2^0) \times \frac{I_r}{2^4} = 15I_r/16.$$

If $\Delta_{15}=I_{in}-I_{r15}<0$, then $T_{15}=0$ and $\Delta_{15}=I_{in}-I_{r15}>0$, then $T_{15}=1$.

For $SCz_{13}$ block that receives a non-zero $\Delta$ current signal, $$I_{r13} = (2^3 + 2^2 + 2^1 - 2^0) \times \frac{I_r}{2^4} = 13I_r/16.$$

If $\Delta_{13}=I_{in}-I_{r13}<0$, then $T_{13}=0$ and $\Delta_{13}=I_{in}-I_{r13}>0$, then $T_{13}=1$.

For $SCz_{11}$ block that receives a non-zero $\Delta$ current signal, $$I_{r11} = (2^3 + 2^2 - 2^1 + 2^0) \times \frac{I_r}{2^4} = 11I_r/16.$$

If $\Delta_{11}=I_{in}-I_{r11}<0$, then $T_{11}=0$ and $\Delta_{11}=I_{in}-I_{r11}>0$, then $T_{11}=1$.

For $SCz_9$ block that receives a non-zero $\Delta$ current signal, $$I_{r9} = (2^3 + 2^2 - 2^1 - 2^0) \times \frac{I_r}{2^4} = 9I_r/16.$$

If $\Delta_9=I_{in}-I_{r9}<0$, then $T_9=0$ and $\Delta_9=I_{in}-I_{r9}>0$, then $T_9=1$.

For $SCz_7$ block that receives a non-zero $\Delta$ current signal, $$I_{r7} = (2^3 - 2^2 + 2^1 + 2^0) \times \frac{I_r}{2^4} = 7I_r/16.$$

If $\Delta_7=I_{in}-I_{r7}<0$, then $T_7=0$ and $\Delta_7=I_{in}-I_{r7}>0$, then $T_7=1$.

For $SCz_5$ block that receives a non-zero $\Delta$ current signal, $$I_{r5} = (2^3 - 2^2 + 2^1 - 2^0) \times \frac{I_r}{2^4} = 5I_r/16.$$

If $\Delta_5=I_{in}-I_{r5}<0$, then $T_5=0$ and $\Delta_5=I_{in}-I_{r5}>0$, then $T_5=1$.

For $SCz_3$ block that receives a non-zero $\Delta$ current signal, $$I_{r3} = (2^3 - 2^2 - 2^1 + 2^0) \times \frac{I_r}{2^4} = 3I_r/16.$$

If $\Delta_3=I_{in}-I_{r3}<0$, then $T_3=0$ and $\Delta_3=I_{in}-I_{r3}>0$, then $T_3=1$.

For $SCz_1$ block that receives a non-zero $\Delta$ current signal, $$I_{r3} = (2^3 - 2^2 - 2^1 - 2^0) \times \frac{I_r}{2^4} = 1I_r/16.$$

If $\Delta_1=I_{in}-I_{r1}<0$, then $T_1=0$ and $\Delta_1=I_{in}-I_{r1}>0$, then $T_1=1$.

As stated earlier, the thermometer codes $T_1$ through $T_{15}$ are inputted to a 15×4 (15-inputs to 4-outputs) digital encoder to generate the binary 4-bit digital outputs of the iADC. Be mindful that the tree ADC method is not limited to n=4 bits (or thermometer codes $T_1$ through $T_{15}$), which is arranged as such for clarity of description and illustrations.

Moreover, in proceeding sections, it will described how to combine the signals $\Delta_1$, $\Delta_3$, $\Delta_5$, $\Delta_7$, $\Delta_9$, $\Delta_{11}$, $\Delta_{13}$, and $\Delta_{15}$ to extend the resolution of an ADC, while utilizing the tree ADC method.

In summary the benefits of the tree ADC method are as follows:

First, the digital computation does not interfere with the ADC's analog computation, which facilitates arranging for a glitch free ADC.

Second, asynchronous (clock free) ADCs can be arranged, which reduces noise and dynamic power consumption (related to free running clocks).

Third, the accuracy of an ADC is dominated by the signal conditioning circuit (SCz) of the first row which can be optimized for accuracy, wherein thereafter the matching requirement for ADC's reference network diminishes (allowing for more area efficient reference network arrangement).

Figure 5B:
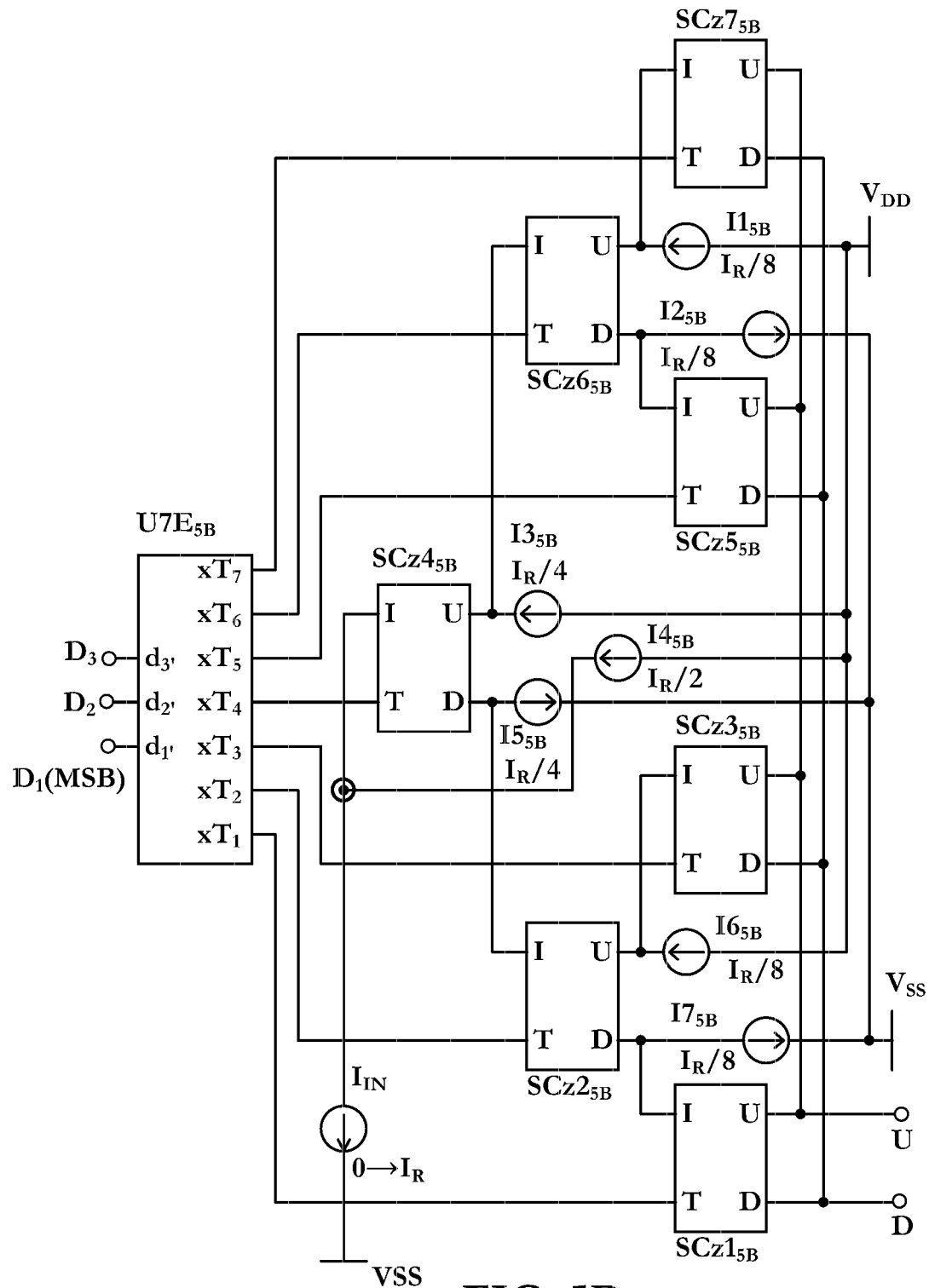
FIG. 5B is a circuit block diagram of an embodiment of a binary weighted 3-bit tree iADC that utilizes the tree ADC method described in section 5A.

Section 5B—Description of FIG. 5B

FIG. 5B is a circuit block diagram of an embodiment of a binary weighted 3-bit tree iADC that utilizes the tree ADC method described in section 5A. The 3-bit tree iADC of FIG. 5B is referred to as ADC3z cell (whose block diagram is provided in FIG. 5C). As a reminder, the 3-bit tree iADC of FIG. 5B utilizes SCz whose circuit schematic is illustrated in FIG. 1A, and SCz's block diagram is illustrated in FIG. 1K. The ADC3z cell block diagram is described (and illustrated) in section 5C (FIG. 5C).

Also, note that FIG. 5C of ADC3z will be utilized later to illustrate multi-stage iADC.

The ADC3z is illustrated as having 3-bits of resolution (i.e., n=3), which is not as a limitation of the disclosed invention, but for illustrative and descriptive clarity. Higher resolution tree iADC (e.g., 10-bits with calibration for higher accuracy) can be arranged by utilizing the disclosed tree iADC3z.

The ADC3z has an analog input port (A) that receives $I_{IN}$ (that traverses between zero scale=0 and full scale=$I_R$ amplitude).

The ADC3z has an analog current reference input port, REF, which is inputted with $I_R$ that is internally mirrored onto the tree iADC's internal reference current network. The binary weighted tree iADC's internal current reference network is comprising of $2^n-1=2^3-1=7$ 'positive' and 'negative' reference current sources (wherein the sign of the current depend on whether they are being sourced from $V_{DD}$ or sunk in $V_{SS}$). These positive and negative current sources are $I1_{5B}=1\times I_R/8$ sourced from $V_{DD}$, $I2_{5B}=1\times I_R/8$ sunk in $V_{SS}$, $I3_{5B}=2\times I_R/8$ sourced from $V_{DD}$, $I4_{5B}=4\times I_R/8$ sourced from $V_{DD}$, $I5_{5B}=2\times I_R/8$ sunk in $V_{SS}$, $I6_{5B}=1\times I_R/8$ sourced from $V_{DD}$, and $I7_{5B}=1\times I_R/8$ sunk in $V_{SS}$.

The ADC3z has a digital output port that is 3-bit wide comprising of $D_1$ (MSB) through $D_3$ (LSB). Notice that the T digital outputs of respective plurality of SCzs are received by the 7×3 digital encoder $U7E_{5B}$ whose logic block diagram is illustrated in FIG. 2A (section 2A), and its block diagram is depicted in FIG. 2H (section 2H).

The ADC3z has two analog output ports U and D, whose signal's combination are needed to generate an equilateral triangular waveform or the $i_{LSP}$ (that will be fed into a second ADC to extend resolution), which is explained later in this section. Otherwise, analog output ports U and D can be coupled with $V_{DD}$ and $V_{SS}$, respectively.

Here is how ADC3z operates: Let $I_R$=32 nA and ramp $I_{IN}$ from 0 to +32 nA in t μs. Thus, the input current into $SCz4_{5B}$ traverses from −16 nA to +16 nA in t μs. The current out of the D port of $SCz4_{5B}$ traverses from −16 nA to 0 in the first t/2 μs and remains at 0 for the second t/2 μs. The Current out of the U port of $SCz4_{5B}$ remains at 0 in the first t/2 μs and traverses from 0 to −16 nA for the second t/2 μs.

Considering $$I5_{5B} = \frac{I_R}{4} = 8nA$$

is added at the D port of $SCz4_{5B}$, the current into the I port of $SCz2_{5B}$ traverses from 8 nA to +8 nA in the first t/2 μs and remains at +8 nA for the second t/2 μs. The current out of the D port of $SCz2_{5B}$ remains at 0 in the first t/4 μs, then traverses from 0 to 8 nA in the next t/4 μs, and then remains at −8 nA for the last t/2 μs. The Current out of the U port of $SCz2_{5B}$ traverses from 8 nA to 0 in the first t/4 μs and then remains at 0 to for the remainder of second 3t/4 μs.

In view of $$I3_{5B} = \frac{I_R}{4} = 8nA$$

that is subtracted at the U port of $SCz4_{5B}$, the current into the I port of $SCz6_{5B}$ remains at +8 nA in the first t/2 μs and then it traverses from +8 nA to −8 nA for the second t/2 μs. The current out of the D port of $SCz6_{5B}$ remains at +8 nA in the first t/2 μs, then traverses from +8 nA to 0 in the next t/4 μs, and then remains at 0 for the last t/4 as. The Current out of the U port of $SCz2_{5B}$ remains at 0 in the first 3t/4 μs and then ramps from 0 to −8 nA for the remainder of second t/4 μs.

Also, considering $$I7_{5B} = \frac{I_R}{8} = 4nA$$

is added at the D port of $SCz2_{5B}$, the current into the I port of $SCz1_{5B}$ traverses from +4 nA to −4 nA in the first t/4 μs and remains at −4 nA for the remainder 3t/4 μs. The current out of the D port of $SCz1_{5B}$ traverses from +4 nA to 0 in the first t/8 μs and remains at 0 for the next 7t/8 μs. The Current out of the U port of $SCz1_{5B}$ remains at 0 in the first t/8 μs, traverses from 0 to −4 nA to 0 in the next t/8 μs, and then remains at −4 nA to for the remainder of second 3t/4 μs.

In light of $$I6_{5B} = \frac{I_R}{8} = 4nA$$

that is subtracted at the U port of $SCz2_{5B}$, the current into the I port of $SCz3_{5B}$ remains at +4 nA in the first t/4 μs, traverses from +4 nA to −4 nA for the second t/4 μs, and remains at −4 nA in the last t/2 μs. The current out of the D port of $SCz3_{5B}$ remains at +4 nA in the first t/4 μs, traverses from +4 nA to 0 in the next t/8 as, and remains at 0 in the last 5t/8 μs. The current out of the U port of $SCz3_{5B}$ remains at 0 in the first 3t/8 μs, traverses from 0 to +4 nA in the next t/8 as, and remains at −4 nA in the last t/2 μs.

Bearing in mind that $$I2_{5B} = \frac{I_R}{8} = 4nA$$

is added at me D port of $SCz6_{5B}$, the current into the I port of $SCz5_{5B}$ remains at +4 nA in the first t/2 μs, then traverses from +4 nA to −4 nA for the second t/4 μs, and remains at −4 nA in the last t/4 μs. The current out of the D port of $SCz5_{5B}$ remains at +4 nA in the first t/2 μs, then traverses from +4 nA to 0 in the next t/8 μs, and lastly remains at 0 for the next 3t/8 μs. The Current out of the U port of $SCz5_{5B}$ remains at 0 in the first 5t/8 μs, traverses from 0 to −4 nA in the next t/8 μs, and then remains at −4 nA to for the remainder of second t/4 μs.

Also, considering $$I1_{5B} = \frac{I_R}{8} = 4nA$$

is subtracted at the U port of SCz6$_{5B}$, the current into the I port of SCz7$_{5B}$ remains at +4 nA in the first 3t/4 µs, and then traverses from +4 nA to −4 nA in the last t/4 µs. The current out of the D port of SCz7$_{5B}$ remains at 4 nA in the first 3t/4 µs, then traverses from 4 nA to 0 in the next t/8 µs, and lastly remains at 0 in the last t/8 µs. The current out of the U port of SCz7$_{5B}$ remains at 0 in the first 7t/8 µs, and then traverses from 0 to −4 nA in the next t/8 µs.

The T digital output of SCz7$_{5B}$ flips from high-state to low-state at t/8 µs. The T digital output of SCz6$_{5B}$ flips from high to low at 2t/8 µs. The T digital output of SCz5$_{5B}$ flips from high to low at 3t/8 µs. The T digital output of SCz4$_{5B}$ flips from high to low at 4t/8 µs. The T digital output of SCz3$_{5B}$ flips from high to low at 5t/8 µs. The T digital output of SCz2$_{5B}$ flips from high to low at 6t/8 µs. The T digital output of SCz1$_{5B}$ flips from high to low at 7t/8 µs. The respective T digital outputs of SCz7$_{5B}$ through SCz1$_{5B}$ are inputted to U7E$_{5B}$ that is a 7×3 thermometer-to-binary code encoder, which generates the ADCz digital output bits $D_1$ (MSB) through $D_3$ (LSB), as the digital representation of analog input signal $I_{in}$ of ADCz when $I_{in}$ traverses from zero to full-scale ($I_{in}$=+32 nA)

In the last row of SCzs, an $i_{LSP}$ can be generated by subtracting the sum of analog output currents in the D port of SCz7$_{5B}$, SCz5$_{5B}$, SCz3$_{5B}$, and SCz1$_{5B}$ form the analog output currents in the U port of SCz7$_{5B}$, SCz5$_{5B}$, SCz3$_{5B}$, and SCz1$_{5B}$. The $i_{LSP}$ is a peak-to-peak $$4nA = \frac{I_r}{2^n} = \frac{I_r}{2^3} = \frac{32nA}{2^n}$$

saw-tooth current waveform while riding-on an offset current of $$12nA = \frac{I_r}{2^n} + \frac{I_r}{2^{n-1}} = (32nA)\left(\frac{1}{4} + \frac{1}{8}\right).$$

The $i_{LSP}$ saw-tooth current waveform is an equilateral (e.g., no step or pulse between zero and full scale, but instead a sequence of 4 nA full-scale to zero-scale ramp-down in t/8 µs followed by a zero-scale to 4 nA full-scale ramp up in t/8 µs). The $i_{LSP}$ can be inputted to a second iADC to extend the resolution of the overall iADC, which will be described later in this disclosure In summary some of the benefits of the tree iADC of FIG. 5B described in this disclosure are:

First, the tree iADC operates in current mode and benefits from current mode operations, which were explained earlier.

Second, the digital computation does not interfere with the tree iADC's analog computation, which facilitates arranging for a glitch free iADC.

Third, the tree iADC is asynchronous and does not require a free running clock. As such, the digital noise and dynamic power consumption associated with ADCs requiring free running clocks is avoided.

Fourth, the accuracy of the tree iADC is dominated by the signal conditioning circuit (SCz) of the first row which can be optimized for accuracy, wherein thereafter the matching requirement for iADC's reference network diminishes (allowing for more area efficient reference network arrangement).

Fifth, instead of right-angled triangular waveforms (i.e., zero-scale to full-scale step-function or pulse) the sum of the difference of analog current signals out of SCz's D and U ports in the last row, form an $i_{LSP}$ equilateral triangular waveform (i.e., no zero-scale to full-scale pulse), which helps the dynamic response of a second stage iADCs that receives the $i_{LSP}$ signal.

Sixth, the disclosed tree iADC is not restricted in its operating current magnitude. It can operate in subthreshold for ultra-low current or normal region with higher currents for wider input current span and for higher speeds.

Seventh, the disclosed iADC architecture is flexible in that its resolution can be extended by coupling multiple iADCs together.

Eight, the speed of the iADC is dominated by one SCz with the smallest difference input signal (i.e., input and reference difference signal as overdrive signal). However, the remaining SCz that are imbalanced with larger input and reference overdrive signal operate faster when performing their respective analog and digital computations, which enhances the overall speed of the iADC.

Ninth, $2^n$ replicates of the input current signal are needed in a conventional current mode n-bit flash iADC wherein mismatch between copies of the input current signal generates inaccuracies for the flash iADC. The disclosed current mode iADC does not require any replicates of that input current signal and avoids the corresponding mismatches and inaccuracies.

Section 5C—Description of FIG. 5C

FIG. 5C is a tree iADC block diagram for the tree ADC3z that is described and illustrated in section 5B and FIG. 5B, respectively. The tree iADC block diagram of FIG. 5B has an analog input port (A), an analog current reference input port (REF), four analog current output ports (U, and D), and a digital output port that is 3-bit wide and comprising of digital output bits $d_{1'}$ through $d_{3'}$ wherein $d_{1'}$ is the MSB and $d_{3'}$ is the LSB, unless otherwise specified.

Figure 6A:
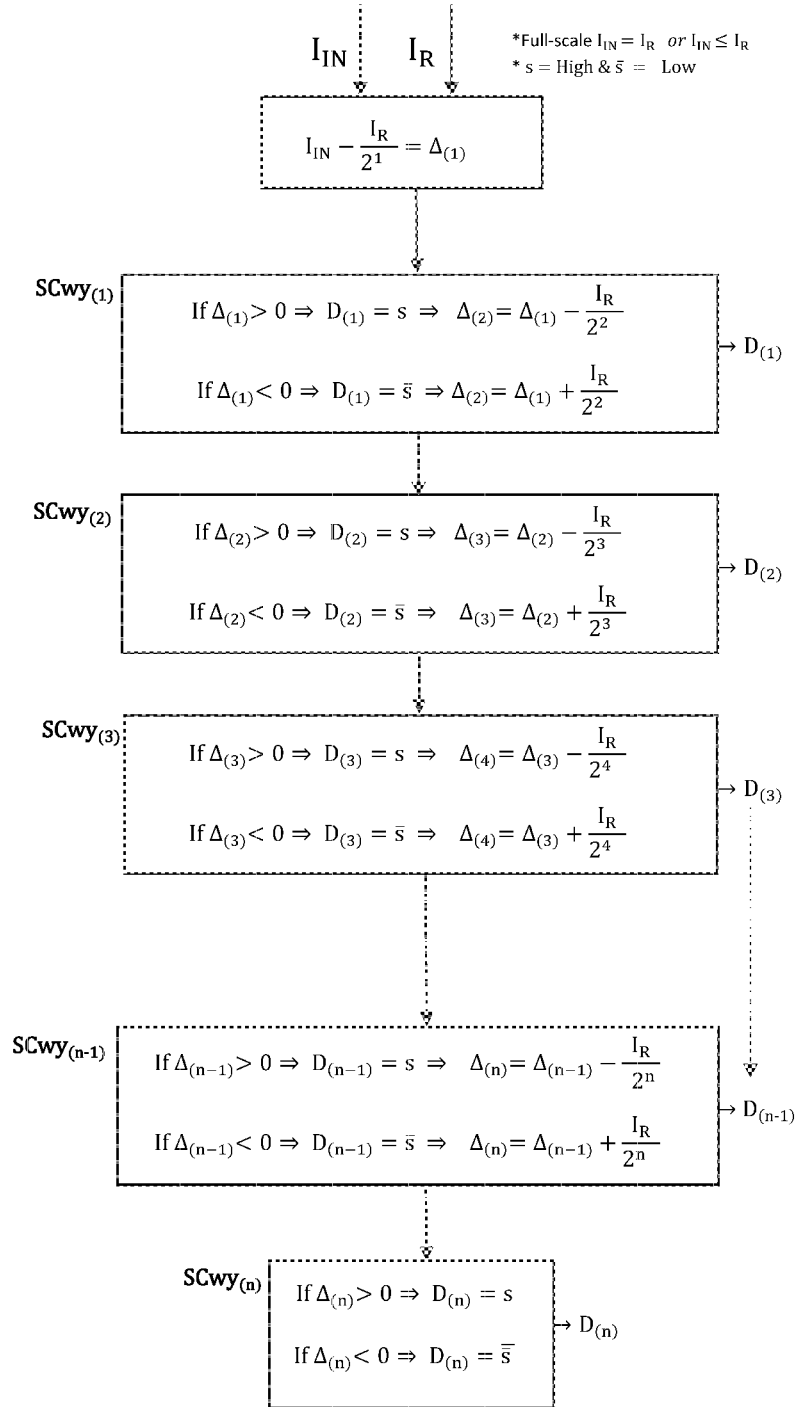
FIG. 6A is a flow chart that illustrates a simplified tree ADC method, by utilizing a sequential signal conditioning arrangement for a binary-weighted current mode ADC (iADC).

Section 6A—Description of FIG. 6A

FIG. 6A is a flow chart that illustrates a simplified tree ADC method, by utilizing a sequential signal conditioning arrangement for a binary-weighted current mode ADC (iADC). As a reminder, the tree ADC method is described in section 5A and illustrated in FIG. 5A.

The sequential signal conditioning that is implemented in an iADC here, utilizes the tree ADC method, as follows. First the iADC's input current is subtracted with a scaled reference current at half of full scale, and a first analog difference output signal $\Delta_{(1)}$ is produced:

$$I_{IN} - \frac{I_R}{2^1} = \Delta_{(1)}.$$

Bear in mind that $\Delta_{(n)}$ here refers to a output current signal that is the difference between an input current signal (e.g., $\Delta_{(n-1)}$) and a scaled reference current signal $$\left(\text{e.g., } \frac{I_R}{2^n}\right),$$

wherein n−1 is a signal conditioner (e.g., $SCwy_{(n-1)}$) that receives the analog current $\Delta_{(n-1)}$ as well as the $$\frac{I_R}{2^n}$$

and generates the digital output bit n−1, as well as analog difference current $\Delta_{(n)}$ which is inputted to the next signal conditioner (e.g., $SCwy_{(n)}$) as the sequential signal conditioning continues.

A first signal conditioner $SCwy_{(1)}$ performs the following analog current and digital computation: If $$\Delta_{(1)} > 0 \Rightarrow D_{(1)} = s \Rightarrow \Delta_{(2)} = \Delta_{(1)} - \frac{I_R}{2^2}.$$

Conversely, if $$\Delta_{(1)} < 0 \Rightarrow D_{(1)} = \bar{s} \Rightarrow \Delta_{(2)} = \Delta_{(1)} + \frac{I_R}{2^2}.$$

Keep in mind that sign S of the digital output bit (e.g., $D_{(1)}$=s) can be assigned as 1 or 0.

A second signal conditioner $SCwy_{(2)}$ performs the following analog current and digital computation:

$$\text{If } \Delta_{(2)} > 0 \Rightarrow D_{(2)} = s \Rightarrow \Delta_{(3)} = \Delta_{(2)} - \frac{I_R}{2^3}.$$

Conversely, it $$\Delta_{(2)} < 0 \Rightarrow D_{(2)} = \bar{s} \Rightarrow \Delta_{(3)} = \Delta_{(2)} + \frac{I_R}{2^3}.$$

A third signal conditioner $SCwy_{(3)}$ performs the following analog current and digital computation:

$$\text{If } \Delta_{(3)} > 0 \Rightarrow D_{(3)} = s \Rightarrow \Delta_{(4)} = \Delta_{(3)} - \frac{I_R}{2^4}.$$

Conversely, it $$\Delta_{(3)} < 0 \Rightarrow D_{(3)} = \bar{s} \Rightarrow \Delta_{(4)} = \Delta_{(3)} + \frac{I_R}{2^4}.$$

and so on.

As the above sequential analog and digital computation continues, a n−1 signal conditioner $SCwy_{(n-1)}$ performs the following analog current and digital computation:

$$\text{If } \Delta_{(n-1)} > 0 \Rightarrow D_{(n-1)} = s \Rightarrow \Delta_{(n)} = \Delta_{(n-1)} - \frac{I_R}{2^n}.$$

Conversely, if $$\Delta_{(n-1)} < 0 \Rightarrow D_{(n-1)} = \bar{s} \Rightarrow \Delta_{(n)} = \Delta_{(n-1)} + \frac{I_R}{2^n}.$$

Finally, if $\Delta_{(n)} > 0 \Rightarrow D_{(n)}$=s. Conversely, if $\Delta_{(n)} < 0 \Rightarrow D_{(n)}=\bar{s}$.

Here is a summary of some of the benefits of implementing sequential signal conditioning to simplify tree ADC method:

First, the disclosed method allows for a digital light design which helps reduces die size. The disclosed simplified tree ADC method, reduces number of computations and thus reduces circuit size and die cost. The disclosed simplified tree ADC method also lowers power consumptions of embodiments that implement the sequential signal conditioning in tree ADC method.

Second, implementing the sequential signal conditioning in current mode in a current mode ADC (that utilizes the tree ADC method) benefits from current mode operations, which were explained earlier.

Figure 6B:
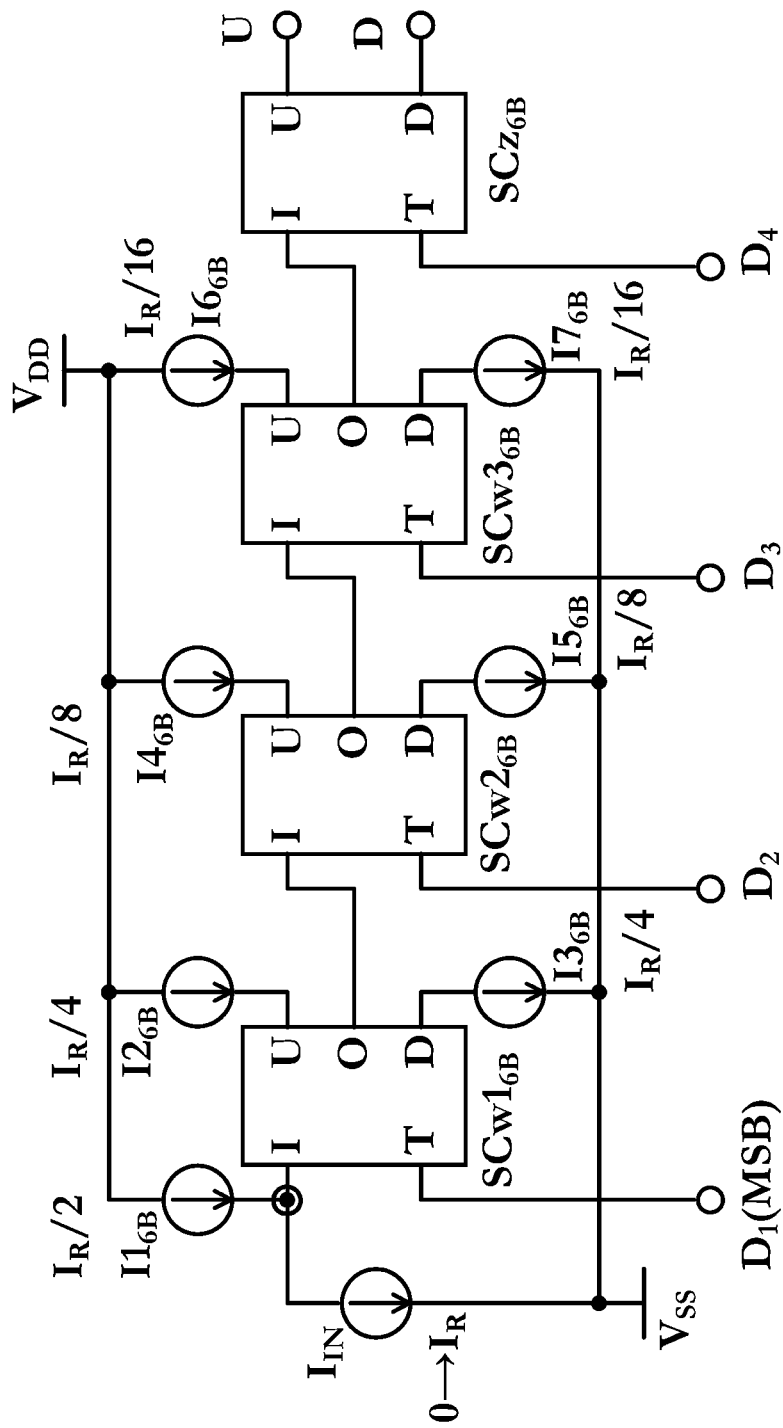
FIG. 6B is a circuit block diagram of an embodiment of a binary weighted 4-bit iADC that implements a sequential signal conditioning arrangement, while utilizing the tree ADC method disclosed in section 6A and illustrated in FIG. 6A.
Figure 6C:
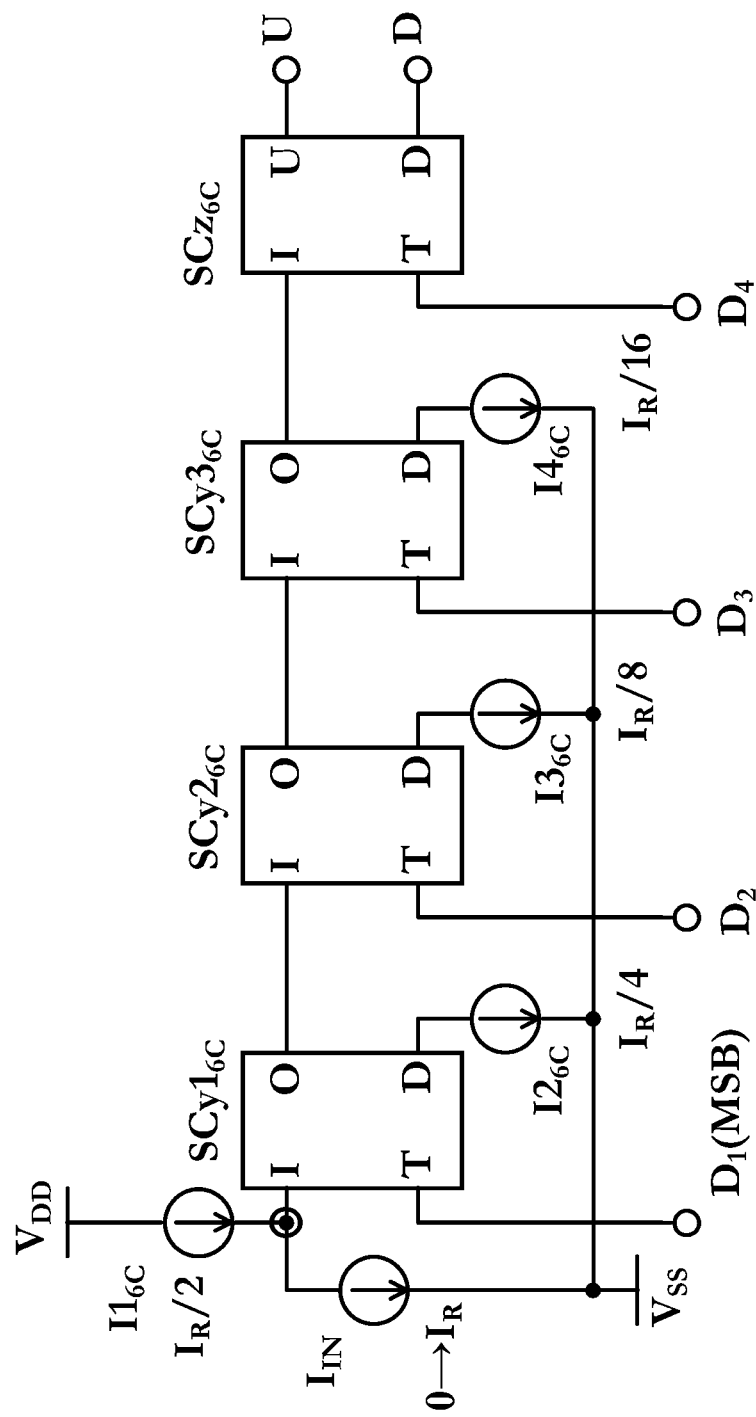
FIG. 6C is a circuit block diagram of another embodiment of a binary weighted 4-bit iADC that implements a sequential signal conditioning arrangement, utilizing the tree ADC method disclosed in section 6A and illustrated in FIG. 6A.
Figure 6D:
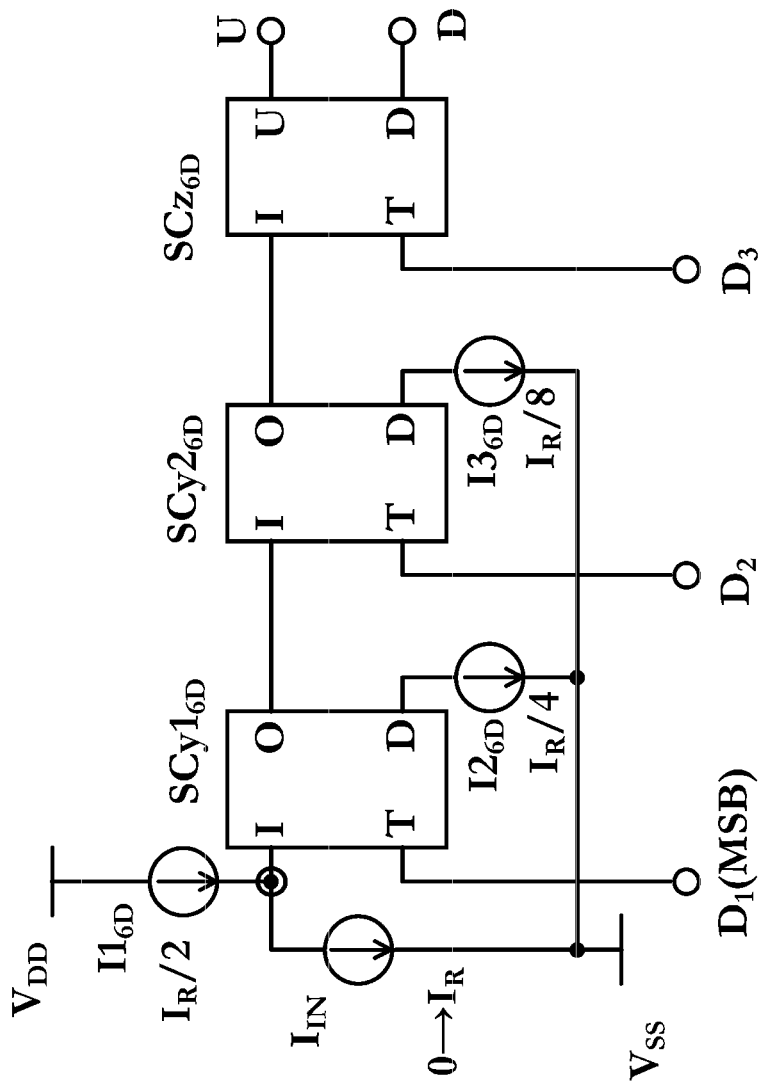
FIG. 6D is a circuit block diagram of an embodiment of a binary weighted 3-bit iADC that implements the sequential signal conditioning arrangement of the tree ADC method disclosed in section 6A and illustrated in FIG. 6A.

The disclosed sequential signal conditioning that utilizing the tree ADC method, is implanted in current mode ADCs described next in sections 6B (FIG. 6B), 6C (FIG. 6C), and 6D (FIG. 6D).

Section 6B—Description of FIG. 6B

FIG. 6B is a circuit block diagram of an embodiment of a binary weighted 4-bit iADC that implements a sequential signal conditioning arrangement, while utilizing the tree ADC method disclosed in section 6A and illustrated in FIG. 6A.

The embodiment of FIG. 6B's circuit, utilizes the tree ADC method with a sequential signal conditioning, which as noted earlier, simplifies the circuit and reduces the size and power consumption of an iADC.

Notice that the 4-bit tree iADC of FIG. 6B is referred to as ADC4u' cell (whose block diagram is provided in FIG. 6F).

Also, as a reminder, the 4-bit tree iADC of FIG. 6B utilizes SCw and SCz cells. The SCw's circuit schematic is illustrated in FIG. 1E, and SCw's block diagram is illustrated in FIG. 1N. The SCz's circuit schematic is illustrated in FIG. 1A, and SCz's block diagram is illustrated in FIG. 1K. Notice that SCw and SCz cells are comprised of simple minimum sized inverters and current switches, which makes the iADC simple and small.

Bear in mind that the iADC of FIG. 5B, which utilized the tree ADC method for FIG. 5A, is free of clock and relies on analog computation (that is generally independent of iADC's digital computation) to generate the iADC's output code. As such the iADC of FIG. 5B is glitch-free. The iADC of FIG. 6B utilizes the tree ADC method with a sequential signal conditioning, which relies on both sequential analog and sequential digital computation, and as such it is not glitch free. However, the sequential signal conditioning utilized in the tree ADC method, simplifies the iADC, which lowers power consumption and reduces die size and die cost.

The ADC4u' is illustrated as a binary weighted 4-bits (i.e., n=4) converter, which is not as a limitation of the disclosed invention, but for illustrative and descriptive clarity. Higher resolution iADC (e.g., 16-bits with calibration for higher accuracy) can be arranged by utilizing the disclosed tree iADC4u'.

The ADC4u' has an analog input port (A) that receives $I_{IN}$ (that traverses between zero scale=0 and full scale=$I_R$ amplitude).

The ADC4u' has an analog current reference input port, REF, which is inputted with $I_R$ that is internally mirrored onto the ADC4u''s internal reference current network. The binary weighted ADC4u''s internal current reference network is comprising of 7 'positive' and 'negative' reference current sources (wherein the sign of the current depends on whether they are being sourced from $V_{DD}$ or sunk in $V_{SS}$). These positive and negative current sources are $I1_{6B}=I_R/2$ sourced from $V_{DD}$, $I2_{6B}=I_R/4$ sourced from $V_{DD}$, $I3_{6B}=I_R/4$ sunk in $V_{SS}$, $I4_{6B}=I_R/8$ sourced from $V_{DD}$, $I5_{6B}=I_R/8$ sunk in $V_{SS}$, $I6_{6B}=I_R/16$ sourced from $V_{DD}$, and $I7_{6B}=I_R/16$ sunk in $V_{SS}$. Note that for a non-linear iADC, the current reference network may be arranged non-linearly.

The ADC4u' has a digital output port that is 4-bit wide comprising of $D_1$ (MSB) through $D_4$ (LSB). Notice that the T digital outputs of respective plurality of SCws provide the binary bits directly without any additional logic, which save area and reduces dynamic power consumption associated with digital logic.

The ADC4u' has two analog output ports U and D, whose signal's combination (e.g., current through the D port subtracted from the current through the U port) can be fed into a second ADC to extend the resolution of an overall ADC. Otherwise, analog output ports U and D can be terminated in $V_{DD}$ and $V_{SS}$, respectively.

Here is how a ADC4u' operates: Depending on the polarity of the T digital output of a SCw, a scaled reference current is either added or subtracted for the output current of the SCw before it is inputted to a next SCw. For binary weighted ADC4u' the scaled reference current is halved from one SCw to the next. For example, $I2_{6B}=I_R/4$ or $I3_{6B}=I_R/4$ (which are fed into the U and D current reference ports of $SCw1_{6B}$) are added or subtracted from the output of $SCw1_{6B}$ depending on the ($D_1$) digital output of $SCw1_{6B}$.

Let $I_R$=32 nA and ramp $I_{IN}$ from 0 to +32 nA in t µs. Thus, the input current into $SCw1_{5B}$ traverses from +16 nA to −16 nA in t µs.

The current out of the O port of $SCw1_{6B}$ (that is coupled with the I port of $SCw2_{6B}$) is a saw-tooth waveform that traverses from +16 nA to −16 nA in the first t/2 µs (steps from −16 nA to +16 nA at t/2 µs) and then traverses from +16 nA to −16 nA in the second t/2 µs.

The current out of the O port of $SCw2_{6B}$ (that is coupled with the I port of $SCw3_{6B}$) is also a saw-tooth waveform (at half the amplitude and twice the frequency of the previous SCw) that traverses from +8 nA to −8 nA in the first t/4 µs, traverses next from +8 nA to −8 nA in the second t/4 µs, also traverses next from +8 nA to −8 nA in the third t/4 µs, and lastly traverses next from +8 nA to −8 nA in the last t/4 µs.

The current out of the O port of $SCw3_{6B}$ (that is coupled with the I port of $SCz_{6B}$) is similarly a saw-tooth waveform (at again half the amplitude and twice the frequency of the previous SCw) that traverses from +4 nA to −4 nA in the first t/8 µs, traverses next from +4 nA to −4 nA in the second t/8 µs, also traverses next from +4 nA to −4 nA in the third t/8 µs, traverses next from +4 nA to −4 nA in the fourth t/8 µs, traverses from +4 nA to −4 nA in the fifth t/8 µs, traverses next from +4 nA to −4 nA in the sixth t/8 µs, also traverses next from +4 nA to −4 nA in the seventh t/8 µs, and lastly traverses from +4 nA to −4 nA in the last t/8 µs.

The respective T digital outputs of $SCw1_{6B}$ through $SCw3_{6B}$ followed by $SCz_{6B}$ are the binary digital outputs (MSB at $D_1$ through LSB at $D_4$) of the ADC4u'.

In summary some of the benefits of the iADCs of FIG. 6B described in this disclosure are:

First, the iADC operates in current mode and benefits from current mode operations, which were explained earlier.

Second, the disclosed iADC is simple. Utilizing the tree ADC method, wherein analog and digital signals in a SCy are conditioned by prior ones, simplifies the iADC which saves area and power consumption. Moreover, the digital outputs of the iADC are generated sequentially and synchronously without the need for any logic such as decoding or encoding. Thus, iADC size can be made small and dynamic power consumption associated with logic is minimized.

Third, the iADC is asynchronous and does not require a free running clock. As such, the digital noise and dynamic power consumption associated with iADCs requiring free running clocks is avoided.

Fourth, the disclosed iADC is not restricted in its operating current magnitude. It can operate in subthreshold for ultra-low current or normal region with higher currents for wider input current span and for higher speeds.

Fifth, the disclosed iADC architecture is flexible in that its resolution can be extended by coupling multiple iADCs together.

Section 6C—Description of FIG. 6C

Figure 6E:
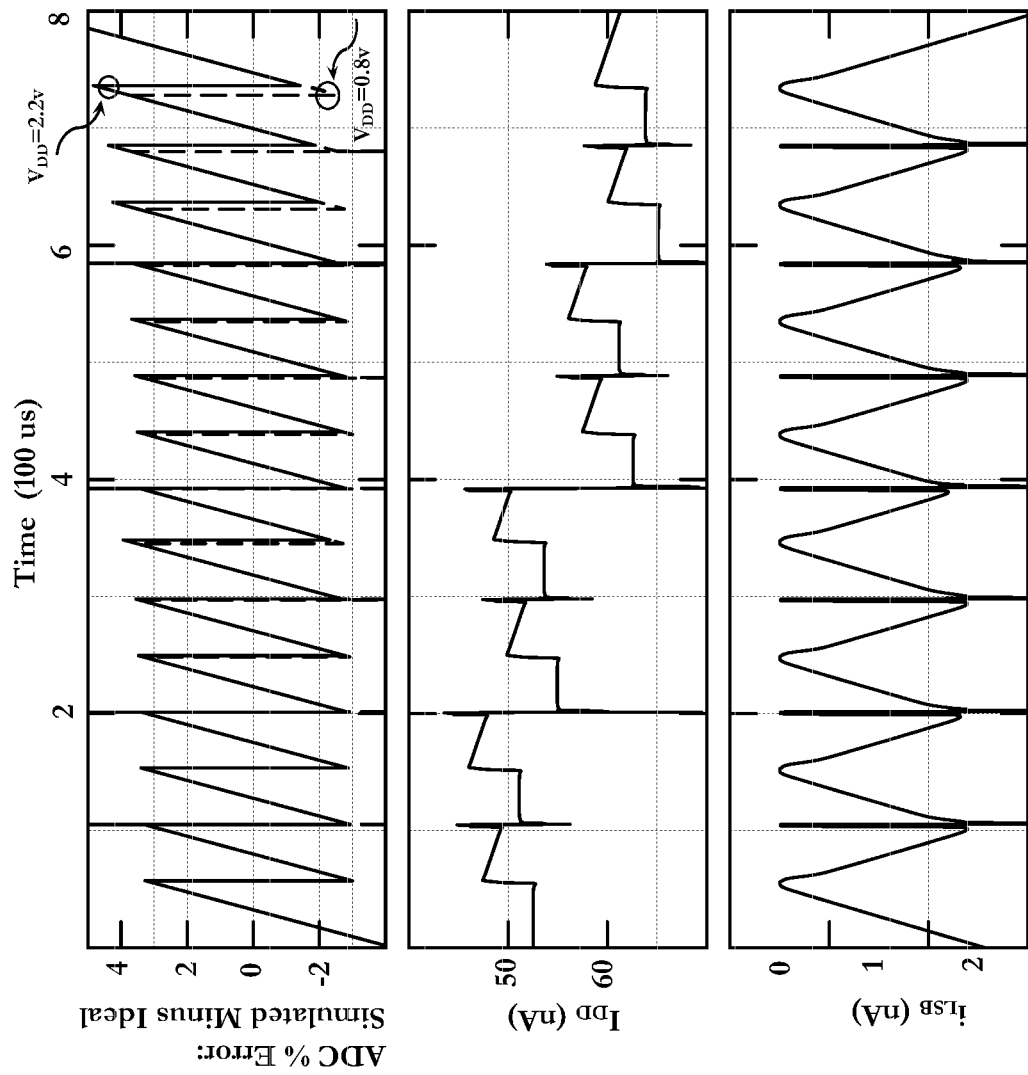
FIG. 6E is a circuit simulation showing waveforms of the iADC illustrated in FIG. 6C.

FIG. 6C is a circuit block diagram of another embodiment of a binary weighted 4-bit iADC that implements a sequential signal conditioning arrangement, utilizing the tree ADC method disclosed in section 6A and illustrated in FIG. 6A. Also keep in mind that FIG. 6E is a circuit simulation (which is described in section 6E) showing waveforms of the iADC illustrated here in FIG. 6C.

The embodiment of FIG. 6C's circuit, utilizes the tree ADC method with a sequential signal conditioning, which as stated earlier, simplifies the circuit and reduces the size and power consumption of an iADC.

Notice that the 4-bit tree iADC of FIG. 6C is referred to as ADC4u cell (whose block diagram is provided in FIG. 6G).

Keep in mind that the 4-bit iADC of FIG. 6C utilizes SCy and SCz cells. The SCy's circuit schematic is illustrated in FIG. 1D, and SCy's block diagram is illustrated in FIG. 1M. The SCz's circuit schematic is illustrated in FIG. 1A, and SCz's block diagram is illustrated in FIG. 1K.

As a reminder, the iADC of FIG. 5B was discussed earlier, which utilized the tree ADC method for FIG. 5A, is free of clock and relies on analog computation (that is generally independent of iADC's digital computation) to generate the iADC's output code. As such the iADC of FIG. 5B is glitch-free. The ADC4u of FIG. 6C utilizes the tree ADC method with a sequential signal conditioning, which relies on both sequential analog and sequential digital computation, and as such it is not a glitch free arrangement. The SCy circuit's analog signal conditioning consumes low current since it does not use inverters as gain elements. Also, SCy simplifies the iADC's current reference network by utilizing a switching current mirror inverter to flip the polarity of a single reference current source (that is linked to the analog output O port of SCy) which is also less glitchy. As such, the SCy improves the sequential signal conditioning function of the iADC with less glitch, less power consumption, and smaller silicon size (and less cost).

The ADC4u is illustrated as a binary weighted 4-bits (i.e., n=4) converter, which is not as a limitation of the disclosed invention, but for illustrative and descriptive clarity. Higher resolution tree iADC (e.g., 16-bits with calibration for higher precision) can be arranged by utilizing the disclosed iADC4u.

The ADC4u has an analog input port (A) that receives $I_{IN}$ (that traverses between zero scale=0 and full scale=$I_R$ amplitude).

The ADC4u has an analog current reference input port, REF, which is inputted with $I_R$ that is internally mirrored onto the ADC4u's internal reference current network. The binary weighted tree ADC4u's internal current reference network is comprising of $I1_{6c}=I_R/2$ sourced from $V_{DD}$, $I2_{6c}=I_R/4$ sunk in $V_{SS}$, $I3_{6c}=I_R/8$ sunk in $V_{SS}$, and $I4_{6c}=I_R/16$ sunk in $V_{SS}$. Note that for a non-linear iADC, the current reference network may be arranged non-linearly.

The ADC4u has a digital output port that is 4-bit wide comprising of $D_1$ (MSB) through $D_4$ (LSB). Notice that the T digital outputs of respective plurality of SCys (and the last SCz) provide the binary bits directly without any additional logic, which save area and reduces dynamic power consumption associated with digital logic.

The ADC4u has two analog output ports U and D, whose signal's combination (e.g., current through the D port subtracted from the current through the U port) can be fed into a second ADC to extend the resolution of an overall ADC. Otherwise, analog output ports U and D can be terminated in $V_{DD}$ and $V_{SS}$, respectively.

Here is how a ADC4u operates: Depending on the polarity of the T digital output of a SCy, a scaled reference current is either added or subtracted for the output current of the SCy before it is inputted to a next SCy. For binary weighted ADC4u the scaled reference current is halved from one SCy to the next. For example, $I2_{6c}=I_R/4$ which are fed into the analog D current reference ports of $SCy1_{6c}$ is added or subtracted from the output of $SCy1_{6c}$ depending on the ($D_1$) digital output of $SCy1_{6c}$. Notice that the $SCy1_{6c}$ is comprised of a signal conditioning function as well as a switching current mirror inverter, which adds or subtracts $I_R/4$ from $SCy1_{6c}$'s output (O) current depending on polarity of $D_1$.

Let $I_R=32$ nA and ramp $I_{IN}$ from 0 to +32 nA in t µs. Thus, the input current into $SCy1_{6c}$ traverses from +16 nA to −16 nA in t µs.

The current out of the O port of $SCy1_{6c}$ (that is coupled with the I port of $SCy2_{6c}$) is a saw-tooth waveform that traverses from +16 nA to −16 nA in the first t/2 µs (steps from −16 nA to +16 nA at t/2 µs) and then traverses from +16 nA to −16 nA in the second t/2 µs.

The current out of the O port of $SCy2_{6c}$ (that is coupled with the I port of $SCy3_{6c}$) is also a saw-tooth waveform (at half the amplitude and twice the frequency of the previous SCy) that traverses from +8 nA to −8 nA in the first t/4 µs, traverses next from +8 nA to −8 nA in the second t/4 µs, traverses next from +8 nA to −8 nA in the third t/4 µs, and lastly traverses next from +8 nA to −8 nA in the last t/4 µs.

The current out of the O port of $SCy3_{6c}$ (that is coupled with the I port of $SCz_{6c}$) is similarly a saw-tooth waveform (at again half the amplitude and twice the frequency of the previous SCy) that traverses from +4 nA to −4 nA in the first t/8 µs, traverses next from +4 nA to −4 nA in the second t/8 µs, traverses next from +4 nA to −4 nA in the third t/8 µs, traverses next from +4 nA to −4 nA in the fourth t/8 µs, traverses next from +4 nA to −4 nA in the fifth t/8 µs, traverses next from +4 nA to −4 nA in the sixth t/8 µs, traverses next from +4 nA to −4 nA in the seventh t/8 µs, and lastly traverses from +4 nA to −4 nA in the last t/8 µs.

The respective T digital outputs of $SCy1_{6c}$ through $SCy3_{6c}$ followed by $SCz_{6c}$ are the binary digital outputs (MSB at $D_1$ through LSB at $D_4$) of the ADC4u.

In summary some of the benefits of the iADCs of FIG. 6C described in this disclosure are:

First, the iADC operates in current mode and benefits from current mode operations, which were explained earlier.

Second, the disclosed iADC is simple. Utilizing the tree ADC method, wherein analog and digital signals in a SCy are conditioned by prior ones, simplifies the iADC which saves area and power consumption. Moreover, the digital outputs of the iADC are generated sequentially and synchronously without the need for any logic such as decoding or encoding. Thus, iADC size can be made small and dynamic power consumption associated with logic is minimized.

Third, the iADC is asynchronous and it does not require a free running clock. As such, digital noise and dynamic power consumption associated with iADCs requiring free running clocks is avoided.

Fourth, the disclosed iADC is not restricted in its operating current magnitude. It can operate in subthreshold for ultra-low current or normal region with higher currents for wider input current span and for higher speeds.

Fifth, the disclosed iADC architecture is flexible in that its resolution can be extended by coupling multiple iADCs together.

Section 6D—Description of FIG. 6D

FIG. 6D is a circuit block diagram of an embodiment of a binary weighted 3-bit iADC that implements the sequential signal conditioning arrangement of the tree ADC method disclosed in section 6A and illustrated in FIG. 6A. Notice that iADC of FIG. 6D (section 6D) here is a 3-bit version of the iADC of FIG. 6C (section 6C).

The embodiment of FIG. 6D's circuit, arranges the tree ADC method with a sequential signal conditioning, which as stated earlier, simplifies the circuit and reduces the size and power consumption of an iADC.

Notice that the 3-bit tree iADC of FIG. 6D is referred to as ADC3u cell (whose block diagram is provided in FIG. 6H).

Bear in mind that the 3-bit iADC of FIG. 6D utilizes SCy and SCz cells. The SCy's circuit schematic is illustrated in FIG. 1D, and SCy's block diagram is illustrated in FIG. 1M. The SCz's circuit schematic is illustrated in FIG. 1A, and SCz's block diagram is illustrated in FIG. 1K.

The ADC3u utilizes the tree ADC method with a sequential signal conditioning, which relies on both sequential analog and sequential digital computation, and as such it is not a glitch free arrangement. The SCy circuit's analog signal conditioning consumes low current since it does not use inverters as gain elements. Also, SCy simplifies the iADC's current reference network by utilizing a switching current mirror inverter to flip the polarity of a single reference current source (that is linked to the analog output O port of SCy) which is also less glitchy. As such, the SCy improves the sequential signal conditioning function of the iADC with less glitch, less power consumption, and smaller silicon size (and less cost).

The ADC3u is illustrated as a binary weighted 3-bits (i.e., n=3) converter, which is not as a limitation of the disclosed invention, but for illustrative and descriptive clarity. Higher resolution tree iADC (e.g., 16-bits with calibration for higher precision) can be arranged by utilizing the disclosed iADC3u.

The ADC3u has an analog input port (A) that receives $I_{IN}$ (that traverses between zero scale=0 and full scale=$I_R$ amplitude).

The ADC3u has an analog current reference input port, REF, which is inputted with $I_R$ that is internally mirrored onto the ADC3u's internal reference current network. The binary weighted tree ADC3u's internal current reference network is comprising of $I1_{6D}=I_R/2$ sourced from $V_{DD}$, $I2_{6D}=I_R/4$ sunk in $V_{SS}$, and $I3_{6D}=I_R/8$ sunk in $V_{SS}$. Note that for a non-linear iADC, the current reference network may be arranged non-linearly.

The ADC3u has a digital output port that is 3-bit wide comprising of $D_1$ (MSB) through $D_3$ (LSB). Notice that the T digital outputs of respective plurality of SCys (and the last SCz) provide the binary bits directly without any additional logic, which save area and reduces dynamic power consumption associated with digital logic.

The ADC3u has two analog output ports U and D, whose signal's combination (e.g., current through the D port subtracted from the current through the U port) can be fed into a second ADC to extend the resolution of an overall ADC. Otherwise, analog output ports U and D can be terminated in $V_{DD}$ and $V_{SS}$, respectively.

Here is how a ADC3u operates: Depending on the polarity of the T digital output of a SCy, a scaled reference current is either added or subtracted for the output current of the SCy before it is inputted to a next SCy. For binary weighted ADC3u the scaled reference current is halved from one SCy to the next. For example, $I2_{6D}=I_R/4$ which are fed into the analog D current reference ports of $SCy1_{6D}$ is added or subtracted from the output of $SCy1_{6D}$ depending on the ($D_1$) digital output of $SCy1_{6D}$. Notice that the $SCy1_{6D}$ is comprised of a signal conditioning function as well as a switching current mirror inverter, which adds or subtracts $I_R/4$ from $SCy1_{6D}$'s output (O) current depending on polarity of $D_1$.

Let $I_R=32$ nA and ramp $I_{IN}$ from 0 to +32 nA in t μs. Thus, the input current into $SCy1_{6D}$ traverses from +16 nA to −16 nA in t μs.

The current out of the O port of $SCy1_{6D}$ (that is coupled with the I port of $SCy2_{6c}$) is a saw-tooth waveform that traverses from +16 nA to −16 nA in the first t/2 μs (steps from −16 nA to +16 nA at t/2 μs) and then traverses from +16 nA to −16 nA in the second t/2 μs.

Finally, the current out of the O port of $SCy2_{6D}$ (that is coupled with the I port of $SCy3_{6D}$) is also a saw-tooth waveform (at half the amplitude and twice the frequency of the previous SCy) that traverses from +8 nA to −8 nA in the first t/4 μs, traverses next from +8 nA to −8 nA in the second t/4 μs, traverses next from +8 nA to −8 nA in the third t/4 μs, and lastly traverses next from +8 nA to −8 nA in the last t/4 μs.

The respective T digital outputs of $SCy1_{6D}$ through $SCy2_{6D}$ followed by $SCz_{6D}$ are the binary digital outputs (MSB at $D_1$ through LSB at $D_4$) of the ADC3u.

In summary some of the benefits of the iADCs of FIG. 6D described in this disclosure are:

First, the iADC operates in current mode and benefits from current mode operations, which were explained earlier.

Second, the disclosed iADC is simple. Utilizing the tree ADC method, wherein analog and digital signals in a SCy are conditioned by prior ones, simplifies the iADC which saves area and power consumption. Moreover, the digital outputs of the iADC are generated sequentially and synchronously without the need for any logic such as decoding or encoding. Thus, iADC size can be made small and dynamic power consumption associated with logic is minimized.

Third, the iADC is asynchronous and it does not require a free running clock. As such, digital noise and dynamic power consumption associated with iADC requiring free running clocks is avoided.

Fourth, the disclosed iADC is not restricted in its operating current magnitude. It can operate in subthreshold for ultra-low current or normal region with higher currents for wider input current span and for higher speeds.

Fifth, the disclosed iADC architecture is flexible in that its resolution can be extended by coupling multiple iADCs together.

Section 6E—Description of FIG. 6E

FIG. 6E is a circuit simulation showing waveforms of the iADC illustrated in FIG. 6C. Bear in mind that the illustrated simulations here is intended to further clarify the disclosed iADC's functionality and not as a limitation on the performance of the disclosed iADC.

The ADC4u of FIG. 6C is simulated by SPICE (Simulation Program with Integrated Circuit Emphasis) using mainstream 0.18 μm CMOS (Complementary Metal Oxide Semiconductor) transistor typical models.

The horizontal axis shows time in 100 micro-seconds (μs), where $I_{IN}$ of the iADC of FIG. 6C (ADC4u) is ramped from zero to full-scale 32 nA in 800 μs. The input reference current or $I_R$ of ADC4u is 32 nA.

In the upper segment of FIG. 6E, the simulated digital output codes ADC4u of FIG. 6C are fed onto an ideal current mode digital-to-analog-converter (iDAC). The difference (in %) between the analog input of ADC4u and the analog output of the ideal iDAC are plotted, which indicates the ADC4u deviation error (simulation minus ideal) in % format, when power supply $V_{DD}$ is 2.2v and 0.8v. Bear in mind that for a 4-bit iADC, Least-Significant-Bit (LSB) is $$\frac{1}{2^4} = 6.25\%,$$

which reflects the peak-to-peak % deviation error (saw-tooth waveform) in the upper segment of FIG. 6E.

In the middle segment of FIG. 6E is the simulated $I_{DD}$ or current consumption (in nano-ampere or nA) of ADC4u (of FIG. 6C).

In the bottom segment of FIG. 6E is the simulated $i_{LSP}$ (nA) current of ADC4u (of FIG. 6C), with a peak-to-peak amplitude of 2 nA (or 2 nA/32 nA=6.25%) wherein $i_{LSP}$ can be fed onto a second iADC in order to extend the resolution of ADC4u. As a reminder, $i_{LSP}$ represents the Least Significant Portion of $I_{IN}$ through ADC4u, which is derived by subtracting the analog output current of $SCz_{6C}$'s D port from that of its U port.

Section 6F—Description of FIG. 6F

FIG. 6F is an iADC block diagram for the ADC4u' that is described and illustrated in section 6B and FIG. 6B, respectively. The iADC block diagram of FIG. 6F has an analog input port (A), an analog current reference input port (REF), two analog current output ports (U and D), and a digital output port that is 4-bit wide and comprising of digital output bits $d_{1'}$ through $d_{4'}$, wherein $d_{1'}$ is the MSB and $d_{4'}$ is the LSB, unless otherwise specified.

Section 6G—Description of FIG. 6G

FIG. 6G is an iADC block diagram for the ADC4u that is described and illustrated in section 6C and FIG. 6C, respectively. The iADC block diagram of FIG. 6G has an analog input port (A), an analog current reference input port (REF),

US 10,797,718 B1

57 two analog current output ports (U and D), and a digital output port that is 4-bit wide and comprising of digital output bits $d_{1'}$ through $d_{4'}$, wherein $d_{1'}$ is the MSB and $d_{4'}$ is the LSB, unless otherwise specified.

Section 6H—Description of FIG. 6H

FIG. 6H is an iADC block diagram for the ADC3u that is described and illustrated in section 6D and FIG. 6D, respectively. The iADC block diagram of FIG. 6H has an analog input port (A), an analog current reference input port (REF), two analog current output ports (U and D), and a digital output port that is 3-bit wide and comprising of digital output bits $d_{1'}$ through $d_{3'}$, wherein $d_{1'}$ is the MSB and $d_{3'}$ is the LSB, unless otherwise specified.

Figure 7A:
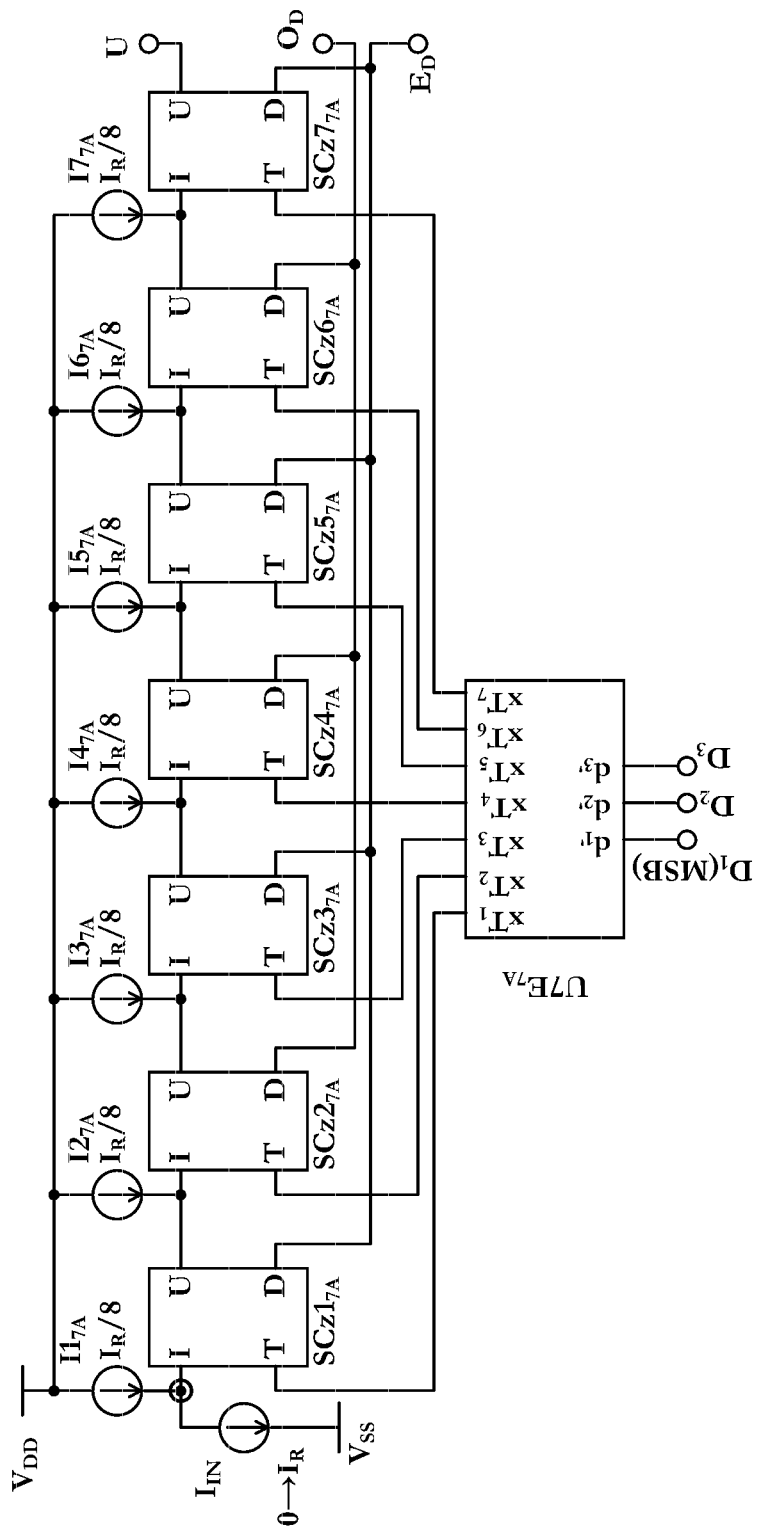
FIG. 7A is a circuit block diagram of an embodiment of a binary weighted 3-bit iADC that utilizes a thermometer reference current network.

Section 7A—Description of FIG. 7A

FIG. 7A is a circuit block diagram of an embodiment of a binary weighted 3-bit iADC that utilizes a thermometer reference current network. The 3-bit iADC of FIG. 7A is referred to as ADC3y cell (whose block diagram is provided in FIG. 7C). As a reminder, the 3-bit iADC of FIG. 7A utilizes SCz whose circuit schematic is illustrated in FIG. 1A, and SCz's block diagram is illustrated in FIG. 1K.

Also, note that FIG. 7C is the block diagram for ADC3y, which can be utilized later to illustrate multi-stage iADCs.

The ADC3y is illustrated as having 3-bits of resolution (i.e., n=3), which is not as a limitation of the disclosed invention, but for illustrative and descriptive clarity. Higher resolution tree iADC (e.g., 16-bits with calibration for higher accuracy) can be arranged by utilizing the disclosed iADC3y.

The ADC3y has an analog input port (A) that receives $I_{IN}$ (that traverses between zero scale=0 and full scale=$I_R$ amplitude).

The ADC3y has an analog current reference input port, REF, which is inputted with $I_R$ that is internally mirrored onto the iADC's internal thermometer reference current network. The binary weighted tree iADC's internal current reference network is comprising of $2^n-1=2^3-1=7$ thermometer reference current sources. These equally sized current sources are $I1_{7A}=I_R/8$ through $I7_{7A}=I_R/8$.

The ADC3y has a digital output port that is 3-bit wide comprising of $D_1$ (MSB) through $D_3$ (LSB). Notice that the T digital outputs of respective plurality of SCzs are received by the 7×3 digital encoder $U7E_{7A}$ whose logic block diagram is illustrated in FIG. 2A (section 2A), and its block diagram is depicted in FIG. 2H (section 2H).

The ADC3y has three analog output ports U, $O_D$, and $E_D$, whose signal's combination are needed to generate an equilateral triangular waveform or the $i_{LSP}$ (that will be fed into a second ADC to extend resolution), which is explained later in this section. Otherwise, analog output ports U can be coupled with $V_{DD}$, and $O_D$ and $E_D$ can be coupled with $V_{SS}$.

Here is how ADC3y operates: Let $I_R$=32 nA and ramp $I_{IN}$ from 0 to +32 nA in t µs. As stated earlier, the equally sized thermometer current sources are $$I1_{7A} = \frac{I_R}{8} = \frac{32nA}{8} = 4nA$$

through $I7_{7A}$=4 nA. As illustrated in FIG. 7A, each of the equally sized thermometer current sources is coupled with the U port of a SCz that is coupled with the I port of the next SCz in sequence.

58

Accordingly, the input current into the I port of $SCz1_{7A}$ traverses from +4 nA to −28 nA in t µs.

The input current into the I port of $SCz2_{7A}$ remains at +4 nA for the first 1×t/8 µs, and then traverses from +4 nA to −24 nA for the rest of 7×t/8 µs.

The input current into the I port of $SCz3_{7A}$ remains at +4 nA for the first 2×t/8 µs, and then traverses from +4 nA to 20 nA for the rest of 6×t/8 µs.

The input current into the I port of $SCz4_{7A}$ remains at +4 nA for the first 3×t/8 µs, and then traverses from +4 nA to 16 nA for the rest of 5×t/8 µs.

The input current into the I port of $SCz5_{7A}$ remains at +4 nA for the first 4×t/8 µs, and then traverses from +4 nA to 12 nA for the rest of 4×t/8 µs.

The input current into the I port of $SCz6_{7A}$ remains at +4 nA for the first 5×t/8 µs, and then traverses from +4 nA to 8 nA for the rest of 3×t/8 µs.

The input current into the I port of $SCz7_{7A}$ remains at +4 nA for the first 6×t/8 µs, and then traverses from +4 nA to −4 nA for the rest of 2×t/8 µs. Note that the I port of $SCz7_{7A}$ crosses zero nA at 7×t/8 µs.

The T digital output of $SCz1_{7A}$ flips from high-state to low-state at t/8 µs. The T digital output of $SCz2_{7A}$ flips from high to low at 2t/8 µs. The T digital output of $SCz3_{7A}$ flips from high to low at 3t/8 µs. The T digital output of $SCz4_{7A}$ flips from high to low at 4t/8 µs. The T digital output of $SCz5_{7A}$ flips from high to low at 5t/8 µs. The T digital output of $SCz6_{7A}$ flips from high to low at 6t/8 µs. The T digital output of $SCz7_{7A}$ flips from high to low at 7t/8 µs. The respective T digital outputs of $SCz1_{7A}$ through $SCz7_{7A}$ are inputted to $U7E_{7A}$ that is a 7×3 thermometer-to-binary code encoder, which generates the ADC3y's digital output bits $D_1$ (MSB) through $D_3$ (LSB), as the digital representation of analog input signal $I_{in}$ of ADC3y when $I_{in}$ traverses from zero to full-scale ($I_{in}$=+32 nA)

Notice that the analog output current D port of the odd numbered SCz's (i.e., $SCz7_{7A}$, $SCz5_{7A}$, $SCz3_{7A}$, and $SCz1_{7A}$) are couple and summed together at the ADC3y's analog output port $O_D$. Moreover, the analog output current D port of the even numbered SCz's (i.e., $SCz6_{7A}$, $SCz4_{7A}$, and $SCz2_{7A}$) are couple and summed together at the ADC3y's analog output port $E_D$. An $i_{LSP}$ can be generated by adding the analog output current in the U port of $SCz7_{7A}$ to the difference between the analog output current in $O_D$ and $E_D$. For example, the $i_{LSP}$ can be generated by utilizing the SCr circuit that is illustrated and described in FIG. 1J section 1J (block diagram illustrated and described in FIG. 1R section 1R). For ADC3y, the $i_{LSP}$ is a peak-to-peak $$4nA = \frac{I_r}{2^n} = \frac{I_r}{2^3} = \frac{32nA}{8}$$

equilateral waveform (e.g., no step or pulse between zero and full scale, but instead a sequence of 4 nA full-scale to zero-scale ramp-down in t/8 µs followed by a zero-scale to 4 nA full-scale ramp up in t/8 µs). The generated $i_{LSP}$ can be inputted to a second iADC to extend the resolution of the overall iADC, which will be described later in this disclosure.

Alternatively, if increasing the iADC's resolution is not required, then the $E_D$ and $O_D$ ports can be coupled with $V_{SS}$ and the U port of $SCz7_{7A}$ be coupled to $V_{DD}$.

In summary some of the benefits of the thermometer iADC of FIG. 7A described in this disclosure are:

First, the thermometer iADC operates in current mode and benefits from current mode operations, which were explained earlier.

Second, the digital computation does not interfere with the thermometer iADC's analog computation, which facilitates arranging for a nearly glitch free iADC.

Third, the iADC is asynchronous and does not require a free running clock. As such, the digital noise and dynamic power consumption associated with ADCs requiring free running clocks is avoided.

Fourth, the linearity of the thermometer iADC has inherent advantages since the iADC's reference network is arranged with equal sized thermometer current source whose random mismatches are attenuated by the square root of the sum of the square of such random mismatch errors.

Fifth, the thermometer iADC dynamic response is inherently enhanced, in part, because an $i_{LSP}$ following an equilateral triangular waveform pattern (i.e., no zero-scale to full-scale pulse) can be generated, which helps the dynamic response of a second stage iADCs that receives the $i_{LSP}$ signal.

Sixth, the disclosed thermometer iADC is not restricted in its operating current magnitude. It can operate in subthreshold for ultra-low current or normal region with higher currents for wider input current span and for higher speeds.

Seventh, the disclosed thermometer iADC architecture is flexible in that its resolution can be extended by coupling multiple iADCs together.

Eight, the speed of the thermometer iADC is dominated by one SCz with the smallest difference input signal (i.e., input and reference difference signal as overdrive signal). However, the remaining SCz that are imbalanced with larger input and reference overdrive signal operate faster when performing their respective analog and digital computations, which enhances the overall speed of the iADC.

Ninth, the thermometer iADC current reference network has smaller capacitance since it is arranged with small 1× sized FETs, instead of (for example) binary current reference network requiring binary scaled n× to 1× sized FETs which have larger capacitance. As such, the dynamic response of the thermometer iADC can be faster where equal sized thermometer current source FETs (carrying less capacitive load) are coupled with the input and output nodes of each SCz in the cascaded sequence of SCzs that form the thermometer iADC.

Figure 7B:
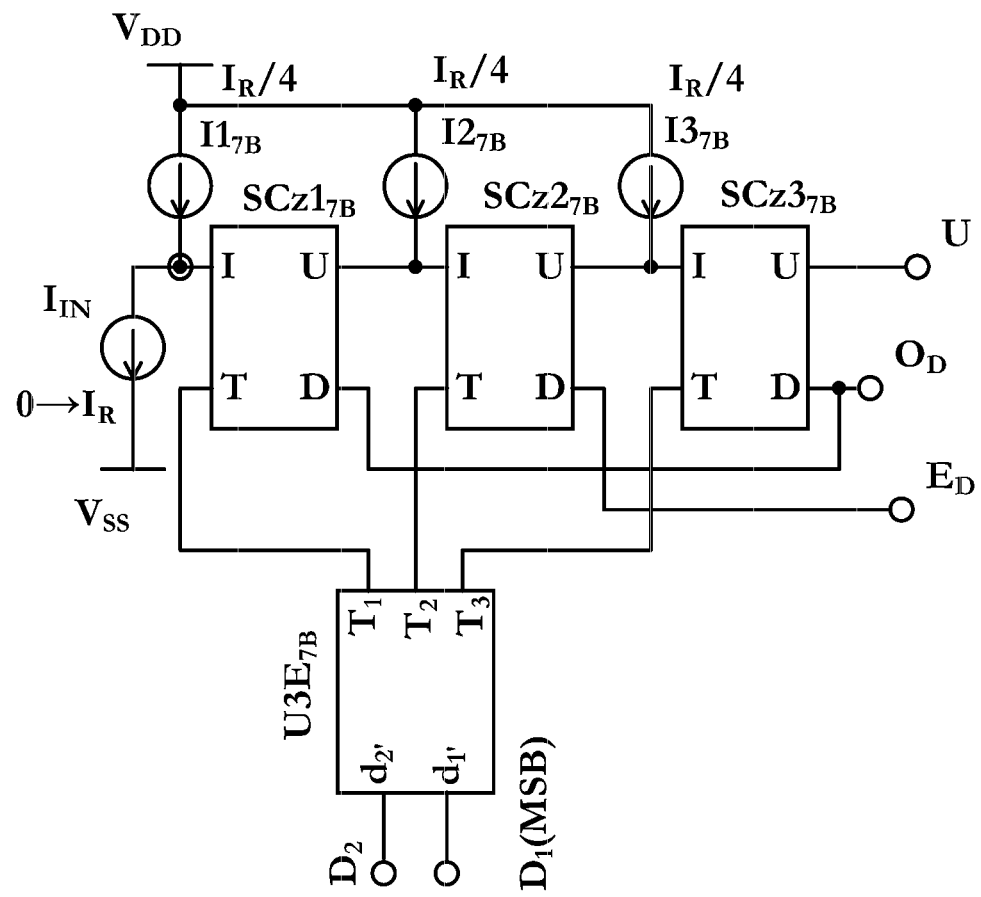
FIG. 7B is a circuit block diagram of an embodiment of a binary weighted 2-bit iADC that utilizes a thermometer reference current network.

Section 7B—Description of FIG. 7B

FIG. 7B is a circuit block diagram of an embodiment of a binary weighted 2-bit iADC that utilizes a thermometer reference current network. Notice that FIG. 7B is a 2-bit version of the 3-bit iADC that is disclosed (and illustrated) in section 7A (FIG. 7A). The 2-bit iADC of FIG. 7B is referred to as ADC2y cell (whose block diagram is provided in FIG. 7D). As a reminder, the 2-bit iADC of FIG. 7B utilizes SCz whose circuit schematic is illustrated in FIG. 1A, and SCz's block diagram is illustrated in FIG. 1K.

Also, note that FIG. 7D is the block diagram for ADC2y, which can be utilized later to illustrate multi-stage iADCs.

The ADC2y is illustrated as having 2-bits of resolution (i.e., n=2), which is not as a limitation of the disclosed invention, but for illustrative and descriptive clarity. Higher resolution tree iADC (e.g., 16-bits with calibration for higher accuracy) can be arranged by utilizing the disclosed iADC3y.

The ADC2y has an analog input port (A) that receives $I_{IN}$ (that traverses between zero scale=0 and full scale=$I_R$ amplitude).

The ADC2y has an analog current reference input port, REF, which is inputted with $I_R$ that is internally mirrored onto the iADC's internal thermometer reference current network. The binary weighted tree iADC's internal current reference network is comprising of $2^n-1=2^2-1=3$ thermometer reference current sources. These equally sized reference current sources are $I1_{7B}=I_R/4$ through $I3_{7E}=I_R/4$.

The ADC2y has a digital output port that is 2-bit wide comprising of $D_1$ (MSB) through $D_3$ (LSB). Notice that the T digital outputs of respective plurality of SCzs are received by the 3×2 digital encoder $U3E_{7B}$ whose logic block diagram is illustrated in FIG. 2B (section 2B), and its block diagram is depicted in FIG. 2i (section 2i).

The ADC2y has three analog output ports U, $O_D$, and $E_D$, whose signal's combination are needed to generate an equilateral triangular waveform or the $i_{LSP}$ (that will be fed into a second ADC to extend resolution), which is explained later in this section. Otherwise, analog output ports U can be coupled with $V_{DD}$, and $O_D$ and $E_D$ can be coupled with $V_{SS}$.

Here is how ADC2y operates: Let $I_R$=32 nA and ramp $I_{IN}$ from 0 to +32 nA in t µs. As stated earlier, the equally sized thermometer current sources are $$I1_{1A} = \frac{I_R}{4} = \frac{32nA}{4} = 8nA$$

through $I3_{7A}$=8 nA. As illustrated in FIG. 7B, each of the equally sized thermometer current sources is coupled with the U port of a SCz that is coupled with the I port of the next SCz in sequence.

Again, the ADC2y's input current signal traverses from 0 to +32 nA in t µs.

The output current flowing out of the U port of $SCz1_{7B}$ remains at 0 for the first 1×t/4 µs, and then traverses from 0 to +24 nA for the rest of 3×t/4 µs.

The output current flowing out of the U port of $SCz2_{7B}$ remains at 0 for the first 2×t/4 µs, and then traverses from 0 to +16 nA for the rest of 2×t/4 µs.

The output current flowing out of the U port of $SCz3_{7B}$ remains at 0 for the first 3×t/4 µs, and then traverses from 0 to +8 nA for the rest of 1×t/4 µs.

The T digital output of $SCz1_{7B}$ flips from high-state to low-state at 1×t/4 µs. The T digital output of $SCz2_{7B}$ flips from high to low at 2×t/4 µs. The T digital output of $SCz3_{7B}$ flips from high to low at 3×t/4 µs.

The respective T digital outputs of $SCz1_{7B}$ through $SCz3_{7B}$ are inputted to $U3E_{7B}$ that is a 3×2 thermometer-to-binary code encoder, which generates the ADC2y's digital output bits $D_1$ (MSB) through $D_2$ (LSB), as the digital representation of analog input signal $I_{in}$ of ADC2y when $I_{in}$ traverses from zero to full-scale $g_{in}$=+32 nA).

Notice that the analog output current D port of the odd numbered SCz's (i.e., $SCz3_{7B}$, and $SCz1_{7B}$) are couple and summed together at the ADC2y's analog output port $O_D$. Moreover, the analog output current D port of the even numbered SCz's (i.e., $SCz2_{7B}$) are couple and summed together at the ADC2y's analog output port $E_D$. An $i_{LSP}$ can be generated by adding the analog output current in the U port of $SCz3_{7B}$ to the difference between the analog output current in $O_D$ and $E_D$. For example, the $i_{LSP}$ can be generated by utilizing the SCr circuit that is illustrated and described in FIG. 1J section 1J (block diagram illustrated and described in FIG. 1R section 1R). For ADC2y, the $i_{LSP}$ is a peak-to-peak $$8nA = \frac{I_r}{2^n} = \frac{I_r}{2^2} = \frac{32nA}{4}$$

equilateral waveform (e.g., no step or pulse between zero and full scale, but instead a sequence of 8 nA full-scale to zero-scale ramp-down in t/4 µs followed by a zero-scale to 8 nA full-scale ramp up in t/4 µs). The generated $i_{LSP}$ can be inputted to a second iADC to extend the resolution of the overall iADC, which will be described later in this disclosure.

Alternatively, if increasing the iADC's resolution is not required, then the $E_D$ and $O_D$ ports can be coupled with $V_{Ss}$ and the U port of $SCz3_{7B}$ be coupled to $V_{DD}$.

In summary some of the benefits of the thermometer iADC of FIG. 7B described in this disclosure are:

First, the thermometer iADC operates in current mode and benefits from current mode operations, which were explained earlier.

Second, the digital computation does not interfere with the thermometer iADC's analog computation, which facilitates arranging for a nearly glitch free iADC.

Third, the iADC is asynchronous and does not require a free running clock. As such, the digital noise and dynamic power consumption associated with ADCs requiring free running clocks is avoided.

Fourth, the linearity of the thermometer iADC has inherent advantages since the iADC's reference network is arranged with equal sized thermometer current source whose random mismatches are attenuated by the square root of the sum of the square of such random mismatch errors.

Fifth, the thermometer iADC dynamic response is inherently enhanced, in part, because an $i_{LSP}$ following an equilateral triangular waveform pattern (i.e., no zero-scale to full-scale pulse) can be generated, which helps the dynamic response of a second stage iADCs that receives the $i_{LSP}$ signal.

Sixth, the disclosed thermometer iADC is not restricted in its operating current magnitude. It can operate in subthreshold for ultra-low current or normal region with higher currents for wider input current span and for higher speeds.

Seventh, the disclosed thermometer iADC architecture is flexible in that its resolution can be extended by coupling multiple iADCs together.

Eight, the speed of the thermometer iADC is dominated by one SCz with the smallest difference input signal (i.e., input and reference difference signal as overdrive signal). However, the remaining SCz that are imbalanced with larger input and reference overdrive signal operate faster when performing their respective analog and digital computations, which enhances the overall speed of the iADC.

Ninth, the thermometer iADC current reference network has smaller capacitance since it is arranged with small 1× sized FETs, instead of (for example) binary current reference network requiring binary scaled n× to 1× sized FETs which have larger capacitance. As such, the dynamic response of the thermometer iADC can be faster where equal sized thermometer current source FETs (carrying less capacitive load) are coupled with the input and output nodes of each SCz in the cascaded sequence of SCzs that form the thermometer iADC.

Section 7C—Description of FIG. 7C

FIG. 7C is an iADC block diagram for the ADC3y that is described and illustrated in section 7A and FIG. 7A, respectively. The iADC block diagram of FIG. 7C has an analog input port (A), an analog current reference input port (REF), three analog current output ports ($O_D$ and $E_D$ and U), and a digital output port that is 3-bit wide and comprising of digital output bits $d_{1'}$ through $d_{3'}$, wherein $d_{1'}$ is the MSB and $d_{3'}$ is the LSB, unless otherwise specified.

Section 7D—Description of FIG. 7D

FIG. 7D is an iADC block diagram for the ADC2y that is described and illustrated in section 7B and FIG. 7B, respectively. The iADC block diagram of FIG. 7D has an analog input port (A), an analog current reference input port (REF), three analog current output ports ($O_D$ and $E_D$ and U), and a digital output port that is 2-bit wide and comprising of digital output bits $d_{1'}$ through $d_{2'}$, wherein $d_{1'}$ is the MSB and $d_{2'}$ is the LSB, unless otherwise specified.

Section 8A—Description of FIG. 8A

FIG. 8A is a circuit diagram that illustrates an embodiment of a multi-stage iADC comprising of a first sub-iADC disclosed (and illustrated) in section 4A (FIG. 4A) and a second sub-iADC disclosed (and illustrated) in section 3B (FIG. 3B).

For descriptive and illustrative clarity, the resolution of the multi-stage iADC of FIG. 8A is arranged for 6-bits, but higher resolutions can be arranged by utilizing higher resolution first and second sub-iADCs (e.g., 16-bits via trimming or calibration).

The multi-stage iADC of FIG. 8A ($ADC_{8A}$) is comprised of $ADC2x_{8A}$, $ADC4w_{8A}$, $SCt'_{8A}$, and $U4S_{8A}$.

The $ADC_{8A}$ receives an input signal $I_{IN}$ that spans from zero to full-scale amplitude equal to $I_R$. The $ADC_{8A}$ also receives a current reference current $I_R$ and it generates a digital output word comprising of $D_1$ (MSB) through $D_6$ (MSB).

The $I_R$ of $ADC_{8A}$ is internally mirrored onto $I1_{8A}=I_R$ (for $ADC2x_{8A}$) and $$I2_{8A} = \frac{I_R}{2^{MSP}} = \frac{I_R}{2^2} = \frac{I_R}{4} \text{ (for } ADC4w_{8A}),$$

wherein MSP is Most-Significant-Portion weight that is established by the resolution of the first sub-iADC or $ADC2x_{8A}$.

The $ADC_{8A}$'s first sub-iADC is $ADC2x_{8A}$ whose circuit diagram is disclosed (and illustrated) in section 4A (FIG. 4A) and whose block diagram is disclosed (and illustrated) in section 4B (FIG. 4B). The resolution of the embodied $ADC2x_{8A}$ is 2-bits for clarity of description and illustration and not as a limitation of $ADC_{8A}$'s arrangement. The digital output ports of $ADC2x_{8A}$ are $D_1$ (corresponding to MSB of the over all $ADC_{8A}$) through $D_2$. The A input port of $ADC2x_{8A}$ receives the analog input current $I_{IN}$ of $ADC_{8A}$.

The $ADC_{8A}$ analog current interface circuit (is $SCt'_{8A}$) between the first and second sub-iDACs generates the $i_{LSP}$ signal. As a reminder, $i_{LSP}$ generally represents $I_{IN}$'s LSP (or Least-Significant-Portion of $ADC_{8A}$'s input current signal) that is fed as input to $ADC4w_{8A}$. The embodiment of FIG. 8A utilizes the signal conditioning circuit $SCt'_{8A}$ that is disclosed and illustrated in section 1H and FIG. 1H (whose block diagram is disclosed and illustrated in section 1P and FIG. 1P). Keeping in mind that for SCt'$_{8A}$ the O$_U$ and O$_{U'}$ are same (input/output) port, the difference in currents through O$_{U'}$ and E$_U$ ports minus the difference in currents through O$_D$ and E$_D$ ports is the i$_{LSP}$ current that is passed into ADC4w$_{8A}$ analog input port. The peach-to-peak amplitude of i$_{LSP}$ is $$\frac{I_R}{2^{MSP}} = \frac{I_R}{2^2} = \frac{I_R}{4},$$

and the ADC4w$_{8A}$ is arranged such that the i$_{LSP}$ is generated as an equilateral triangular waveform, which will be described shortly. As indicated earlier, the sub-iADC dynamic response is improved when its input signal avoids a step or impulse (between zero and full scale) waveform. Moreover, note that for SCt'$_{8A}$ of FIG. 1H, the bias currents I1$_{1H}$=I2$_{1H}$ can be programmed to $$\frac{I_R}{2^{MSP}} = \frac{I_R}{2^2} = \frac{I_R}{4}.$$

Also, consider that instead of SCt'$_{8A}$, an alternative circuit such as SCt$_{8A}$ can be utilized here (for ADC$_{8A}$ of FIG. 8A) which is disclosed and illustrated in section 1G and FIG. 1G.

The ADC$_{8A}$'s second sub-iADC is ADC4w$_{8A}$ whose circuit diagram is disclosed (and illustrated) in section 3B (FIG. 3B) and whose block diagram is disclosed (and illustrated) in section 3F (FIG. 3F). The resolution of the embodied ADC4w$_{8A}$ is 4-bits for clarity of description and illustration and not as a limitation of ADC$_{8A}$'s arrangement. The digital output ports of ADC4w$_{8A}$ are d$_{1'}$ through d$_{4'}$. As stated earlier, the A input port of ADC4w$_{8A}$ receives the I$_{LSP}$.

The ADC$_{8A}$'s polarity logic is U4S$_{8A}$ whose logic diagram is disclosed (and illustrated) in section 2E (FIG. 2E) and whose block diagram is disclosed (and illustrated) in section 2L (FIG. 2L). The U4S$_{8A}$ receives a digital input word at its digital input port comprising of b$_{1'}$ through b$_{4'}$. The U4S$_{8A}$ generates a digital output word at its digital out port comprising of d$_{1'}$ through d$_{4'}$ that ties in with D$_3$ through D$_6$ (corresponding to LSB of the over all ADC$_{8A}$). The S port of U4S$_{8A}$ that is coupled to D$_2$ (from ADC2x$_{8A}$) programs the polarity of D$_3$ through D$_6$ bits (to properly map the input-output of the ADC4w$_{8A}$ with the equilateral triangular form of its input signal i$_{LSP}$)

In summary some of the benefits of the multi-stage iADCs of FIG. 8A described in this disclosure are:

First, the overall multi-stage iADC here operates in current mode and benefits from current mode operations, which were explained earlier.

Second, the first sub-iADC is a flash iADC and its inherently fast since an analog input signal is compared with respective cumulative thermometer weighted current reference signals in parallel, wherein the MSP of the digital outputs are generated simultaneously.

Third, the multi-stage iADC is asynchronous and does not require a free running clock. As such, the digital noise and dynamic power consumption associated with iADCs requiring free running clocks is avoided.

Fourth, for the sub-iADCs, the analog computations and the digital computations occur concurrently with nearly no interference between analog computation and digital computation. Thus, the disclosed multi-stage iADC has low glitch.

Fifth, the i$_{LSP}$ that supplies the input to the second sub-iADC is programmed to avoid a zero-full scale step or impulse patterns, which helps the dynamic response of the second sub-iADC and hence that of the overall multi-stage iADC.

Sixth, the disclosed multi-stage iADC is not restricted in its operating current magnitude. It can operate in subthreshold for ultra-low current or normal region with higher currents for wider input current span and for higher speeds.

Seventh, the disclosed iADC architecture is flexible in that its resolution can be extended by coupling multiple iADCs together.

Eighth, the accuracy (in DC and Dynamic mode) of the overall multi-stage iADC is dominated by the first sub-iADC. From another perspective, the accuracy requirement (in DC and Dynamic mode) of the second sub-iADC is attenuated by the resolution of the first sub-iADC, which provides the flexibility of arranging the second sub-iADC more cost effectively (e.g., smaller and less accurate).

Ninth, although the LSB current signals in a general data-converter get smaller, but in the disclosed embodiment of the multi-stage iADC, the current difference signal inputted to signal conditioning circuits of the second sub-iADC maintain their peak-to-peak amplitude (and hence the overdrive) which helps the dynamic response of second sub-iADC.

Figure 8B:
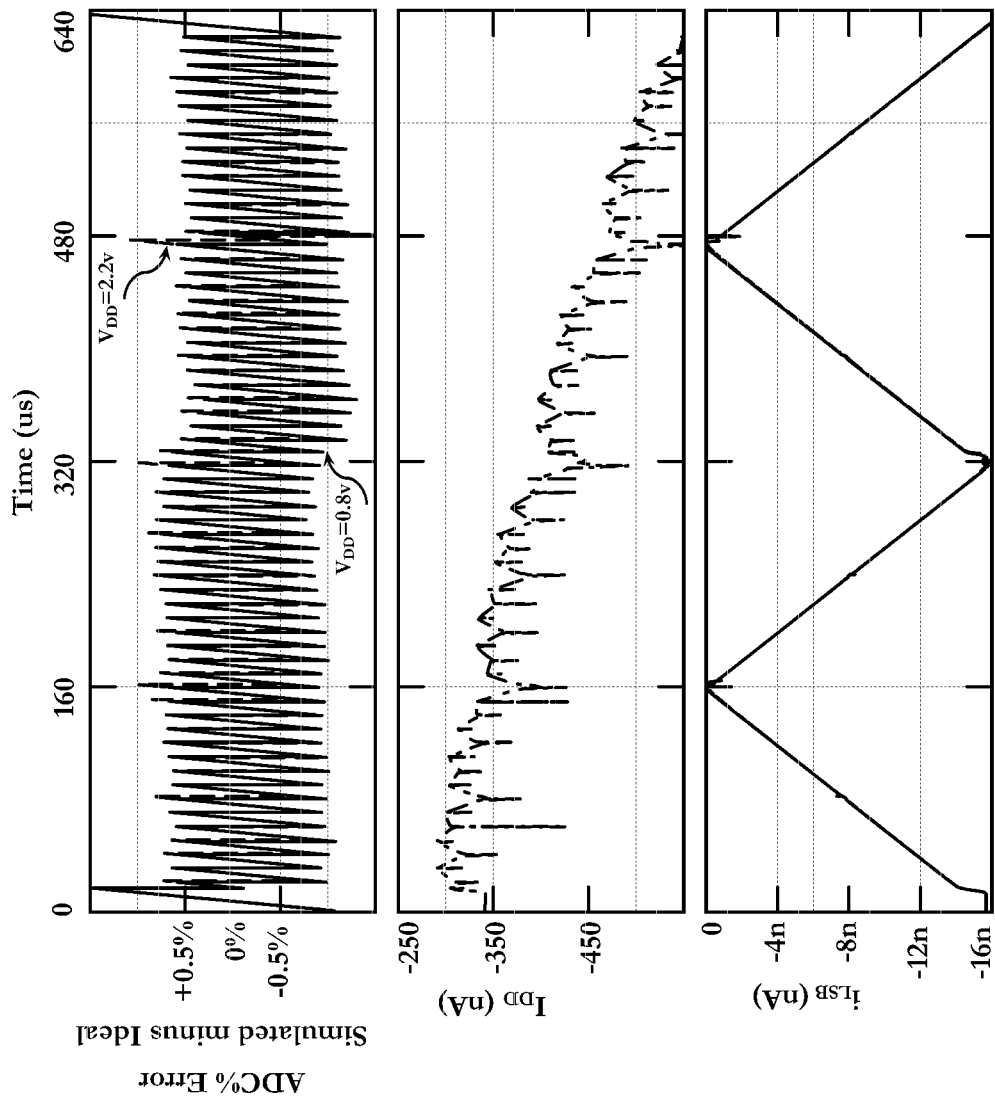
FIG. 8B is a circuit simulation showing waveforms of the multi-stage iADC illustrated in FIG. 8A.

Section 8B—Description of FIG. 8B

FIG. 8B is a circuit simulation showing waveforms of the multi-stage iADC illustrated in FIG. 8A. Bear in mind that the illustrated simulations here is intended to further clarify the disclosed multi-stage iADC's functionality and not as a limitation on the performance of the disclosed multi-stage iADC.

The multi-stage iADC of FIG. 8A is simulated by SPICE (Simulation Program with Integrated Circuit Emphasis) using main-stream 0.18 μm CMOS (Complementary Metal Oxide Semiconductor) transistor typical models.

The horizontal axis shows time in micro-seconds (μs), where I$_{IN}$ of the multi-stage iADC of FIG. 8A is ramped from zero to full-scale of 64 nA in 640 μs. The input reference current or I$_R$=64 nA of the multi-stage iADC of FIG. 8A.

In the upper segment of FIG. 8B, the simulated digital output codes the multi-stage iADC of FIG. 8A are fed onto an ideal current mode digital-to-analog-converter (iDAC). The difference (in %) between the analog input of the multi-stage iADC of FIG. 8A and the analog output of the ideal iDAC are plotted. This plot indicates the multi-stage iADC of FIG. 8A's deviation error (simulation minus ideal) in % format, when power supply V$_{DD}$ is 2.2v and 0.8v. Bear in mind that for a 6-bit iADC, Least-Significant-Bit (LSB) is $$\frac{1}{2^6} = 1.5\%,$$

which reflects the peak-to-peak % deviation error (saw-tooth waveform) in the upper segment of FIG. 8B.

In the middle segment of FIG. 8B is the simulated I$_{DD}$ or current consumption (in nano-ampere or nA) of the multi-stage iADC of FIG. 8A In the bottom segment of FIG. 8B is the simulated $i_{LSP}$ (nA) current of the multi-stage iADC of FIG. 8A with a peak-to-peak amplitude of 16 nA $$(\text{or } \frac{16nA}{64nA} = 25\% \text{ of full scale})$$

wherein $i_{LSP}$ can be fed onto a second sub-iADC in order to extend the resolution of the multi-stage iADC of FIG. 8A.

Figure 9A:
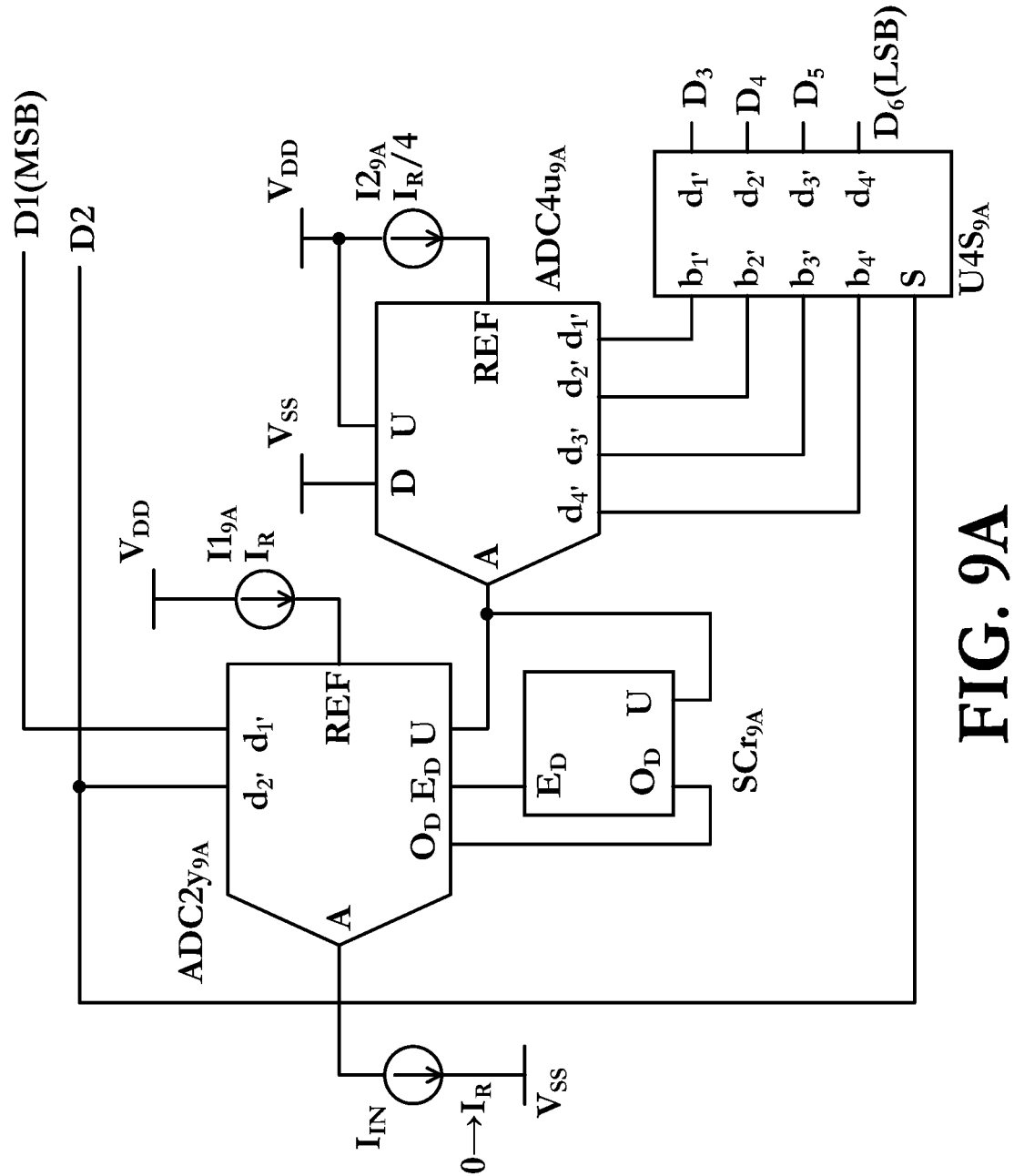
FIG. 9A is a circuit diagram that illustrates an embodiment of a multi-stage iADC comprising of a first sub-iADC disclosed (and illustrated) in section 7B (FIG. 7B) and a second sub-iADC disclosed (and illustrated) in section 6C (FIG. 6C).

Section 9A—Description of FIG. 9A

FIG. 9A is a circuit diagram that illustrates an embodiment of a multi-stage iADC comprising of a first sub-iADC disclosed (and illustrated) in section 7B (FIG. 7B) and a second sub-iADC disclosed (and illustrated) in section 6C (FIG. 6C).

For descriptive and illustrative clarity, the resolution of the multi-stage iADC of FIG. 9A is arranged for 6-bits, but higher resolutions can be arranged by utilizing higher resolution first and second sub-iADCs (e.g., 16-bits via trimming or calibration).

The multi-stage iADC of FIG. 9A ($ADC_{9A}$) is comprised of $ADC2y_{9A}$, $ADC4u_{9A}$, $SCr_{9A}$, and $U4S_{9A}$.

The $ADC_{9A}$ receives an input signal $I_{IN}$ that spans from zero to full-scale amplitude equal to $I_R$. The $ADC_{9A}$ also receives a current reference current $I_R$ and it generates a digital output word comprising of $D_1$ (MSB) through $D_6$ (MSB).

The $I_R$ of $ADC_{9A}$ is internally mirrored onto $I1_{9A}=I_R$ (for $ADC2y_{9A}$) and $$I2_{9A} = \frac{I_R}{2^{MSP}} = \frac{I_R}{2^2} = \frac{I_R}{4} \text{ (for } ADC4u_{9A}),$$

wherein MSP is Most-Significant-Portion weight that is established by the resolution of the first sub-iADC or $ADC2y_{9A}$.

The $ADC_{9A}$'s first sub-iADC is $ADC2y_{9A}$ whose circuit diagram is disclosed (and illustrated) in section 7B (FIG. 7B) and whose block diagram is disclosed (and illustrated) in section 7D (FIG. 7D). The resolution of the embodied $ADC2y_{9A}$ is 2-bits for clarity of description and illustration and not as a limitation of $ADC_{9A}$'s arrangement. The digital output ports of $ADC2y_{9A}$ are $D_1$ (corresponding to the MSB of the over all $ADC_{9A}$) through $D_2$. The A input port of $ADC2y_{9A}$ receives the analog input current $I_{IN}$ of $ADC_{9A}$.

The $ADC_{9A}$ analog current interface circuit (is $SCr_{9A}$) between the first and second sub-iDACs generates the $i_{LSP}$ signal. As a reminder, $i_{LSP}$ generally represents $i_{IN}$'s LSP (or Least-Significant-Portion of $ADC_{9A}$'s input current signal) that is fed as analog input current to $ADC4u_{9A}$. The embodiment of FIG. 9A utilizes the signal conditioning circuit $SCr_{9A}$ that is disclosed and illustrated in section 1J and FIG. 1J (whose block diagram is disclosed and illustrated in section 1R and FIG. 1R).

Keeping in mind that for $SCr_{9A}$ the $O_U$ and $O_{U'}$ are same (input/output) port, the difference in currents through $O_D$ and $E_D$ ports minus the currents through $O_{U'}$ is the $i_{LSP}$ current that is passed into $ADC4u_{9A}$ analog input port. The peach-to-peak amplitude of $i_{LSP}$ is $$\frac{I_R}{2^{MSP}} = \frac{I_R}{2^2} = \frac{I_R}{4},$$

and the $ADC4u_{9A}$ is arranged such that the $i_{LSP}$ is generated as an equilateral triangular waveform, which will be described shortly. As indicated earlier, the sub-iADC dynamic response is improved when its input signal avoids a step or impulse (between zero and full scale) waveform.

The $ADC_{9A}$'s second sub-iADC is $ADC4u_{9A}$ whose circuit diagram is disclosed (and illustrated) in section 6C (FIG. 6C) and whose block diagram is disclosed (and illustrated) in section 6G (FIG. 6G). The resolution of the embodied $ADC4u_{9A}$ is 4-bits for clarity of description and illustration and not as a limitation of $ADC_{9A}$'s arrangement. The digital output ports of $ADC4u_{9A}$ are $d_{1'}$ through $d_{4'}$. As stated earlier, the A input port of $ADC4u_{9A}$ receives the $i_{LSP}$.

The $ADC_{9A}$'s polarity logic is $U4S_{9A}$ whose logic diagram is disclosed (and illustrated) in section 2E (FIG. 2E) and whose block diagram is disclosed (and illustrated) in section 2L (FIG. 2L). The $U4S_{9A}$ receives a digital input word at its digital input port comprising of $b_{1'}$ through $b_{4'}$. The $U4S_{9A}$ generates a digital output word at its digital out port comprising of $d_{1'}$ through $d_{4'}$ that ties in with $D_3$ through $D_6$ (corresponding to LSB of the over all $ADC_{9A}$). The S port of $U4S_{9A}$ that is coupled to $D_2$ (from $ADC2y_{9A}$) programs the polarity of $D_3$ through $D_6$ bits (to properly map the input-output of the $ADC4u_{9A}$ with the equilateral triangular form of its input signal $i_{LSP}$)

In summary some of the benefits of the multi-stage iADCs of FIG. 9A described in this disclosure are:

First, the overall multi-stage iADC here operates in current mode and benefits from current mode operations, which were explained earlier.

Second, the first sub-iADC is a thermometer iADC which has enhanced accuracy. The first sub-iADC's reference network is arranged with equal sized thermometer current source whose random mismatches are attenuated by the square root of the sum of the square of such random mismatch errors. As such, the accuracy of the overall multi-stage iADC is enhanced since multi-stage iADC's accuracy is dominated by that of the first sub-iADC.

Third, the multi-stage iADC is asynchronous and does not require a free running clock. As such, the digital noise and dynamic power consumption associated with iADCs requiring free running clocks is avoided.

Fourth, for the first sub-iADC, the analog computations and the digital computations occur concurrently with nearly no interference between analog computation and digital computation. Thus, the disclosed multi-stage iADC's glitch is attenuated by the resolution of the first sub-iADC.

Fifth, the $i_{LSP}$ that supplies the input to the second sub-iADC is programmed to avoid a zero-full scale step or impulse patterns, which helps the dynamic response of the second sub-iADC and hence that of the overall multi-stage iADC.

Sixth, the disclosed multi-stage iADC is not restricted in its operating current magnitude. It can operate in subthreshold for ultra-low current or normal region with higher currents for wider input current span and for higher speeds.

Seventh, the disclosed iADC architecture is flexible in that its resolution can be extended by coupling multiple iADCs together.

Eighth, as indicated earlier, the accuracy (in DC and Dynamic mode) of the overall multi-stage iADC is dominated by the first sub-iADC. From another perspective, the accuracy requirement (in DC and Dynamic mode) of the second sub-iADC is attenuated by the resolution of the first sub-iADC, which provides the flexibility of arranging the second sub-iADC more cost effectively (e.g., smaller and less accurate).

Ninth, the second sub-iADC is simple. Utilizing the tree ADC method, wherein analog and digital signals in a SCy are conditioned by prior ones, simplifies the second sub-iADC which saves area and power consumption. Moreover, the digital outputs of the second sub-iADC are generated sequentially and synchronously without the need for any logic such as decoding or encoding. Thus, the overall multi-stage iADC size can be made small and dynamic power consumption associated with logic is reduced.

Figure 9B:
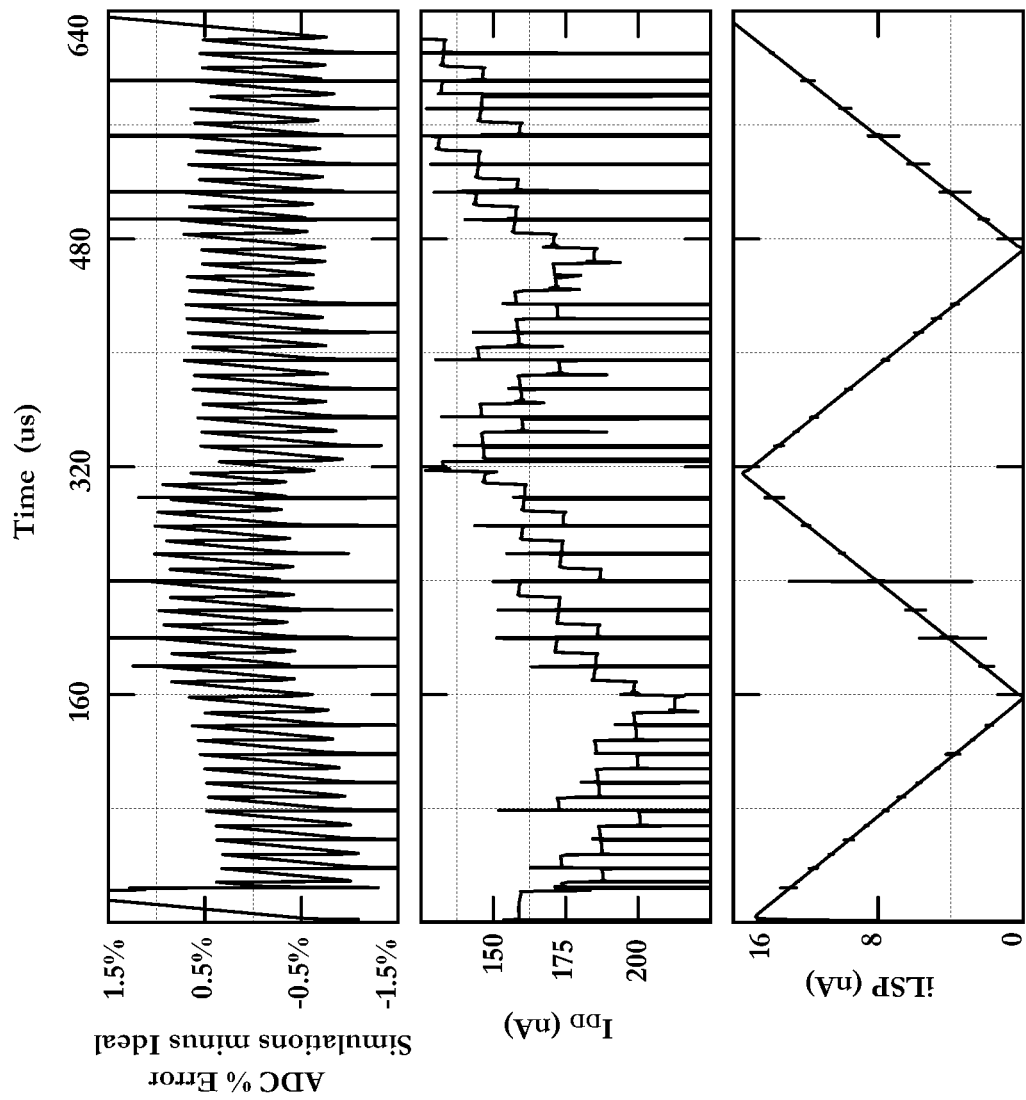
FIG. 9B is a circuit simulation showing waveforms of the multi-stage iADC illustrated in FIG. 9A.

Section 9B—Description of FIG. 9B

FIG. 9B is a circuit simulation showing waveforms of the multi-stage iADC illustrated in FIG. 9A. Bear in mind that the illustrated simulations here is intended to further clarify the disclosed multi-stage iADC's functionality and not as a limitation on the performance of the disclosed multi-stage iADC.

The multi-stage iADC of FIG. 9A is simulated by SPICE (Simulation Program with Integrated Circuit Emphasis) using main-stream 0.18 μm CMOS (Complementary Metal Oxide Semiconductor) transistor typical models.

The horizontal axis shows time in micro-seconds (μs), where $I_{IN}$ of the multi-stage iADC of FIG. 9A is ramped from zero to full-scale of 64 nA in 640 μs. The input reference current or $I_R$=64 nA of the multi-stage iADC of FIG. 9A.

In the upper segment of FIG. 9B, the simulated digital output codes the multi-stage iADC of FIG. 9A are fed onto an ideal current mode digital-to-analog-converter (iDAC). The difference (in %) between the analog input of the multi-stage iADC of FIG. 9A and the analog output of the ideal iDAC are plotted. This plot indicates the multi-stage iADC of FIG. 9A's deviation error (simulation minus ideal) in % format, when $V_{DD}$=0.8v. Bear in mind that for a 6-bit iADC, Least-Significant-Bit (LSB) is $$\frac{1}{2^6} = 1.5\%,$$

which reflects the peak-to-peak % deviation error (saw-tooth waveform) in the upper segment of FIG. 9B.

In the middle segment of FIG. 9B is the simulated $I_{DD}$ or current consumption (in nano-ampere or nA) of the multi-stage iADC of FIG. 9A In the bottom segment of FIG. 9B is the simulated $i_{LSP}$ (nA) current of the multi-stage iADC of FIG. 9A with a peak-to-peak amplitude of 16 nA $$(\text{or } \frac{16nA}{64nA} = 25\% \text{ of full scale})$$

wherein $i_{LSP}$ can be fed onto a second sub-iADC in order to extend the resolution of the multi-stage iADC of FIG. 9A.

Figure 10A:
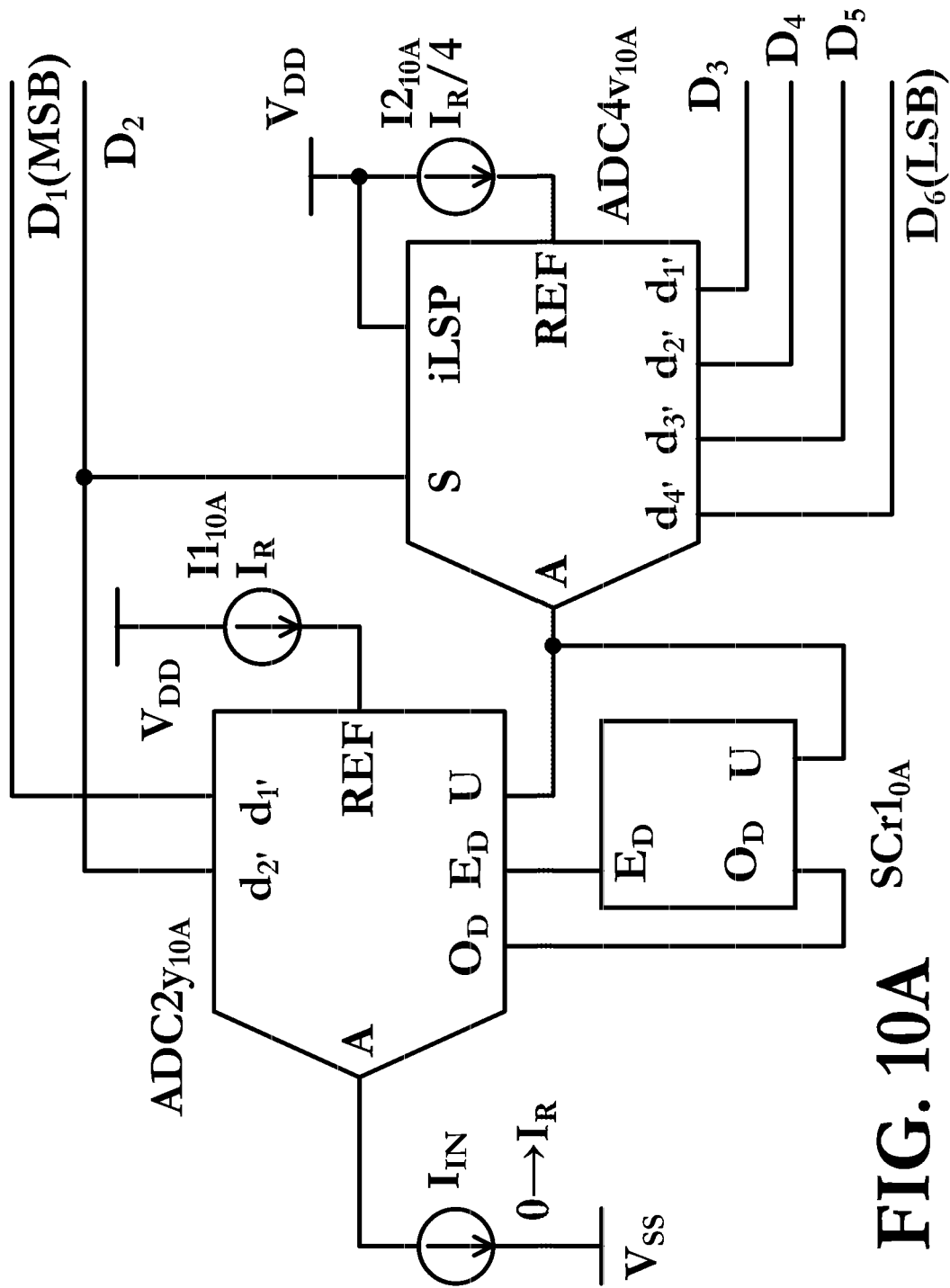
FIG. 10A is a circuit diagram that illustrates an embodiment of a multi-stage iADC comprising of a first sub-iADC disclosed (and illustrated) in section 7B (FIG. 7B) and a second sub-iADC disclosed (and illustrated) in section 3A (FIG. 3A).

Section 10A—Description of FIG. 10A

FIG. 10A is a circuit diagram that illustrates an embodiment of a multi-stage iADC comprising of a first sub-iADC disclosed (and illustrated) in section 7B (FIG. 7B) and a second sub-iADC disclosed (and illustrated) in section 3A (FIG. 3A).

For descriptive and illustrative clarity, the resolution of the multi-stage iADC of FIG. 10A is arranged for 6-bits, but higher resolutions can be arranged by utilizing higher resolution first and second sub-iADCs (e.g., 16-bits via trimming or calibration).

The multi-stage iADC of FIG. 10A ($ADC_{10A}$) is comprised of $ADC2y_{10A}$, $ADC4v_{10A}$, and $SCr_{10A}$ The $ADC_{10A}$ receives an input signal $I_{IN}$ that spans from zero to full-scale amplitude equal to $I_R$. Also, $ADC_{10A}$ receives a current reference current $I_R$, and it generates a digital output word comprising of $D_1$ (MSB) through $D_6$ (MSB).

The $I_R$ of $ADC_{10A}$ is internally mirrored onto $I1_{10A}=I_R$ (for $ADC2y_{10A}$) and $$I2_{10A} = \frac{I_R}{2^{MSP}} = \frac{I_R}{2^2} = \frac{I_R}{4} \text{ (for } ADC4v_{10A}\text{)},$$

wherein MSP is Most-Significant-Portion weight that is established by the resolution of the first sub-iADC or $ADC2y_{10A}$.

The $ADC_{10A}$'s first sub-iADC is $ADC2y_{10A}$ whose circuit diagram is disclosed (and illustrated) in section 7B (FIG. 7B) and whose block diagram is disclosed (and illustrated) in section 7D (FIG. 7D). The resolution of the embodied $ADC2y_{10A}$ is 2-bits for clarity of description and illustration and not as a limitation of $ADC_{10A}$'s arrangement. The digital output ports of $ADC2y_{10A}$ are $D_1$ (corresponding to the MSB of the over all $ADC_{10A}$) through $D_2$. The A input port of $ADC2y_{10A}$ receives the analog input current $I_{IN}$ of $ADC_{10A}$.

The $ADC_{10A}$ analog current interface circuit (is $SCr_{10A}$) between the first and second sub-iDACs generates the $i_{LSP}$ signal. As a reminder, $i_{LSP}$ generally represents $I_{IN}$'s LSP (or Least-Significant-Portion of $ADC_{10A}$'s input current signal) that is fed as analog input current to $ADC4V_{10A}$. The embodiment of FIG. 10A utilizes the signal conditioning circuit $SCr_{10A}$ that is disclosed and illustrated in section 1j and FIG. 1j (whose block diagram is disclosed and illustrated in section 1R and FIG. 1R).

Keeping in mind that for $SCr_{10A}$ the $O_U$ and $O_{U'}$ are same (input/output) port, the difference in currents through $O_D$ and $E_D$ ports minus the currents through $O_{U'}$ is the $i_{LSP}$ current that is passed into $ADC4v_{10A}$ analog input port. The peach-to-peak amplitude of $i_{LSP}$ is $$\frac{I_R}{2^{MSP}} = \frac{I_R}{2^2} = \frac{I_R}{4},$$

and the $ADC4v_{10A}$ is arranged such that the $i_{LSP}$ is generated as an equilateral triangular waveform, which will be described shortly. As indicated earlier, the sub-iADC dynamic response is improved when its input signal avoids a step or impulse (between zero and full scale) waveform.

The $ADC_{10A}$'s second sub-iADC is $ADC4v_{10A}$ whose circuit diagram is disclosed (and illustrated) in section 3A (FIG. 3A) and whose block diagram is disclosed (and illustrated) in section 3E (FIG. 3E). The resolution of the embodied $ADC4v_{10A}$ is 4-bits for clarity of description and illustration and not as a limitation of $ADC_{10A}$'s arrangement. The digital output ports of $ADC4v_{10A}$ are $d_1$' through $d_4$'. As stated earlier, the A input port of $ADC4v_{10A}$ receives the $i_{ISP}$.

Bear in mind that the S port of $ADC4v_{10A}$ that is coupled to $D_2$ (from $ADC2y_{10A}$) programs the polarity of $D_3$ through $D_6$ bits (to properly map the input-output of the $ADC4v_{10A}$ with the equilateral triangular form of its input signal $i_{LSP}$)

In summary some of the benefits of the multi-stage iADCs of FIG. 10A described in this disclosure are:

First, the overall multi-stage iADC here operates in current mode and benefits from current mode operations, which were explained earlier.

Second, the first sub-iADC is a thermometer iADC which has enhanced accuracy. The first sub-iADC's reference network is arranged with equal sized thermometer current source whose random mismatches are attenuated by the square root of the sum of the square of such random mismatch errors. As such, the accuracy of the overall multi-stage iADC is enhanced since multi-stage iADC's accuracy is dominated by that of the first sub-iADC.

Third, the multi-stage iADC is asynchronous and does not require a free running clock. As such, the digital noise and dynamic power consumption associated with iADCs requiring free running clocks is avoided.

Fourth, for the sub-iADCs, the analog computations and the digital computations occur concurrently with nearly no interference between analog computation and digital computation. Thus, the disclosed multi-stage iADC has low glitch.

Fifth, the $i_{LSP}$ that supplies the input to the second sub-iADC is programmed to avoid a zero-full scale step or impulse patterns, which helps the dynamic response of the second sub-iADC and hence that of the overall multi-stage iADC.

Sixth, the disclosed multi-stage iADC is not restricted in its operating current magnitude. It can operate in subthreshold for ultra-low current or normal region with higher currents for wider input current span and for higher speeds.

Seventh, the disclosed iADC architecture is flexible in that its resolution can be extended by coupling multiple iADCs together.

Eighth, as indicated earlier, the accuracy (in DC and Dynamic mode) of the overall multi-stage iADC is dominated by the first sub-iADC. From another perspective, the accuracy requirement (in DC and Dynamic mode) of the second sub-iADC is attenuated by the resolution of the first sub-iADC, which provides the flexibility of arranging the second sub-iADC more cost effectively (e.g., smaller and less accurate).

Ninth, the second sub-iADC utilizes only one current mirror in each of its signal conditioning circuits (SCx). Generally, the fewer current mirrors, then the more accurate and faster is the SCx. The more accurate and faster the SCx, then the more accurate and faster is the second sub-iADC and the overall multi-stage iADC.

Figure 10B:
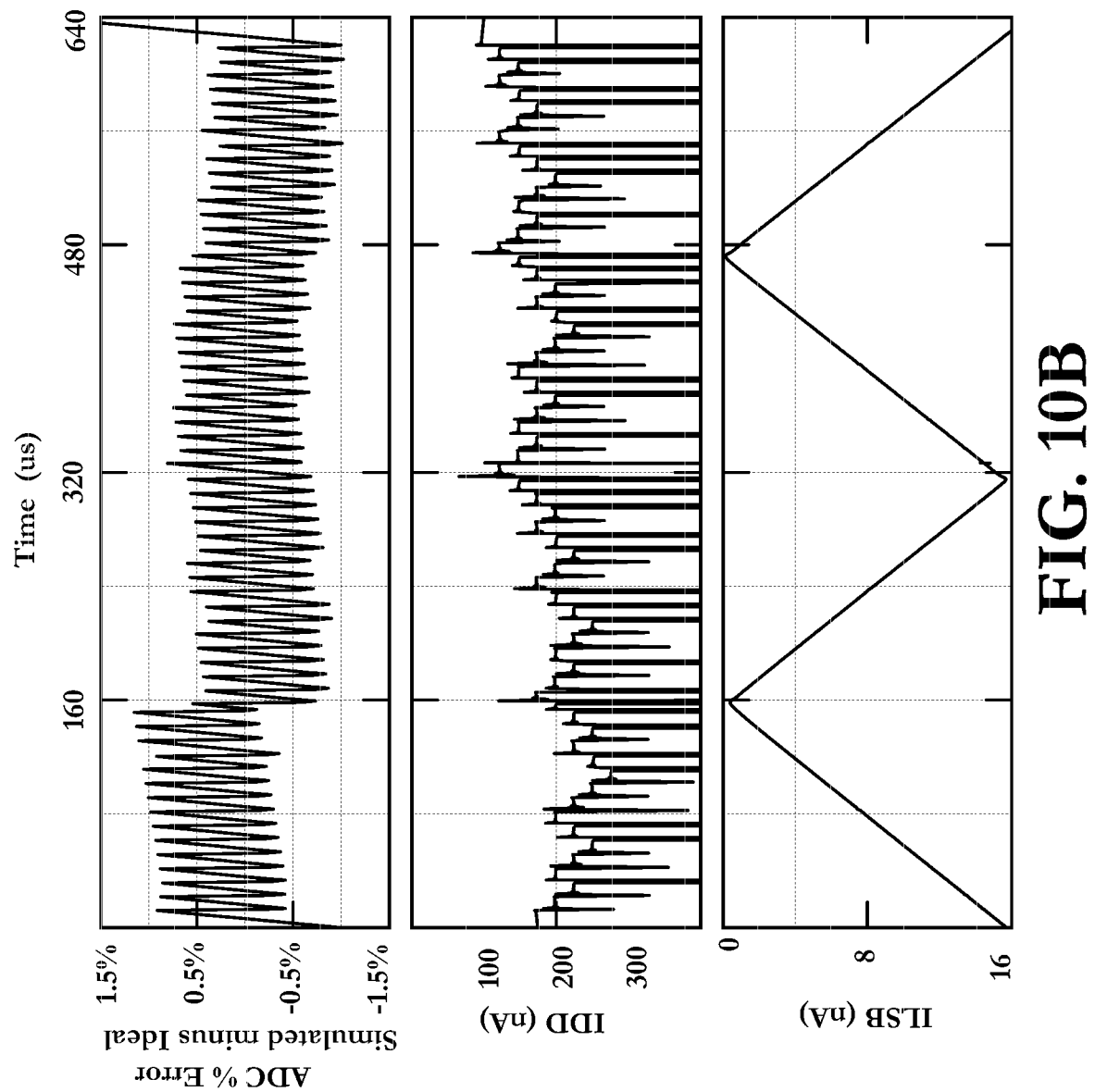
FIG. 10B is a circuit simulation showing waveforms of the multi-stage iADC illustrated in FIG. 10A.

Section 10B—Description of FIG. 10B

FIG. 10B is a circuit simulation showing waveforms of the multi-stage iADC illustrated in FIG. 10A. Bear in mind that the illustrated simulations here is intended to further clarify the disclosed multi-stage iADC's functionality and not as a limitation on the performance of the disclosed multi-stage iADC.

The multi-stage iADC of FIG. 10A is simulated by SPICE (Simulation Program with Integrated Circuit Emphasis) using main-stream 0.18 μm CMOS (Complementary Metal Oxide Semiconductor) transistor typical models.

The horizontal axis shows time in micro-seconds (μs), where $I_{IN}$ of the multi-stage iADC of FIG. 10A is ramped from zero to full-scale of 64 nA in 640 μs. The input reference current or $I_R$=64 nA of the multi-stage iADC of FIG. 10A.

In the upper segment of FIG. 10B, the simulated digital output codes the multi-stage iADC of FIG. 10A are fed onto an ideal current mode digital-to-analog-converter (iDAC). The difference (in %) between the analog input of the multi-stage iADC of FIG. 10A and the analog output of the ideal iDAC are plotted. This plot indicates the multi-stage iADC of FIG. 10A's deviation error (simulation minus ideal) in % format, when $V_{DD}$=0.8v. Bear in mind that for a 6-bit iADC, Least-Significant-Bit (LSB) is $$\frac{1}{2^6} = 1.5\%,$$

which reflects the peak-to-peak % deviation error (saw-tooth waveform) in the upper segment of FIG. 10B.

In the middle segment of FIG. 10B is the simulated $I_{DD}$ or current consumption (in nano-ampere or nA) of the multi-stage iADC of FIG. 10A In the bottom segment of FIG. 10B is the simulated $i_{LSP}$ (nA) current of the multi-stage iADC of FIG. 10A with a peak-to-peak amplitude of 16 nA $$\left(\text{or } \frac{16nA}{64nA} = 25\% \text{ of full scale}\right)$$

wherein $i_{LSP}$ can be fed onto a second sub-iADC in order to extend the resolution of the multi-stage iADC of FIG. 10A.

Figure 11A:
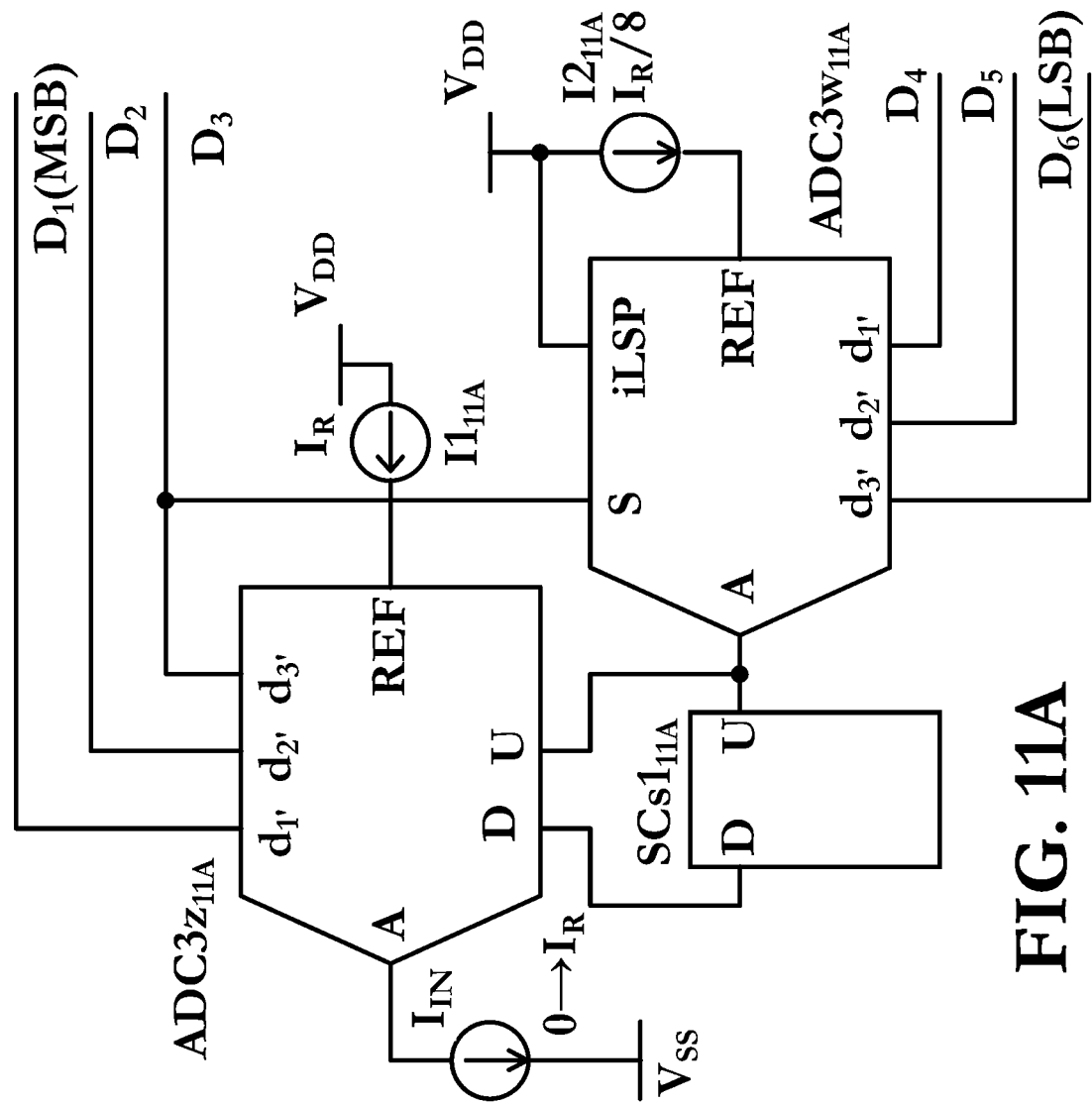
FIG. 11A is a circuit diagram that illustrates an embodiment of a multi-stage iADC comprising of a first sub-iADC disclosed (and illustrated) in section 5B (FIG. 5B) and a second sub-iADC disclosed (and illustrated) in section 3D (FIG. 3D).

Section 11A—Description of FIG. 11A

FIG. 11A is a circuit diagram that illustrates an embodiment of a multi-stage iADC comprising of a first sub-iADC disclosed (and illustrated) in section 5B (FIG. 5B) and a second sub-iADC disclosed (and illustrated) in section 3D (FIG. 3D).

For descriptive and illustrative clarity, the resolution of the multi-stage iADC of FIG. 11A is arranged for 6-bits, but higher resolutions can be arranged by utilizing higher resolution first and second sub-iADCs (e.g., 16-bits via trimming or calibration).

The multi-stage iADC of FIG. 11A ($ADC_{11A}$) is comprised of $ADC3z_{11A}$, $ADC3w_{11A}$, and $SCs_{11A}$ The $ADC_{11A}$ receives an input signal $I_{IN}$ that spans from zero to full-scale amplitude equal to $I_R$. Also, $ADC_{11A}$ receives a current reference current $I_R$, and it generates a digital output word comprising of $D_1$ (MSB) through $D_6$ (MSB).

The $I_R$ of $ADC_{11A}$ is internally mirrored onto $I1_{11A}=I_R$ (for $ADC3z_{11A}$) and $$I2_{11A} = \frac{I_R}{2^{MSP}} = \frac{I_R}{2^3} = \frac{I_R}{8} \text{ (for } ADC3w_{11A}\text{)},$$

wherein MSP is Most-Significant-Portion weight that is established by the resolution of the first sub-iADC or $ADC3z_{11A}$.

The $ADC_{11A}$'s first sub-iADC is $ADC3z_{11A}$ whose circuit diagram is disclosed (and illustrated) in section 5B (FIG. 5B) and whose block diagram is disclosed (and illustrated) in section 5C (FIG. 5C). The resolution of the embodied $ADC3z_{11A}$ is 3-bits for clarity of description and illustration and not as a limitation of $ADC_{11A}$'s arrangement. The digital output ports of $ADC3z_{11A}$ are $D_1$ (corresponding to the MSB of the over all $ADC_{11A}$) through $D_1$. The A input port of $ADC3z_{11A}$ receives the analog input current $I_{IN}$ of $ADC_{11A}$.

The $ADC_{11A}$ analog current interface circuit (is $SCs_{11A}$) between the first and second sub-iDACs generates the $i_{LSP}$ signal. As a reminder, $i_{LSP}$ generally represents $I_{IN}$'s LSP (or Least-Significant-Portion of $ADC_{11A}$'s input current signal) that is fed as analog input current to $ADC3w_{11A}$. The embodiment of FIG. 11A utilizes the signal conditioning circuit $SCs_{11A}$ that is disclosed and illustrated in section 1i and FIG. 1i (whose block diagram is disclosed and illustrated in section 1Q and FIG. 1Q).

Keep in mind that for $SCs_{HA}$ the $O_U$ and $O_{U'}$ are same (input/output) port. The difference in currents through D and U ports riding on top of an offset bias current (e.g., see FIG. 1i where $I3_{1i}$ is a scaled reference current S. $I_R$ wherein the embodiment of FIG. 11A, the scale factor $s=\frac{1}{2}^{MSP}+\frac{1}{2}^{MSP-1}=\frac{1}{2}^3+\frac{1}{2}^2=\frac{1}{8}+\frac{1}{4}$) generates the $i_{LSP}$ that is passed into $ADC3w_{11A}$ analog input port. The peach-to-peak amplitude of $i_{LSP}$ is $$\frac{I_R}{2^{MSP}} = \frac{I_R}{2^3} = \frac{I_R}{8},$$

and the $ADC3w_{11A}$ is arranged such that the $i_{LSP}$ is generated as an equilateral triangular waveform, which will be described shortly. As indicated earlier, the sub-iADC dynamic response is improved when its input current signal avoids a step or impulse (between zero and full scale) waveform.

The $ADC_{11A}$'s second sub-iADC is $ADC3w_{11A}$ whose circuit diagram is disclosed (and illustrated) in section 3D (FIG. 3D) and whose block diagram is disclosed (and illustrated) in section 3H (FIG. 3H). The resolution of the embodied $ADC3w_{11A}$ is 3-bits for clarity of description and illustration and not as a limitation of $ADC_{11A's}$ arrangement. The digital output ports of $ADC3w_{11A}$ are $d_1$. through $d_3$.. As stated earlier, the A input port of $ADC3w_{11A}$ receives the $i_{LSP}$.

Bear in mind that the S port of $ADC3w_{11A}$ that is coupled to $D_3$ (from $ADC3z_{11A}$) programs the polarity of $D_4$ through $D_6$ bits (to properly map the input-output of the $ADC3w_{11A}$ with the equilateral triangular form of its input signal $i_{LSP}$)

In summary some of the benefits of the multi-stage iADCs of FIG. 11A described in this disclosure are:

First, the overall multi-stage iADC here operates in current mode and benefits from current mode operations, which were explained earlier.

Second, the first sub-iADC is a tree iADC whose accuracy is dominated by its signal conditioning circuit (SCz) in its first row, for which it can be optimized accordingly and enhance the overall cost-accuracy of the multi-staged iADC.

Third, $2^n$ copies of the input current signal are needed in a conventional current mode n-bit flash iADC wherein mismatch between copies of the input current signal generates inaccuracies for the flash iADC. The disclosed first sub-iADC does not require any copies of that input current signal and avoids the corresponding mismatches and inaccuracies, which improves the overall accuracy of the disclosed multi-stage iADC.

Fourth, the multi-stage iADC is asynchronous and does not require a free running clock. As such, the digital noise and dynamic power consumption associated with iADCs requiring free running clocks is avoided.

Fifth, for the sub-iADCs, the analog computations and the digital computations occur concurrently with nearly no interference between analog computation and digital computation. Thus, the disclosed multi-stage iADC is free from glitch.

Sixth, the $i_{LSP}$ that supplies the input to the second sub-iADC is programmed to avoid a zero-full scale step or impulse patterns, which helps the dynamic response of the second sub-iADC and hence that of the overall multi-stage iADC.

Seventh, as indicated earlier, the accuracy (in DC and Dynamic mode) of the overall multi-stage iADC is dominated by the first sub-iADC. From another perspective, the accuracy requirement (in DC and Dynamic mode) of the second sub-iADC is attenuated by the resolution of the first sub-iADC, which provides the flexibility of arranging the second sub-iADC more cost effectively (e.g., smaller and less accurate).

Eighth, in the second sub-iADC each of its (signal conditioning circuits) SCu's input-to-output current difference signal maintains its peak-to-peak amplitude down the cascaded sequence of SCus. As such, there remains enough current to fuel the speed of SCu, especially SCus down the sequence stream.

Ninth, the disclosed multi-stage iADC is not restricted in its operating current magnitude. It can operate in subthreshold for ultra-low current or normal region with higher currents for wider input current span and for higher speeds.

Tenth, the disclosed iADC architecture is flexible in that its resolution can be extended by coupling multiple iADCs together.

Figure 11B:
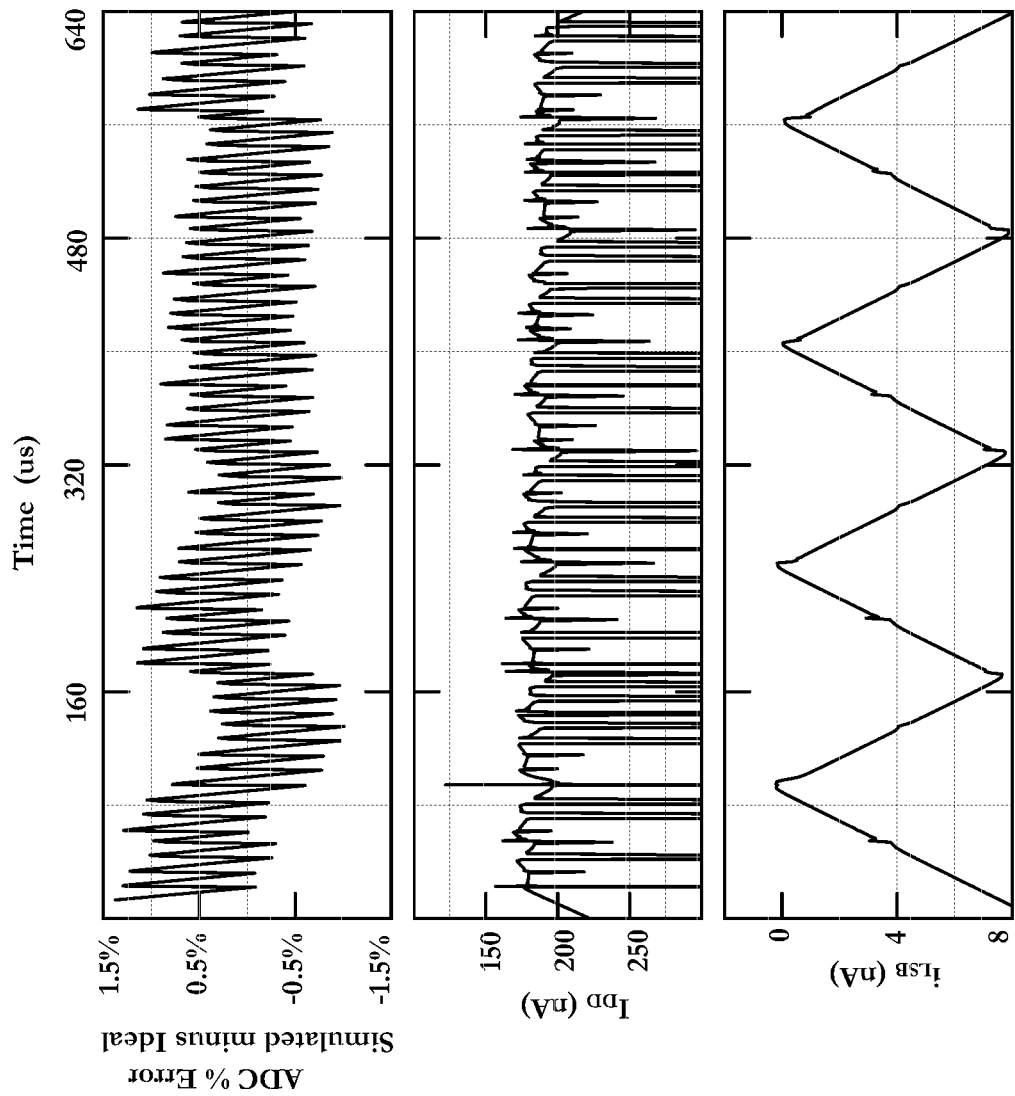
FIG. 11B is a circuit simulation showing waveforms of the multi-stage iADC illustrated in FIG. 11A.

Section 11B—Description of FIG. 11B

FIG. 11B is a circuit simulation showing waveforms of the multi-stage iADC illustrated in FIG. 11A. Bear in mind that the illustrated simulations here is intended to further clarify the disclosed multi-stage iADC's functionality and not as a limitation on the performance of the disclosed multi-stage iADC.

The multi-stage iADC of FIG. 11A is simulated by SPICE (Simulation Program with Integrated Circuit Emphasis) using main-stream 0.18 µm CMOS (Complementary Metal Oxide Semiconductor) transistor typical models.

The horizontal axis shows time in micro-seconds (is), where $I_{IN}$ of the multi-stage iADC of FIG. 11A is ramped from zero to full-scale of 64 nA in 640 µs. The input reference current or $I_R$=64 nA of the multi-stage iADC of FIG. 11A.

In the upper segment of FIG. 11B, the simulated digital output codes the multi-stage iADC of FIG. 11A are fed onto an ideal current mode digital-to-analog-converter (iDAC). The difference (in %) between the analog input of the multi-stage iADC of FIG. 11A and the analog output of the ideal iDAC are plotted. This plot indicates the multi-stage iADC of FIG. 11A's deviation error (simulation minus ideal) in % format, when $V_{DD}$=0.8v. Bear in mind that for a 6-bit iADC, Least-Significant-Bit (LSB) is $$\frac{1}{2^6} = 1.5\%,$$

which reflects the peak-to-peak % deviation error (saw-tooth waveform) in the upper segment of FIG. 11B.

In the middle segment of FIG. 11B is the simulated $I_{DD}$ or current consumption (in nano-ampere or nA) of the multi-stage iADC of FIG. 11A.

In the bottom segment of FIG. 11B is the simulated $i_{LSP}$ (nA) current of the multi-stage iADC of FIG. 11A with a peak-to-peak amplitude of 8 nA $$(\text{or } \frac{8nA}{64nA} = 12.5\% \text{ of full scale})$$

wherein $i_{LSP}$ can be fed onto a second sub-iADC in order to extend the resolution of the multi-stage iADC of FIG. 11A.

Figure 12A:
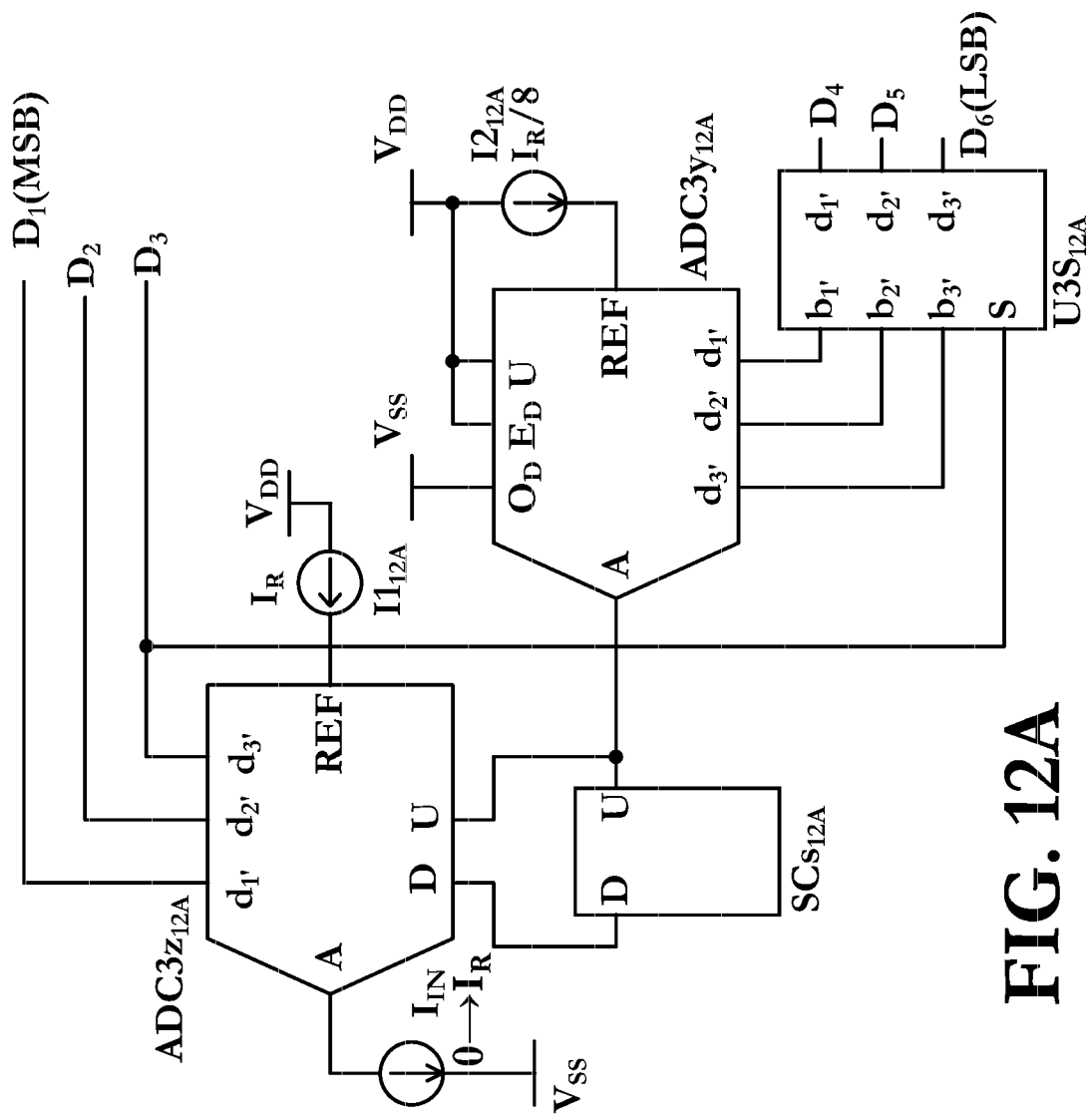
FIG. 12A is a circuit diagram that illustrates an embodiment of a multi-stage iADC comprising of a first sub-iADC disclosed (and illustrated) in section 5B (FIG. 5B) and a second sub-iADC disclosed (and illustrated) in section 7A (FIG. 7A).

Section 12A—Description of FIG. 12A

FIG. 12A is a circuit diagram that illustrates an embodiment of a multi-stage iADC comprising of a first sub-iADC disclosed (and illustrated) in section 5B (FIG. 5B) and a second sub-iADC disclosed (and illustrated) in section 7A (FIG. 7A).

For descriptive and illustrative clarity, the resolution of the multi-stage iADC of FIG. 12A is arranged for 6-bits, but higher resolutions can be arranged by utilizing higher resolution first and second sub-iADCs (e.g., 16-bits via trimming or calibration).

The multi-stage iADC of FIG. 12A ($ADC_{12A}$) is comprised of $ADC3z_{12A}$, $ADC3y_{12A}$, $SCs_{12A}$, and $U3S_{12A}$.

The $ADC_{12A}$ receives an input signal $I_{IN}$ that spans from zero to full-scale amplitude equal to $I_R$. Also, $ADC_{12A}$ receives a current reference current $I_R$, and it generates a digital output word comprising of $D_1$ (MSB) through $D_6$ (MSB).

The $I_R$ of $ADC_{12A}$ is internally mirrored onto $I1_{12A}=I_R$ (for $ADC3z_{12A}$) and $$I2_{12A} = \frac{I_R}{2^{MSP}} = \frac{I_R}{2^3} = \frac{I_R}{8} \text{ (for } ADC3y_{12A}\text{)},$$

wherein MSP is Most-Significant-Portion weight that is established by the resolution of the first sub-iADC or $ADC3z_{12A}$.

The $ADC_{12A}$'s first sub-iADC is $ADC3z_{12A}$ whose circuit diagram is disclosed (and illustrated) in section 5B (FIG. 5B) and whose block diagram is disclosed (and illustrated) in section 5C (FIG. 5C). The resolution of the embodied $ADC3z_{12A}$ is 3-bits for clarity of description and illustration and not as a limitation of $ADC_{12A}$'s arrangement. The digital output ports of $ADC3z_{12A}$ are $D_1$ (corresponding to the MSB of the over all $ADC_{12A}$) through $D_1$. The A input port of $ADC3z_{12A}$ receives the analog input current $I_{IN}$ of $ADC_{12A}$.

The $ADC_{12A}$ analog current interface circuit (is $SCs_{12A}$) between the first and second sub-iDACs generates the $i_{LSP}$ signal. As a reminder, $i_{LSP}$ generally represents $I_{IN}$'s LSP (or Least-Significant-Portion of $ADC_{12A}$'s input current signal) that is fed as analog input current to $ADC3y_{12A}$. The embodiment of FIG. 12A utilizes the signal conditioning circuit $SCs_{12A}$ that is disclosed and illustrated in section 1i and FIG. 1i (whose block diagram is disclosed and illustrated in section 1Q and FIG. 1Q).

Keep in mind that for $SCs_{12A}$ the $O_U$ and $O_{U'}$ are same (input/output) port. The difference in currents through D and U ports riding on top of an offset bias current (e.g., see FIG. 1i where $I3_{1i}$ is a scaled reference current S. $I_R$ wherein the embodiment of FIG. 12A, the scale factor $s=\frac{1}{2}^{MSP}+\frac{1}{2}^{MSP-1}=\frac{1}{2}^3+\frac{1}{2}^2=\frac{1}{8}+\frac{1}{4}$) generates the $i_{LSP}$ that is passed into $ADC3y_{12A}$ analog input port. The peach-to-peak amplitude of $i_{LSP}$ is $$\frac{I_R}{2^{MSP}} = \frac{I_R}{2^3} = \frac{I_R}{8},$$

and the $ADC3y_{12A}$ is arranged such that the $i_{LSP}$ is generated as an equilateral triangular waveform, which will be described shortly. As indicated earlier, the sub-iADC dynamic response is improved when its input current signal avoids a step or impulse (between zero and full scale) waveform.

The $ADC_{12A}$'s second sub-iADC is $ADC3y_{12A}$ whose circuit diagram is disclosed (and illustrated) in section 7A (FIG. 7A) and whose block diagram is disclosed (and illustrated) in section 7C (FIG. 7C). The resolution of the embodied $ADC3y_{12A}$ is 3-bits for clarity of description and illustration and not as a limitation of $ADC_{12A}$'s arrangement. The digital output ports of $ADC3y_{12A}$ are $d_{1'}$ through $d_{3'}$. As stated earlier, the A input port of $ADC3y_{12A}$ receives the $I_{lSP}$.

The $ADC_{12A}$'s polarity logic is $U3S_{12A}$ whose logic diagram is disclosed (and illustrated) in section 2F (FIG. 2F) and whose block diagram is disclosed (and illustrated) in section 2M (FIG. 2M). The $U3S_{12A}$ receives a digital input word at its digital input port comprising of $b_{1'}$ through $b_{3'}$. The $U3S_{12A}$ generates a digital output word at its digital out port comprising of $d_{1'}$ through $d_{3'}$ that ties in with $D_4$ through $D_6$ (corresponding to LSB of the overall $ADC_{12A}$). The S port of $U3S_{12A}$ that is coupled to $D_3$ (from $ADC3z_{12A}$) programs the polarity of $D_4$ through $D_6$ bits (to properly map the input-output of the $ADC3y_{12A}$ with the equilateral triangular form of its input signal $i_{LSP}$)

In summary some of the benefits of the multi-stage iADCs of FIG. 12A described in this disclosure are:

First, the overall multi-stage iADC here operates in current mode and benefits from current mode operations, which were explained earlier.

Second, the first sub-iADC is a tree iADC whose accuracy is dominated by its signal conditioning circuit (SCz) in its first row, for which it can be optimized accordingly and enhance the overall cost-accuracy of the multi-staged iADC.

Third, $2^n$ copies of the input current signal are needed in a conventional current mode n-bit flash iADC wherein mismatch between copies of the input current signal generates inaccuracies for the flash iADC. The disclosed first sub-iADC that embodies the tree ADC method does not require any copies of that input current signal and avoids the corresponding mismatches and inaccuracies, which improves the overall accuracy of the disclosed multi-stage iADC.

Fourth, the multi-stage iADC is asynchronous and does not require a free running clock. As such, the digital noise and dynamic power consumption associated with iADCs requiring free running clocks is avoided.

Fifth, for the sub-iADCs, the analog computations and the digital computations occur concurrently with nearly no interference between analog computation and digital computation. Thus, the disclosed multi-stage iADC is free from glitch.

Sixth, the $i_{LSP}$ that supplies the input to the second sub-iADC is programmed to avoid a zero-full scale step or impulse patterns, which helps the dynamic response of the second sub-iADC and hence that of the overall multi-stage iADC.

Seventh, as indicated earlier, the accuracy (in DC and Dynamic mode) of the overall multi-stage iADC is dominated by the first sub-iADC. From another perspective, the accuracy requirement (in DC and Dynamic mode) of the second sub-iADC is attenuated by the resolution of the first sub-iADC, which provides the flexibility of arranging the second sub-iADC more cost effectively (e.g., smaller and less accurate).

Eighth, the second sub-iADC is a thermometer iADC which has inherent enhanced accuracy. The second sub-iADC's reference network is arranged with equal sized thermometer current source whose random mismatches are attenuated by the square root of the sum of the square of such random mismatch errors. As such, the accuracy of the overall multi-stage iADC is enhanced cost effectively.

Ninth, the disclosed multi-stage iADC is not restricted in its operating current magnitude. It can operate in subthreshold for ultra-low current or normal region with higher currents for wider input current span and for higher speeds.

Tenth, the disclosed iADC architecture is flexible in that its resolution can be extended by coupling multiple iADCs together.

Figure 12B:
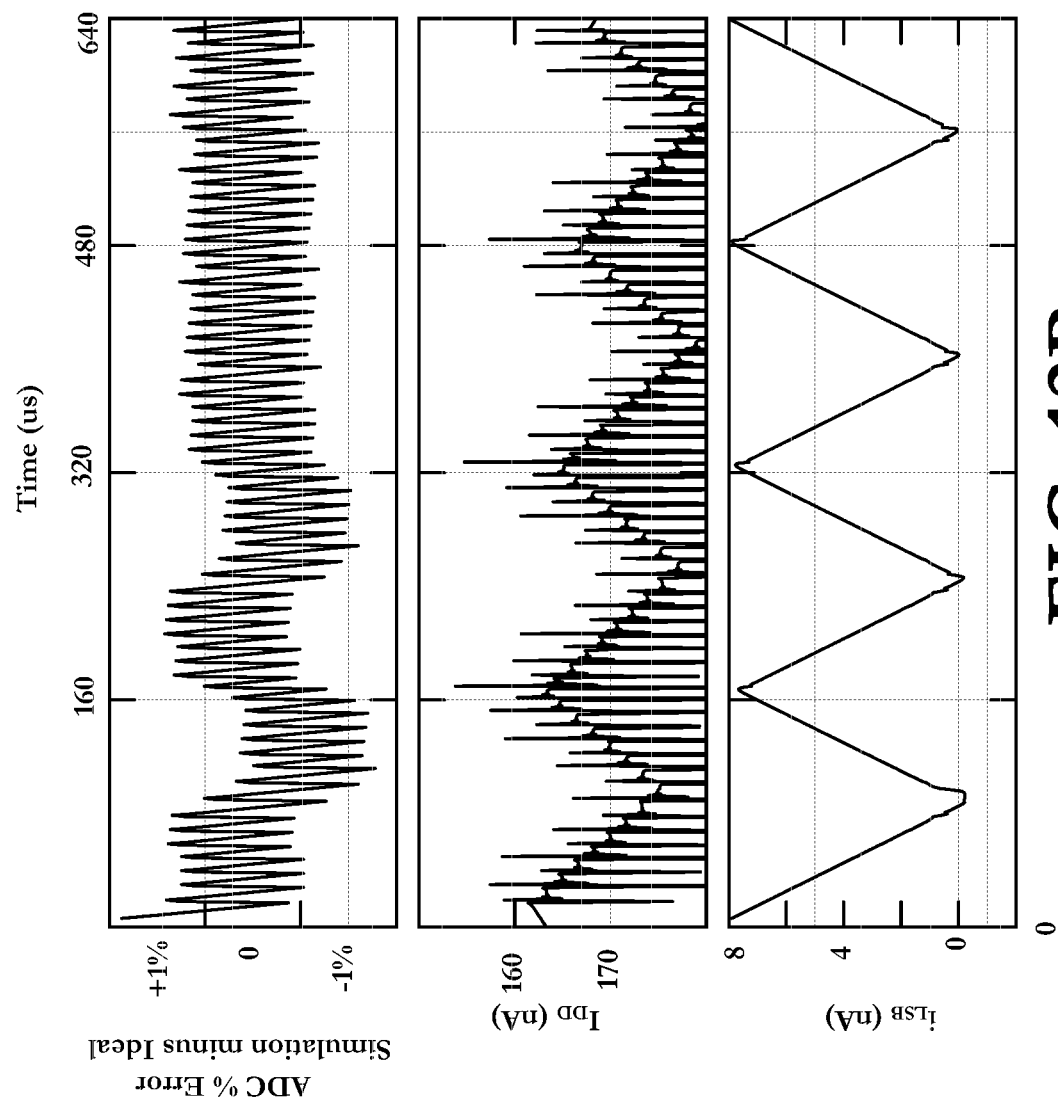
FIG. 12B is a circuit simulation showing waveforms of the multi-stage iADC illustrated in FIG. 12A.

Section 12B—Description of FIG. 12B

FIG. 12B is a circuit simulation showing waveforms of the multi-stage iADC illustrated in FIG. 12A. Bear in mind that the illustrated simulations here is intended to further clarify the disclosed multi-stage iADC's functionality and not as a limitation on the performance of the disclosed multi-stage iADC.

The multi-stage iADC of FIG. 12A is simulated by SPICE (Simulation Program with Integrated Circuit Emphasis) using main-stream 0.18 μm CMOS (Complementary Metal Oxide Semiconductor) transistor typical models.

The horizontal axis shows time in micro-seconds (μs), where $I_{IN}$ of the multi-stage iADC of FIG. 12A is ramped from zero to full-scale of 64 nA in 640 μs. The input reference current or $I_R$=64 nA of the multi-stage iADC of FIG. 12A.

In the upper segment of FIG. 12B, the simulated digital output codes the multi-stage iADC of FIG. 12A are fed onto an ideal current mode digital-to-analog-converter (iDAC). The difference (in %) between the analog input of the multi-stage iADC of FIG. 12A and the analog output of the ideal iDAC are plotted. This plot indicates the multi-stage iADC of FIG. 12A's deviation error (simulation minus ideal) in % format, when $V_{DD}$=0.8v. Bear in mind that for a 6-bit iADC, Least-Significant-Bit (LSB) is $$\frac{1}{2^6} = 1.5\%,$$

which reflects the peak-to-peak % deviation error (saw-tooth waveform) in the upper segment of FIG. 12B.

In the middle segment of FIG. 12B is the simulated $I_{DD}$ or current consumption (in nano-ampere or nA) of the multi-stage iADC of FIG. 12A In the bottom segment of FIG. 12B is the simulated $i_{LSP}$ (nA) current of the multi-stage iADC of FIG. 12A with a peak-to-peak amplitude of 8 nA $$\text{(or } \frac{8 \text{ nA}}{64 \text{ nA}} = 12.5\% \text{ of full scale)}$$

wherein $i_{LSP}$ can be fed onto a second sub-iADC in order to extend the resolution of the multi-stage iADC of FIG. 12A.

Figure 13A:
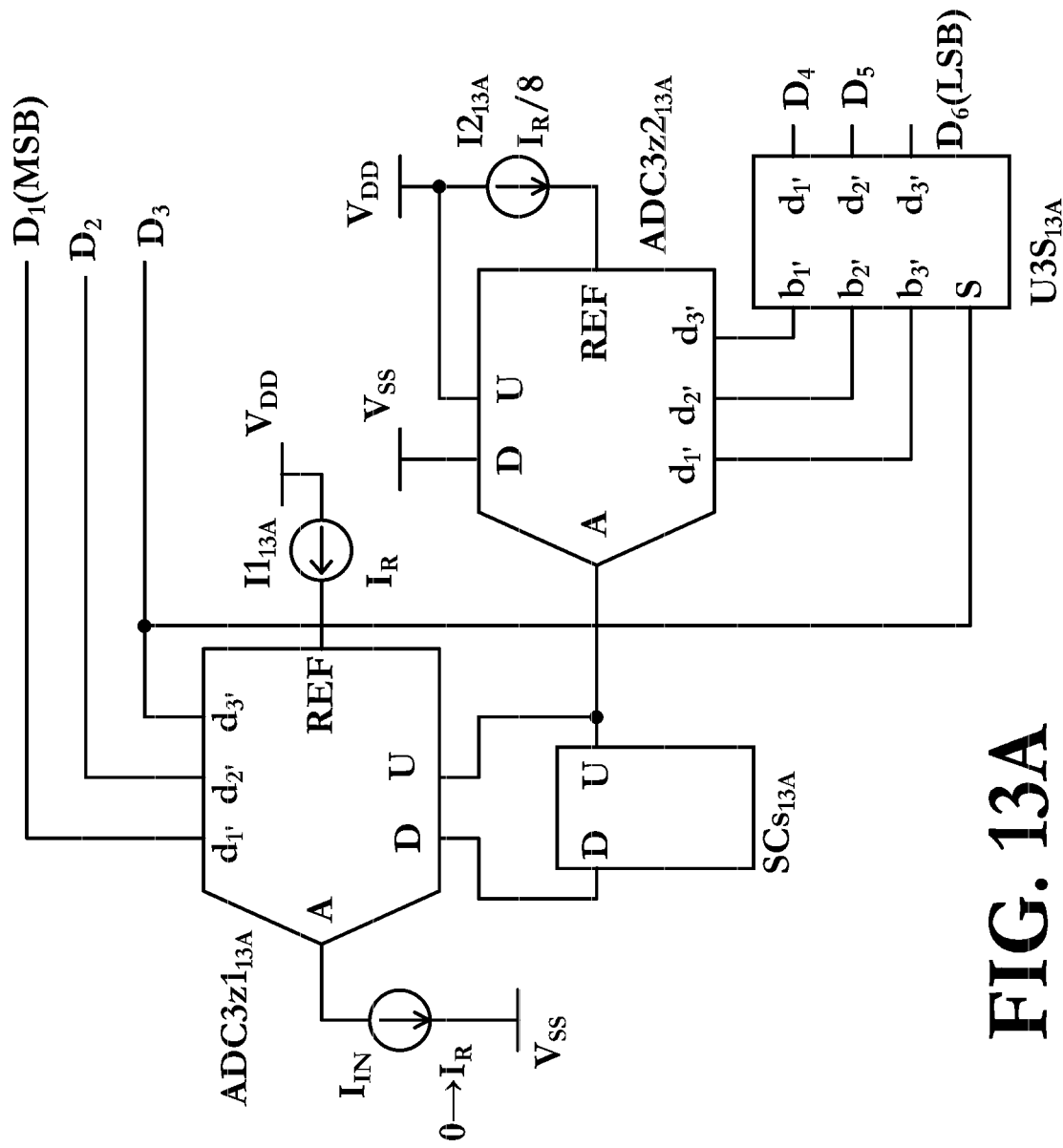
FIG. 13A is a circuit diagram that illustrates an embodiment of a multi-stage iADC comprising of a first sub-iADC disclosed (and illustrated) in section 5B (FIG. 5B) and a second sub-iADC disclosed (and illustrated) in section 5B (FIG. 5B).

Section 13A—Description of FIG. 13A

FIG. 13A is a circuit diagram that illustrates an embodiment of a multi-stage iADC comprising of a first sub-iADC disclosed (and illustrated) in section 5B (FIG. 5B) and a second sub-iADC disclosed (and illustrated) in section 5B (FIG. 5B).

For descriptive and illustrative clarity, the resolution of the multi-stage iADC of FIG. 13A is arranged for 6-bits, but higher resolutions can be arranged by utilizing higher resolution first and second sub-iADCs (e.g., 16-bits via trimming or calibration).

The multi-stage iADC of FIG. 13A ($ADC_{13A}$) is comprised of $ADC3z1_{13A}$, $ADC3z2_{13A}$, $SCs_{13A}$, and $U3S_{13A}$.

The $ADC_{13A}$ receives an input signal that spans from zero to full-scale amplitude equal to $I_R$. Also, $ADC_{13A}$ receives a current reference current $I_R$, and it generates a digital output word comprising of $D_1$ (MSB) through $D_6$ (MSB).

The $I_R$ of $ADC_{13A}$ is internally mirrored onto $I1_{13A}=I_R$ (for $ADC3z1_{43A}$) and $$I2_{13A} = \frac{I_R}{2^{MSP}} = \frac{I_R}{2^3} = \frac{I_R}{8} \text{ (for } ADC3z2_{13A}),$$

wherein MSP is Most-Significant-Portion weight that is established by the resolution of the first sub-iADC or $ADC3z1_{43A}$.

The $ADC_{13A}$'s first sub-iADC is $ADC3z1_{13A}$ whose circuit diagram is disclosed (and illustrated) in section 5B (FIG. 5B) and whose block diagram is disclosed (and illustrated) in section 5C (FIG. 5C). The resolution of the embodied $ADC3z1_{13A}$ is 3-bits for clarity of description and illustration and not as a limitation of $ADC_{13A}$'s arrangement. The digital output ports of $ADC3z1_{43A}$ are $D_1$ (corresponding to the MSB of the over all $ADC_{13A}$) through $D_1$. The A input port of $ADC3z1_{13A}$ receives the analog input current $I_{IN}$ of $ADC_{13A}$.

The $ADC_{13A}$ analog current interface circuit (is $SCs_{13A}$) between the first and second sub-iDACs generates the $i_{LSP}$ signal. As a reminder, $i_{LSP}$ generally represents $I_{IN}$'s LSP (or Least-Significant-Portion of $ADC_{13A}$'s input current signal) that is fed as analog input current to $ADC3z2_{13A}$. The embodiment of FIG. 13A utilizes the signal conditioning circuit $SCs_{13A}$ that is disclosed and illustrated in section 1i and FIG. 1i (whose block diagram is disclosed and illustrated in section 1Q and FIG. 1Q).

Keep in mind that for $SCs_{13A}$ the $O_U$ and $O_{U'}$ are same (input/output) port. The difference in currents through D and U ports riding on top of an offset bias current (e.g., see FIG. 1i where $B_{ii}$ is a scaled reference current $S$. $I_R$ wherein the embodiment of FIG. 13A, the scale factor $s=\frac{1}{2}^{MSP}+\frac{1}{2}^{MSP-1}=\frac{1}{2}^3+\frac{1}{2}^2=\frac{1}{8}+\frac{1}{4}$) generates the $i_{LSP}$ that is passed into $ADC3z2_{13A}$ analog input port. The peach-to-peak amplitude of $i_{LSP}$ is $$\frac{I_R}{2^{MSP}} = \frac{I_R}{2^3} = \frac{I_R}{8},$$

and the $ADC3z2_{13A}$ is arranged such that the $i_{LSP}$ is generated as an equilateral triangular waveform, which will be described shortly. As indicated earlier, the sub-iADC dynamic response is improved when its input current signal avoids a step or impulse (between zero and full scale) waveform.

The $ADC_{13A}$'s second sub-iADC is $ADC3z2_{13A}$, is similar to the first sub-iADC, whose circuit diagram is also disclosed (and illustrated) in section 5B (FIG. 5B) and whose block diagram is disclosed (and illustrated) in section 5C (FIG. 5C). The resolution of the embodied $ADC3z2_{13A}$ is 3-bits for clarity of description and illustration and not as a limitation of $ADC_{13A}$'s arrangement. The digital output ports of $ADC3z2_{13A}$ are $d_1$, through $d_3$. As stated earlier, the A input port of $ADC3z2_{13A}$ receives the $I_{LSP}$.

The $ADC_{13A}$'s polarity logic is $U3S_{13A}$ whose logic diagram is disclosed (and illustrated) in section 2F (FIG. 2F) and whose block diagram is disclosed (and illustrated) in section 2M (FIG. 2M). The $U3S_{13A}$ receives a digital input word at its digital input port comprising of $b_1$, through $b_3$,. The $U3S_{13A}$ generates a digital output word at its digital out port comprising of $d_1$, through $d_3$, that ties in with $D_4$ through $D_6$ (corresponding to LSB of the overall $ADC_{13A}$). The S port of $U3S_{13A}$ that is coupled to $D_3$ (from $ADC3z1_{13A}$) programs the polarity of $D_4$ through $D_6$ bits (to properly map the input-output of the $ADC3z2_{13A}$ with the equilateral triangular form of its input signal $i_{LSP}$)

In summary some of the benefits of the multi-stage iADCs of FIG. 13A described in this disclosure are:

First, the overall multi-stage iADC here operates in current mode and benefits from current mode operations, which were explained earlier.

Second, the first and second sub-iADCs are arranged as tree iADCs whose accuracies are dominated by their signal conditioning circuit (SCz) in the first row, where they can optimized to enhance the overall cost-accuracy of the multi-staged iADC.

Third, $2^n$ copies of the input current signal are needed in a conventional current mode n-bit flash iADC wherein mismatch between copies of the input current signal generates inaccuracies for the flash iADC. The disclosed sub-iADCs that embody the tree ADC method do not require any copies of that input current signal. Thus, they avoid the corresponding mismatches and inaccuracies, which improves the overall accuracy of the disclosed multi-stage iADC.

Fourth, the multi-stage iADC is asynchronous and does not require a free running clock. As such, the digital noise and dynamic power consumption associated with iADCs requiring free running clocks is avoided.

Fifth, for the sub-iADCs, the analog computations and the digital computations occur concurrently with nearly no interference between analog computation and digital computation. Thus, the disclosed multi-stage iADC is free from glitch.

Sixth, the $i_{LSP}$ that supplies the input to the second sub-iADC is programmed to avoid a zero-full scale step or impulse patterns, which helps the dynamic response of the second sub-iADC and hence that of the overall multi-stage iADC.

Seventh, as indicated earlier, the accuracy (in DC and Dynamic mode) of the overall multi-stage iADC is dominated by the first sub-iADC. From another perspective, the accuracy requirement (in DC and Dynamic mode) of the second sub-iADC is attenuated by the resolution of the first sub-iADC, which provides the flexibility of arranging the second sub-iADC more cost effectively (e.g., smaller and less accurate).

Eighth, the disclosed multi-stage iADC is not restricted in its operating current magnitude. It can operate in subthreshold for ultra-low current or normal region with higher currents for wider input current span and for higher speeds.

Ninth, the disclosed iADC architecture is flexible in that its resolution can be extended by coupling multiple iADCs together.

Figure 13B:
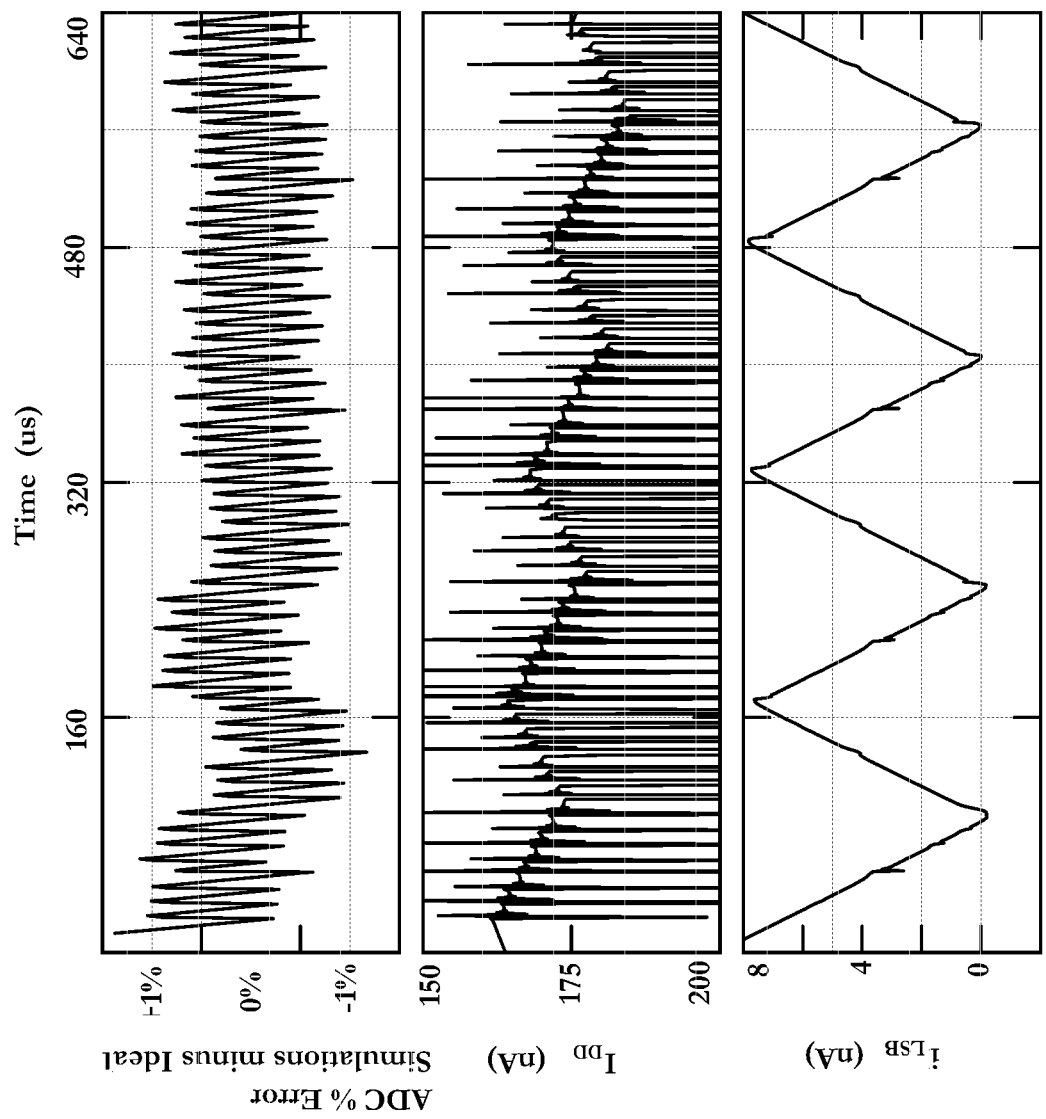
FIG. 13B is a circuit simulation showing waveforms of the multi-stage iADC illustrated in FIG. 13A.

Section 13B—Description of FIG. 13B

FIG. 13B is a circuit simulation showing waveforms of the multi-stage iADC illustrated in FIG. 13A. Bear in mind that the illustrated simulations here is intended to further clarify the disclosed multi-stage iADC's functionality and not as a limitation on the performance of the disclosed multi-stage iADC.

The multi-stage iADC of FIG. 13A is simulated by SPICE (Simulation Program with Integrated Circuit Emphasis) using main-stream 0.18 μm CMOS (Complementary Metal Oxide Semiconductor) transistor typical models.

The horizontal axis shows time in micro-seconds (μs), where $I_{IN}$ of the multi-stage iADC of FIG. 13A is ramped from zero to full-scale of 64 nA in 640 μs. The input reference current or $I_R$=64 nA of the multi-stage iADC of FIG. 13A.

In the upper segment of FIG. 13B, the simulated digital output codes the multi-stage iADC of FIG. 13A are fed onto an ideal current mode digital-to-analog-converter (iDAC). The difference (in %) between the analog input of the multi-stage iADC of FIG. 13A and the analog output of the ideal iDAC are plotted. This plot indicates the multi-stage iADC of FIG. 13A's deviation error (simulation minus ideal) in % format, when $V_{DD}$=0.8v. Bear in mind that for a 6-bit iADC, Least-Significant-Bit (LSB) is $$\frac{1}{2^6} = 1.5\%,$$

which reflects the peak-to-peak % deviation error (saw-tooth waveform) in the upper segment of FIG. 13B.

In the middle segment of FIG. 13B is the simulated $I_{DD}$ or current consumption (in nano-ampere or nA) of the multi-stage iADC of FIG. 13A In the bottom segment of FIG. 13B is the simulated $i_{LSP}$ (nA) current of the multi-stage iADC of FIG. 13A with a peak-to-peak amplitude of 8 nA $$(\text{or } \frac{8 \text{ nA}}{64 \text{ nA}} = 12.5\% \text{ of full scale})$$

wherein $i_{LSP}$ can be fed onto a second sub-iADC in order to extend the resolution of the multi-stage iADC of FIG. 13A.

Figure 14A:
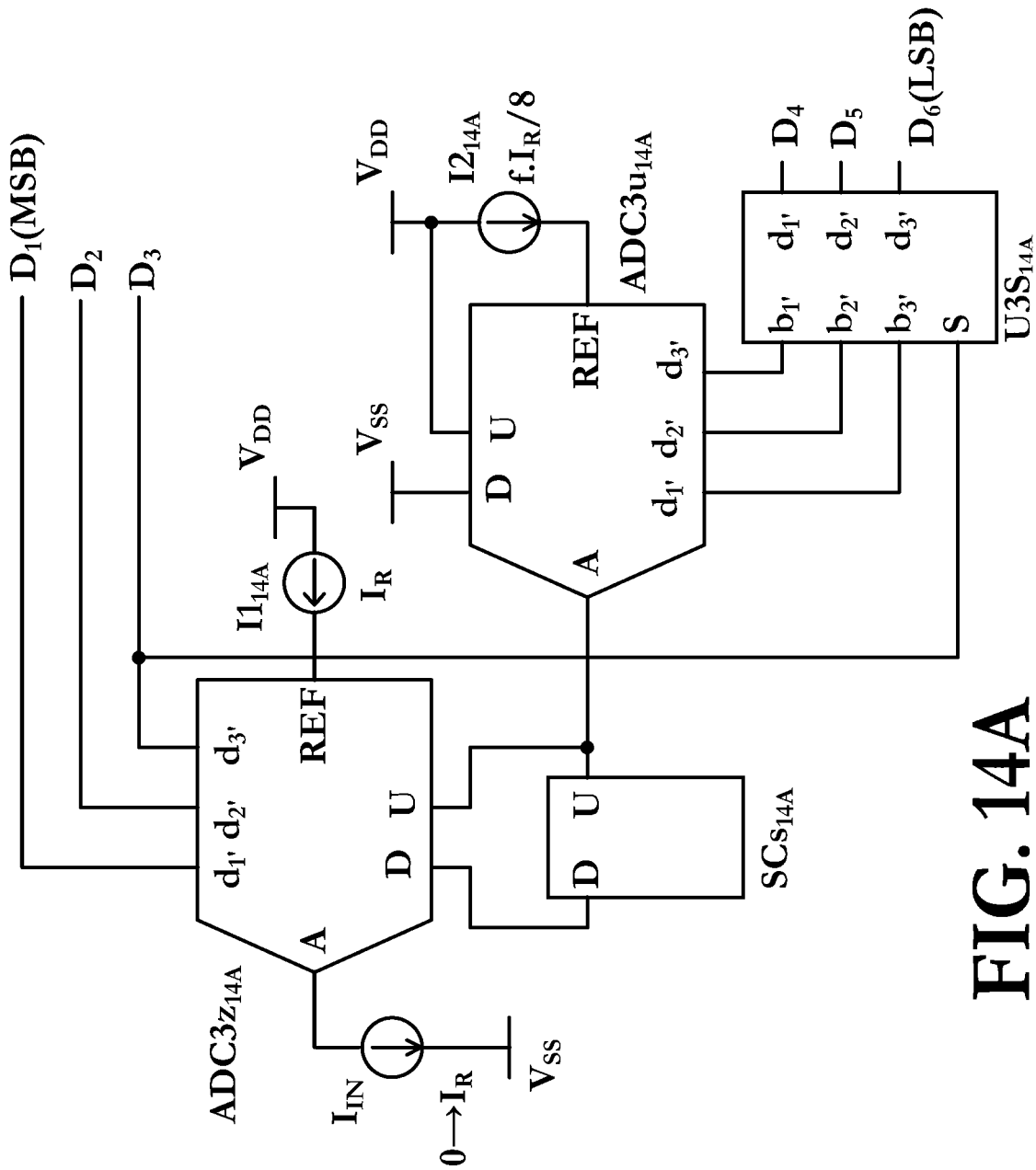
FIG. 14A is a circuit diagram that illustrates an embodiment of a multi-stage iADC comprising of a first sub-iADC disclosed (and illustrated) in section 5B (FIG. 5B) and a second sub-iADC disclosed (and illustrated) in section 6D (FIG. 6D).

Section 14A—Description of FIG. 14A

FIG. 14A is a circuit diagram that illustrates an embodiment of a multi-stage iADC comprising of a first sub-iADC disclosed (and illustrated) in section 5B (FIG. 5B) and a second sub-iADC disclosed (and illustrated) in section 6D (FIG. 6D).

For descriptive and illustrative clarity, the resolution of the multi-stage iADC of FIG. 14A is arranged for 6-bits, but higher resolutions can be arranged by utilizing higher resolution first and second sub-/ADCs (e.g., 16-bits via trimming or calibration).

The multi-stage iADC of FIG. 14A ($ADC_{14A}$) is comprised of $ADC3z_{14A}$, $ADC3u_{14A}$, $SCs_{14A}$, and $U3S_{14A}$.

The $ADC_{14A}$ receives an input signal $I_{IN}$ that spans from zero to full-scale amplitude equal to $I_R$. Also, $ADC_{14A}$ receives a current reference current $I_R$, and it generates a digital output word comprising of $D_1$ (MSB) through $D_6$ (MSB).

The $I_R$ of $ADC_{14A}$ is internally mirrored onto $I1_{14A}=I_R$ (for $ADC3z_{14A}$) and $$I2_{14A} = \frac{f \times I_R}{2^{MSP}} = \frac{f \times I_R}{2^3} = \frac{f \times I_R}{8} \text{ (for } ADC3u_{14A}),$$

wherein f is a gain factor (programmed in the $SCs_{14A}$ cell to be discussed shortly), and MSP is Most-Significant-Portion weight that is established by the resolution of the first sub-iADC or $ADC3z1_{14A}$.

The $ADC_{14A}$'s first sub-iADC is $ADC3z_{14A}$ whose circuit diagram is disclosed (and illustrated) in section 5B (FIG. 5B) and whose block diagram is disclosed (and illustrated) in section 5C (FIG. 5C). The resolution of the embodied $ADC3z_{14A}$ is 3-bits for clarity of description and illustration and not as a limitation of $ADC_{14A}$'s arrangement. The digital output ports of $ADC3z_{14A}$ are $D_1$ (corresponding to the MSB of the over all $ADC_{14A}$) through $D_3$. The A input port of $ADC3z_{14A}$ receives the analog input current $I_{IN}$ of $ADC_{14A}$.

The $ADC_{14A}$ analog current interface circuit (is $SCs_{14A}$) between the first and second sub-iDACs generates the $i_{LSP}$ signal. As a reminder, $i_{LSP}$ generally represents $I_{IN}$'s LSP (or Least-Significant-Portion of $ADC_{14A}$'s input current signal) that is fed as analog input current to $ADC3u_{14A}$. The embodiment of FIG. 14A utilizes the signal conditioning circuit $SCs_{14A}$ that is disclosed and illustrated in section 1i and FIG. 1i (whose block diagram is disclosed and illustrated in section 1Q and FIG. 1Q).

Keep in mind that for $SCs_{14A}$ the $O_U$ and $O_{U''}$ are same (input/output) port. Generally, the difference in currents through D and U ports riding on top of an offset bias current (e.g., see FIG. 1i where $I3_{1i}$ is a scaled reference currents. $I_R$ wherein the embodiment of FIG. 14A, the scale factor $s=\frac{1}{2}^{MSP}+\frac{1}{2}^{MSP-1}=\frac{1}{2}^3+\frac{1}{2}^2=\frac{1}{8}+\frac{1}{4}$) generates the $i_{LSP}$ that is passed into $ADC3u_{14A}$ analog input port.

The disclosed embodiment of FIG. 14A has the flexibility to amplify the magnitude of $i_{LSP}$ by a factor of 'f' before it is fed into $ADC3u_{14A}$ analog input port, in order to provide more current overdrive and speed up $ADC3u_{14A}$. For example, referring to FIG. 1i, the W/L of $N2_{1i}$ can be programmed f times that of $N1_{1i}$ and accordingly the scale factor 's' (offset bias current) can be programmed at s×f.

Taking into account the f factor, The peach-to-peak amplitude of $i_{LSP}$ is $$\frac{f \times I_R}{2^{MSP}} = \frac{f \times I_R}{2^3} = \frac{f \times I_R}{8},$$

and the $ADC3z2_{14A}$ is arranged such that the $i_{LSP}$ is generated as an equilateral triangular waveform, which will be described shortly. As indicated earlier, the sub-iADC dynamic response is improved when its input current signal avoids a step or impulse (between zero and full scale) waveform.

The $ADC_{14A}$'s second sub-iADC is $ADC3u_{14A}$, is similar to the first sub-iADC, whose circuit diagram is also disclosed (and illustrated) in section 6D (FIG. 6D) and whose block diagram is disclosed (and illustrated) in section 6H (FIG. 6H). The resolution of the embodied $ADC3u_{14A}$ is 3-bits for clarity of description and illustration and not as a limitation of $ADC_{14A}$'s arrangement. The digital output ports of $ADC3u_{14A}$ are $d_1$ through $d_3$. As stated earlier, the A input port of $ADC3u_{14A}$ receives the $i_{LSP}$ with a peak-to-peak amplitude of $$\frac{f \times I_R}{8},$$

and the REF input port of $ADC3u_{14A}$ receives $$\frac{f \times I_R}{8}$$

as its input reference current.

The $ADC_{14A}$'s polarity logic is $U3S_{14A}$ whose logic diagram is disclosed (and illustrated) in section 2F (FIG. 2F) and whose block diagram is disclosed (and illustrated) in section 2M (FIG. 2M). The $U3S_{14A}$ receives a digital input word at its digital input port comprising of $b_1$ through $b_3$. The $U3S_{14A}$ generates a digital output word at its digital out port comprising of $d_1$ through $d_3$ that ties in with $D_4$ through $D_6$ (corresponding to LSB of the overall $ADC_{14A}$). The S port of $U3S_{14A}$ that is coupled to $D_3$ (from $ADC3z_{14A}$) programs the polarity of $D_4$ through $D_6$ bits (to properly map the input-output of the $ADC3u_{14A}$ with the equilateral triangular form of its input signal $i_{LSP}$)

In summary some of the benefits of the multi-stage iADCs of FIG. 14A described in this disclosure are:

First, the overall multi-stage iADC here operates in current mode and benefits from current mode operations, which were explained earlier.

Second, the first sub-iADCs is arranged as tree iADC whose accuracy is dominated by its signal conditioning circuit (SCz) in the first row, for which it can be optimized accordingly and enhance the overall cost-accuracy of the multi-staged iADC.

Third, $2^n$ replicates of the input current signal are needed in a conventional current mode n-bit flash iADC wherein mismatch between copies of the input current signal generates inaccuracies for the flash iADC. The disclosed first sub-iADC that embody the tree ADC method does not require any replicates of that input current signal. Thus, the first sub-iADC avoids the corresponding mismatches and inaccuracies, which improves the overall accuracy of the disclosed multi-stage iADC.

Fourth, the multi-stage iADC is asynchronous and does not require a free running clock. As such, the digital noise and dynamic power consumption associated with iADCs requiring free running clocks is avoided.

Fifth, for the first sub-iADC, the analog computations and the digital computations occur concurrently with nearly no interference between analog computation and digital computation. Thus, the first sub-iADC's glitch contribution to the overall multi-stage iADC is reduced.

Sixth, the $i_{LSP}$ that supplies the input to the second sub-iADC is programmed to avoid a zero-full scale step or impulse patterns, which helps the dynamic response of the second sub-iADC and hence that of the overall multi-stage iADC.

Seventh, as indicated earlier, the accuracy (in DC and Dynamic mode) of the overall multi-stage iADC is dominated by the first sub-iADC. From another perspective, the accuracy requirement (in DC and Dynamic mode) of the second sub-iADC is attenuated by the resolution of the first sub-iADC, which provides the flexibility of arranging the second sub-iADC more cost effectively (e.g., smaller and less accurate).

Eighth the disclosed second sub-iADC is simple. Utilizing the tree ADC method, wherein analog and digital signals in a SCy are conditioned by prior ones, simplifies the second sub-iADC which saves area and power consumption. Moreover, the digital outputs of the second sub-iADC are generated sequentially and synchronously without the need for any logic such as decoding or encoding. Thus, overall multi-stage iADC size can be made small and dynamic power consumption associated with logic is minimized.

Ninth, the disclosed multi-stage iADC is not restricted in its operating current magnitude. It can operate in subthreshold for ultra-low current or normal region with higher currents for wider input current span and for higher speeds.

Tenth, the disclosed iADC architecture is flexible in that its resolution can be extended by coupling multiple iADCs together.

Figure 14B:
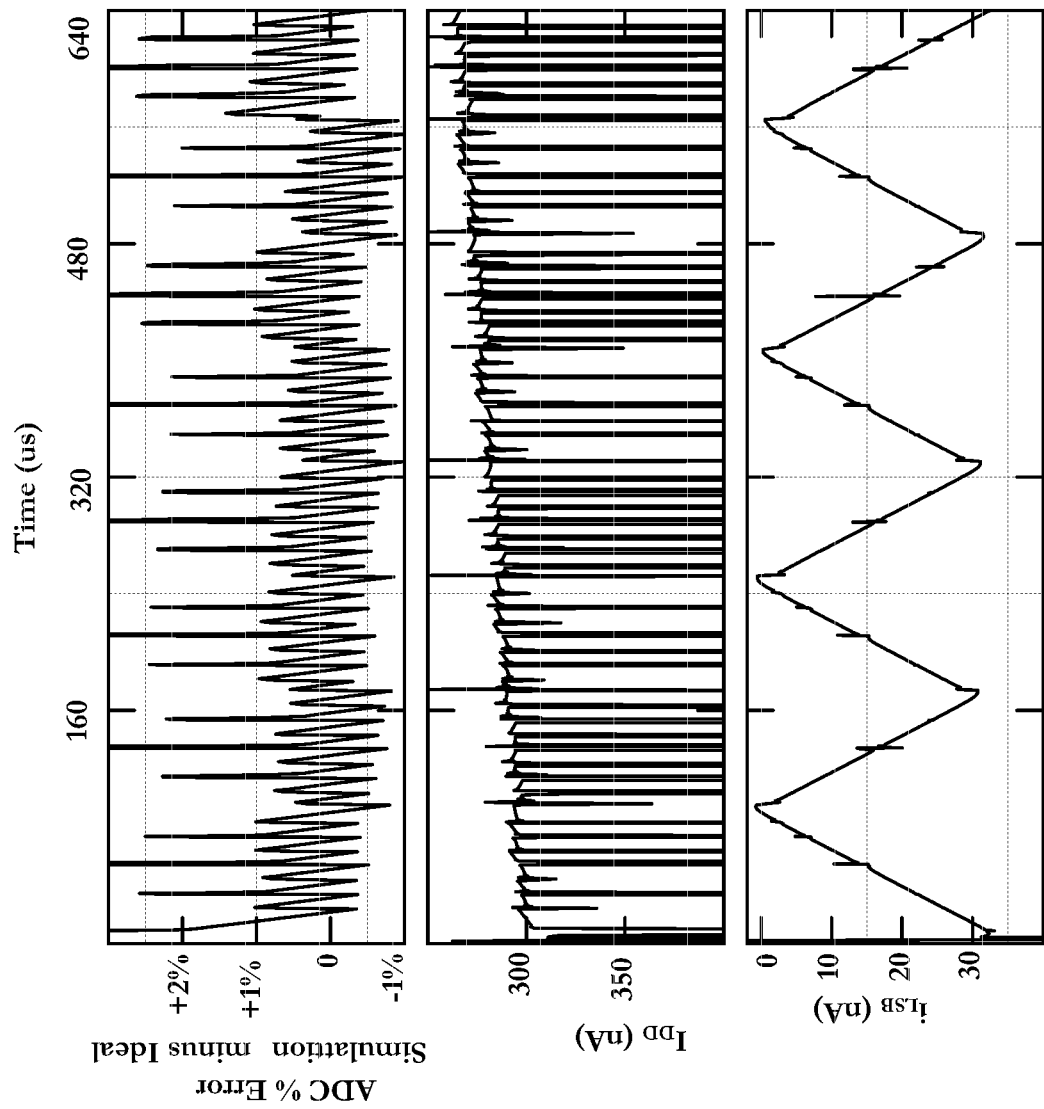
FIG. 14B is a circuit simulation showing waveforms of the multi-stage iADC illustrated in FIG. 14A.

Section 14B—Description of FIG. 14B

FIG. 14B is a circuit simulation showing waveforms of the multi-stage iADC illustrated in FIG. 14A. Bear in mind that the illustrated simulations here is intended to further clarify the disclosed multi-stage iADC's functionality and not as a limitation on the performance of the disclosed multi-stage iADC.

The multi-stage iADC of FIG. 14A is simulated by SPICE (Simulation Program with Integrated Circuit Emphasis) using main-stream 0.18 µm CMOS (Complementary Metal Oxide Semiconductor) transistor typical models.

The horizontal axis shows time in micro-seconds (µs), where $I_{IN}$ of the multi-stage iADC of FIG. 14A is ramped from zero to full-scale of 64 nA in 640 µs. The input reference current or $I_R$=64 nA of the multi-stage iADC of FIG. 14A.

In the upper segment of FIG. 14B, the simulated digital output codes the multi-stage iADC of FIG. 14A are fed onto an ideal current mode digital-to-analog-converter (iDAC). The difference (in %) between the analog input of the multi-stage iADC of FIG. 14A and the analog output of the ideal iDAC are plotted. This plot indicates the multi-stage iADC of FIG. 14A's deviation error (simulation minus ideal) in % format, when $V_{DD}$=0.8v. Bear in mind that for a 6-bit iADC, Least-Significant-Bit (LSB) is $$\frac{1}{2^6} = 1.5\%,$$

which reflects the peak-to-peak % deviation error (saw-tooth waveform) in the upper segment of FIG. 14B.

In the middle segment of FIG. 14B is the simulated $I_{DD}$ or current consumption (in nano-ampere or nA) of the multi-stage iADC of FIG. 14A In the bottom segment of FIG. 14B is the simulated $i_{LSP}$ (nA) current of the multi-stage iADC of FIG. 14A with a peak-to-peak amplitude of f×8 nA=4×8 nA=32 nA $$\left(\text{or } \frac{32 \text{ nA}}{64 \text{ nA}} = 50\% \text{ of full scale}\right)$$

wherein $i_{LSP}$ is gained-up by the factor f and then fed onto a second sub-iADC in order to extend the resolution of the multi-stage iADC of FIG. 14A.

Figure 15A:
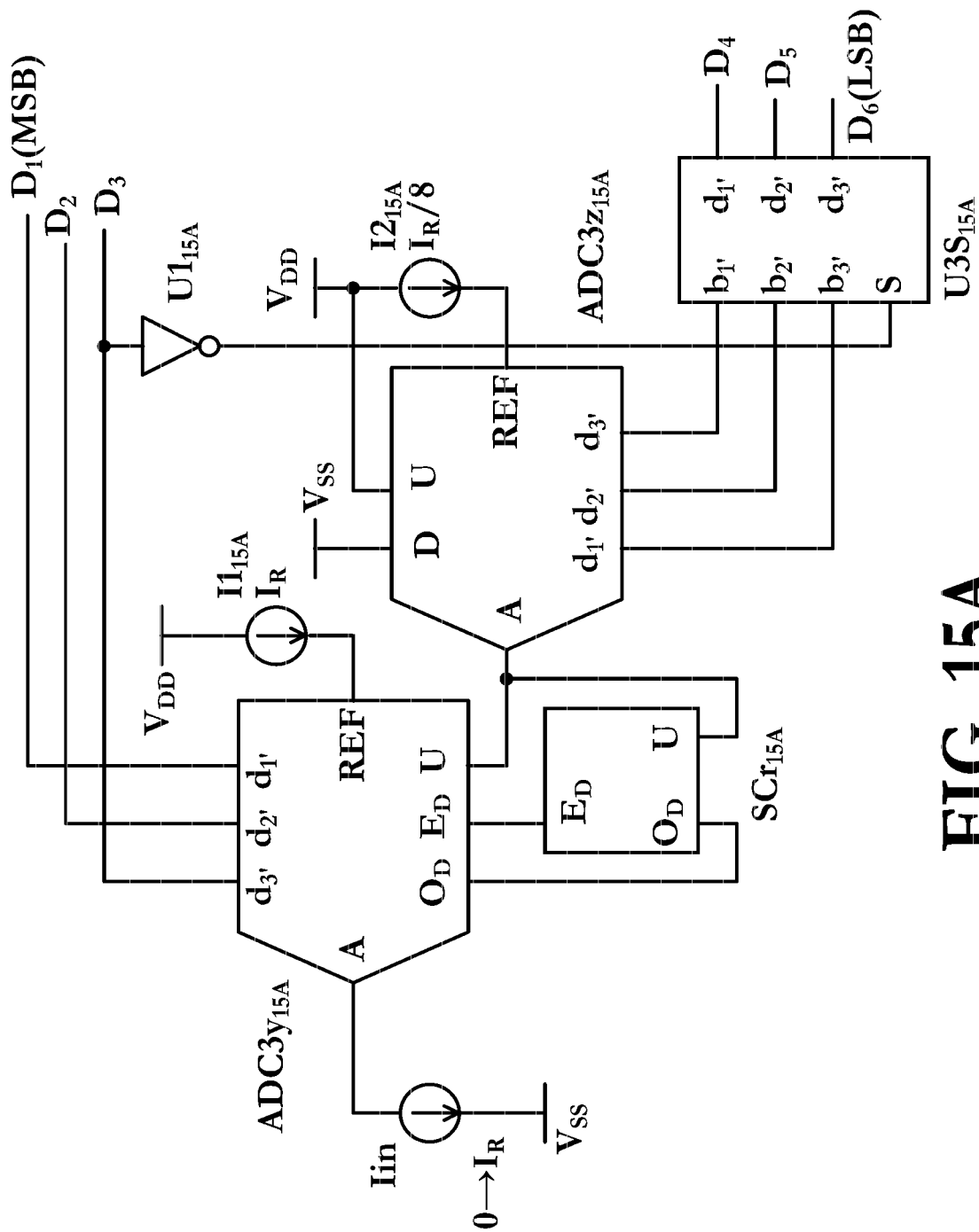
FIG. 15A is a circuit diagram that illustrates an embodiment of a multi-stage iADC comprising of a first sub-iADC disclosed (and illustrated) in section 7A (FIG. 7A) and a second sub-iADC disclosed (and illustrated) in section 5B (FIG. 5B).

Section 15A—Description of FIG. 15A

FIG. 15A is a circuit diagram that illustrates an embodiment of a multi-stage iADC comprising of a first sub-iADC disclosed (and illustrated) in section 7A (FIG. 7A) and a second sub-iADC disclosed (and illustrated) in section 5B (FIG. 5B).

For descriptive and illustrative clarity, the resolution of the multi-stage iADC of FIG. 15A is arranged for 6-bits, but higher resolutions can be arranged by utilizing higher resolution first and second sub-iADCs (e.g., 16-bits via trimming or calibration).

The multi-stage iADC of FIG. 15A ($ADC_{15A}$) is comprised of $ADC3y_{15A}$, $ADC3z_{15A}$, $SCr_{15A}$, and $U3S_{15A}$.

The $ADC_{15A}$ receives an input signal that spans from zero to full-scale amplitude equal to $I_R$. The $ADC_{15A}$ also receives a current reference current $I_R$ and it generates a digital output word comprising of $D_1$ (MSB) through $D_6$ (MSB).

The $I_R$ of $ADC_{15A}$ is internally mirrored onto $I1_{15A}=I_R$ (for $ADC3y_{15A}$) and $$I2_{15A} = \frac{I_R}{2^{MSP}} = \frac{I_R}{2^3} = \frac{I_R}{8} \text{ (for } ADC3z_{15A}),$$

wherein MSP is Most-Significant-Portion weight that is established by the resolution of the first sub-iADC or $ADC3y_{15A}$.

The $ADC_{15A}$'s first sub-iADC is $ADC3y_{15A}$ whose circuit diagram is disclosed (and illustrated) in section 7A (FIG. 7A) and whose block diagram is disclosed (and illustrated) in section 7C (FIG. 7C). The resolution of the embodied $ADC3y_{15A}$ is 3-bits for clarity of description and illustration and not as a limitation of $ADC_{15A}$'s arrangement. The digital output ports of $ADC3_{15A}$ are $D_1$ (corresponding to the MSB of the over all $ADC_{15A}$) through $D_1$. The A input port of $ADC3y_{15A}$ receives the analog input current $I_{IN}$ of $ADC_{15A}$.

The $ADC_{15A}$ analog current interface circuit (is $SCr_{15A}$) between the first and second sub-iDACs generates the $i_{LSP}$ signal. As a reminder, $i_{LSP}$ generally represents $I_{IN}$'s LSP (or Least-Significant-Portion of $ADC_{15A}$'s input current signal) that is fed as analog input current to $ADC3z_{15A}$. The embodiment of FIG. 15A utilizes the signal conditioning circuit $SCr_{15A}$ that is disclosed and illustrated in section 1j and FIG. 1j (whose block diagram is disclosed and illustrated in section 1R and FIG. 1R).

Keeping in mind that for $SCr_{15A}$ the $O_U$ and $O_{U'}$ are same (input/output) port, the difference in currents through $O_D$ and $E_D$ ports minus the currents through $O_{U'}$ is the $i_{LSP}$ current that is passed into $ADC3z_{15A}$ analog input port. The peach-to-peak amplitude of $i_{LSP}$ is $$\frac{I_R}{2^{MSP}} = \frac{I_R}{2^3} = \frac{I_R}{8},$$

and the $ADC3z_{15A}$ is arranged such that the $i_{LSP}$ is generated as an equilateral triangular waveform, which will be described shortly. As indicated earlier, the sub-iADC dynamic response is improved when its input signal avoids a step or impulse (between zero and full scale) waveform.

The ADC$_{15A}$'s second sub-iADC is ADC3z$_{15A}$ whose circuit diagram is disclosed (and illustrated) in section 5B (FIG. 5B) and whose block diagram is disclosed (and illustrated) in section 5C (FIG. 5C). The resolution of the embodied ADC3z$_{15A}$ is 3-bits for clarity of description and illustration and not as a limitation of ADC$_{15A}$'s arrangement. The digital output ports of ADC3z$_{15A}$ are d$_{1'}$ through d$_{3'}$. As stated earlier, the A input port of ADC3z$_{15A}$ receives the i$_{LSP}$.

The ADC$_{15A}$'s polarity logic is U3S$_{15A}$ whose logic diagram is disclosed (and illustrated) in section 2F (FIG. 2F) and whose block diagram is disclosed (and illustrated) in section 2M (FIG. 2M). The U3S$_{15A}$ receives a digital input word at its digital input port comprising of b$_{1'}$ through b$_{3'}$. The U3S$_{15A}$ generates a digital output word at its digital out port comprising of d$_{1'}$ through d$_{3'}$ that ties in with D$_4$ through D$_6$ (corresponding to LSB of the over all ADC$_{15A}$). The S port of U3S$_{15A}$ that is coupled to an inverted D$_3$ signal (from U1$_{15A}$) programs the polarity of D$_4$ through D$_6$ bits (to properly map the input-output of the ADC3z$_{15A}$ with the equilateral triangular form of its input signal i$_{LSP}$)

In summary some of the benefits of the multi-stage iADCs of FIG. 15A described in this disclosure are:

First, the overall multi-stage iADC here operates in current mode and benefits from current mode operations, which were explained earlier.

Second, the first sub-iADC is a thermometer iADC which has enhanced accuracy. The first sub-iADC's reference network is arranged with equal sized thermometer current source whose random mismatches are attenuated by the square root of the sum of the square of such random mismatch errors. As such, the accuracy of the overall multi-stage iADC is enhanced since multi-stage iADC's accuracy is dominated by that of the first sub-iADC.

Third, the multi-stage iADC is asynchronous and does not require a free running clock. As such, the digital noise and dynamic power consumption associated with iADCs requiring free running clocks is avoided.

Fourth, for the first and second sub-iADC, the analog computations and the digital computations occur concurrently with nearly no interference between analog computation and digital computation. Thus, the disclosed multi-stage iADC is nearly glitch free.

Fifth, the i$_{LSP}$ that supplies the input to the second sub-iADC is programmed to avoid a zero-full scale step or impulse patterns, which helps the dynamic response of the second sub-iADC and hence that of the overall multi-stage iADC.

Sixth, the disclosed multi-stage iADC is not restricted in its operating current magnitude. It can operate in subthreshold for ultra-low current or normal region with higher currents for wider input current span and for higher speeds.

Seventh, the disclosed iADC architecture is flexible in that its resolution can be extended by coupling multiple iADCs together.

Eighth, as indicated earlier, the accuracy (in DC and Dynamic mode) of the overall multi-stage iADC is dominated by the first sub-iADC. From another perspective, the accuracy requirement (in DC and Dynamic mode) of the second sub-iADC is attenuated by the resolution of the first sub-iADC, which provides the flexibility of arranging the second sub-iADC more cost effectively (e.g., smaller and less accurate).

Ninth, the second sub-iADCs is arranged as tree iADC whose accuracy is dominated by its signal conditioning circuit (SCz) in the first row, for which it can be optimized accordingly and enhance the overall cost-accuracy of the multi-staged iADC.

Tenth, 2$^n$ copies of the input current signal are needed in a conventional current mode n-bit flash iADC wherein mismatch between copies of the input current signal generates inaccuracies for the flash iADC. The disclosed second sub-iADC that embody the tree ADC method does not require any copies of that input current signal. Thus, the first sub-iADC avoids the corresponding mismatches and inaccuracies, which improves the overall accuracy of the disclosed multi-stage iADC.

Figure 15B:
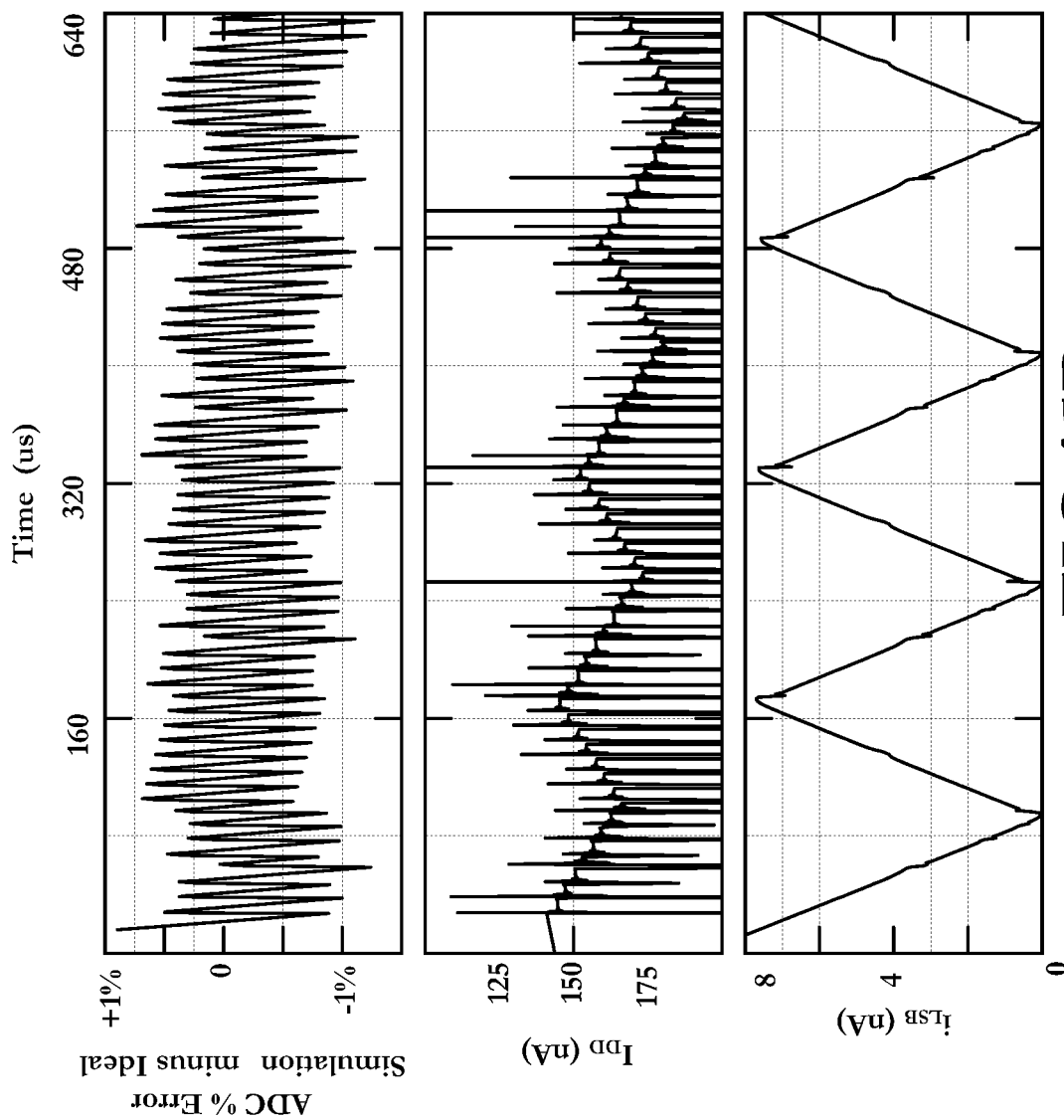
FIG. 15B is a circuit simulation showing waveforms of the multi-stage iADC illustrated in FIG. 15A.

Section 15B—Description of FIG. 15B

FIG. 15B is a circuit simulation showing waveforms of the multi-stage iADC illustrated in FIG. 15A. Bear in mind that the illustrated simulations here is intended to further clarify the disclosed multi-stage iADC's functionality and not as a limitation on the performance of the disclosed multi-stage iADC.

The multi-stage iADC of FIG. 15A is simulated by SPICE (Simulation Program with Integrated Circuit Emphasis) using main-stream 0.18 μm CMOS (Complementary Metal Oxide Semiconductor) transistor typical models.

The horizontal axis shows time in micro-seconds (μs), where I$_{IN}$ of the multi-stage iADC of FIG. 15A is ramped from zero to full-scale of 64 nA in 640 μs. The input reference current or I$_R$=64 nA of the multi-stage iADC of FIG. 15A.

In the upper segment of FIG. 15B, the simulated digital output codes the multi-stage iADC of FIG. 15A are fed onto an ideal current mode digital-to-analog-converter (iDAC). The difference (in %) between the analog input of the multi-stage iADC of FIG. 15A and the analog output of the ideal iDAC are plotted. This plot indicates the multi-stage iADC of FIG. 15A's deviation error (simulation minus ideal) in % format, when V$_{DD}$=0.8v. Bear in mind that for a 6-bit iADC, Least-Significant-Bit (LSB) is $$\frac{1}{2^6} = 1.5\%,$$

which reflects the peak-to-peak % deviation error (saw-tooth waveform) in the upper segment of FIG. 15B.

In the middle segment of FIG. 15B is the simulated I$_{DD}$ or current consumption (in nano-ampere or nA) of the multi-stage iADC of FIG. 15A In the bottom segment of FIG. 15B is the simulated i$_{LSP}$ (nA) current of the multi-stage iADC of FIG. 15A with a peak-to-peak amplitude of 8 nA $$\left(\text{or } \frac{8 \text{ nA}}{64 \text{ nA}} = 12.5\% \text{ of full scale}\right)$$

wherein i$_{LSP}$ can be fed onto a second sub-iADC in order to extend the resolution of the multi-stage iADC of FIG. 15A.

What is claimed:

1. A system for current signal conditioning in an integrated circuit, the system comprising:
   a plurality of current-mode signal-conditioners (iSC)s each having an analog current input port (A$_I$), an analog current output port (A$_O$), and a digital output port (D$_O$);
   a plurality of scaled reference current sources (I$_R$);
   the first I$_R$ source coupled to the A$_I$ port of the first iSC;

the second and each subsequent $I_R$ source each having a digital input port ($D_R$) for controlling the polarity of the $I_R$ source;

the $A_O$ port of the first iSC and the $A_O$ port of each subsequent iSC coupled to the $A_I$ port of each corresponding subsequent successive iSC;

the $A_O$ port of each iSC coupled to its corresponding $I_R$ source; and the $D_O$ port of each iSC coupled to the $D_R$ port of each corresponding $I_R$ source.

2. The system for current signal conditioning in an integrated circuit of claim 1, the system further comprising:

a current mode analog to digital converter (iADC) having an analog current input port ($Ai_{ADC}$) receiving an analog input current signal ($Ii_{ADC}$);

the iADC having an analog reference current port ($Ar_{ADC}$) receiving an analog reference current signal ($Ir_{ADC}$);

the iADC having a digital output port ($Do_{ADC}$);

the respective $D_O$ ports of the plurality of iSCs coupled to the $Do_{ADC}$ port; and the $A_I$ port of the first iSC coupled to the $Ai_{ADC}$ port.

3. The system for current signal conditioning in an integrated circuit of claim 1, the system further comprising:

wherein each iSC generating an analog difference current (i$\Delta$);

wherein if the i$\Delta$>0, then the corresponding iSC steers the +i current onto the $A_O$ port, and generates a digital output signal ($T_O$) at the $D_O$ port;

wherein if the i$\Delta$<0, then the corresponding iSC steers the $-$i$\Delta$ current onto the $A_O$ port, and generates an opposite digital output signal ($xT_O$) at the $D_O$ port;

wherein the absolute value of the magnitude of the $I_R$ corresponding to each successive iSC is scaled to substantially twice the absolute value of the magnitude of the $I_R$ source corresponding to the subsequent successive iSC; and wherein there are n of iSCs beginning with the first iSC and ending with the $n^{th}$ iSC.

4. The system for current signal conditioning in an integrated circuit of claim 3, the system further comprising:

a current mode analog to digital converter (iADC) having an analog current input port ($Ai_{ADC}$) receiving an analog input current signal ($Ii_{ADC}$);

the iADC having an analog reference current port ($Ar_{ADC}$) receiving an analog reference current signal ($Ir_{ADC}$);

the iADC having a digital output port ($Do_{ADC}$);

the respective $D_O$ ports of the plurality of iSCs coupled to the $Do_{ADC}$ port; and the $A_I$ port of the first iSC coupled to the $Ai_{ADC}$ port.

5. The system for current signal conditioning in an integrated circuit of claim 4, the system further comprising:

wherein n is the resolution of the iADC and the $Do_{ADC}$ port is n-bit wide;

wherein the absolute value of the magnitude of each $I_R$ can be scaled between a zero-scale $I_R$ and a full-scale $I_R$;

wherein $Ir_{ADC}$ is proportional to the full-scale scaled $I_R$; and wherein $Ii_{ADC}$ can span between the zero-scale $I_R$ and the full-scale $I_R$.

6. The system for current signal conditioning in an integrated circuit of claim 2, the system further comprising:

wherein n is the resolution of the iADC and the $Do_{ADC}$ port is n-bit wide;

wherein the absolute value of the magnitude of each $I_R$ can be scaled between a zero-scale $I_R$ and a full-scale $I_R$;

wherein $Ir_{ADC}$ is proportional to the full-scale scaled $I_R$; and wherein $Ii_{ADC}$ can span between the zero-scale $I_R$ and the full-scale $I_R$.

7. A method for analog to digital conversion in an integrated circuit, the method comprising:

receiving a first analog input signal;

receiving a first analog reference signal;

subtracting the first analog reference signal from the first analog input signal to generate a first analog difference signal;

generating a first digital output signal having a sign responsive to the sign of the first analog difference signal;

receiving a second and subsequent analog reference signals, each respectively having a sign responsive to the respective signs of the first and subsequent analog difference signals;

subtracting the second and subsequent analog reference signals, each respectively from the first and subsequent analog difference signals to respectively generate second and subsequent analog difference signals; and generating a second and subsequent digital output signals, each respectively having a sign responsive to the respective sign of the second and subsequent analog difference signals.

8. The method for analog to digital conversion in an integrated circuit of claim 7, the method further comprising:

scaling the first, second, and each subsequent analog reference signals respectively to follow at least one of binary, equal, and individual weightings.

\* \* \* \* \*